United States Patent
Koike et al.

(10) Patent No.: US 7,943,984 B2
(45) Date of Patent: May 17, 2011

(54) NONVOLATILE SEMICONDUCTOR MEMORY APPARATUS

(75) Inventors: Masahiro Koike, Yokohama (JP);
Yuuichiro Mitani, Kanagawa-Ken (JP);
Yasushi Nakasaki, Yokohama (JP);
Masato Koyama, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 274 days.

(21) Appl. No.: 12/233,023

(22) Filed: Sep. 18, 2008

(65) Prior Publication Data
US 2009/0267134 A1 Oct. 29, 2009

(30) Foreign Application Priority Data
Mar. 19, 2008 (JP) .................... 2008-072148

(51) Int. Cl.
*H01L 29/792* (2006.01)
(52) U.S. Cl. .................. 257/325; 257/E29.309
(58) Field of Classification Search .............. 257/321, 257/324, 325, E29.3, E29.304, E29.309
See application file for complete search history.

(56) References Cited

U.S. PATENT DOCUMENTS

| 7,279,737 | B2 | 10/2007 | Nara et al. | |
|---|---|---|---|---|
| 2005/0122775 | A1* | 6/2005 | Koyanagi et al. | 365/185.11 |
| 2007/0052011 | A1* | 3/2007 | Bhattacharyya | 257/324 |
| 2007/0228447 | A1* | 10/2007 | Ozawa | 257/314 |
| 2008/0073691 | A1 | 3/2008 | Konno et al. | |
| 2008/0135922 | A1 | 6/2008 | Mitani et al. | |

FOREIGN PATENT DOCUMENTS

| JP | 08-125042 | 5/1996 |
|---|---|---|
| JP | 3357861 | 10/2002 |
| JP | 2008-147390 | 6/2008 |

OTHER PUBLICATIONS

Seguini et al., "Band alignment at the $La_2Hf_2O_7/(001)Si$ interface," Applied Physics Letters (May 16, 2006), 88:202903-1-202903-3.
Dimoulas et al., "$La_2Hf_2O_7$ high-$K$ gate dielectric grown directly on Si(001) by molecular-beam epitaxy," Applied Physics Letters (Oct. 11, 2004), 85:3205-07.
Koike et al., "Effect of Hf-N Bond on Properties of Thermally Stable Amorphous HFSiON and Applicability of this material to Sub-50nm Technology Node LSIs," IEEE (2003), pp. 1-4.

(Continued)

*Primary Examiner* — Benjamin P Sandvik
*Assistant Examiner* — W. Wendy Kuo
(74) *Attorney, Agent, or Firm* — Finnegan, Henderson, Farabow, Garrett & Dunner, L.L.P.

(57) ABSTRACT

A nonvolatile semiconductor memory apparatus includes: a memory element including: a semiconductor substrate; a source region and a drain region formed at a distance from each other in the semiconductor substrate; a first insulating film formed on a portion of the semiconductor substrate located between the source region and the drain region, having sites that perform electron trapping and releasing and are formed by adding an element different from a base material, and including insulating layers having different dielectric constants, the sites having a higher level than a Fermi level of a material forming the semiconductor substrate; a charge storage film formed on the first insulating film; a second insulating film formed on the charge storage film; and a control gate electrode formed on the second insulating film.

20 Claims, 96 Drawing Sheets

OTHER PUBLICATIONS

Yu et al., "Energy gap and band alignment for $(HfO_2)_x (Al_2O_3)_{1-x}$ on (100) SI," Applied Physics Letters (Jul. 8, 2002), 81:376-378.

Wilk et al., "Improved Film Growth and Flatband Voltage Control of ALD $HfO_2$ and Hf-Al-O with $n^+$ poly-Si Gates using Chemical Oxides and Optimized Post-Annealing," 2002 Symposium on VLSI Technology Digest of Technical Papers (2002), pp. 1-2.

Robertson, "Band offsets of wide-band-gap oxides and implications for future electronic devices," J. Vac. Sci. Technol. B (May/Jun. 2000), pp. 1785-1791.

Notice of Preliminary Rejection issued by the Korean Patent Office on Nov. 17, 2010, for Korean Patent Application No. 10-2009-0022918, and English-language translation thereof.

* cited by examiner

|  | DIELECTRIC CONSTANT | ΔEc |
|---|---|---|
| $HfO_2$ | 18 | 2.6 |
| $Al_2O_3$ | 9 | 2.8 |
| $La_2O_3$ | 30 | 2.3 |
| $SiO_2$ | 3.9 | 3.1 |
| $Si_3N_4$ | 7.4 | 2.1 |
| HfAlO | 12 | 2.14 |
| HfSiO | 11 | 1.8 |
| LaAlO | 30 | 1.8 |
| LaHfO | 23 | 2.1 |
| $Ta_2O_5$ | 30 | 1.5 |

FIG. 22

| low-k | high-k | min (eV) | max (eV) | EOTmin (nm) |
|---|---|---|---|---|
| SiO2 | HfO2 | 0 | 1.7 | 1.77 |
| SiO2 | Al2O3 | 0 | 1.9 | 2.38 |
| SiO2 | La2O3 | 0.1 | 1.5 | 1.48 |
| SiO2 | HfSiO | 0 | 0.55 | 2.29 |
| SiO2 | LaAlO | 0 | 1 | 1.26 |
| SiO2 | HfAlO | 0.3 | 1.2 | 2.01 |
| SiO2 | LaHfO | 0.1 | 1.2 | 1.66 |
| SiO2 | SiN | 0 | 0.7 | 3.19 |
| SiO2 | Ta2O5 | 0 | 0 | 1.46 |

| low-k | high-k | EOT min (nm) | |
|---|---|---|---|
| | | ASSIST LEVEL DOES NOT EXIST | ASSIST LEVEL EXIST |
| $SiO_2$ | $HfO_2$ | 2.5 | 1.77 |
| $SiO_2$ | $Al_2O_3$ | 3.25 | 2.38 |
| $SiO_2$ | $La_2O_3$ | 2.1 | 1.48 |
| $SiO_2$ | HfSiO | 2.56 | 2.29 |
| $SiO_2$ | LaAlO | 1.72 | 1.26 |
| $SiO_2$ | HfAlO | 2.45 | 2.01 |
| $SiO_2$ | LaHfO | 2.06 | 1.66 |
| $SiO_2$ | SiN | 3.29 | 3.19 |
| $SiO_2$ | $Ta_2O_5$ | 1.46 | 1.46 |

NONVOLATILE SEMICONDUCTOR MEMORY APPARATUS

CROSS-REFERENCE TO RELATED APPLICATION

This application is based upon and claims the benefit of priority from prior Japanese Patent Application No. 2008-72148 filed on Mar. 19, 2008 in Japan, the entire contents of which are incorporated herein by reference.

BACKGROUND OF THE INVENTION

1. Field of the Invention

The present invention relates to a nonvolatile semiconductor memory apparatus.

2. Related Art

In recent years, electrically writable and erasable nonvolatile semiconductor memory apparatuses have been developed to provide higher performances. As the nonvolatile semiconductor memory apparatuses, there are EEPROMs (Electrically Erasable Programmable Read Only Memories). Two typical examples of EEPROMs are of a floating gate type (hereinafter also referred to as the FG type) and a MONOS (Metal Oxide Nitride Oxide Semiconductor) type.

The fundamental structure of a FG-type EEPROM is a stacked structure that includes, from the top layer, a control gate electrode, an interelectrode insulating film (also referred to as an interpoly insulating film), a floating gate electrode, a tunnel insulating film (a $SiO_2$ film), and a substrate in this order. When a positive high voltage is applied to the control gate electrode, electrons are injected (written) into the floating gate electrode from the substrate side. When a negative high voltage is applied to the control gate electrode, electrons are removed (erased) from the floating gate electrode into the substrate. Ideally, electrons that are once written remain in the floating gate electrode, unless an erasing operation is not performed. Thus, such a structure functions as a nonvolatile memory apparatus (see JP-A 8-125042 (KOKAI), for example).

A fundamental structure of the MONOS type is a stacked structure that includes, from the top layer, a control gate electrode, a block insulating film, a trapping film, a tunnel insulating film, and a substrate in this order. At the time of writing in this structure, electrons are injected by applying a high voltage, as in the case of a FG-type structure. However, the electros are stored in the trapping film. At the time of erasing, holes are injected so that the stored electrons and the injected holes cancel each other, which is an aspect not seen in the characteristics of a FG-type structure.

To realize a high-performance nonvolatile semiconductor apparatus, the write efficiency may be increased. To increase the write efficiency, a large number of electrons are injected over a short period of time by applying a high voltage to the tunnel insulating film, or the leakage current is increased. It is known that the leakage current obtained when an electric field $E_{ox}$ ($=V_{ox}/T_{ox}$) is applied to the tunnel insulating film stays substantially the same (without dependence on $T_{ox}$) while the voltage $V_{ox}$ applied to the tunnel insulating film is equal to or higher than 3.1 V–3.2 V (corresponding to the barrier height). Where $V_{ox}$ is a voltage applied to the tunnel insulating film and $T_{ox}$ is a film thickness of a tunnel insulating film. This is because the dominant mechanism of leakage current is based on the so-called Fowler-Nordheim (F-N) current $J_{fn}$, which is approximately expressed by the following equation (1):

$$J_{fn} = AE_{ox}^2 \exp\left(-\frac{B}{E_{ox}}\right) \quad (1)$$

Wherein, A and B represent the constants depending on the tunnel mass of electrons and the barrier height felt by electrons in the tunnel insulating film. As can be seen from this equation, the leakage current does not depend on the film thickness $T_{ox}$ but depends on the electric field $E_{ox}$. The general requirements for the tunnel insulating film to satisfy with respect to the leakage current are as follows. The leakage current needs to be $1.0 \times 10^{-16}$ A/cm$^2$ or lower in a low electric field of 3 MV/cm, and needs to be 0.1 A/cm$^2$ or higher in a high electric field of 13 MV/cm. Therefore, it is considered that the electric field $E_{ox}$ should be made higher so as to increase the write efficiency. However, a higher electric field $E_{ox}$ leads to a higher voltage, which is not desirable. If the voltage becomes higher, the reliability of the tunnel insulating film is adversely affected.

When a high voltage is applied to the tunnel insulating film, a phenomenon called "stress induced leakage current" (hereinafter also referred to as SILC) is caused, and as a result, the leakage current increases in a low electric field. It is considered that this phenomenon is caused by defects formed in the tunnel insulating film. When the voltage applied to the tunnel insulating film is high, the electrons tunneling through the bandgap of the tunnel insulating film move into the conduction band of the tunnel insulating film. When the electrons in the conduction band reach the anode side, the electrons retain a large energy. Impact ionization is then caused by the energy, and holes are generated. The holes generated here travel in the direction opposite to the traveling direction of the electrons, and cause defects in the tunnel insulating film. The defects trigger the SILC. Therefore, it is preferable that the leakage current is increased to achieve higher write efficiency, without an increase in the electric field $E_{ox}$. For example, it is ideal to obtain a leakage current of 0.1 A/cm$^2$ or higher when the electric field $E_{ox}$ is 13 MV/cm, or a leakage current of 0.1 A/cm$^2$ when the electric field $E_{ox}$ is lower than 13 MV/cm.

To achieve this, the inventors have suggested a technique of forming a trapping site (a site that captures and releases electrons) having a level that is shallow with respect to the conduction band of the tunnel insulating film (Japanese Patent Application No. 2006-332313 (JP-A 2008-147390 (KOKAI))). In the tunnel insulating film suggested in JP-A 2008-147390 (KOKAI), the tunneling current in a low electric field is restricted to substantially the same amount as that in an insulating film not having a trapping site, and electrons tunnel through the trapping site in a high electric field. Accordingly, the tunneling probability becomes higher than that in the case of an insulating film not having a trapping site, and the leakage current becomes higher. In this manner, this tunnel insulating film can achieve higher write efficiency without an increase in electric field $E_{ox}$, and is considered to be an ideal tunnel insulating film.

If the voltage can be made even lower, the SILC can be restricted, and the reliability of the tunnel insulating film can be further increased. To do so, the tunnel insulating film should be made thinner. However, if the tunnel insulating film becomes 5 nm or less, the D-T (Direct Tunneling) current becomes dominant even when the electric field $E_{ox}$ is a low electric field of 3 MV/cm, and the requirements of the tunnel insulating film are not satisfied. In view of this, the film thickness of the tunnel insulating film cannot be reduced to 5 nm or less.

In a low-electric field, a tunnel insulating film having a trapping level is basically the same as an insulating film not having a trapping site as to I-V characteristics. Therefore, the film thickness of a tunnel insulating film having a trapping level cannot be reduced to 5 nm or less. A tunnel insulating film having a trapping level has the advantage that, the leakage current can be increased in a high electric field, and accordingly, the write efficiency can be made higher than the write efficiency achieved with an ordinary tunnel insulating film. However, such a tunnel insulating film having a trapping level is disadvantageous in that its film thickness cannot be made 5 nm or less, since the charge retention properties as a nonvolatile semiconductor memory apparatus are degraded if the leakage current becomes higher in a low electric field.

Meanwhile, as a technique for reducing leakage current, the use of a high-dielectric film is known (see Japanese Patent No. 3,357,861, for example). According to Japanese Patent No. 3,357,861, the leakage current in a low electric field cannot be reduced merely by the use of a single-layer high-dielectric film, and the leakage current in a high electric field cannot be increased. However, if a stacked structure includes a high-dielectric film and a low-dielectric film at an appropriate ratio, the leakage current can be reduced in a low electric field, and can be increased in a high electric field. The equivalent oxide thickness (EOT) of the tunnel insulating film having such a stacked structure can be reduced, and the voltage can be lowered accordingly. Generally there is a tendency that the higher a dielectric constant, the lower the barrier height. This tendency leads to the problem of an increase in current due to the thermal excitation of electrons; however, this problem can be solved by the stacked structure in Japanese Patent No. 3,357,861. Thus, the leakage current can be reduced by the use of a stacked structure including a low-dielectric film that tends to have a large barrier height.

However, if the tunnel insulating film is required to have exactly the same properties as an oxide film, it is difficult to satisfy the requirements merely with the use of the insulating film of the stacked structure disclosed in Japanese Patent No. 3,357,861. With this structure, a smaller EOT than 5 nm can be realized, and accordingly, a high leakage current of 0.1 A/cm$^2$ required for writing can be obtained at a low voltage $V_{ins}$. However, in terms of the equivalent oxide field $E_{ox}$ defined as $V_{ins}$/EOT, it is necessary to induce a higher electric field than 13 MV/cm. To sum up, a stacked structure of a low-dielectric film and a high-dielectric film has the advantage that its thickness can be reduced while the leakage current in a low electric field is restricted to a sufficiently small amount, but is disadvantageous in that a high electric field $E_{ox}$ is necessary to obtain a high current required for writing.

As described above, in accordance with the related art, the EOT of the tunnel insulating film cannot be reduced to 5 nm or less, while the leakage current requirements for a nonvolatile semiconductor memory apparatus are satisfied. Since a reduction in film thickness cannot be achieved, it is necessary to apply a high voltage at the time of data writing or erasing. As a result, defects are formed in the insulating film, and the SILC is caused.

SUMMARY OF THE INVENTION

The present invention has been made in view of these circumstances, and an object thereof is to provide a nonvolatile semiconductor memory apparatus having a tunnel insulating film that can restrict the leakage current in a low electric field even when the EOT is made smaller, and can increase the leakage current in a high electric field.

A nonvolatile semiconductor memory apparatus according to a first aspect of the present invention includes: a memory element including: a semiconductor substrate; a source region and a drain region formed at a distance from each other in the semiconductor substrate; a first insulating film formed on a portion of the semiconductor substrate located between the source region and the drain region, having sites that perform electron trapping and releasing (detrapping) and are formed by adding an element different from a base material, and including insulating layers having different dielectric constants, the sites having a higher level than a Fermi level of a material forming the semiconductor substrate; a charge storage film formed on the first insulating film; a second insulating film formed on the charge storage film; and a control gate electrode formed on the second insulating film.

A nonvolatile semiconductor memory apparatus according to a second aspect of the present invention includes: a semiconductor substrate; a source region and a drain region formed at a distance from each other in the semiconductor substrate; a first insulating film formed on a portion of the semiconductor substrate located between the source region and the drain region, and having sites that perform electron trapping and releasing and are formed by adding an element different from a base material, the sites having a higher level than a Fermi level of a material forming the semiconductor substrate, the first insulating film being a single-layer; a charge storage film formed on the first insulating film; a second insulating film formed on the charge storage film; and a control gate electrode formed on the second insulating film.

BRIEF DESCRIPTION OF THE DRAWINGS

FIG. 22 shows the dielectric constants and the band offsets $\Delta Ec$ of various insulating films;

DETAILED DESCRIPTION OF THE INVENTION

Figure 1:
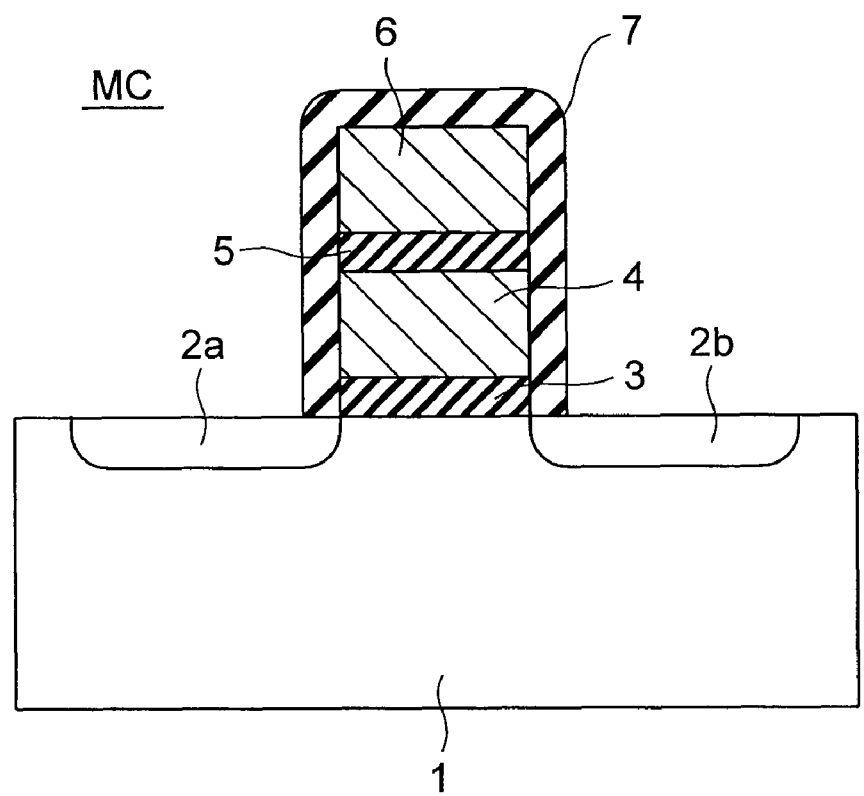
FIG. 1 is a cross-sectional view of a memory cell of a nonvolatile semiconductor memory apparatus according to a first embodiment.

The reasons that the present invention has been made are first described, prior to the description of embodiments of the present invention.

As described earlier, in a tunnel insulating film that includes a $SiO_2$ film having an assist level (a site that traps and releases electrons), high leakage current is caused in a high electric field, and the write efficiency is increased accordingly. However, the leakage current observed in a low electric field is the same as the leakage current observed in a $SiO_2$ film not having an assist level. Therefore, there has been the problem that the $SiO_2$ film cannot be made smaller than the minimum film thickness of 5 nm, which satisfies the requirements. When a stacked structure of a high-dielectric film and a low-dielectric film is used, the leakage current in a low electric field can be reduced, and the desired charge retention properties can be achieved. With this arrangement, however, there has been the problem that the tunnel insulating film needs to have a high electric field $E_{ox}$ at the time of writing.

The inventors made intensive studies, and discovered optimum structures for tunnel insulating films that can solve the above two problems. Those structures will be described below as embodiments of the present invention. The following is the description of the embodiments of the present invention, with reference to the accompanying drawings. Like components throughout the embodiments are denoted by like reference numerals, and explanation of them is omitted. The drawings include schematic views designed to facilitate explanation and understanding of the present invention. Since the shapes, sizes, and ratios might differ from those in actual devices, they may be changed on the basis of the following description and known techniques.

First Embodiment

A nonvolatile semiconductor memory apparatus in accordance with a first embodiment of the present invention has NAND cell units arranged in a matrix form, for example. Each of the NAND cell units includes a NAND cell that is formed with memory cells connected in series. As shown in FIG. 1, each memory cell MC has n-type source and drain regions 2a and 2b that are formed at a distance from each other in a p-type Si substrate 1 and contain n-type impurities (such as P and As). A tunnel insulating film 3 is formed on the portion of the Si substrate 1 located between the source region 2a and the drain region 2b. A charge storage film 4 is formed on the tunnel insulating film 3, and an interelectrode insulating film 5 is formed on the charge storage film 4. A control gate electrode 6 is formed on the interelectrode insulating film 5. The gate of the stacked structure formed with the control gate electrode 6, the interelectrode insulating film 5, the charge storage film 4, and the tunnel insulating film 3 is covered with a silicon oxide film 7. Here, as the charge storage film 4, a floating gate electrode may be used to form a FG-type nonvolatile semiconductor memory apparatus, or a trap insulating film may be used to form a MONOS-type nonvolatile semiconductor memory apparatus.

Figure 2:
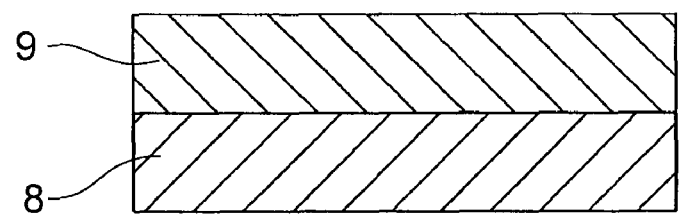
FIG. 2 is a cross-sectional view of the tunnel insulating film according to the first embodiment.

As shown in FIG. 2, the tunnel insulating film 3 has a stacked structure formed with an insulating layer 8 made of a low dielectric constant (low-k) material that does not have an electron trapping and releasing level (an assist level), and an insulating layer 9 made of a high dielectric constant (high-k) material that has the assist level. The tunnel insulating film of this embodiment has a different structure from an ordinary tunnel insulating film. More specifically, a tunnel insulating film invented and filed as Japanese Patent Application No. 2006-332313 (JP-A 2008-147390 (KOKAI)) by the inventors is a $SiO_2$ film having the assist level, but this is a film partially having the assist level in the same film. On the other hand, the stacked structure in this embodiment is a stacked structure of insulating layers having different dielectric constants. Also, while the tunnel insulating film of a stacked structure of insulating layers having different dielectric constants disclosed in Japanese Patent No. 3,357,861 does not have the assist level, this embodiment has the assist level formed in the stacked structure of the tunnel insulating film.

Figure 3:
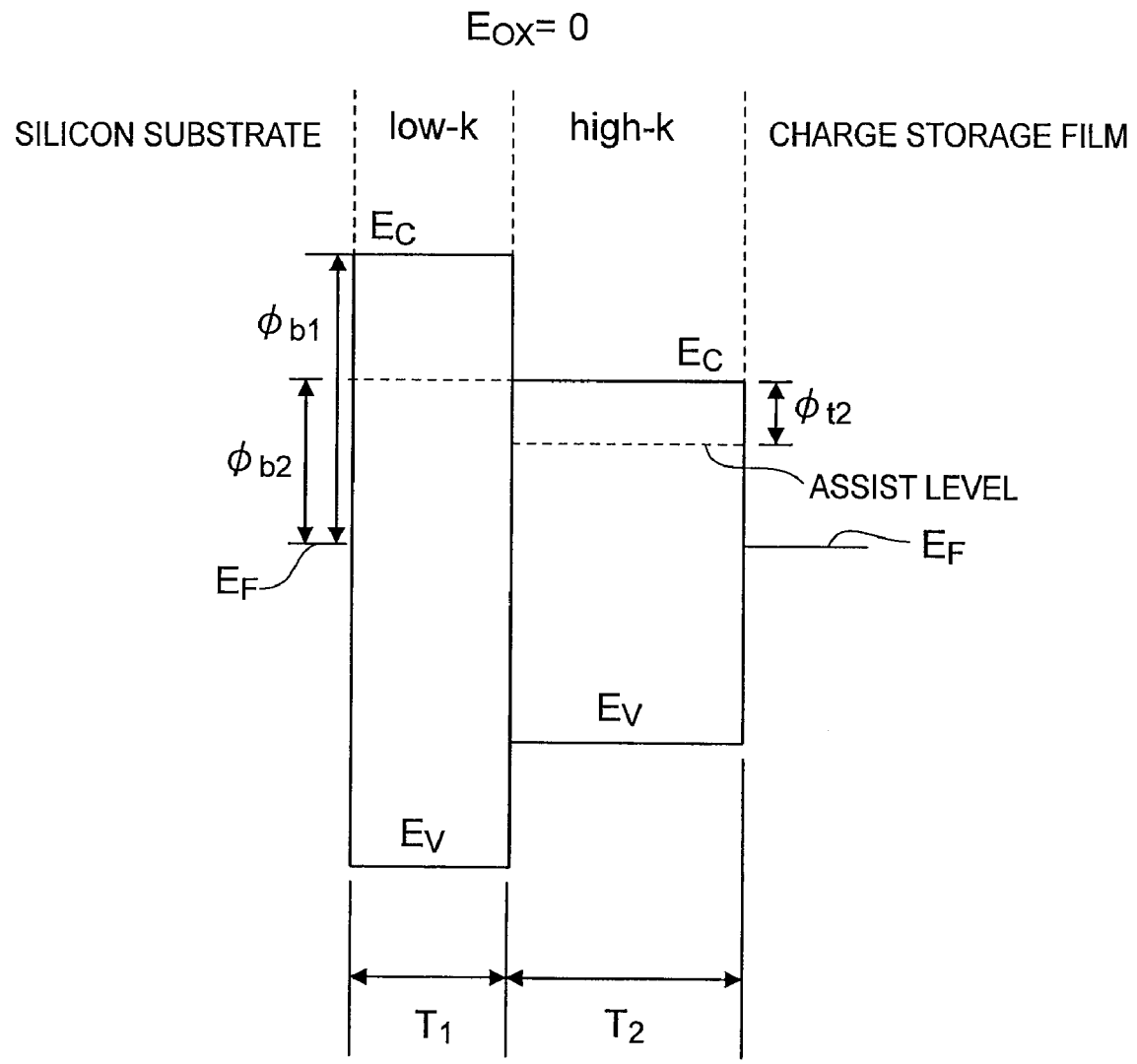
FIG. 3 is an energy band diagram observed in a case where no electric field is applied in the tunnel insulating film according to the first embodiment.

FIG. 3 schematically shows the energy band observed in a case where an electric field is not applied in the tunnel insulating film of the stacked structure shown in FIG. 2 ($E_{ox}=0$). The far left portion in FIG. 3 indicates the Fermi level $E_F$ of the semiconductor substrate, the next one indicates the conduction band minimum (CBM) $E_c$ and the valence band maximum (VBM) $E_v$ of the insulating layer made of a low-k material (hereinafter also referred to as the low-k layer), the next one indicates the $E_c$, the assist level, and the $E_v$ of the insulating layer made of a high-k material (hereinafter also referred to as the high-k layer), and the last one indicates the Fermi level $E_F$ of the charge storage film 5. Here, the Fermi level $E_F$ of the semiconductor substrate is defined as the Fermi level of the surface of the semiconductor substrate in a strong-inverted state (a write state), which is higher than the $E_c$ of the semiconductor substrate by approximately 0.1 eV. The physical thicknesses of the low-k layer and the high-k layer are represented by $T_1$ and $T_2$, respectively. The differences, or barrier heights, between the Fermi level $E_F$ of the semiconductor substrate and the $E_c$ of the low-k layer and the high-k layer are represented by $\phi_{b1}$ and $\phi_{b2}$, respectively. Here, the assist level is defined at the depth $\phi_{t2}$ from the $E_c$ of the high-k layer. This is at the level of $\phi_{b1}-\phi_{t2}$, when seen from the Fermi level $E_F$ of the semiconductor substrate. The $E_c$ and $E_v$ of the semiconductor substrate and the charge storage film are omitted in FIG. 3. Although the semiconductor substrate and the charge storage film have the same Fermi level $E_F$ when $E_{ox}$ is 0 in FIG. 3, the Fermi levels of the semiconductor substrate and the charge storage film are not necessarily the same.

The tunnel current J flowing in the tunnel insulating film having this stacked structure is expressed as:

$$J = \frac{4\pi me}{h^3} \int_0^\infty \zeta(E_x) T^*(E_x) dE_x, \quad (2)$$

$$\zeta(E_x) = \int_0^\infty \frac{dE_r}{1 + \exp[(E_r + E_x - E_F)/(k_B T)]}, \quad (3)$$

where e represents the elementary charge, m represents the mass of electrons in a vacuum, h represents the Planck's constant, $k_B$ represents the Boltzmann's constant, T represents the temperature, E represents the energy held by electrons, $E_x (=E-E_r)$ represents the energy in the electron tunnel direction x, $E_F$ represents the Fermi level of the tunnel insulating film, and $T^*(E_x)$ represents the effective tunneling probability of the electrons flowing in the tunnel insulating film. In this embodiment, a calculation is performed according to the above equations, with the stacked structure of different insulating films and the assist level being taken into consideration.

Figures 4A, 4B:
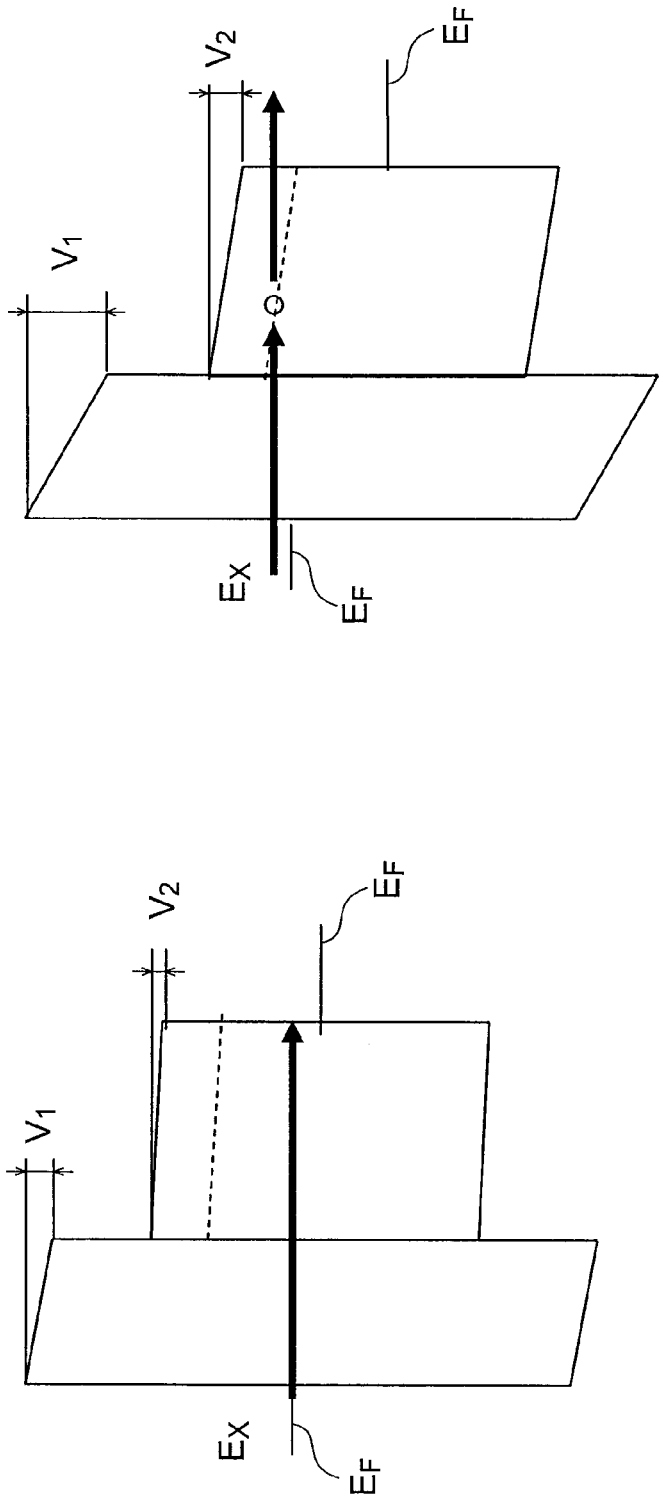
FIGS. 4A and 4B are energy band diagrams in a case where an electric field is applied in the tunnel insulating film in the first embodiment.

FIG. 4A schematically shows the energy band observed in a case where a low electric field $E_{ox}$ is applied in the tunnel insulating film of the structure shown in FIG. 2. Here, the dielectric constants of the low-k layer and the high-k layer are represented by $\in_1$ and $\in_2$, respectively, and the voltages applied to the low-k layer and the high-k layer are represented by $V_1$ and $V_2$, respectively. In an example case where the electric flux density is assumed to be constant in a stacked structure formed with insulating films having different dielectric constants, different actual electric fields are applied in the respective insulating layers. Where the actual electric fields applied in the low-k layer and the high-k layer are represented by $E_1$ and $E_2$, respectively, the following equation is satisfied:

$$\epsilon_{ox} E_{ox} = \epsilon_1 E_1 = \epsilon_2 E_2 \quad (4)$$

Here, $\epsilon_{ox}$ (=3.9) is the dielectric constant of $SiO_2$. The actual electric fields are defined as $E_1 = V_1/T_1$ and $E_2 = V_2/T_2$, which satisfy the following equation:

$$\epsilon_1 \times V_1/T_1 = \epsilon_2 \times V_2/T_2 \quad (5)$$

As can be seen from the equation (4), the actual electric field in the low-k layer is stronger than that in the high-k layer. This is because $E_1$ is larger than $E_2$, since $\epsilon_1$ is smaller than $\epsilon_2$. Accordingly, in a case where the physical layer thickness $T_1$ of the low-k layer is relatively larger than the physical layer thickness $T_2$ of the high-k layer, the voltage $V_1$ applied to the low-k layer is higher than the voltage $V_2$ applied to the high-k layer. This is because, since $\epsilon_1$ is smaller than $\epsilon_2$, ($\epsilon_1/T_1$) is smaller than ($\epsilon_2/T_2$) when $T_1$ is larger than $T_2$, for example. Thus, a relationship V1>V2 is derived from the relationship ($\epsilon_1/T_1$)<($\epsilon_2/T_2$) and Equation (5).

Since the voltage $V_2$ is applied to the high-k layer, the assist level has the width of $V_2$, when seen from the energy level. In this situation, however, the Fermi level $E_F$ of the semiconductor substrate is lower than the assist level. Therefore, the assist level does not affect leakage current. In other words, with a low electric field, the same leakage current as the leakage current observed in the insulating films of a stacked structure not having the assist level is observed. At this point, the effective tunneling probability $T^*(E_x)$ is expressed as follows:

$$T^*(E_x) = T_{FN}(\phi_{b1}^*, m_1^*, E_1^*) T_{FN}^{-1}(\phi_{b1}^* - V_1, m_1^*, E_1) \\ T_{FN}^{-1}(\phi_{b2}^*, m_2, E_2) T_{FN}^{-1}(\phi_{b2}^* - V_2, m_2^*, E_2) \quad (6)$$

Here, $\phi_{b1}^* = \phi_{b1} + E_F - E_x$, $\phi_{b2}^* = \phi_b + E_F - E_x - V_1$, $m_1^*$, and $m_2^*$ are effective masses of the tunneling electrons in the low-k layer and the high-k layer, respectively. The effective mass is 0.5 m, which is set as a typical value. Here, m represents the mass of electrons in a vacuum. $T_{FN}$ represents the Fowler-Nordheim (F-N) tunneling probability, and, in the case of $0 \leq E_x < \phi_b^*$, $T_{FN}$ is defined by the following equation (7):

$$T_{FN}(\phi_b^*, m^*, E) = \exp\left[-\frac{8\pi(2m^*)^{1/2}}{3heE} \phi_b^{*3/2}\right] \quad (7)$$

In the case of $\phi_b^* \leq E_x$, $T_{FN}$ is defined by the following equation (8):

$$T_{FN}(\phi_b^*, m^*, E) = 1 \quad (8)$$

Figure 5B:
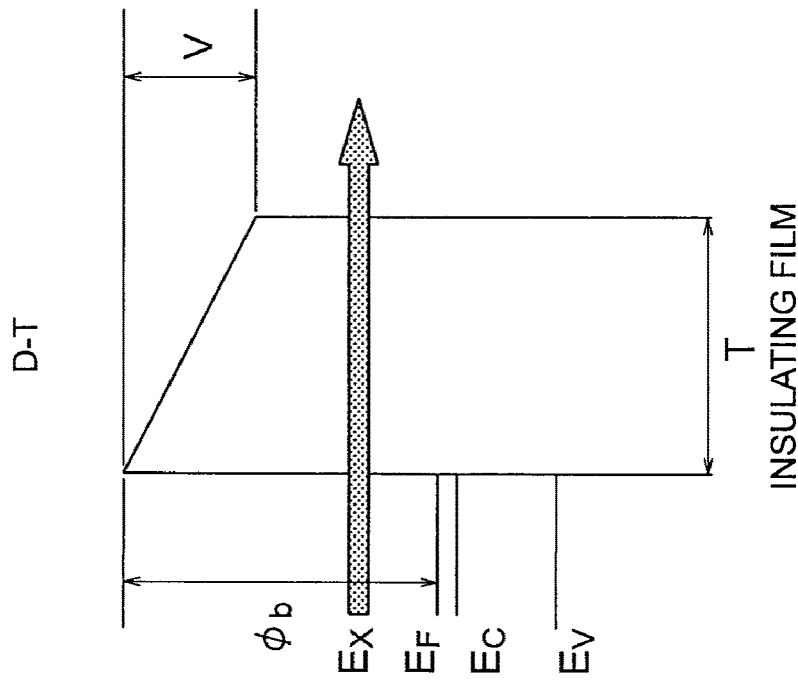
FIGS. 5A and 5B are energy band diagrams illustrating the difference between F-N tunneling and D-T.
Figure 5A:
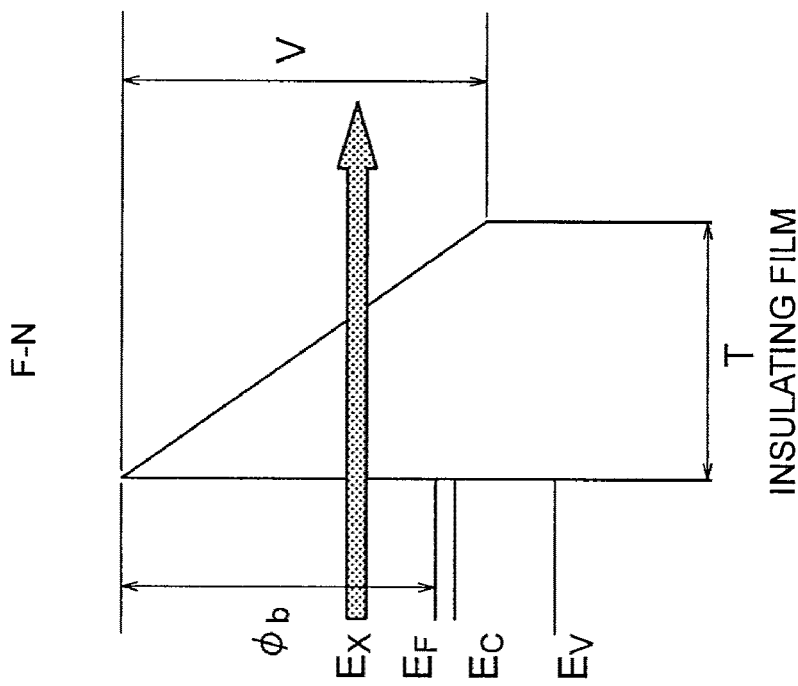

Here, m* represents the effective mass of electrons tunneling in the tunnel insulating film, $\phi_b^*$ represents the effective barrier height of the tunnel insulating film, $E_F$ represents the Fermi level, $E_x$ represents the energy of electrons in the tunneling direction, e represents the elementary charge, h represents the Planck's constant, and $E_1$ and $E_2$ represent the actual electric fields in the low-k layer and the high-k layer, respectively. "F-N tunneling" means electrons tunneling through the tapered conduction band of an insulating film, as shown in FIG. 5A. "D-T (Direct Tunneling)" means electrons not tunneling through the conduction band of an insulating film, but reaching directly to the electrode on the other side.

FIG. 4B is an energy band diagram obtained in a case where a high electric field $E_{ox}$ is applied in the tunnel insulating film of the stacked structure shown in FIG. 2. Since the electric field $E_{ox}$ is high, the voltage to be applied to each film is also high. More specifically, a high voltage $V_1$ is applied to the low-k layer, and a voltage $V_2$ lower than the voltage $V_1$ is applied to the high-k layer. As can be seen from FIG. 4B, when the electric field $E_{ox}$ is higher than a certain value, a high voltage is applied to the low-k layer. As a result, the $E_c$ of the high-k layer becomes lower by $V_1$, and the assist level becomes lower by $V_1$ accordingly. The Fermi level $E_F$ of the semiconductor substrate then becomes equal to the assist level. Electrons then start tunneling via the assist level. With the continuity of the current density being taken into consideration, the tunneling probability P of electrons via the assist level in a steady state satisfies the following equation:

$$P = p_1 \times (1-f) = p_2 \times f \quad (9)$$

where $p_1$ represents the probability that electrons tunnel from the semiconductor substrate to the assist level, $p_2$ represents the probability that electrons tunnel from the assist level to the charge storage film, f represents the probability that the assist level is occupied (the probability that the assist level is unoccupied is represented by 1−f, accordingly). In this case, f is equal to $p_1/(p_1-p_2)$. Accordingly, the following equation is satisfied:

$$P = 1/(1/p_1 + 1/p_2) \quad (10)$$

The probability that electrons do not tunnel through the assist level is equal to the product of $p_1$ and $p_2$, or $p_1 \times p_2$, which is a smaller value than the value obtained according to the equation (10). Therefore, if electrons tunnel through the assist level, leakage current becomes higher than the leakage current observed in a case where electrons do not tunnel through the assist level.

In a case where only the high-k layer has the assist level in a tunnel insulating film having a stacked structure formed with a low-k layer and a high-k layer, tunneling probabilities are classified according to the positional relationship between the energy level $E_x$ of the tunneling electrons and $\phi_{T2}$, and can be categorized as follows:

$$P^* = \begin{cases} P_L P_H & V_2 < \phi_{T2}^* \\ 1/[1/(P_L P_{H1}) + 1/P_{H2}] & 0 < \phi_{T2}^* \leq V_2 \\ P_L P_H & \phi_{T2}^* \leq 0 \end{cases}$$

Figure 55A:
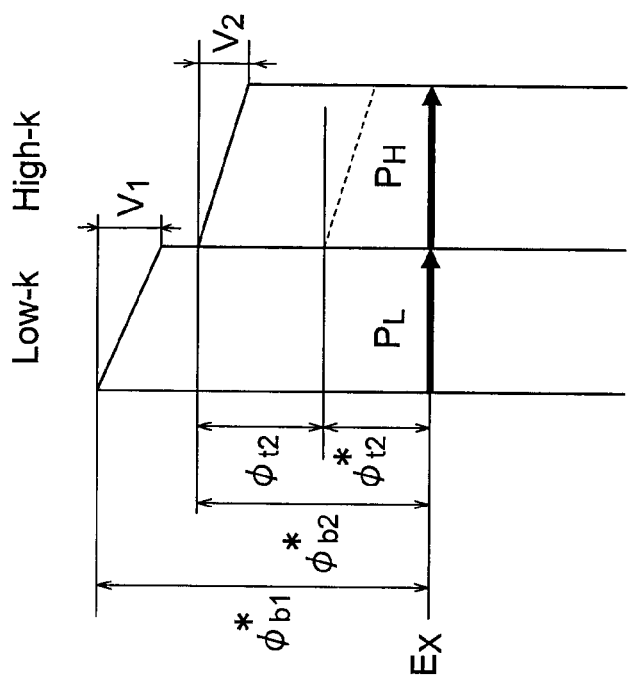
FIGS. 55A to 55C illustrate the tunneling probabilities in the tunnel insulating film formed by stacking a low-k layer and a high-k layer.
Figure 55C:
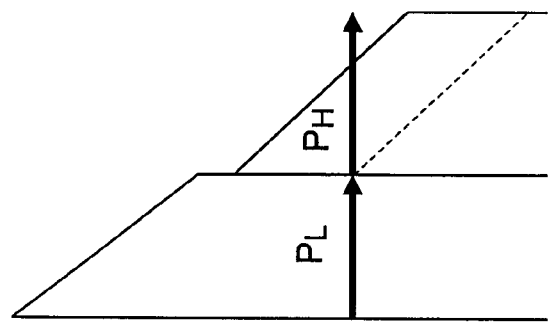
Figure 55B:
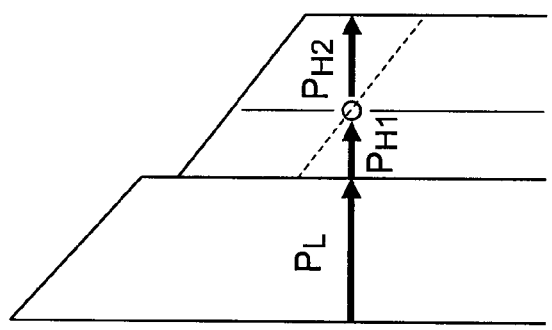

In cases where electrons tunnel without going through the assist level (FIGS. 55A and 55C), the tunneling probability is equal to the product of the tunneling probabilities of the high-k layer and the low-k layer, and can be expressed by the same equation as the equation (6), which is satisfied where there is not an assist level. In a case where electrons tunnel through the assist level (FIG. 55B), the tunneling probabilities are expressed as follows:

$$P_L = T_{FN}(\phi_{b1}^*, m_1^*, E_1) T_{FN}^{-1}(\phi_{b1}^* - V_1, m_1^*, E_1)$$

$$P_{H1} = T_{FN}(\phi_{b2}^*, m_2^*, E_2) T_{FN}^{-1}(\phi_{T2}^*, m_2^*, E_2)$$

$$P_{H2} = T_{FN}(\phi_{T2}^*, m_2^*, E_2) T_{FN}^{-1}(\phi_{b2}^* - V_2, m_2^*, E_2)$$

Here, $\phi_{T2}^*$ is defined as $\phi_{T2} - \phi_{b2}^*$.

As described above, with a low electric field, the assist level does not affect leakage current, and the physical film thickness of the tunnel insulating film can be made larger with the use of the high-k layer. Accordingly, the leakage current can be restricted to a small level. On the other hand, the tunneling probability that electrons tunnel through the assist level in a high electric field becomes higher. Thus, more leakage current can be allowed than in a case where the assist level does not exist. The amount of assist level is preferably such an amount as to trap all electrons injected from the semiconductor substrate, and increase the leakage current in a high electric field, if the amount of the assist level is $1.0 \times 10^{16}$ cm$^{-3}$ or more. As described later, a Ge assist level is formed when added Ge is coupled to oxygen defects. The amount of oxygen defects existing in HfO$_2$ is at least $10^{-4}$ atomic %, which is $10^{-6}$ of the HfO$_2$ density. The HfO$_2$ density is on the order of $10^{22}$ cm$^{-3}$, and therefore, the amount of oxygen defects existing in HfO$_2$ is at least on the order of $10^{16}$ cm$^{-3}$. Accordingly, the amount of assist level is $1.0 \times 10^{16}$ cm$^{-3}$ or more. This value is considered to be a value that does not depend on the material of the tunnel insulating film. Meanwhile, the trap insulating film of a MONOS-type nonvolatile semiconductor memory apparatus has trapping sites of approximately $10^{13}$ cm$^{-2}$, which is considered to be more than $10^{19}$ cm$^{-3}$ if the density is uniform. Thus, it is preferable that the upper limit of the assist level amount is $1.0 \times 10^{19}$ cm$^{-3}$.

Figure 6B:
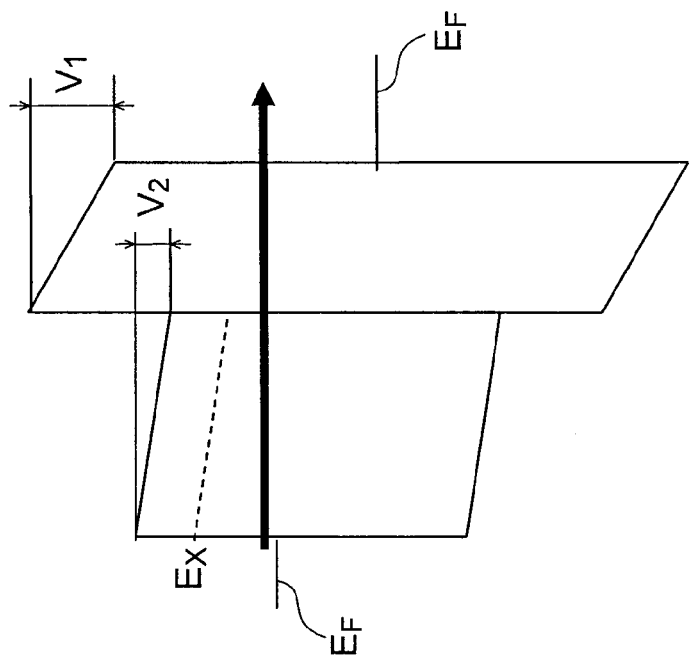
FIGS. 6A and 6B are energy band diagrams observed in a case where an electric field is applied in the tunnel insulating film in a charge retaining state.
Figure 6A:
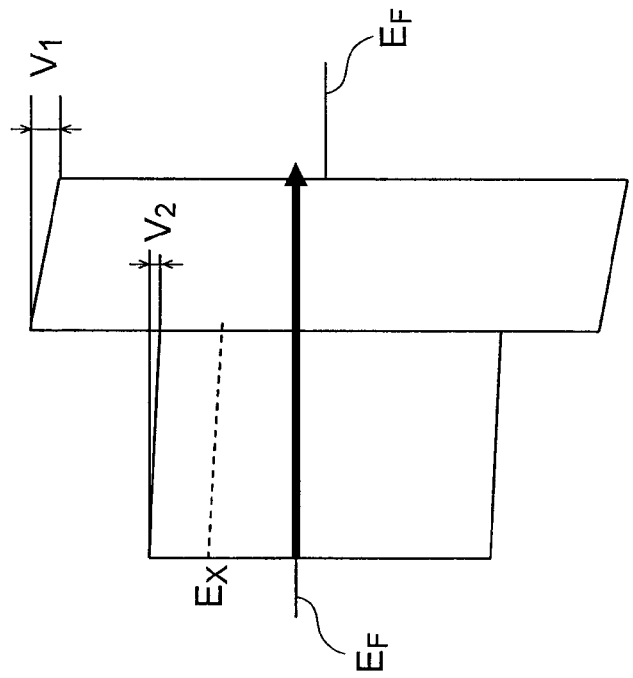

In the above description, writing in the charge storage film is explained. However, while charges are retained, the electric field to be applied in the tunnel insulating film is in the direction opposite to the electric field applied in the case of writing. FIGS. 6A and 6B are energy band diagrams obtained in such cases. FIG. 6A shows the case of a low electric field. In this case, the assist level is higher than the Fermi level $E_F$ of the charge storage film, as in the case shown in FIG. 4A. Accordingly, in a low electric field, the leakage current is restricted to as low as the leakage current in an insulating film not having the assist level.

FIG. 6B shows the case of a high electric field. In this case, the leakage current does not become as high as the leakage current in the case of FIG. 4B. This is because a high voltage is applied to the low-k layer while a low voltage is applied to the high-k layer. The $E_c$ of the high-k layer becomes lower in the case shown in FIG. 4B, but does not vary in the case shown in FIG. 6B. Accordingly, the barrier height for tunneling electrons does not decrease, though the assist level has the width of the voltage $V_1$ applied to the high-k layer. Thus, it is possible to reduce the leakage current also in a high electric field.

Figure 7:
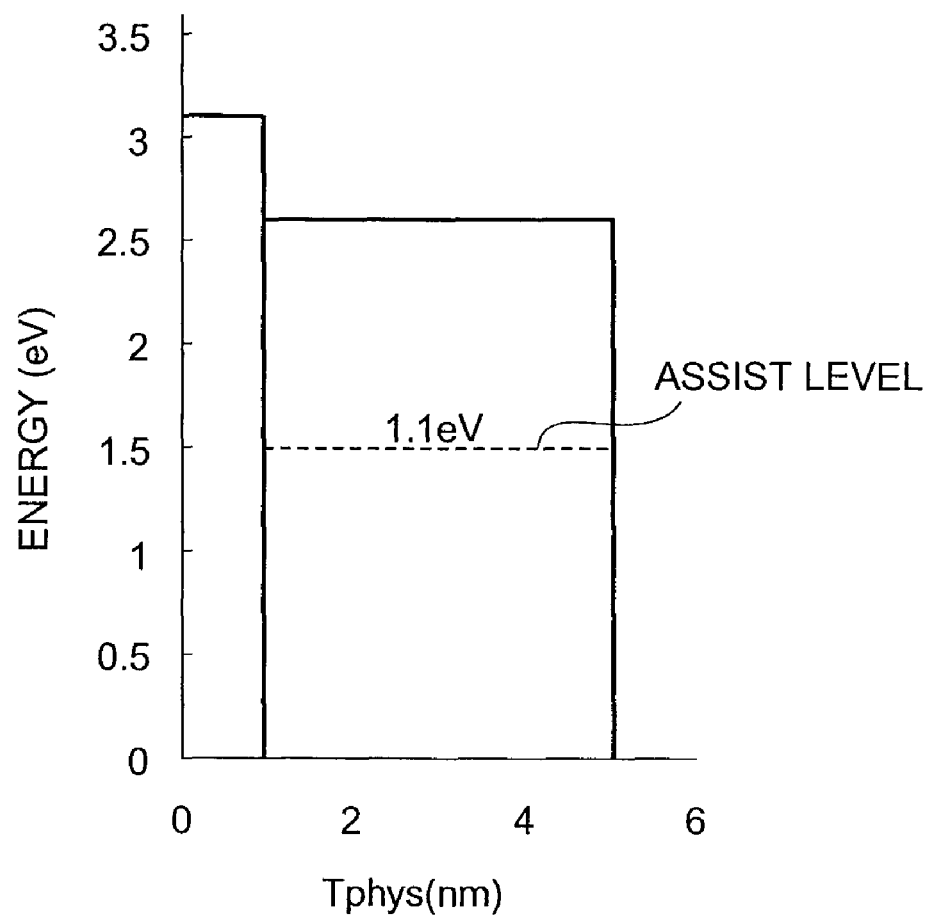
FIG. 7 is an energy band diagram of the tunnel insulating film according to the first embodiment.

The tunnel insulating film of the stacked structure of this embodiment may be a stacked insulating film that includes a SiO$_2$ layer as the low-k layer and a Ge-added HfO$_2$ layer as the high-k layer having the assist level. The dielectric constant $\in_1$ of the SiO$_2$ is 3.9, the dielectric constant $\in_2$ of the Ge-added HfO$_2$ is 18, the barrier height $\phi_{b1}$ of the low-k layer with respect to the Fermi level $E_F$ of the silicon substrate is 3.1 eV, and the barrier height $\phi_{b2}$ of the high-k layer is 2.6 eV (as disclosed by M. Koike, T. Ino, Y. Kamimuta, M. Koyama, Y. Kamata, M. Suzuki, Y. Mitani, A. Nishiyama, and Y. Tsunashima, in Tech. Dig. Int. Electron Devices Meet., 107 (2003), for example). FIG. 7 is an energy band diagram obtained in a case where $E_{ox}$ is 0. Here, the tunnel insulating film is a very thin film of 1.8 nm in EOT ($T_{eq, all}$). The EOT ($T_{eq1}$) of the low-k layer is 0.94 nm. Since "EOT" is the film thickness equivalent to the film thickness in the case of a SiO$_2$ film, the physical film thickness $T_1$ of a SiO$_2$ layer is also 0.94 nm. The EOT ($T_{eq2}$) of the high-k layer is 0.86 nm, and the physical film thickness $T_2$ is 4.0 nm ($=0.86 \times 18/3.9$). The assist level is, for example, formed by adding Ge to a HfO$_2$ layer. The assist level $\phi_{t2}$ is 1.1 eV. In FIG. 7, the abscissa axis indicates the physical film thickness $T_{phys}$, and the ordinate axis indicates the energy.

Figure 8B:
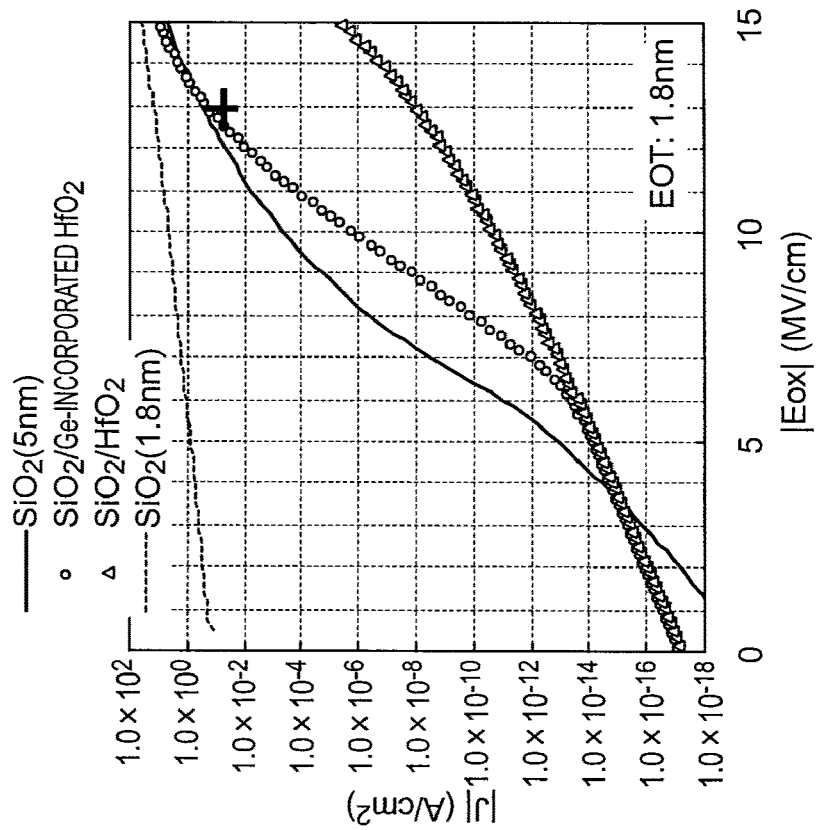
FIGS. 8A and 8B show the dependence of the leakage current flowing in the tunnel insulating film on the electric field respectively at the time of charge retention and at the time of writing.
Figure 8A:
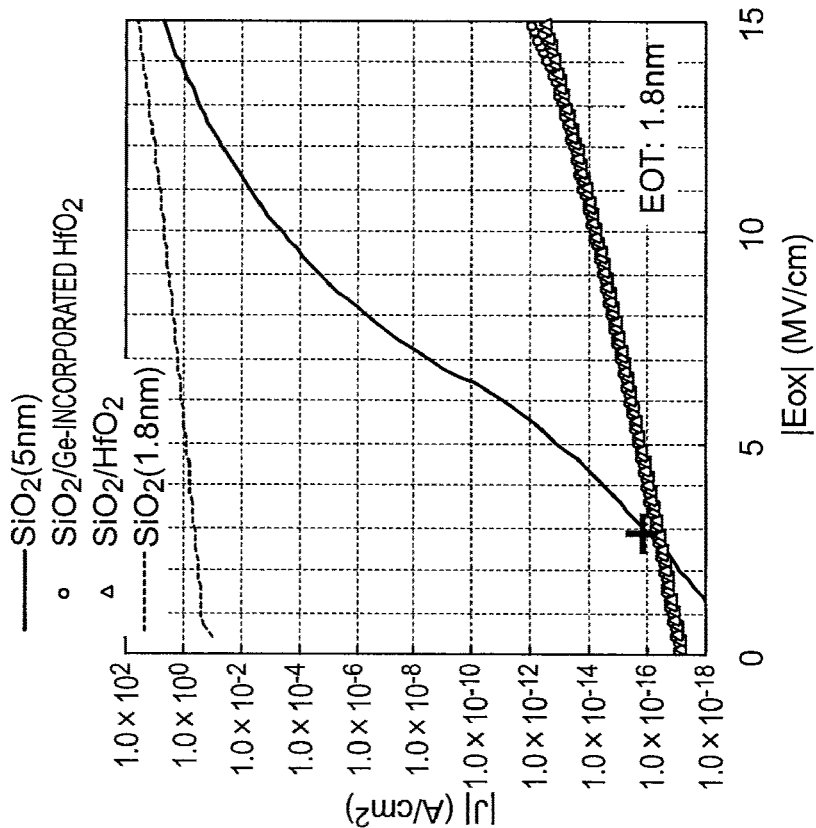

FIGS. 8A and 8B show the relationship between the electric field $E_{ox}$ applied in the tunnel insulating film of the two-layer structure of 1.8 in EOT and the leakage current flowing in the tunnel insulating film. For comparison, FIGS. 8A and 8B also show a case of a stacked insulating film not having the assist level (a stacked insulating film having no Ge added thereto), a case of a single-layer insulating film having a 5 nm thick SiO$_2$ layer, and a case of a single-layer insulating film having a 1.8 nm thick SiO$_2$ layer. Since the leakage current caused in the case where the HfO$_2$ layer having a single-layer structure of 1.8 nm in EOT is extremely low, it does not fall into the range shown in FIGS. 8A and 8B, and therefore, is not shown in FIGS. 8A and 8B. FIG. 8A shows a case of charge retention, and FIG. 8B shows a case of writing. When writing is performed, the electric field $E_{ox}$ is smaller than 0, and the leakage current J is smaller than 0. Therefore, the absolute values of the electric field $E_{ox}$ and the current J are shown in FIGS. 8A and 8B. In all the later described embodiments, the values of the electric field $E_{ox}$ and the current J in the case of writing are absolute values.

When charges are stored in the charge storage film, a positive electric field $E_{ox}$ is applied in the tunnel insulating film. In general, to achieve desired charge retention properties, the leakage current needs to be lower than $1.0 \times 10^{-16}$ A/cm$^2$, when the electric field $E_{ox}$ is 3 MV/cm. In this embodiment, the leakage current required for the tunnel insulating film to maintain is defined as above. As can be seen from FIG. 8A, this requirement can be satisfied in the case of the single-layer insulating film having a 5 nm SiO$_2$ layer (as indicated by the cross-like symbol in FIG. 8A). In the case of the single-layer insulating film having a 1.8 nm SiO$_2$ layer, a high leakage current of approximately $1.0 \times 10^{-3}$ A/cm$^2$ flows when the electric field $E_{ox}$ is 3 MV/cm. Therefore, a very thin SiO$_2$ layer much thinner than 5 nm is not to be used as the tunnel insulating film. In the case of the insulating film having the stacked structure of this embodiment, on the other hand, though the EOT is as small as 1.8 nm, the leakage current is lower than $1.0 \times 10^{-16}$ cm$^{-2}$ with a low electric field of 3 MV/cm, regardless of the existence of the assist level (the existence of added Ge). The number of digits in the value of the leakage current in this embodiment is smaller, by 13, than the number of digits in the value of the leakage current observed in a case of a single-layer SiO$_2$ layer having the same layer thickness. As described above, with the stacked structure including the high-k layer, the physical film thickness can be made larger than a SiO$_2$ layer having the same EOT. Accordingly, leakage current can be made lower. Thus, an insulating film of a stacked structure can satisfy the required charge retention properties.

At the time of writing, a high negative electric field $E_{ox}$ is applied in the tunnel insulating film. In general, to achieve desired write characteristics, the leakage current needs to be equal to or higher than 0.1 A/cm$^2$, when the electric field $E_{ox}$ is 13 MV/cm. As can be seen from FIG. 8B, in the case of the 5 nm SiO$_2$ layer, the above requirements can be satisfied (as indicated by the cross-like symbol in FIG. 8B). Where the SiO$_2$ layer is 1.8 nm, more leakage current can flow, but the leakage current in a low electric field is too high as shown in FIG. 8A. Therefore, the desired charge retention properties and the desired write characteristics cannot be achieved at the same time. Even in the case of the insulating film of the stacked structure, the leakage current in the film without the assist level (the film having no Ge added thereto) is $1.0 \times 10^{-8}$ A/cm$^2$ when the electric field $E_{ox}$ is 13 MV/cm, and the number of digits in the value of the leakage current is only smaller, by less than 7, than the desired value of 0.1 A/cm$^2$. Since the value of $E_c$ in the high-k layer is lower in the case where electrons flow from the low-k layer to the high-k layer as described above, this structure is effective as long as a certain film thickness is maintained. However, as the EOT ($T_{eq,\,all}$) of the tunnel insulating film is made smaller, the $V_{ins}$ applied to the tunnel insulating film is designed to be made lower, even if the electric field $E_{ox}$ is the same. Although the voltage is made lower, the barrier height is determined by the properties of the films, and therefore, cannot be made smaller. In view of this, the leakage current cannot be made sufficiently higher in an electric field of 13 MV/cm in the tunnel insulating film of the stacked structure without the assist level. In the tunnel insulating film of the stacked structure having the assist level, on the other hand, the leakage current can be made as high as 0.1 A/cm² when the electric field $E_{ox}$ is 3 MV/cm. This is because electrons flow through the assist level when the electric field $E_{ox}$ is 13 MV/cm.

Figure 9B:
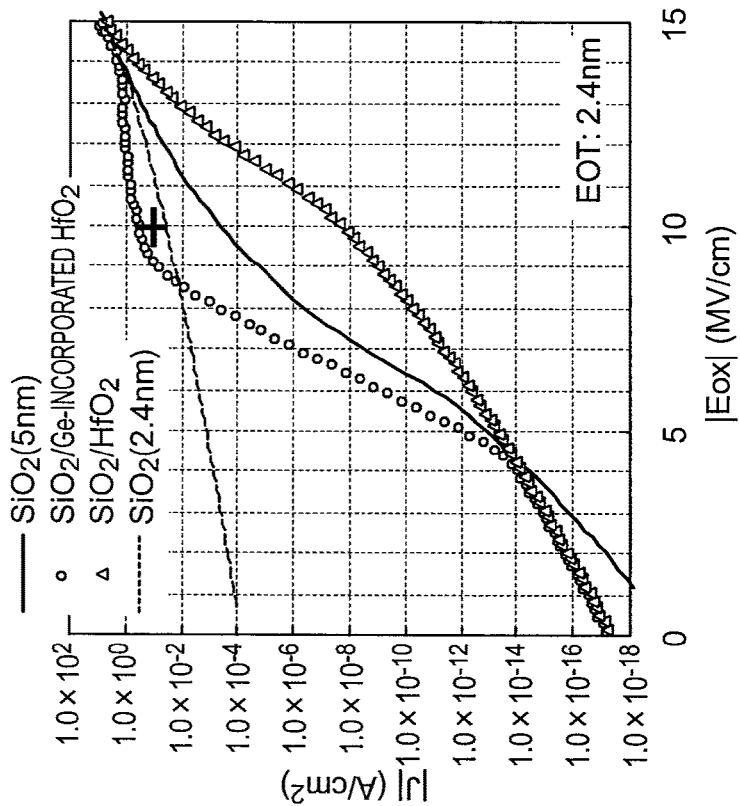
FIGS. 9A and 9B show the dependence of the leakage current flowing in the tunnel insulating film on the electric field at the time of charge retention and at the time of writing.
Figure 9A:
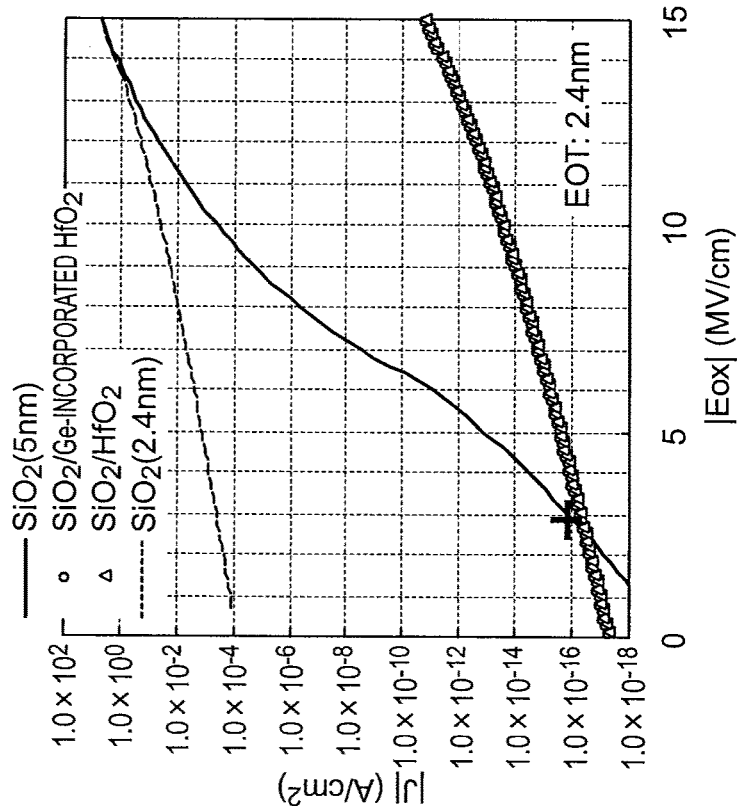

FIGS. 9A and 9B show the relationship between the electric field $E_{ox}$ applied in the tunnel insulating film of the two-layer structure of 2.4 nm in EOT and the leakage current flowing in the tunnel insulating film. In this tunnel insulating film of the two-layer structure, the SiO₂ layer is 1.7 nm in EOT and is 1.7 nm in physical film thickness $T_{phys}$, the HfO₂ layer is 0.7 nm in EOT and is 3.2 nm in physical film thickness $T_{phys}$. For comparison, FIGS. 9A and 9B also show a case of a stacked insulating film without the assist level (a stacked insulating film having no Ge added thereto), a case of a single-layer insulating film having a 5 nm thick SiO₂ layer, and a case of a single-layer insulating film having a 2.4 nm thick SiO₂ layer. FIG. 9A shows a case of charge retention, and FIG. 9B shows a case of writing. As shown in FIG. 9A, the leakage current is restricted to $1.0\times10^{-16}$ A/cm² or lower when the electric field $E_{ox}$ is as low as 3 MV/cm (as indicated by the cross-like symbol in FIG. 9A). As shown in FIG. 9B, the leakage current of 0.1 A/cm² flows when the electric field $E_{ox}$ is 10 MV/cm, which is lower than the requirement set in this embodiment than 3 MV/cm. In other words, the write efficiency can be made higher (as indicated by the cross-like symbol in FIG. 9B). In the case of the single SiO₂ layer of 2.4 nm in EOT, on the other hand, the leakage current is 1.0 A/cm₂ with the high electric field $E_{ox}$ of 13 MV/cm, and the requirements set in this embodiment are satisfied. However, the leakage current is $1.0\times10^{-4}$ A/cm² with the low electric field 3 MV/cm. The number of digits in the value of the leakage current is larger, by 12, than the number of digits in the value of the leakage current obtained in the case of the two-layer insulating film having the same EOT.

As described above, in this embodiment, the leakage current in a tunnel insulating film of a stacked structure having the assist level can be restricted to $1.0\times10^{-16}$ A/cm² or lower when the electric field $E_{ox}$ is as low as 3 MV/cm, and can be increased to 0.1 A/cm₂ or higher when the electric field $E_{ox}$ is as high as 13 MV/cm. Accordingly, the write efficiency can be made higher, while all the requirements for the tunnel insulating film are satisfied. Further, the film thickness can be made as small as 1.8 nm in EOT, though a SiO₂ film cannot be made as thin as 5 nm.

As described so far, this embodiment can provide a nonvolatile semiconductor memory apparatus having a tunnel insulating film that can restrict the leakage current in a low electric field even when the EOT is made smaller, and can increase the leakage current in a high electric field.

(Thickness Range of Tunnel Insulating Film of Stacked Structure)

Figure 10:
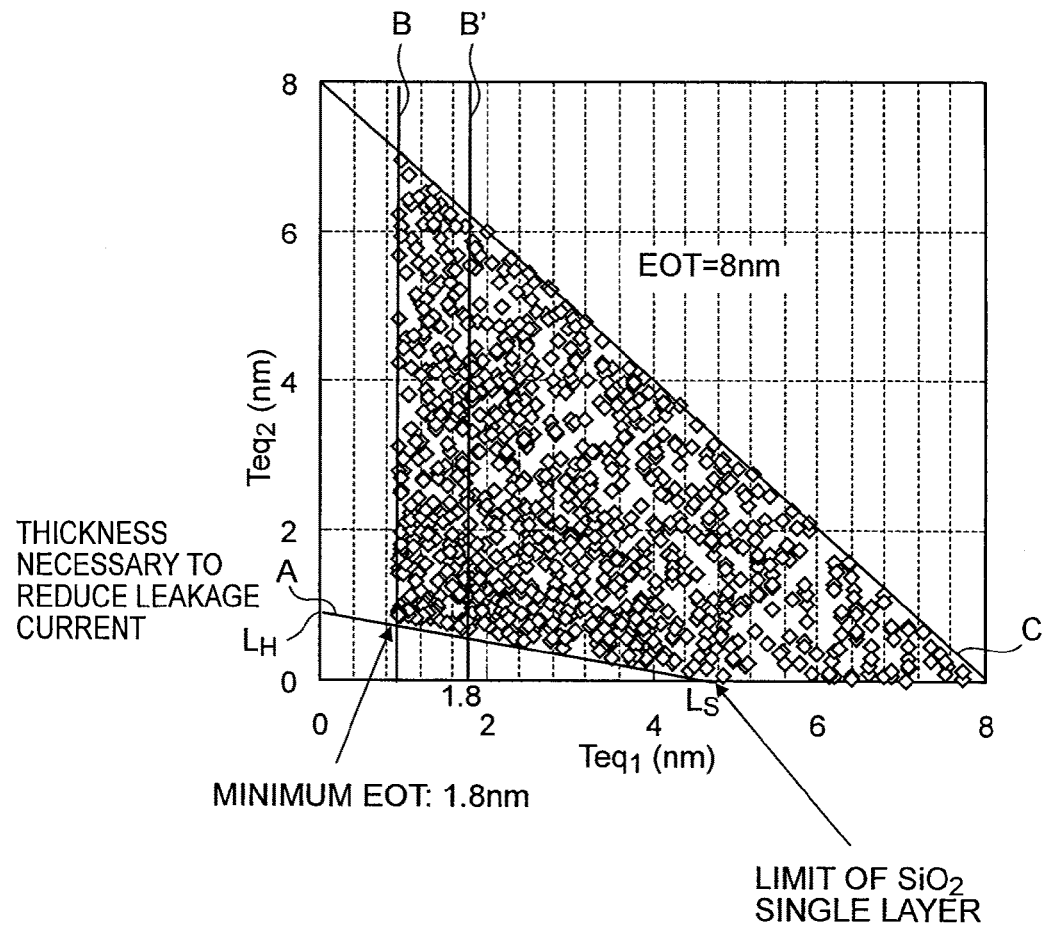
FIG. 10 shows the ranges of EOTs of the SiO$_2$ layer and the HfO$_2$ layer of the tunnel insulating film according to the first embodiment.

Next, the film thickness range in which a tunnel insulating film having a stacked structure satisfies the desired requirements is examined in the nonvolatile semiconductor memory apparatus of the first embodiment. FIG. 10 shows the range to satisfy the requirements for the tunnel insulating film. In FIG. 10, the abscissa axis indicates the EOT ($T_{eq1}$) of the SiO₂ layer, and the ordinate axis indicates the EOT ($T_{eq2}$) of the HfO₂ layer. The range of course includes not only the regions indicated by dots but also the regions between dots. The upper limit of the total EOT ($T_{eq,\,all}$) of the SiO₂ layer and the HfO₂ layer is 8 nm (the straight line C ($T_{eq1}+T_{eq2}=8$)). Therefore, the region represented by $T_{eq1}+T_{eq2}>8$ (the region above the straight line C) shown in FIG. 10 is not contained in the range to satisfy the requirements. In FIG. 10, the straight line A represents the rate of the smallest possible film thickness required to reduce the leakage current in a low electric field. The point $L_s$ at which the straight line A and the abscissa axis cross each other concerns only the SiO₂ layer, and indicates that the thickness of the SiO₂ layer needs to be approximately 5 nm so as to retain charges. The point $L_H$ at which the straight line A and the ordinate axis cross each other concerns only the HfO₂ layer. The straight line A represents the smallest possible film thickness the stacked structure of the SiO₂ layer and the HfO₂ layer needs to have so as to retain charges.

As can be seen from FIG. 10, the requirements represented by the range are not satisfied by the HfO₂ layer alone. This means that the tunnel insulating film cannot be formed only with the HfO₂ layer. This is because the leakage current cannot be made higher in a high electric field only by the HfO₂ layer. The smallest possible layer thicknesses the SiO₂ layer needs to have so as to achieve the required leakage current in a high electric field are represented by the straight line B and the straight line B'. The straight line B' represents the smallest possible layer thickness the SiO₂ layer needs to have in a tunnel insulating film having a HfO₂ layer without the assist level. The layer thickness represented by the straight line B' is 1.8 nm. Even in a case of a tunnel insulating film of a stacked structure formed with a SiO₂ layer and a HfO₂ layer without the assist level, a tunnel insulating film thinner than a 5 nm thick single-layer SiO₂ layer can be formed, if the layer thickness of the SiO₂ layer is 1.8 nm or larger. In that case, the total EOT of the tunnel insulating film can be reduced to as small as 2.5 nm (as indicated by the intersection of the straight line A and the straight line B').

If the assist level is formed in the HfO₂ layer, the film thickness of the SiO₂ layer can be halved to 0.9 nm, and a very thin tunnel insulating film of 1.8 nm in EOT can be formed with the SiO₂ layer and the HfO₂ layer. This film thickness is smaller than the film thickness of 1.8 nm of the SiO₂ layer in the case where the assist level does not exist. The reason that the SiO₂ layer cannot be made thinner when the assist level does not exist is as follows. When there is a high electric field, the leakage current needs to be high. To achieve this, the $E_c$ of the HfO₂ layer needs to become sufficiently low so as to facilitate electron tunneling. However, if the film thickness $T_{eq1}$ of the SiO₂ layer is reduced while the electric field $E_{ox}$ ($=V_1/T_{eq1}$) remains the same, the voltage $V_1$ applied to the SiO₂ layer becomes lower, and the $E_c$ of the HfO₂ layer cannot be lowered enough. Therefore, the leakage current cannot be made higher. If the assist level exists in the HfO₂ layer, on the other hand, the probability of electron tunneling becomes higher as electrons flow through the assist level, even if the $E_c$ of the HfO₂ layer is not lowered enough. Accordingly, in the case of a stacked structure including a HfO₂ layer having the assist level, the SiO₂ layer can be made even thinner than in a case where the assist level does not exist, and the total EOT of the tunnel insulating film can be reduced to as small as 1.8 nm (as indicated by the intersection of the straight line A and the straight line B).

Figure 11:
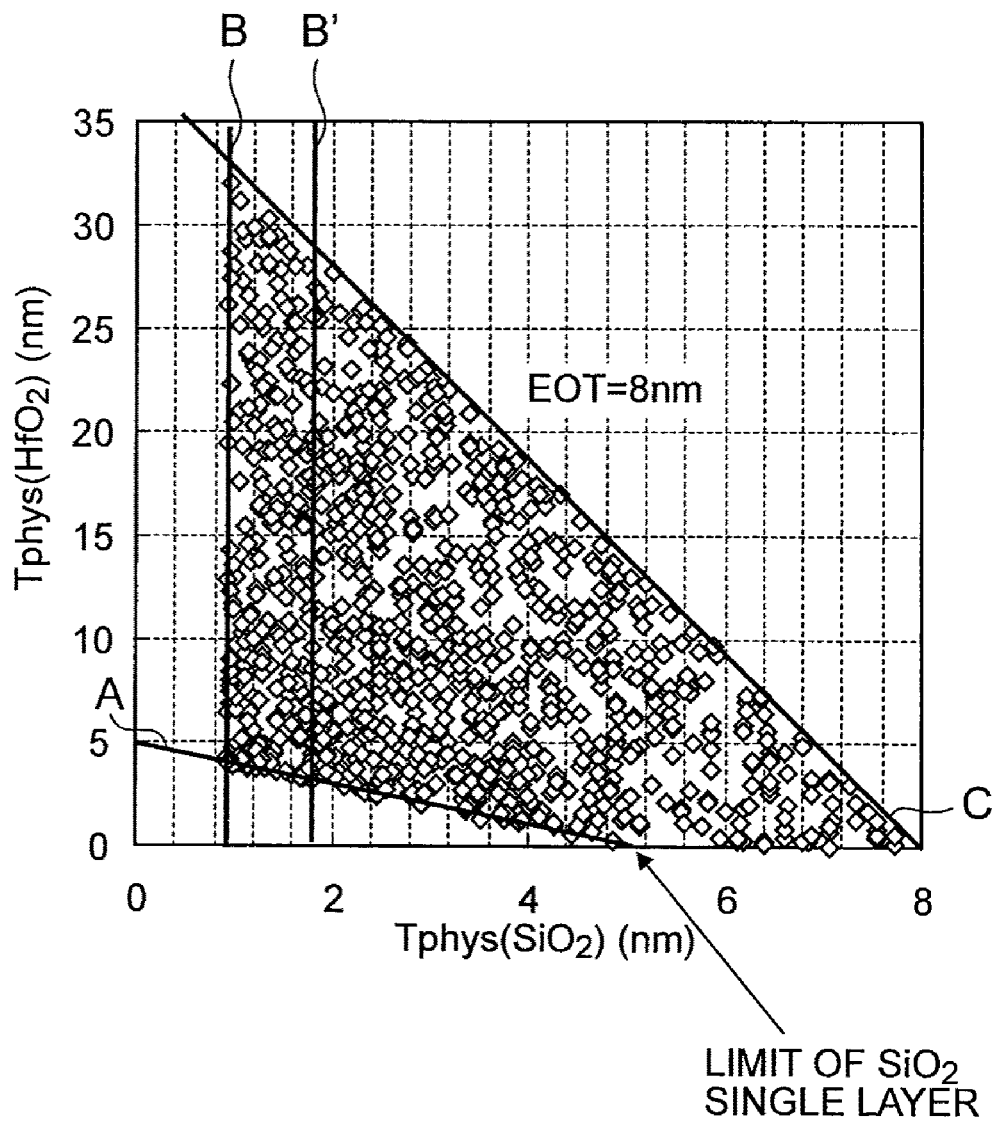
FIG. 11 shows the ranges of physical layer thicknesses of the SiO$_2$ layer and the HfO$_2$ layer of the tunnel insulating film according to the first embodiment.

FIG. 11 shows the range obtained by converting the range shown in FIG. 10 into the range in terms of physical thickness. In FIG. 11, the abscissa axis is the same as the abscissa axis of FIG. 10, and the ordinate axis is scaled by the ratio in dielectric constant between the HfO₂ layer and the SiO₂ layer.

Therefore, the required physical film thickness of the $SiO_2$ layer in a stacked structure is the same as that shown in FIG. 10. The required physical film thickness of the $SiO_2$ layer is 1.8 nm where the assist level does not exist, and is 0.9 nm where the assist level exists. The physical thickness of the $HfO_2$ layer can be in the range of 3 nm to 28 nm.

Second Embodiment

Next, a nonvolatile semiconductor memory apparatus in accordance with a second embodiment of the present invention is described. In the nonvolatile semiconductor memory apparatus of the first embodiment, the tunnel insulating film has the assist level formed only in the high-k layer. In the nonvolatile semiconductor memory apparatus of this embodiment, on the other hand, the tunnel insulating film has the assist level not only in the high-k layer but also in the low-k layer. The nonvolatile semiconductor memory apparatus of the second embodiment has the same structure as the nonvolatile semiconductor memory apparatus of the first embodiment, except for the tunnel insulating film.

Figure 12:
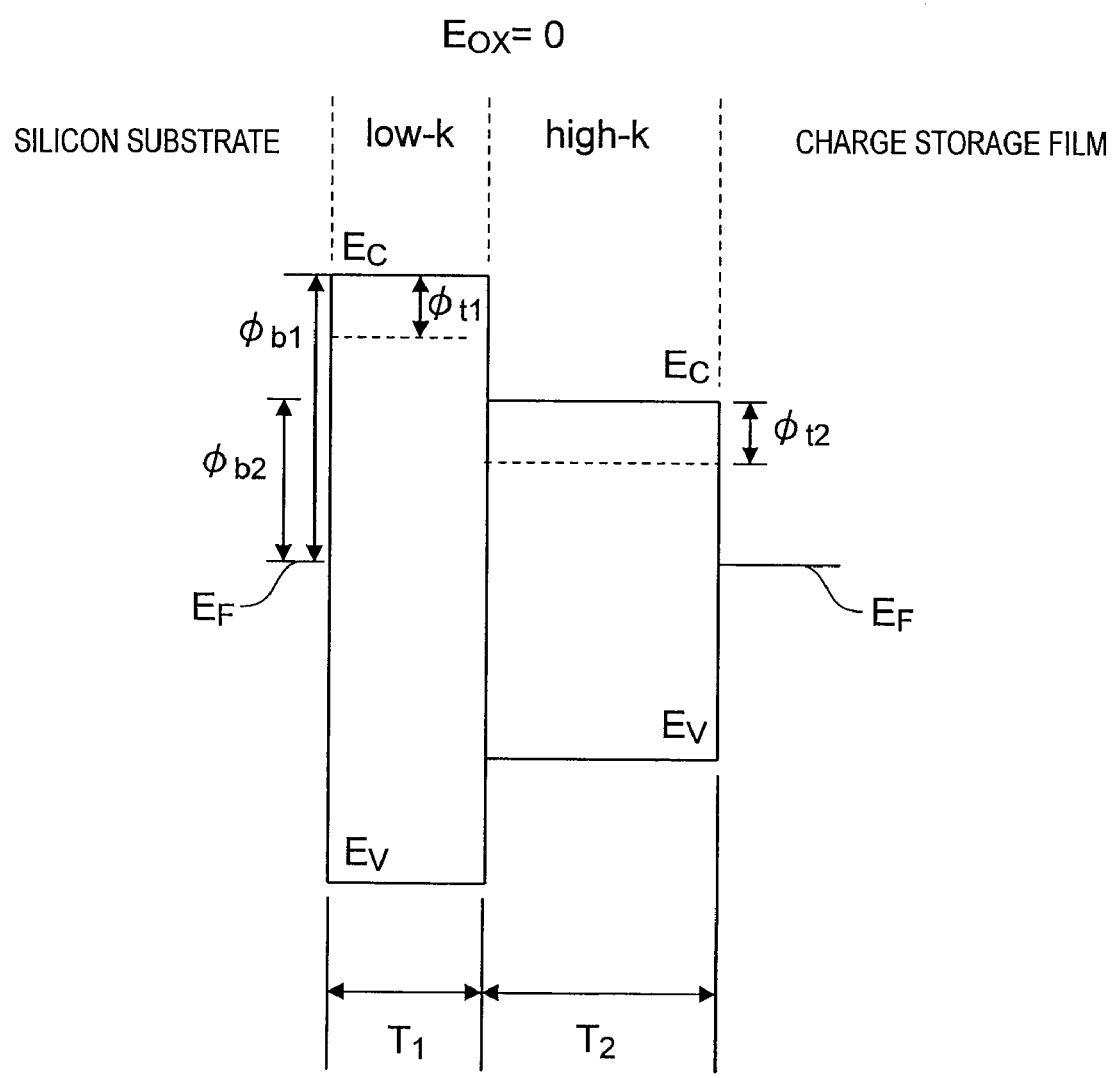
FIG. 12 is an energy band diagram observed when the electric field in the tunnel insulating film according to the first embodiment is zero.
Figure 13B:
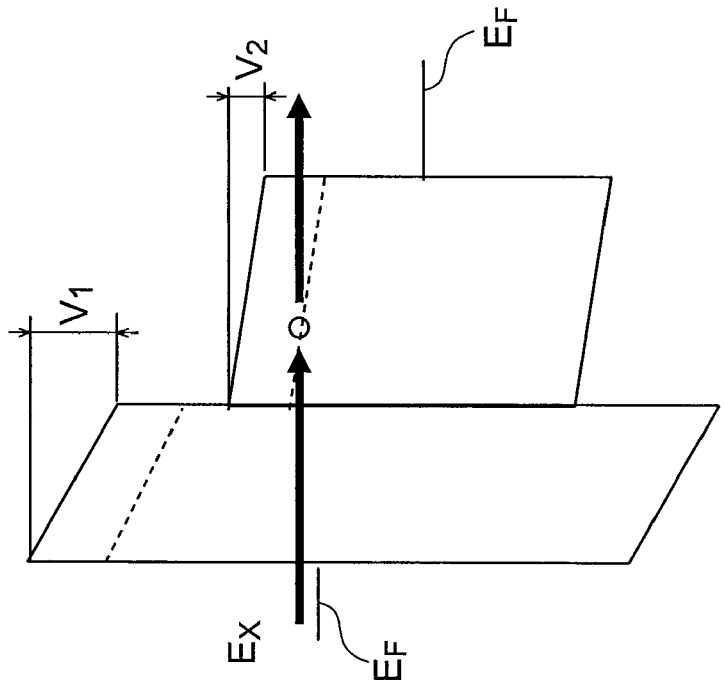
FIGS. 13A and 13B are energy band diagrams observed when an electric field is applied in the tunnel insulating film at the time of writing.
Figure 13A:
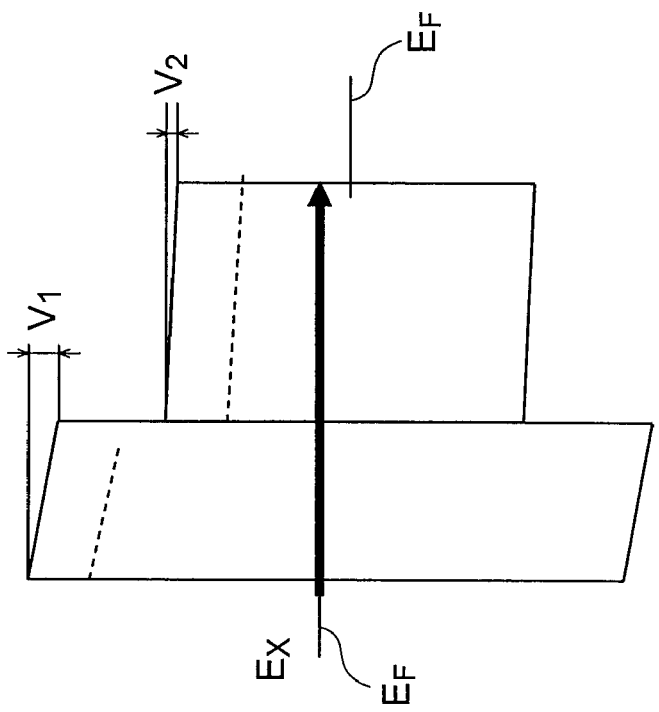

FIG. 12 is an energy band diagram of the tunnel insulating film of this embodiment observed when the electric field $E_{ox}$ is 0, with the assist level $\phi_{t1}$ being added to the low-k layer shown in FIG. 3. FIGS. 13A and 13B schematically show the energy band observed in a case where a low electric field is applied in the tunnel insulating film, and the energy band observed in a case where a high electric field is applied, with the assist level $\phi_{t1}$ being added to the low-k layer shown in FIGS. 4A and 4B. As shown in FIGS. 13A and 13B, the assist level of the low-k layer does not contribute to the leakage current, and therefore, the leakage current does not vary whether or not the assist level exists in the low-k layer. In other words, the write efficiency does not vary. If the assist level of the low-k layer contributes to the leakage current, the write efficiency is increased. In that case, however, the charge retention properties are degraded, which is not preferable.

Figure 14A:
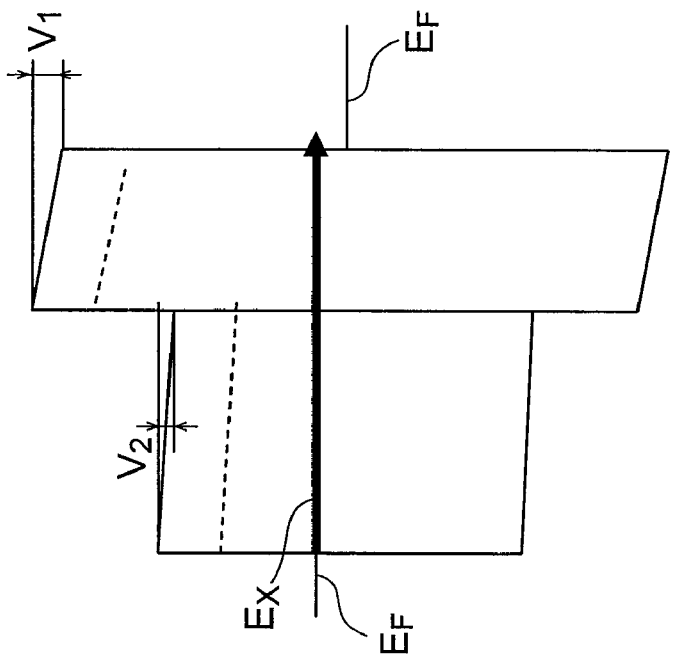
FIGS. 14A and 14B are energy band diagrams observed when an electric field is applied in the tunnel insulating film at the time of charge retaining state.
Figure 14B:
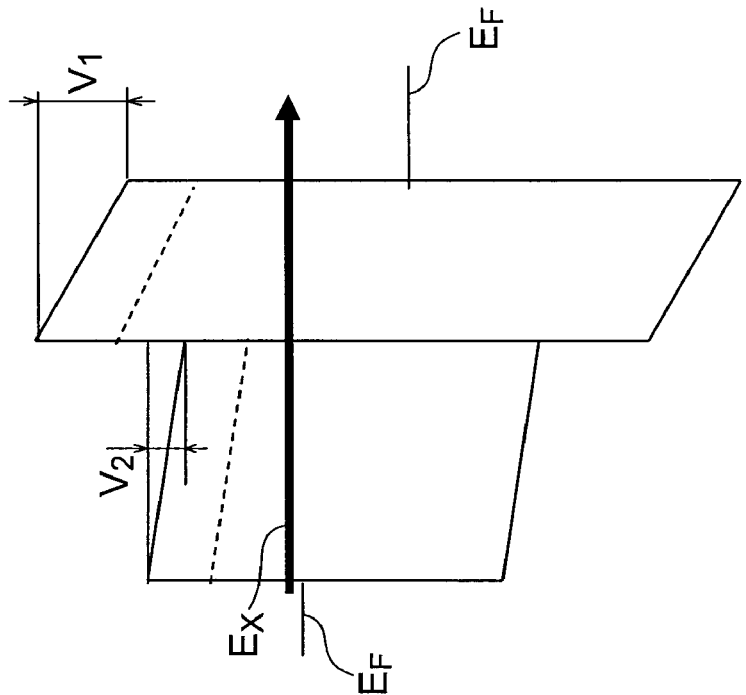

FIGS. 14A and 14B schematically show the energy band observed in a case where a low electric field is applied in the tunnel insulating film, and the energy band observed in a case where a high electric field is applied, with the assist level $\phi_{t1}$ being added to the low-k layer shown in FIGS. 6A and 6B. To retain charges, the leakage current is restricted to a low value, and therefore, the assist level should not contribute to the leakage current. Therefore, in an electric field $E_{ox}$ to retain charges, the assist level should satisfy the relationship expressed as follows:

$$\phi_{b1} - \phi_{t1} - V_2 > V_1 \tag{11}$$

Since the Fermi level $E_F$ of the semiconductor substrate at this point is lower than the assist level of the low-k layer, the leakage current is not increased, and excellent charge retention properties can be realized accordingly.

As described above, in this embodiment, even if the assist level is formed in both the low-k layer and the high-k layer, it is possible to form a tunnel insulating film having a very small EOT to satisfy the requirements. Accordingly, it is possible to provide a nonvolatile semiconductor memory apparatus having a tunnel insulating film that can reduce the leakage current in a low electric field to a low value even if the EOT is reduced, and also increase the leakage current in a high electric field.

(Remarks on Assist Level)

In the first and second embodiments, the assist level is formed in the high-k layer of the tunnel insulating film. This assist level is now described.

The assist level is formed in the bandgap of the high-k layer, when an element other than the elements forming the layer is added to the high-k layer. Here, an example case where Ge is added to the $HfO_2$ layer is described.

In an embodiment of the present invention, to determine the assist level, a calculation is performed based on the spin-polarized generalized gradient approximation density functional theory (hereinafter also referred to as the SP-GGA-DFT), with the use of a super cell formed on the basis of cells 2×2×2 times as many (containing 32 $HfO_2$ in total, or 96 atoms) as the unit cell of monoclinic crystal $HfO_2$ (containing four $HfO_2$, or 12 atoms). A substitutional defect or interstitial defect of M (M being Si, Ge, B, Al, P, or As), and a defect "pair" (a complex) of the substitutional defect or interstitial defect of M and oxygen vacancy ($V_o$), interstitial oxygen ($O_i$), or substitutional nitrogen ($N_o$) is introduced into this cell, and the levels observed in cases where the respective defect structures trap and release charges are calculated. When the charging state is changed, an excessive bipolar energy gain due to the super cell method is corrected by the Makov-Payne-Kantorovich method. Through this calculation, it becomes clear that very active defects are caused when electrons are injected or released in the following three cases: a case where a defect $Ge_{Hf}$ is formed by replacing the Hf site in the $HfO_2$ with Ge; a case where a $V_o$–$Ge_{Hf}$ defect pair is formed when an oxygen defect is caused in the vicinity of the defect $Ge_{Hf}$; and a case where a defect $Ge_o$ that technically occupies the oxygen-defect site is formed. The defect $Ge_o$ mentioned last is Ge that has replaced an oxygen site, and is technically expressed as "$Ge_o$". However, it has become apparent for the first time that, in practice, it is more appropriate to regard the defect $Ge_o$ as a $V_o$–$Ge_i$ defect pair formed when an oxygen defect is caused in the vicinity of interstitial Ge ($Ge_i$) as a result of large structural relaxation (lattice relaxation+a change in electron state).

Figure 15:
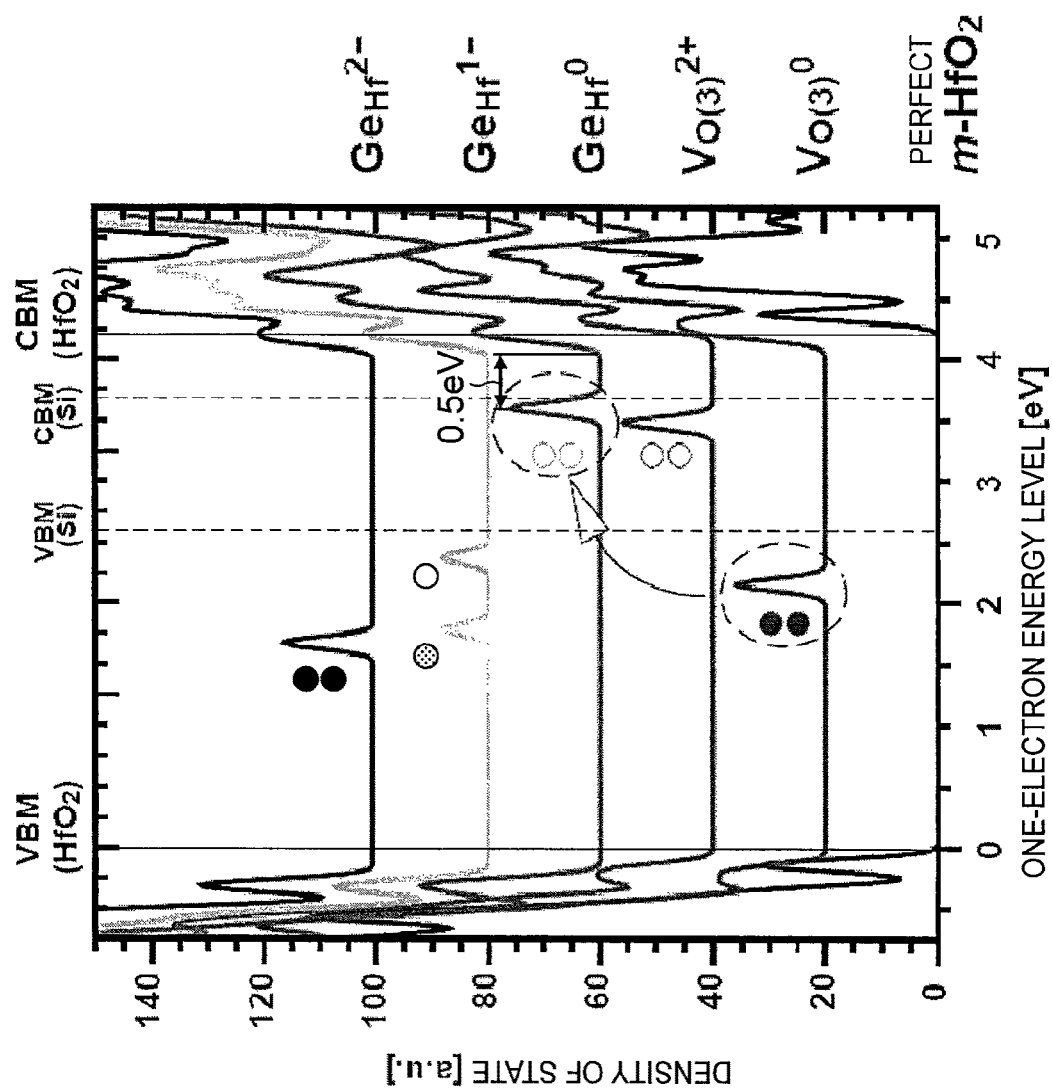
FIGS. 15 to 17 show the levels formed by Ge in $HfO_2$.
Figure 16:
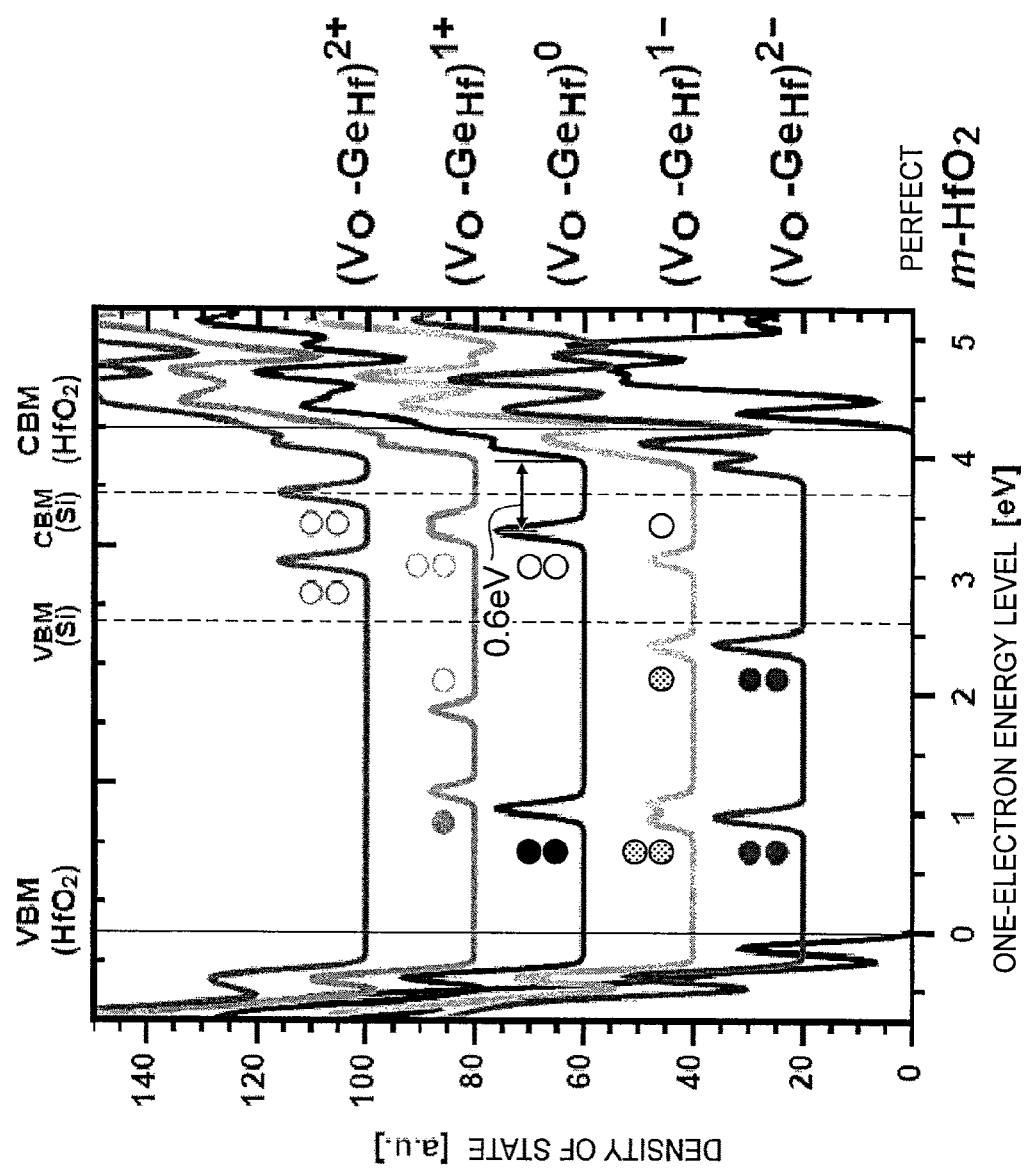
Figure 17:
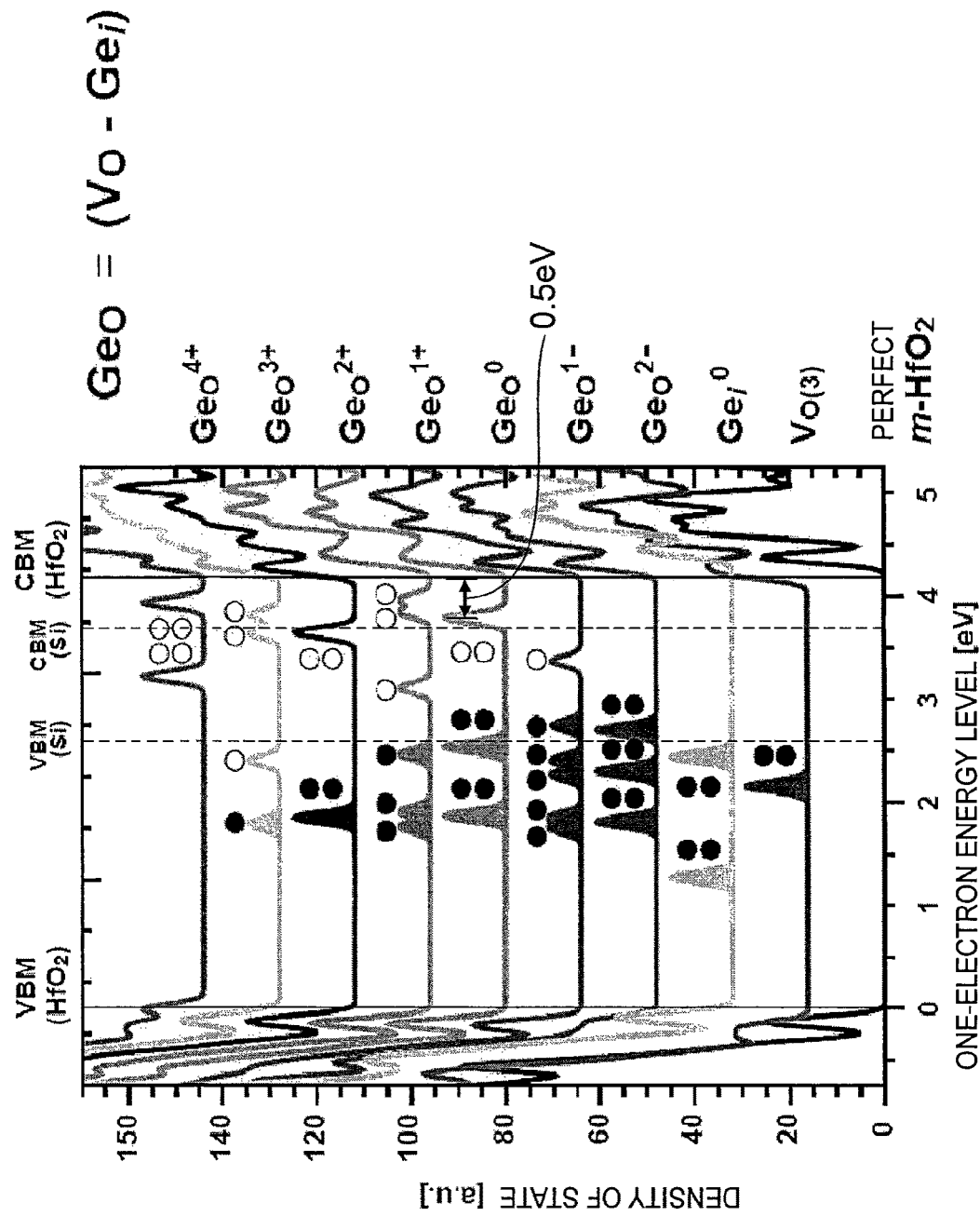

FIGS. 15 to 17 show the Kohn-Sham levels (one-electron energy levels) of the above three defects in various charging state. In each of FIGS. 15 to 17, the abscissa axis indicates the electron energy, and the ordinate axis indicates the density of state (DOS). The VBM of monoclinic crystal $HfO_2$ without defects is located at the point zero on the abscissa axis. In each of FIGS. 15 to 17, VBM ($HfO_2$) represents the VBM of $HfO_2$, CBM ($HfO_2$) represents the CBM of $HfO_2$, VBM (Si) represents the VBM of Si, CBM (Si) represents the CBM of Si, the black circles and arrows allotted to levels appearing in the bandgap of $HfO_2$ represent the occupied levels, and the outline circles and arrows represent the unoccupied levels. It is possible to promptly determine whether charges can be released or accepted, based on the Kohn-Sham levels shown in FIGS. 15 to 17. However, the exact levels of charge trapping and releasing cannot be determined, because an ionic material such as $HfO_2$ has lattice relaxation accompanied by a large energy gain in charge trapping and releasing, and the defect level cannot be determined without the lattice relaxation being taken into consideration. Therefore, the total energy observed before the structural relaxation caused in electron trapping or releasing is compared with the total energy observed after the structural relaxation, so as to determine the precise defect level (which is the assist level). The Hf-site replaced defect $Ge_{Hf}$ shown in FIG. 15 can vary from $Ge_{Hf}^0$ to $Ge_{Hf}^{2-}$, and obviously has (two-electron-equivalent) one-acceptor level. Further, it is possible to predict that $Ge_{Hf}^0$ can accept the surplus two electrons of the neutral oxygen defect $V_o^0$. Actually, the $V_o$–$Ge_{Hf}$ defect pair having an oxygen defect in the vicinity of $Ge_{Hf}$ shown in FIG. 16 turns into a complex material with $V_o^{2+}$ and $Ge_{Hf}^{2-}$, as the two electrons move from $V_o^0$ to $Ge_{Hf}^0$. Accordingly, it is obvious that this defect pair exhibits two-electron one-donor level and (two-electron-equivalent) one acceptor level.

In the situation $V_o$—$Ge_i$ in which $Ge_i$ atoms Ge existing between lattices of $HfO_2$ enter the oxygen vacancies $V_o$ in $HfO_2$ (this situation can be regarded as a case of a $Ge_i$—$V_o$ pair) as shown in FIG. 17, surplus electrons equivalent to six electrons should be generated in the gap, if the originally neutral $V_o^0$ and the originally neutral $Ge_i^0$ remain as they are. However, due to large lattice relaxation, a Hf—Ge bond is formed between Hf and $Ge_i$ adjacent to $V_o$ as the source of the surplus electrons of $V_o$, and restructuring of the electron distribution starts. Therefore, it is obvious that the defect exhibits four-electron two-donor level and (two-electron-equivalent) one acceptor level that are attributed to the bonding and the antibonding orbitals of the Hf—Ge bond.

Figure 18:
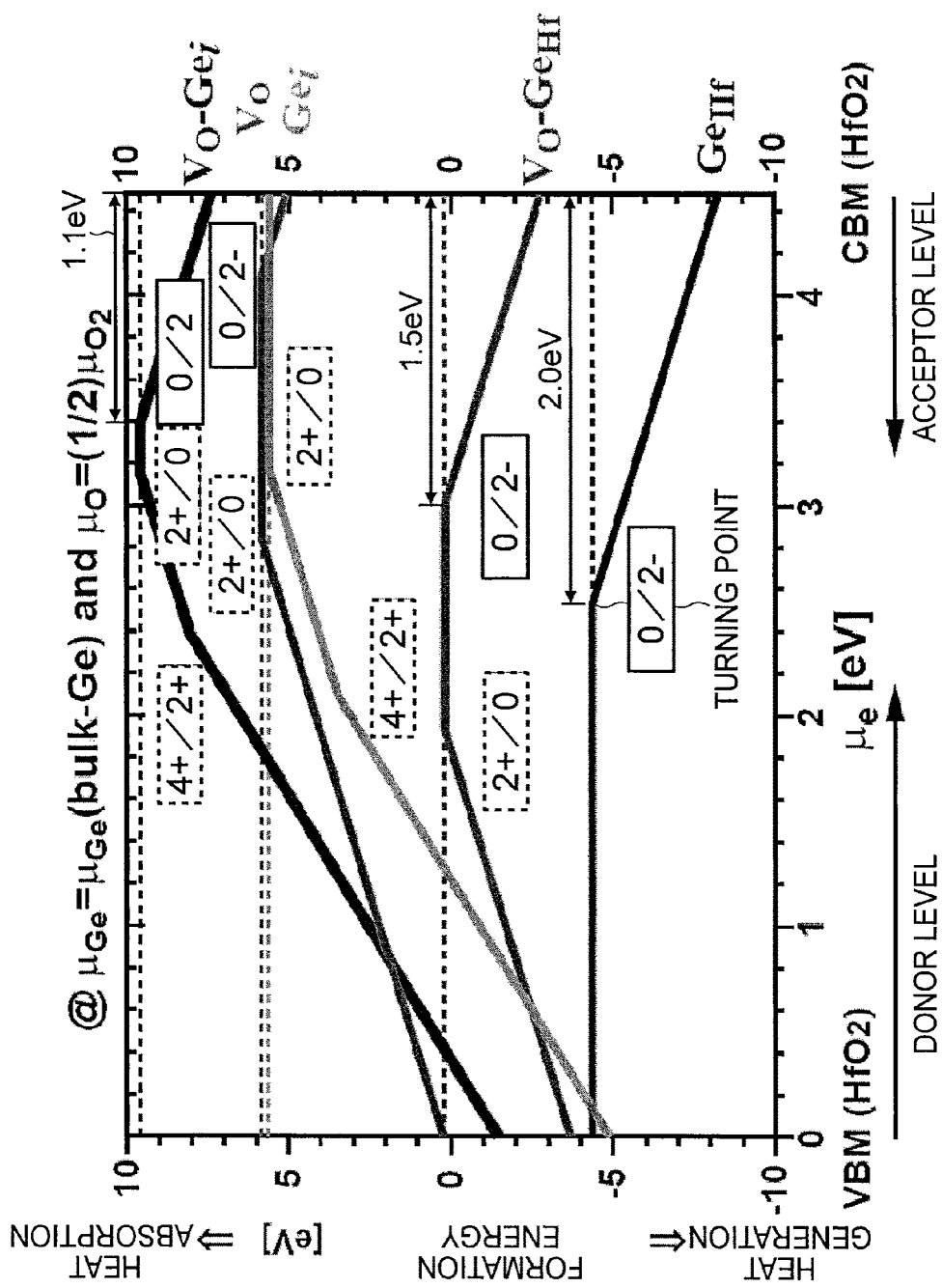
FIG. 18 shows the donor level and the acceptor level formed by Ge in $HfO_2$.

In any of the cases shown in FIGS. 15 to 17, the inner-gap level (Kohn-Sham level) becomes closer to the VBM side or is stabilized, when a semi-occupied or totally-occupied state is formed as electrons are captured by the electron unoccupied level in a charge neutral condition. FIG. 18 collectively shows the donor levels (the donor level depths) and the acceptor levels (the acceptor level depths). In FIG. 18, the abscissa axis indicates the electron energy (Fermi level), and the ordinate axis indicates the defect formation energy. Each positive value on the abscissa axis indicates an endothermic reaction, and each negative value indicates an exothermic reaction. The chemical potential of Ge $\mu_{Ge}$ is the chemical potential of crystalline Ge, and the chemical potential of O (oxygen) $\mu_o$ is half the chemical potential of an $O_2$ molecule. Each defect is indicated by a dotted line and a solid line. Each dotted line represents the formation energy, and runs parallel to the abscissa axis, not depending on the Fermi level. The charge trapping state greatly depends on the Fermi level, and behaves in such a manner as to have a turning point with respect to the value on the abscissa axis. As for each charging state of each defect, the difference between the dotted line and the solid line is equivalent to the electron affinity (in the cases of downward-sloping lines) or the hole affinity (in the cases of upward-sloping lines). In FIG. 18, the difference between the value on the abscissa axis at the turning point denoted by "0/-2" (Fermi level) and the conduction band minimum (CBM) is equivalent to the acceptor level. The turning points denoted by "4+/2+" and "2+/0" are equivalent to the donor levels. In view of the one-electron energy levels shown in FIGS. 15 to 17, the electron unoccupied state in the charge neutral condition of each of the three defects does not greatly vary, being approximately 0.5 eV, 0.6 eV, and 0.5 eV from the conduction band of $HfO_2$. Therefore, the acceptor level does not vary either. However, as a result of calculations that take into account the structural relaxation caused after charge injection, it has become apparent that the acceptor levels clearly reflects the influence of structure relaxation, and are located at 2.0 eV, 1.5 eV, and 1.1 eV, respectively, as shown in FIG. 18. Here, the shallowest acceptor level is of the $V_o$—$Ge_i$ defect pair, the second shallowest is of the $V_o$—$Ge_{Hf}$ defect pair, and the deepest is of the defect $Ge_{Hf}$. When Ge is added to a $HfO_2$ layer, the above levels are formed. Accordingly, if a Ge-added $HfO_2$ layer is used in a tunnel insulating film, each of those levels functions as the assist level that captures and releases electrons when an appropriate electric field is applied.

Although the cases where the assist level is 1.1 eV, 1.5 eV, and 2.0 eV have been described, the assist level may have some other value. However, the effective assist level in this invention cannot have any value. To achieve the effects of the above-described embodiments of the present invention, it is preferable that the assist level is in the ranges described below.

Figure 21:
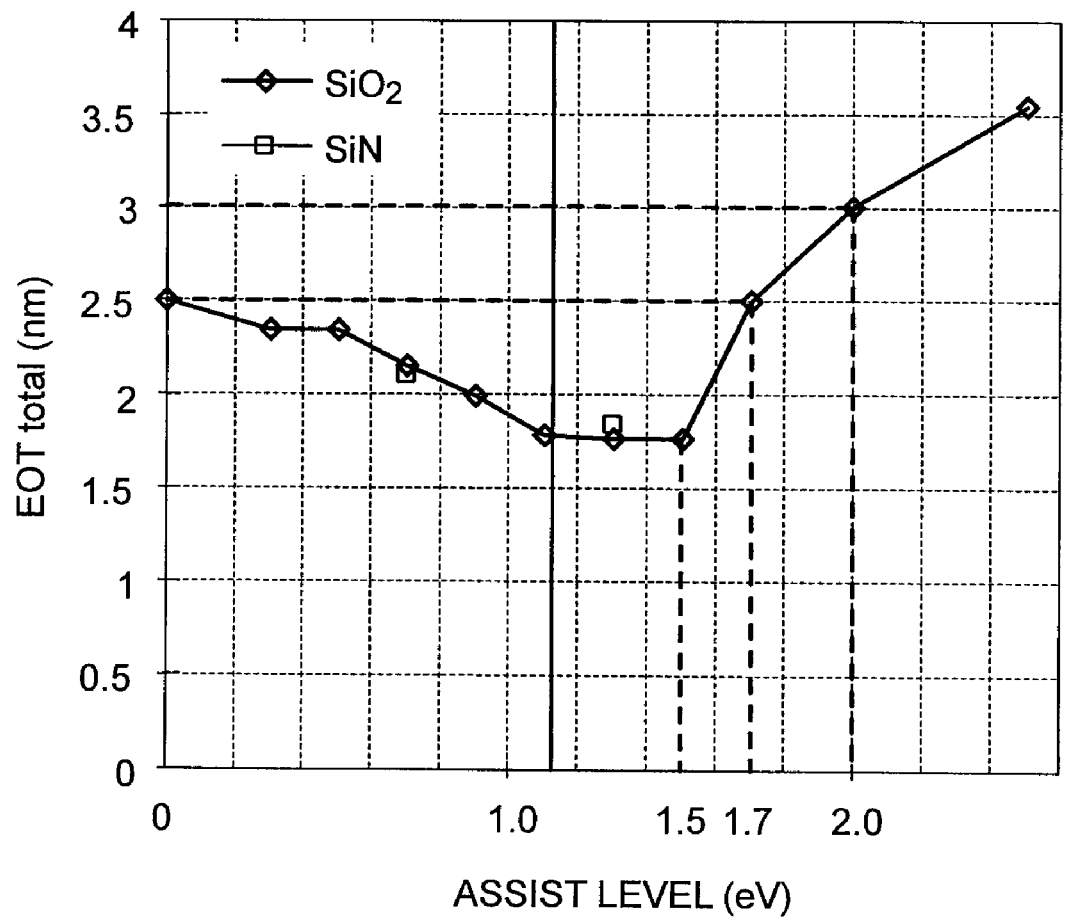
FIG. 21 shows the dependence of the EOT of the tunnel insulating film on the assist level according the embodiment.

FIGS. 20A to 20I show the ranges of the physical film thicknesses $T_{phys}$ of the $HfO_2$ layer and the $SiO_2$ layer that satisfy the requirements that are set in the embodiment of the present invention, with respect to a tunnel insulating film having a stacked structure formed with a $HfO_2$ layer an a $SiO_2$ layer that have various assist levels. As can be seen from those drawings, the range of the physical film thickness of the $SiO_2$ layer varies with the size of the assist level. FIGS. 20A to 21I show cases where the assist level of the $HfO_2$ layer is 2.5 eV, 2.0 eV, 1.7 eV, 1.5 eV, 1.3 eV, 0.9 eV, 0.7 eV, 0.5 eV, and 0.3 eV. FIG. 21 shows the relationship between the EOT of the tunnel insulating film and each of those assist levels. Where the assist level is indicated as 0 eV, the assist level does not exist, and the minimum EOT in such a case is 2.5 nm, as described above. As can be seen from FIG. 21, as the assist level becomes deeper, the EOT of the tunnel insulating film can be made thinner than the EOT without the assist level. When the assist level is 1.5 eV, the EOT becomes the smallest, which is approximately 1.7 nm. If the assist level becomes deeper than 1.5 eV, the EOT becomes dramatically larger. For example, when the assist level is 2.0 eV, the EOT is 3 nm, which is larger than that in a case where the assist level does not exist. This is because, if the assist level in a $HfO_2$ layer is deep, the leakage current flowing through the assist level becomes dominant even when the electric field $E_{ox}$ is low in the $HfO_2$ layer having a small layer thickness. Therefore, the desired requirements in a low electric field are not satisfied. It is preferable that the assist level is larger than 0 eV but smaller than 1.7 eV, and more preferable that the assist level is in the range of 0.3 eV to 1.5 eV. Also, it has become apparent that the most preferred defect structure is the $V_o$—$Ge_{Hf}$ defect pair, followed by the $V_o$—$G_{ei}$ defect pair. Being too deep, the defect $Ge_{Hf}$ is not preferable. In a case where the assist level exists, the layer thickness of the low-k layer (the value at the intersection of the straight line B and the abscissa axis) can be made smaller than the necessary layer thickness of the low-k film where the assist level does not exist (the value at the intersection of the straight line B' and the abscissa axis) (FIGS. 20F to 20I). In the above description, the low-k layer is a $SiO_2$ layer, and the high-k layer is a $HfO_2$ layer. However, the same effects as above can be achieved, as long as the assist level falls into the above described range, even in a case where the low-k layer is a silicon oxide layer, and the high-k layer is a hafnia (HfO) layer.

FIG. 21 also shows a case of a tunnel insulating film having a stacked structure formed with a $HfO_2$ layer and a silicon nitride (SiN) layer. As can be seen from FIG. 21, there is substantially no difference between the case of the $SiO_2$ layer and the case of the SiN layer. Accordingly, the same effects can be achieved, regardless of whether the low-k layer stacked with the high-k layer is a $SiO_2$ layer or a SiN layer. Thus, it is possible to use either one of the two layers. Further, the low-k layer may be a SiON layer having characteristics somewhere between the characteristics of a $SiO_2$ layer and the characteristics of a SiN layer, or may have a stacked structure of three or more layers, such as a stacked structure of a $SiO_2$ layer, a SiN layer, and a $SiO_2$ layer. As long as Si, O, and N are main elements in a film, the film can function as the low-k layer of an embodiment of the present invention, even if the film contains some other element than Si, O, and N.

Figure 19A:
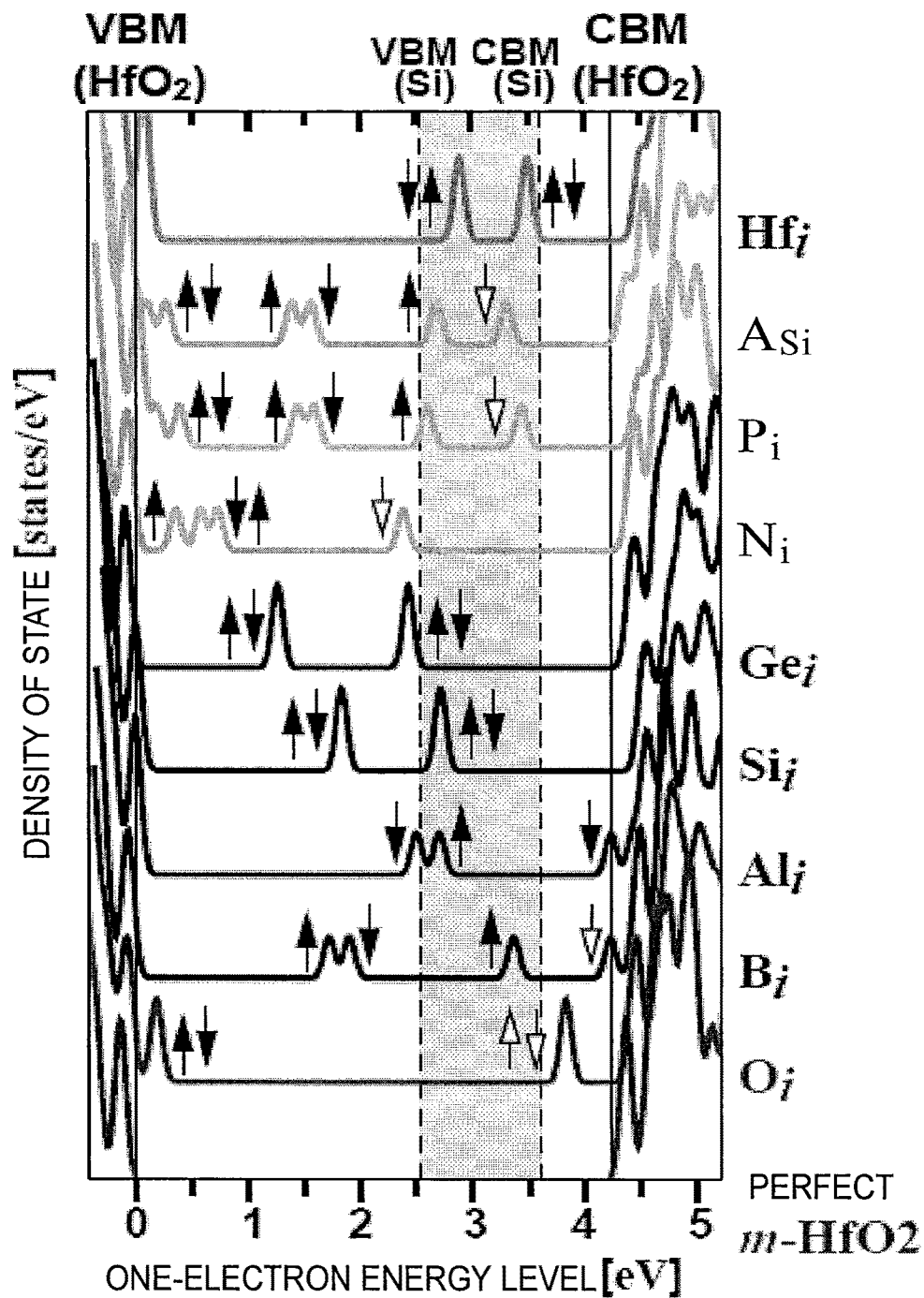
FIGS. 19A to 19C show the levels formed when various elements are added to $HfO_2$.
Figure 19B:
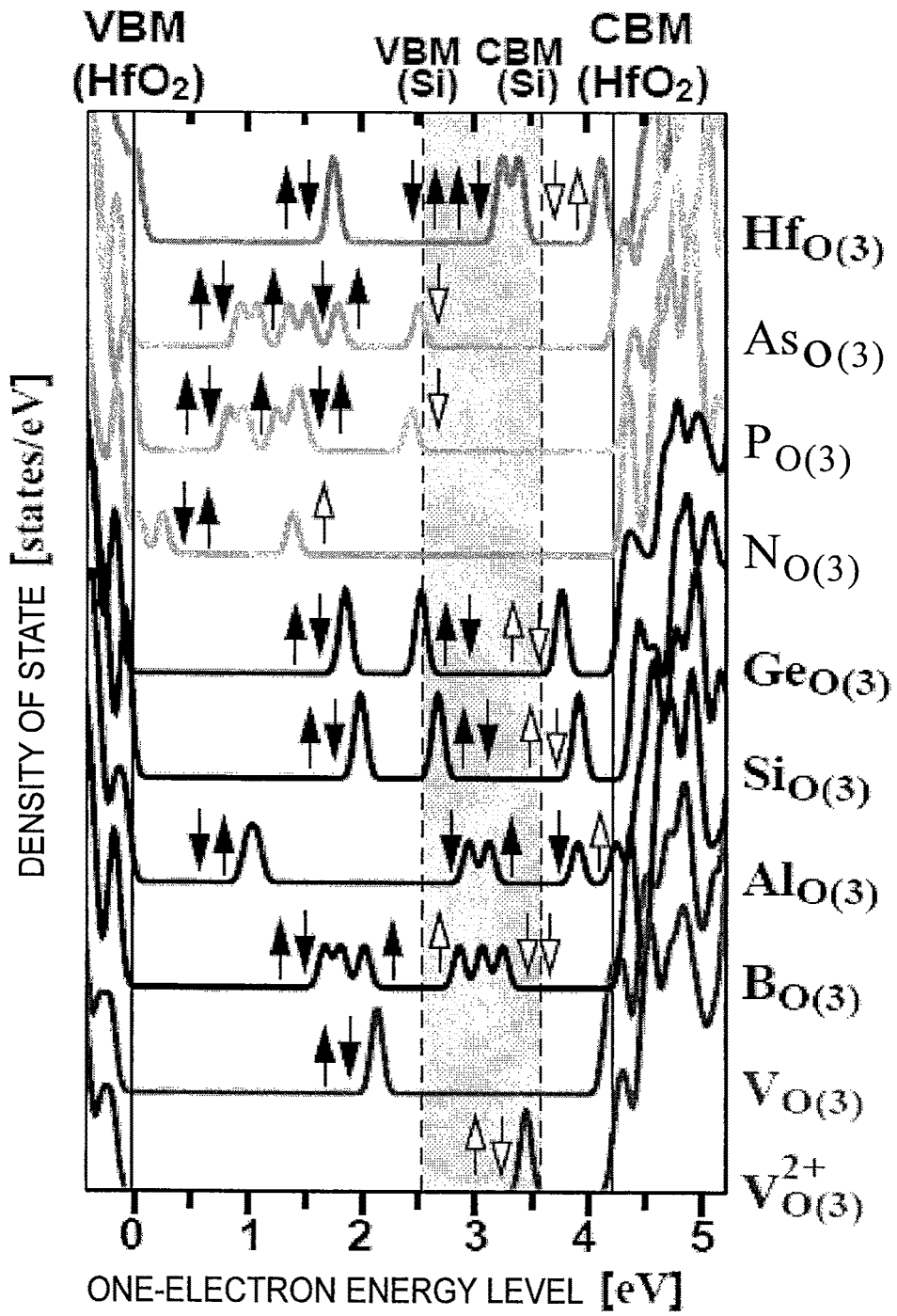
Figure 19C:
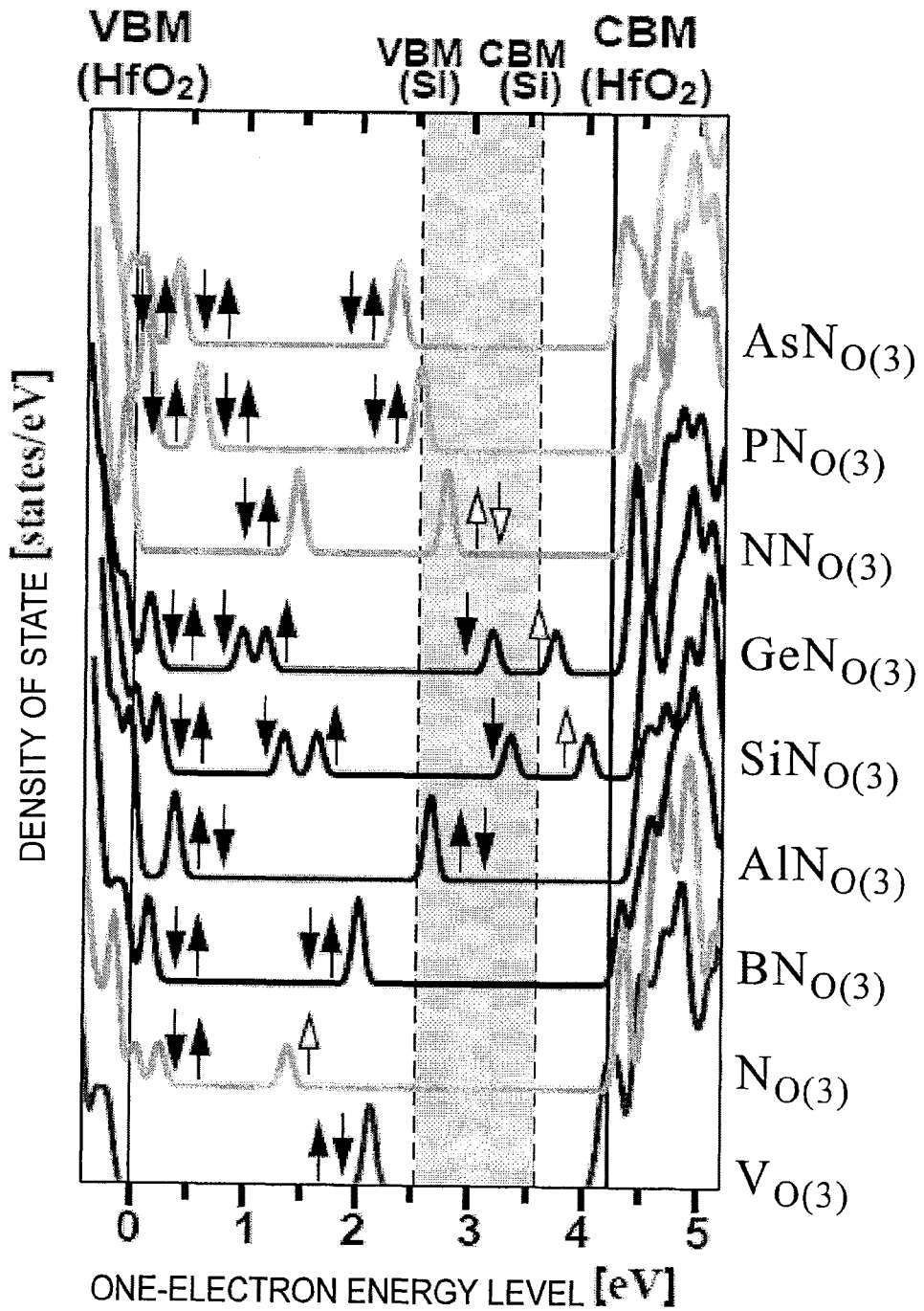
Figure 20A:
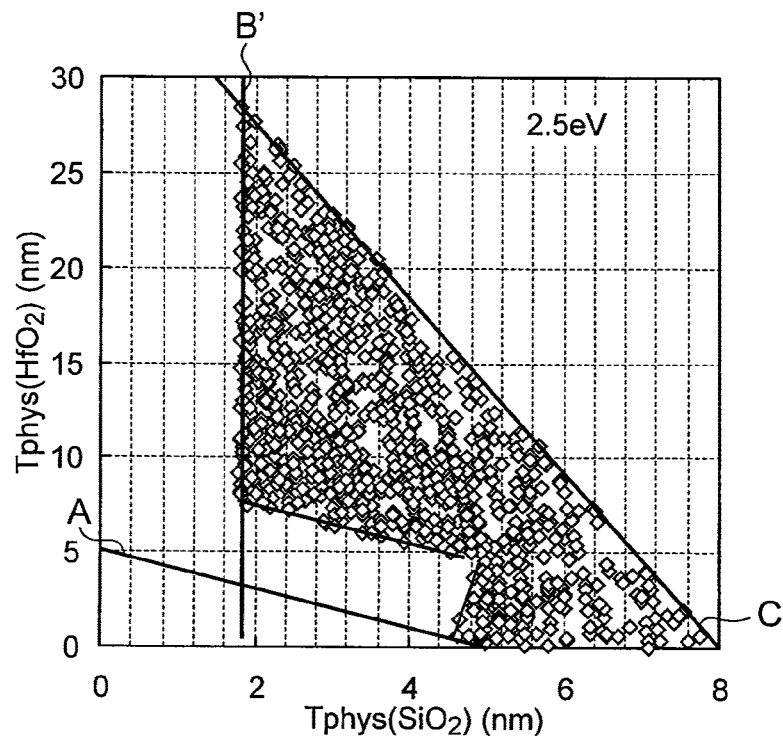
FIGS. 20A to 20I show the ranges of physical film thicknesses of the $SiO_2$ layer and the $HfO_2$ layer of the tunnel insulating film according to an embodiment.
Figure 20B:
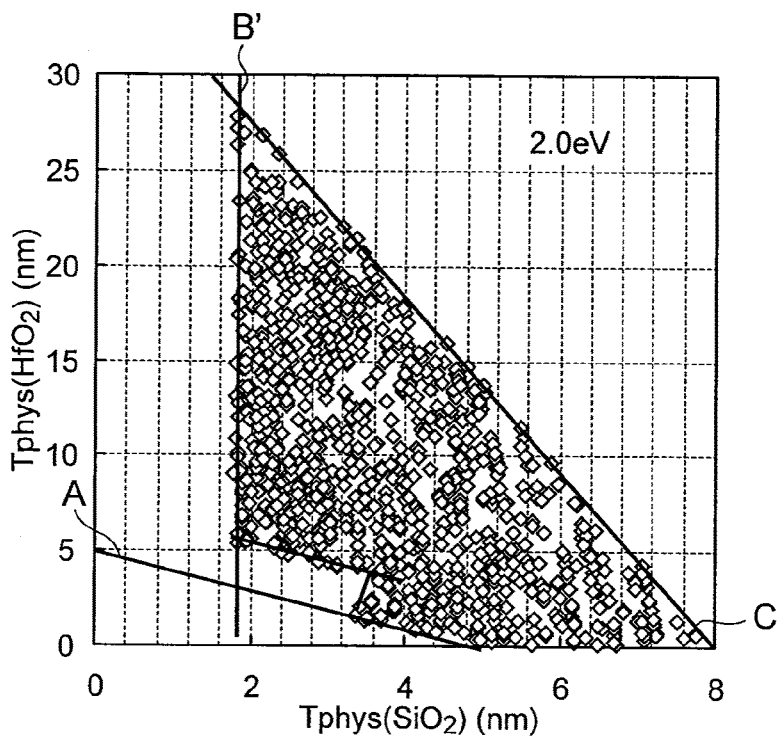
Figure 20C:
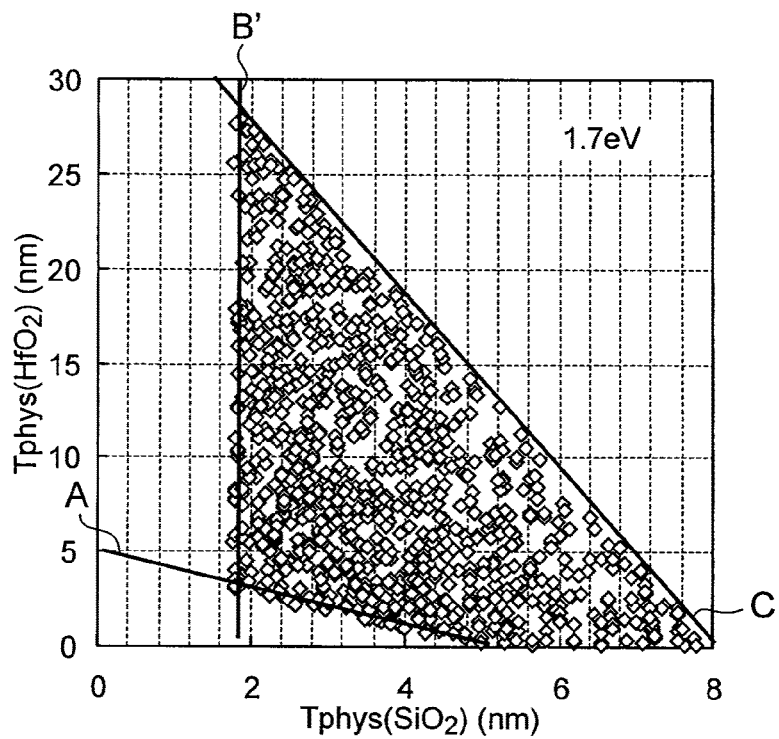
Figure 20D:
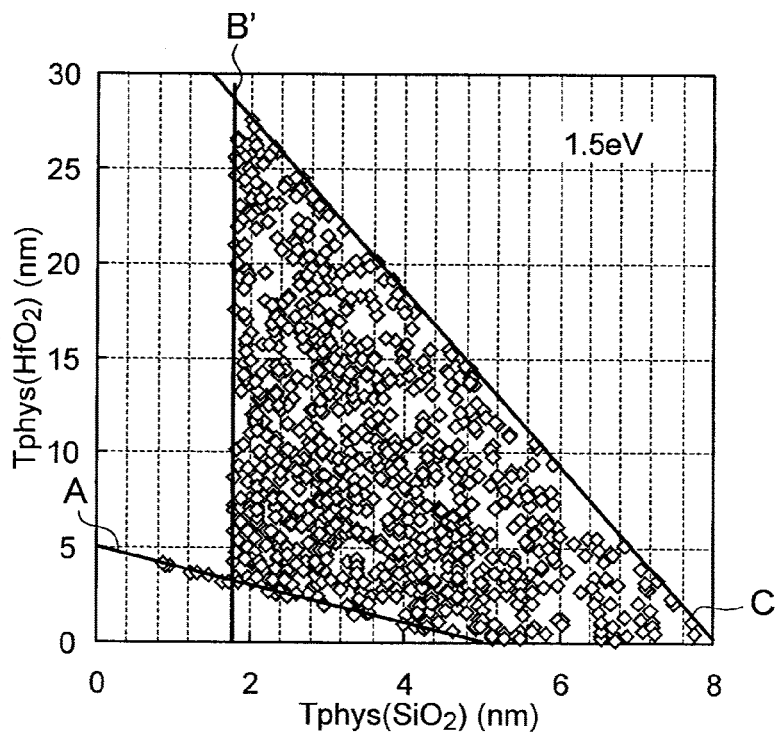
Figure 20E:
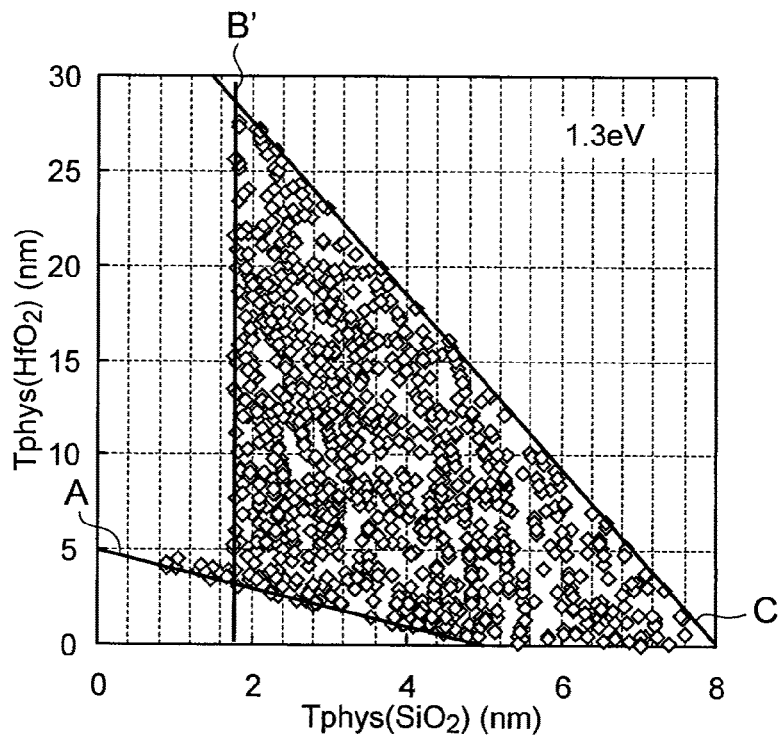
Figure 20F:
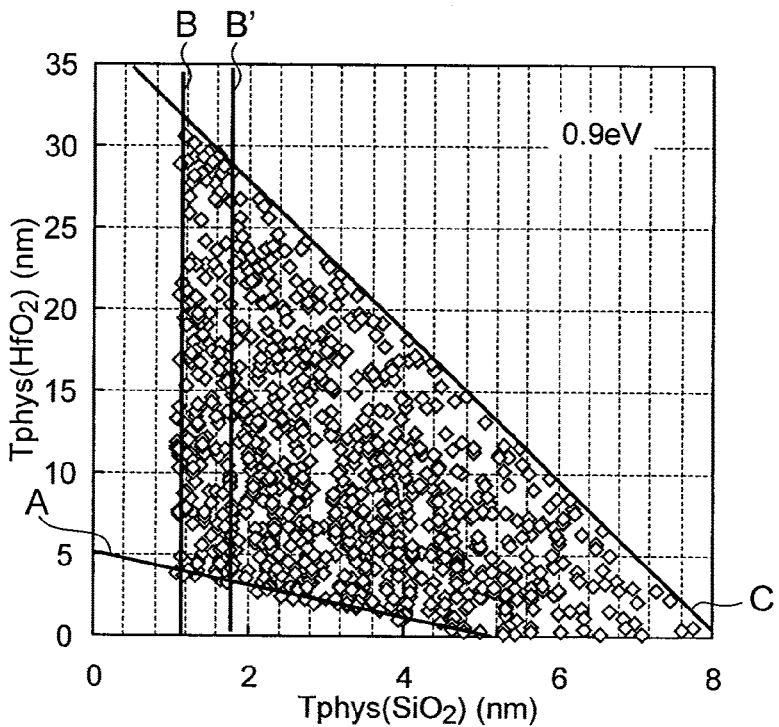
Figure 20G:
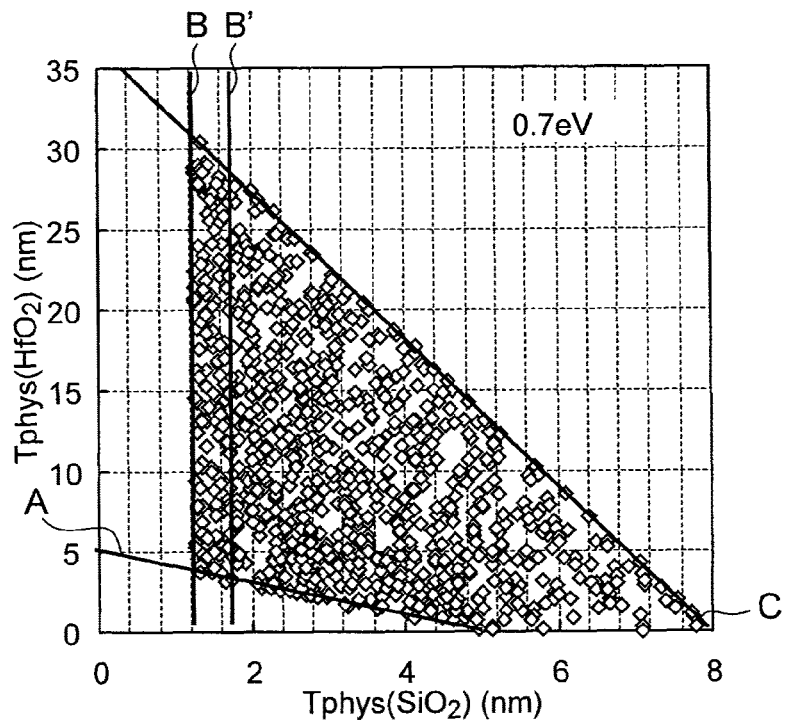
Figure 20H:
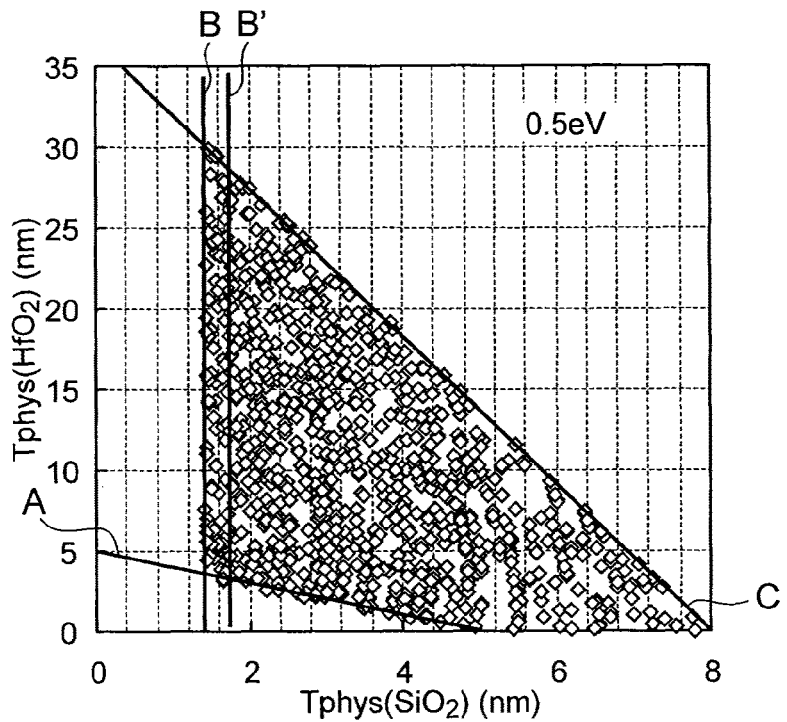
Figure 20I:
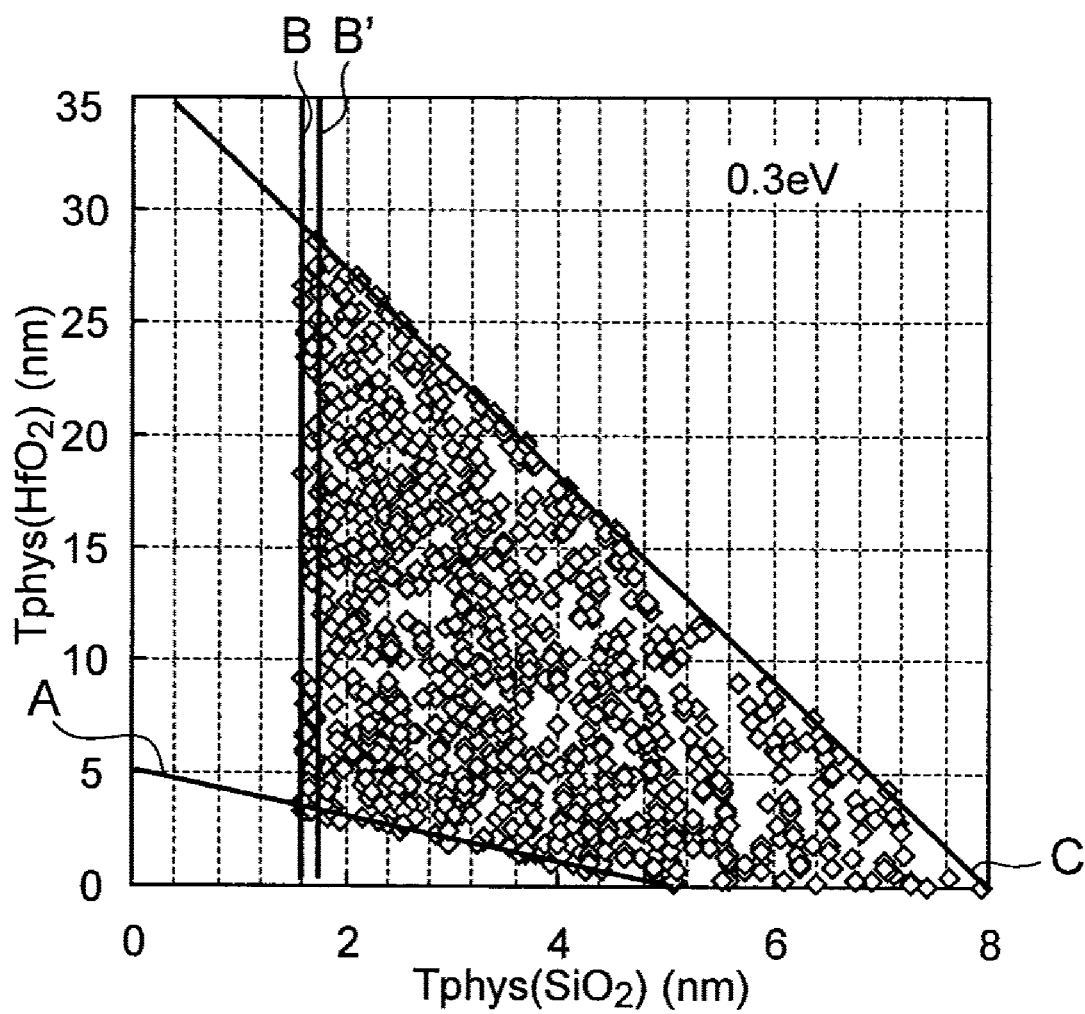

In the above description, Ge is added as a method of forming the assist level. However, it is possible to form the assist level with an element other than Ge, such as P, As, B, Sb, F, Cl, Br, I, At, or H, as shown in FIGS. 19A to 19C. With such an element, a different assist level from the assist level of 1.1 eV of the first embodiment can be formed. As can be seen from FIGS. 19A to 19C, in the cases of some elements, surplus electron levels might be formed in the gap. Therefore, it is necessary to select a suitable element from the above mentioned additive elements in accordance with the specification of the device, with the leakage characteristics and trapping characteristics being taken into consideration.

(Remarks on High-k Layer)

Figure 23:
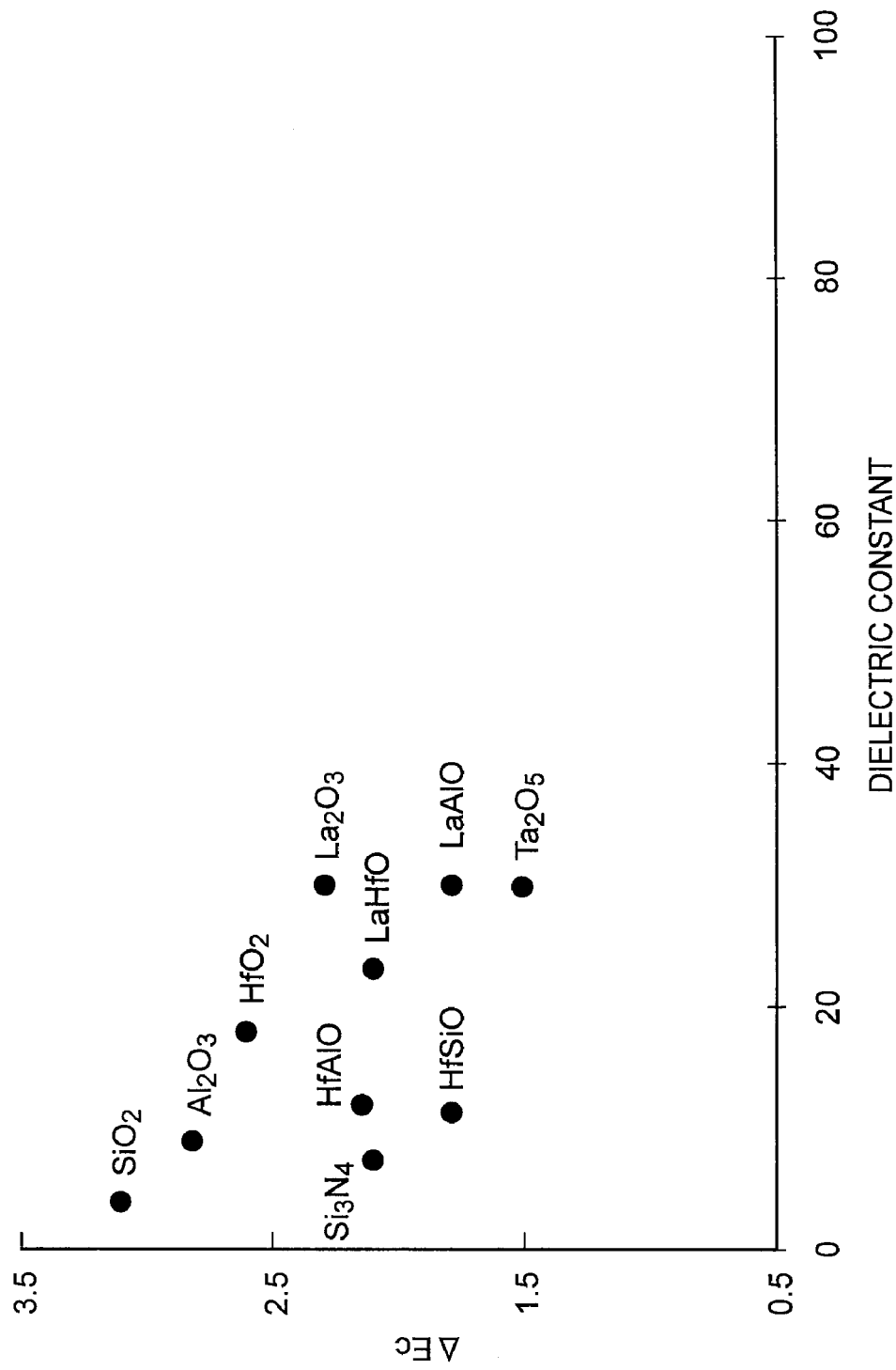
FIG. 23 shows graphs illustrating the dielectric constants and the band offsets $\Delta Ec$ of various insulating films.

Although the high-k layer has been described as a $HfO_2$ layer, the same effects as above can be achieved with some other high-k layer. Examples of high-k layers are shown in FIG. 22 (as disclosed by J. Robertson in J. Vac. Sci. Technol. B, 18, 1785 (2000), G. Yu, et al., in Appl. Phys. Lett. 81, 376 (2002), G. D. Wilk, et al, in Symp. VLSI Tech. Dig. 88 (2002), G. Seguini, et al., in Appl. Phys. Lett. 88, 202903 (2006), and A. Dimouslas, et al., in Appl. Phys. Lett. 85, 3205 (2004), for example). FIG. 23 shows the relationship, in a plotted fashion, between the dielectric constant of each of those high-k layers and the band offset $\Delta E_c$. The band offset $\Delta E_c$ is the difference between the lower end $E_c$ of the conduction band of the Si substrate and the lower end $E_c$ of the conduction band of the high-k layer, and is equivalent to the electron barrier height in the tunnel insulating film.

$Al_2O_3$ Layer

FIGS. 24A to 24M show the ranges of the physical film thicknesses of tunnel insulating films that satisfy the requirements defined in an embodiment of the present invention with various assist levels. In each of the tunnel insulating films, an $Al_2O_3$ layer is selected as the high-k layer while a $SiO_2$ layer is selected as the low-k layer, and the $Al_2O_3$ layer and the $SiO_2$ layer are stacked to form the tunnel insulating film.

Figure 24A:
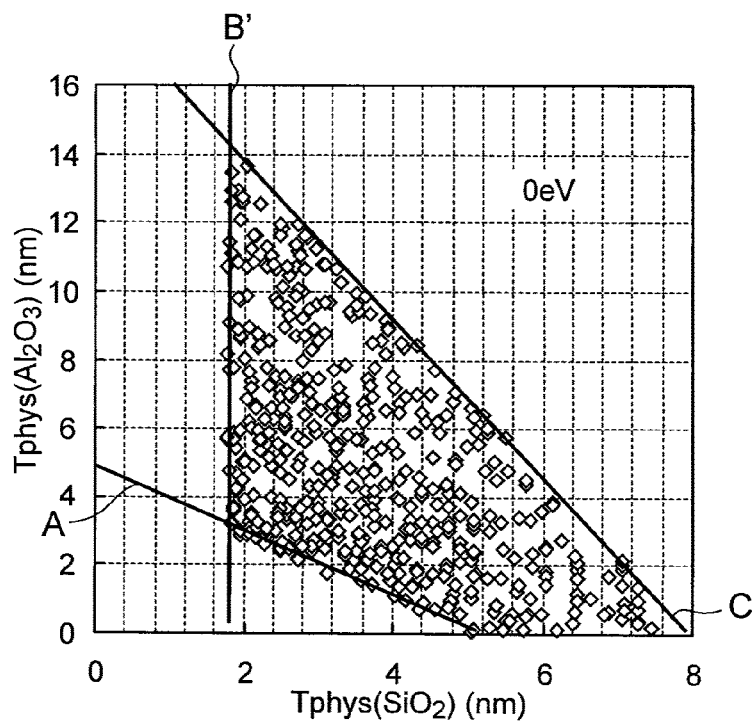
FIGS. 24A to 24M show the ranges of physical film thicknesses of the $SiO_2$ layer and an $Al_2O_3$ layer of the tunnel insulating film according to an embodiment.
Figure 24B:
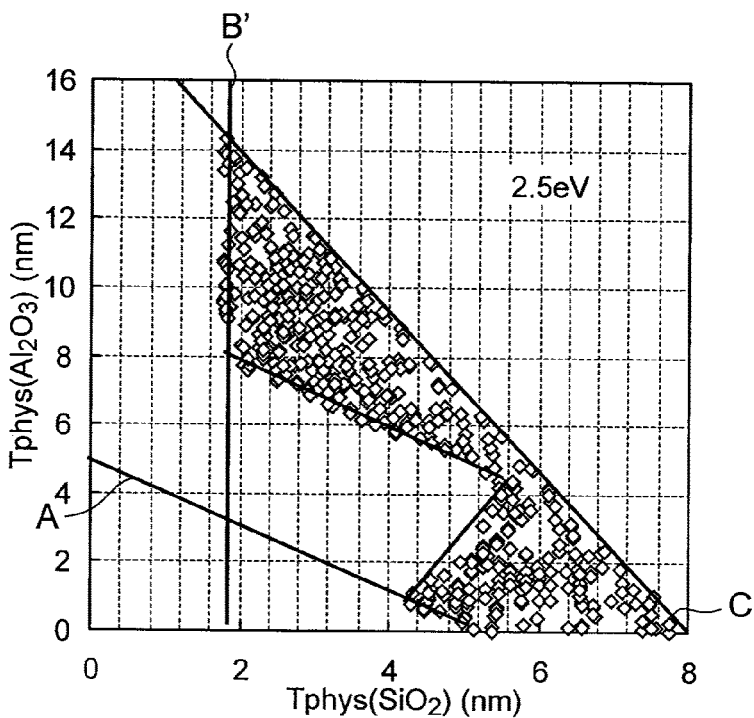
Figure 24C:
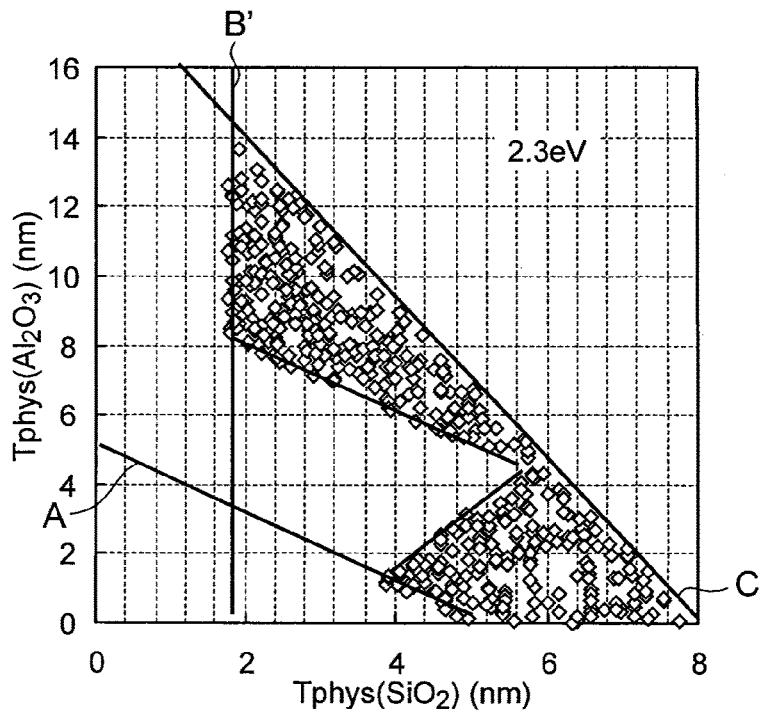
Figure 24D:
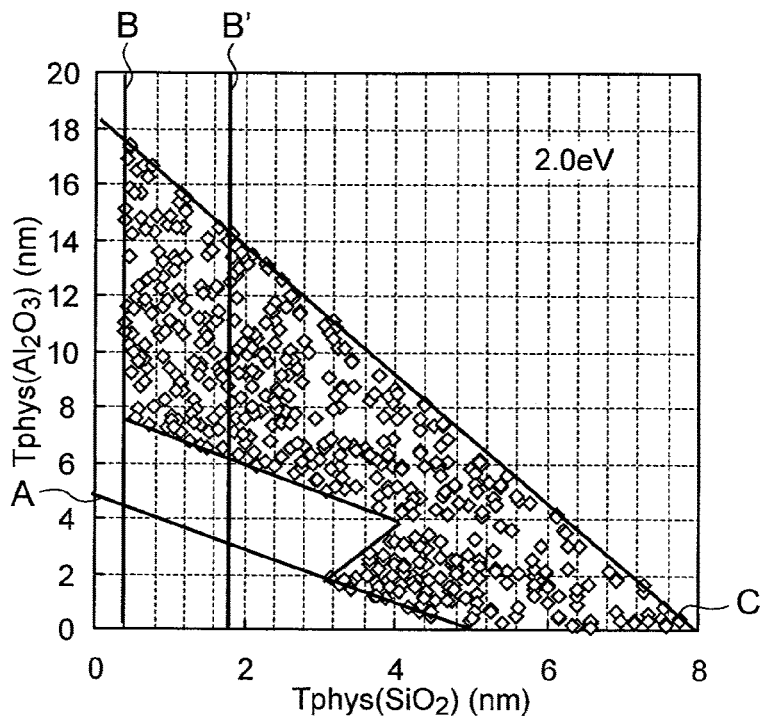
Figure 24E:
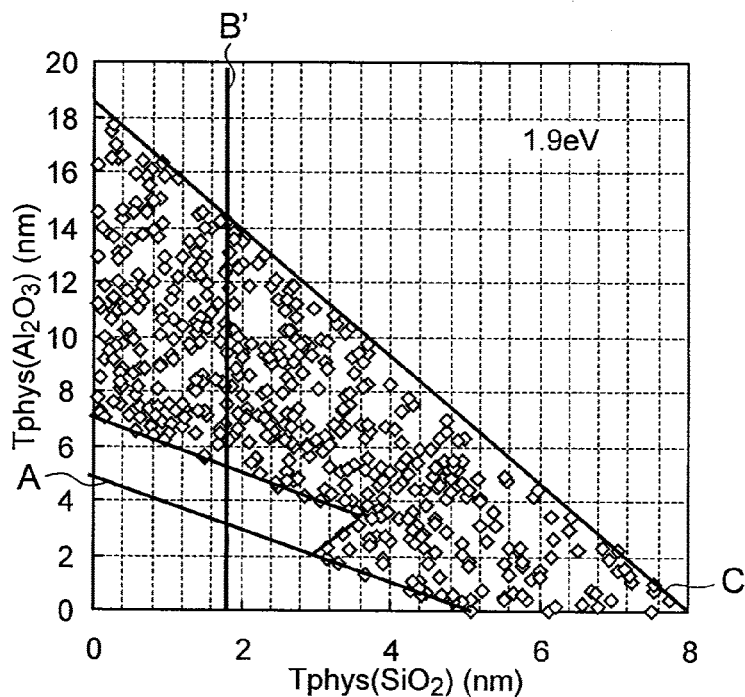
Figure 24F:
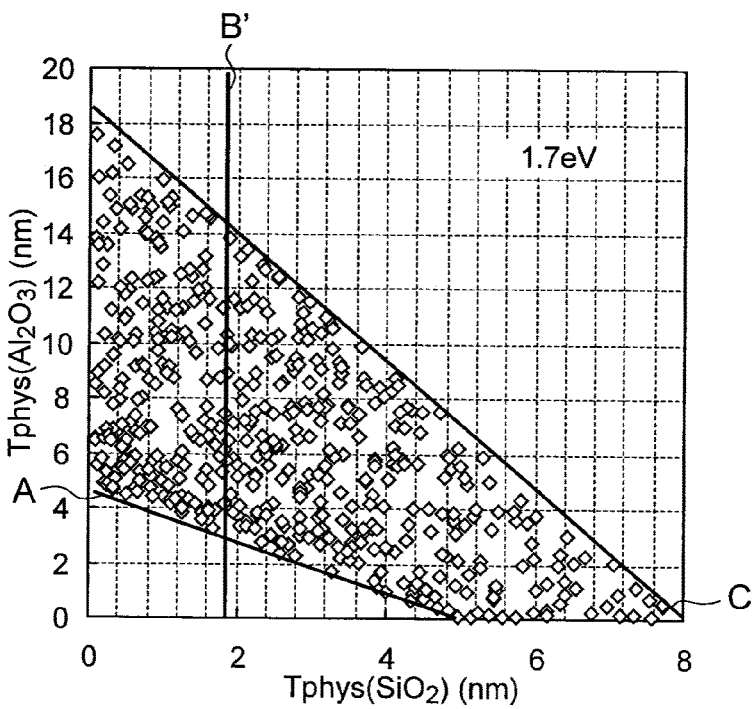
Figure 24G:
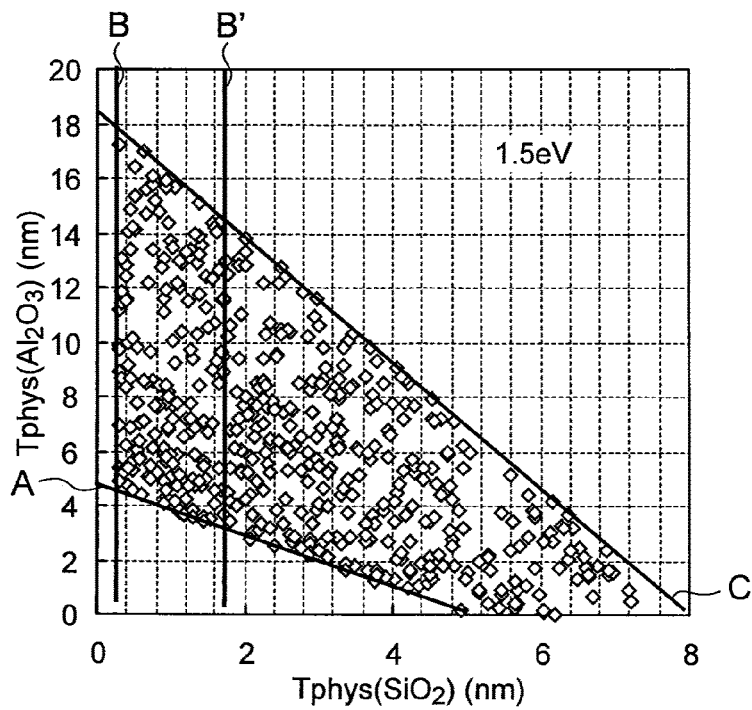
Figure 24H:
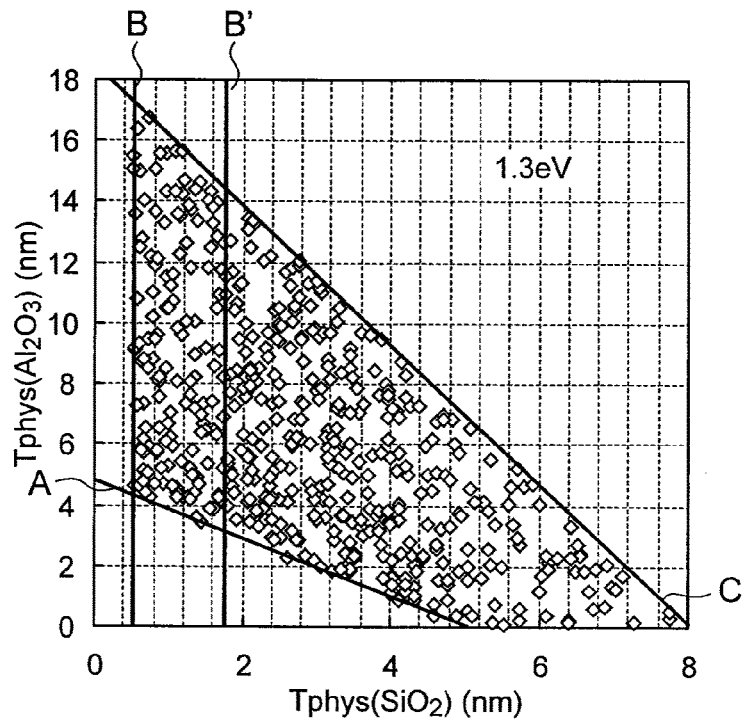
Figure 24I:
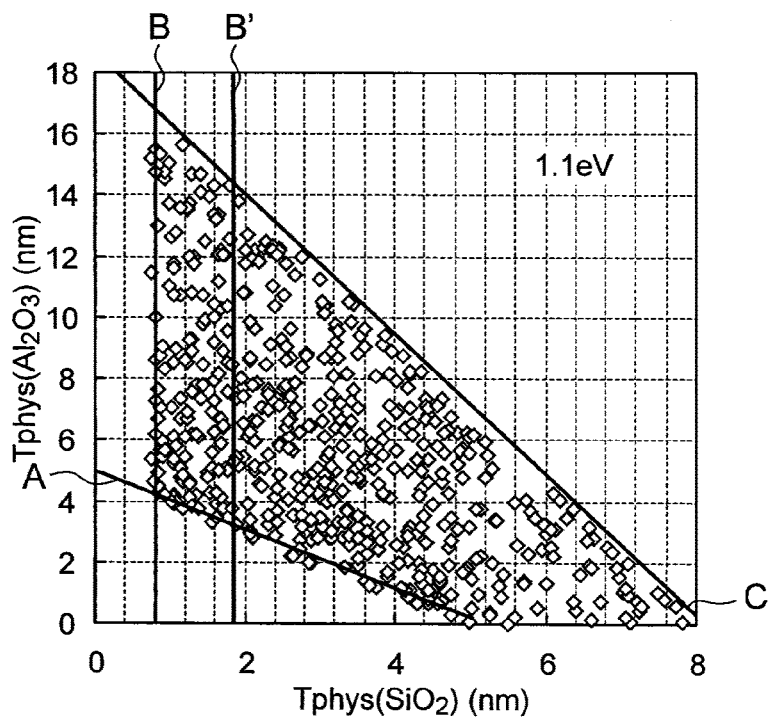
Figure 24J:
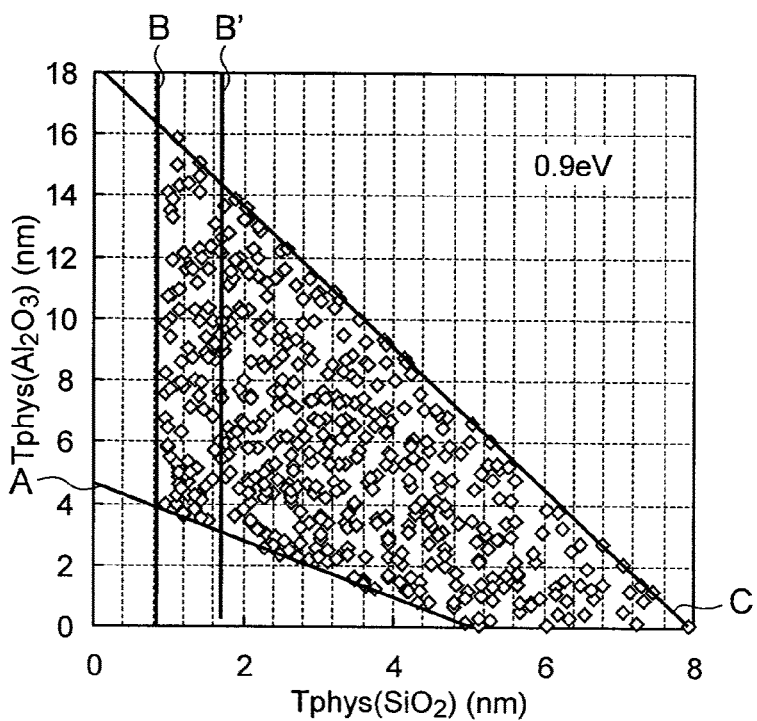
Figure 24K:
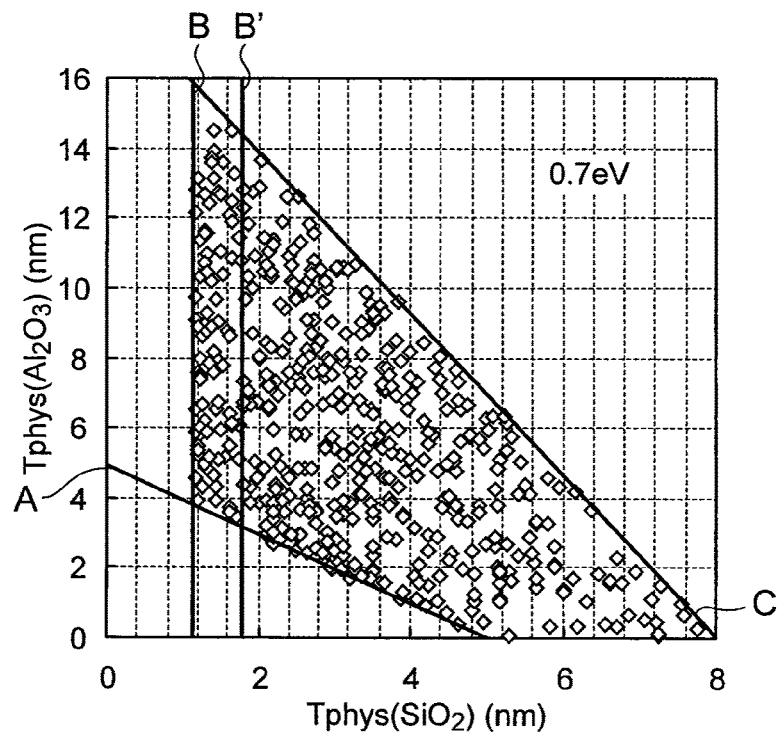
Figure 24L:
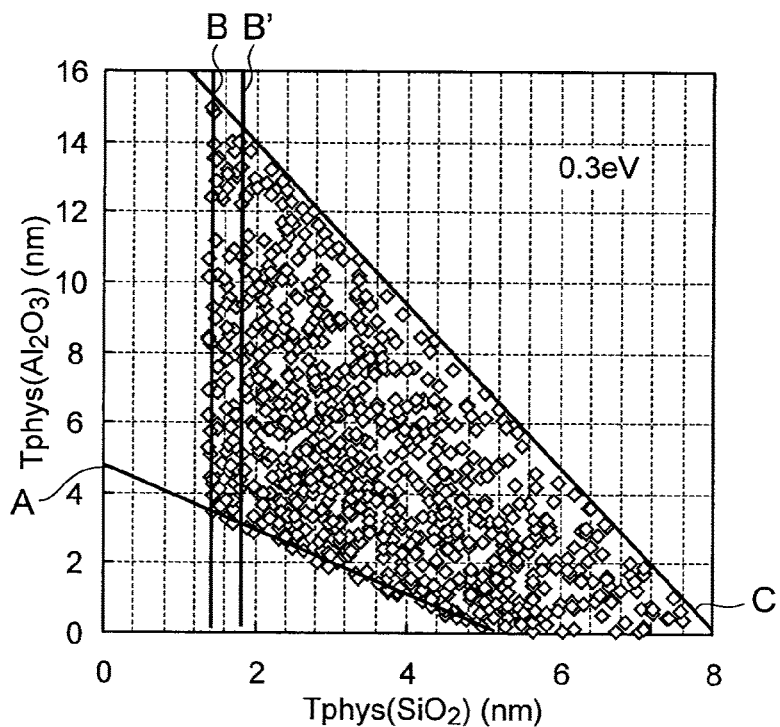
Figure 24M:
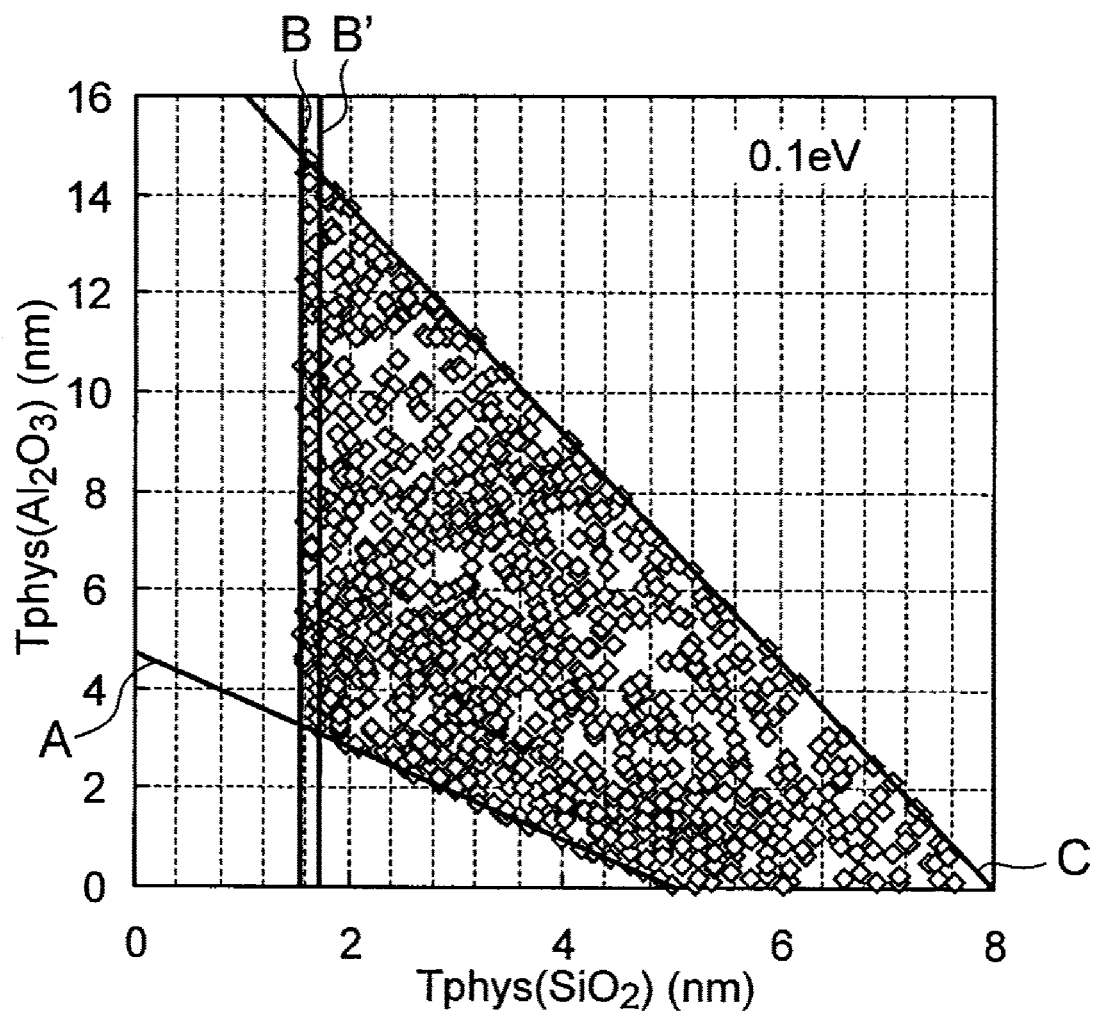
Figure 25:
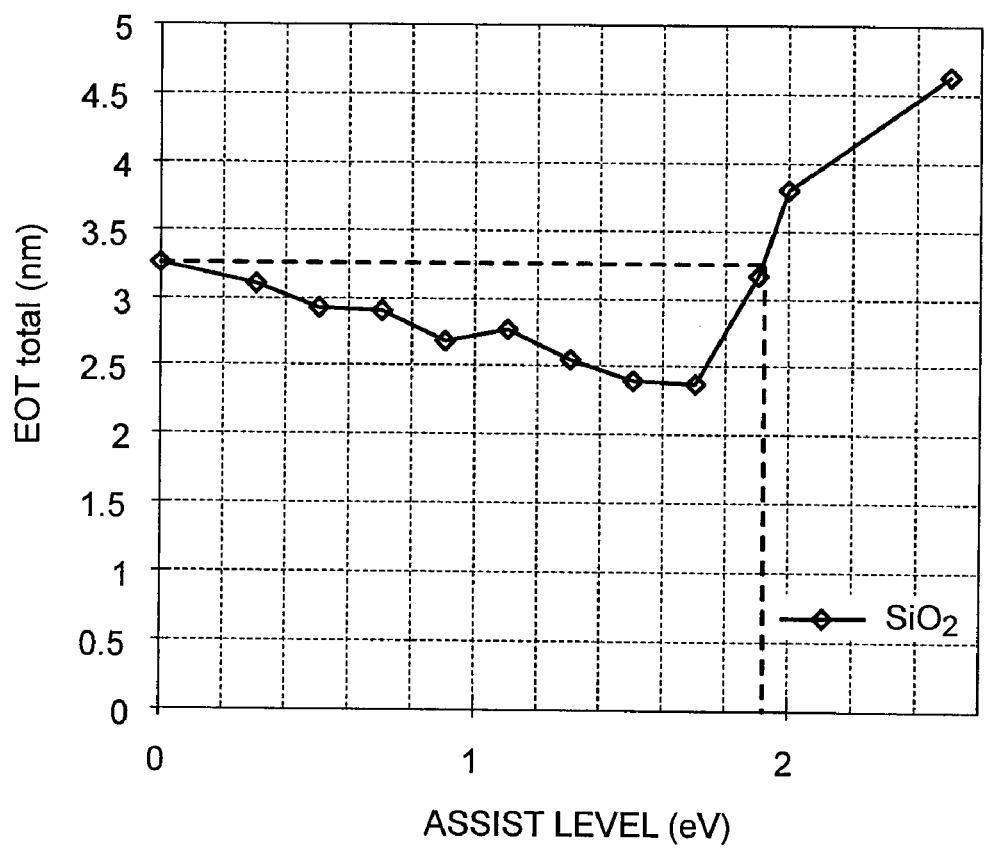
FIG. 25 shows the dependence of the EOT of the tunnel insulating film on the assist level according to the embodiment.
Figure 26A:
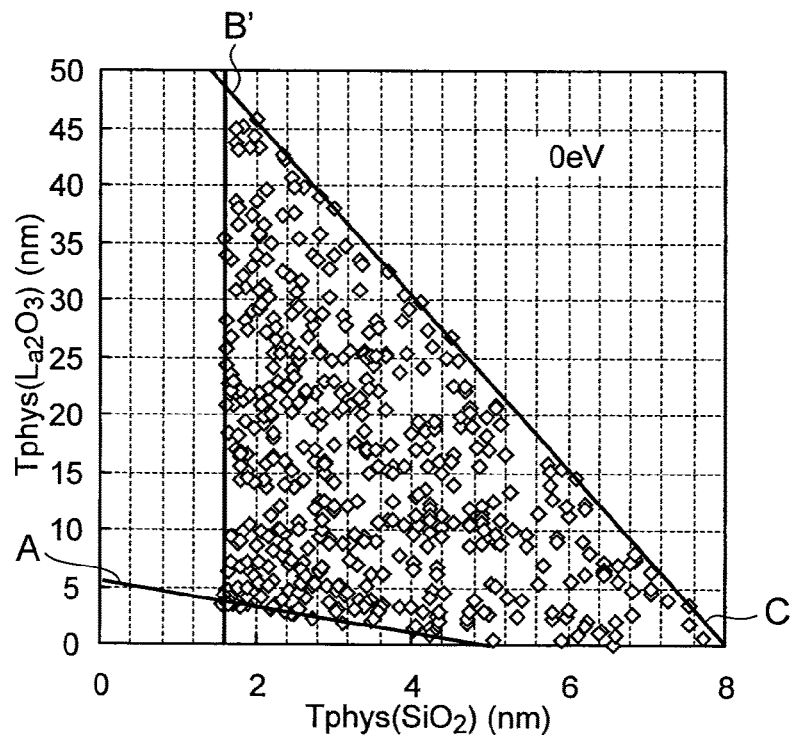
FIGS. 26A to 26K show the ranges of physical film thicknesses of the $SiO_2$ layer and a $La_2O_3$ layer of the tunnel insulating film according to an embodiment.
Figure 26B:
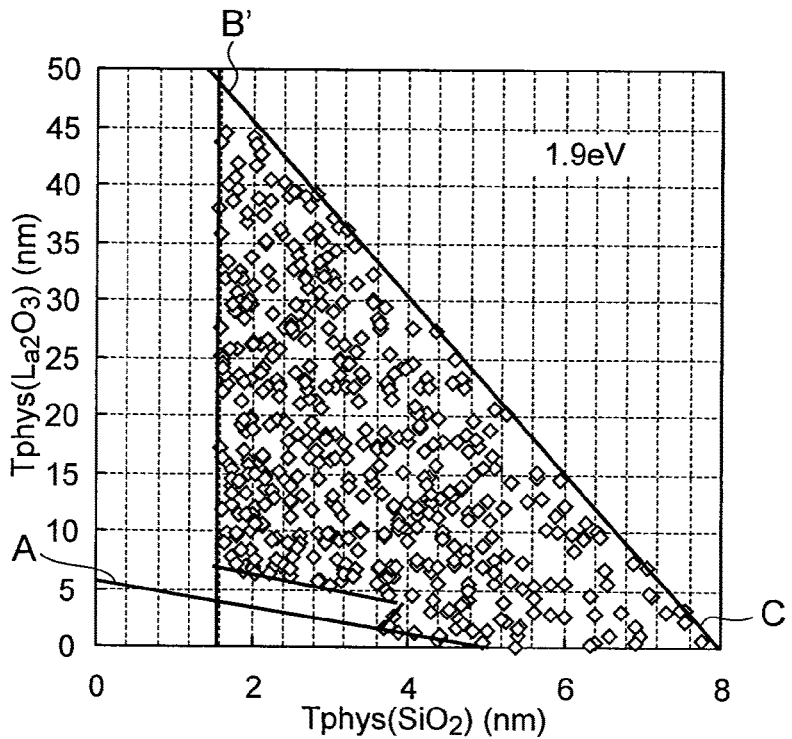
Figure 26C:
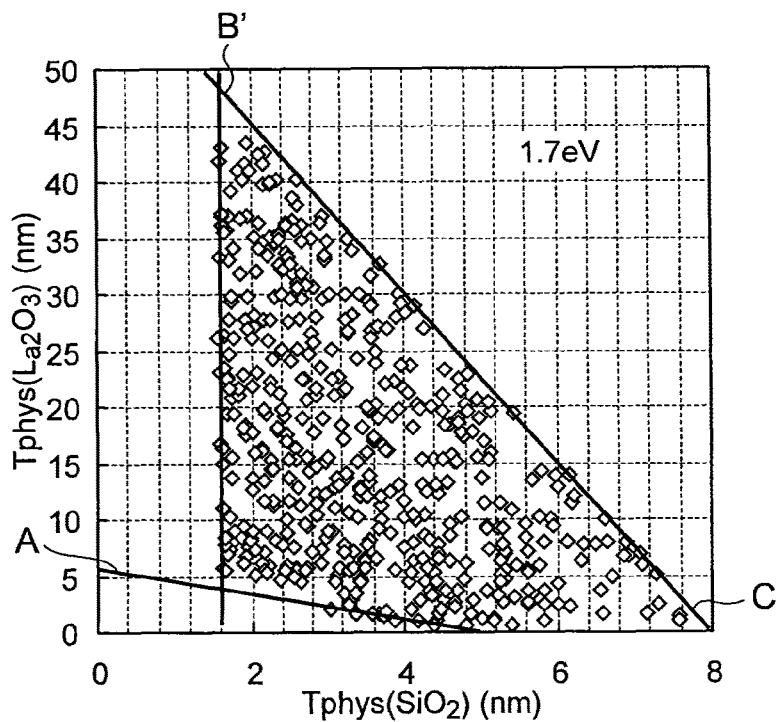
Figure 26D:
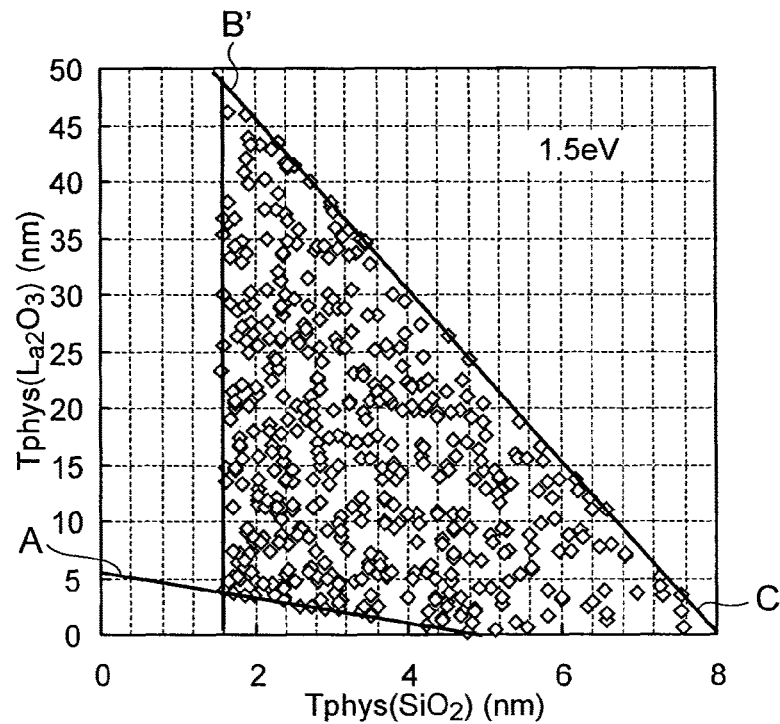
Figure 26E:
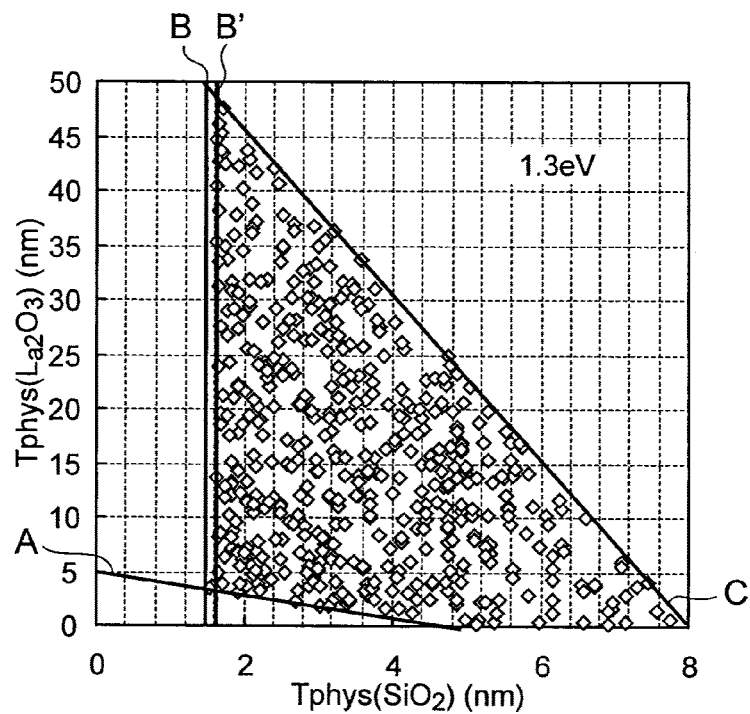
Figure 26F:
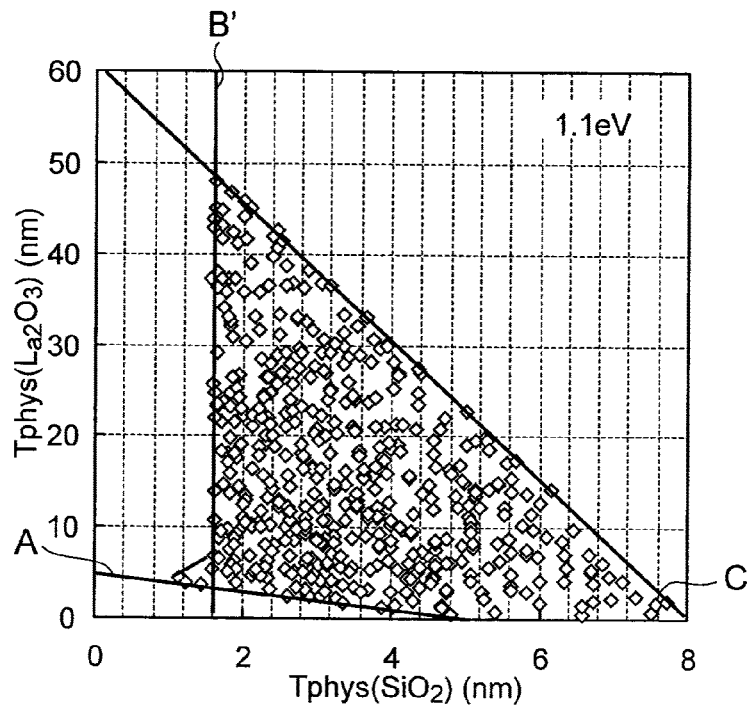
Figure 26G:
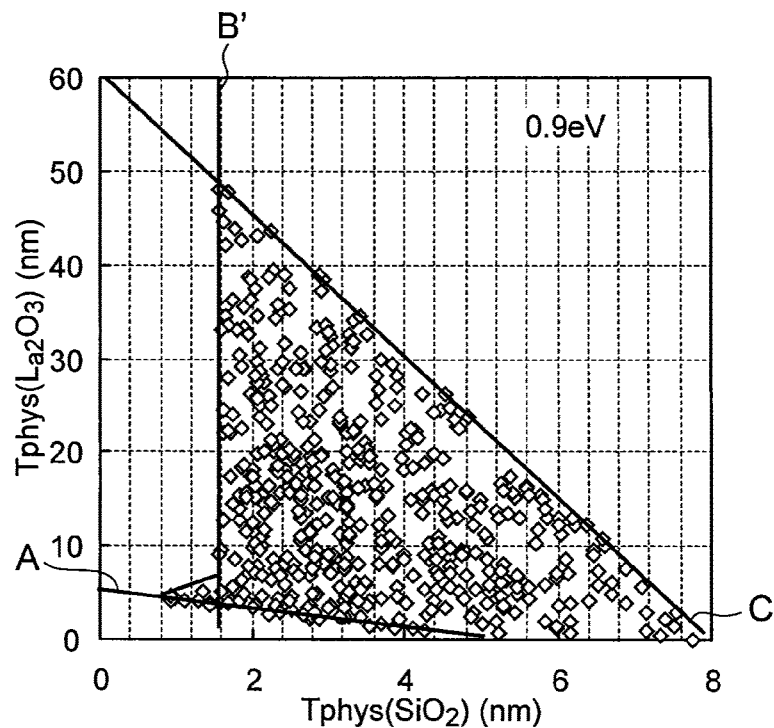
Figure 26H:
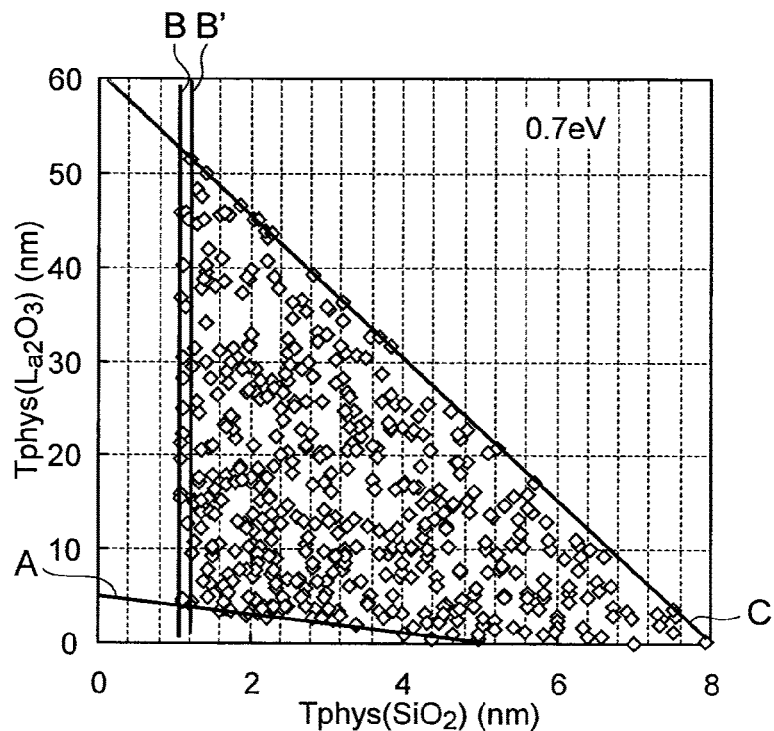
Figure 26I:
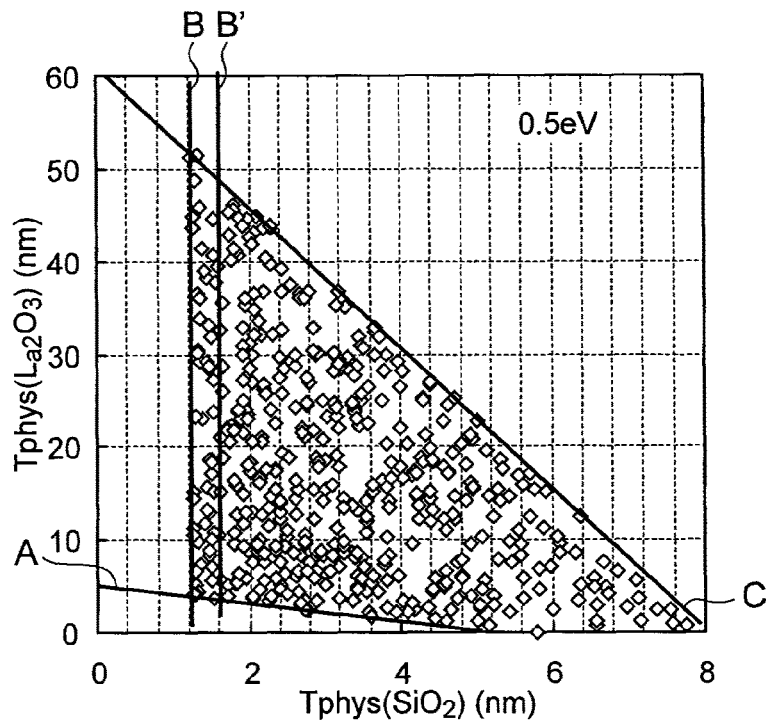
Figure 26J:
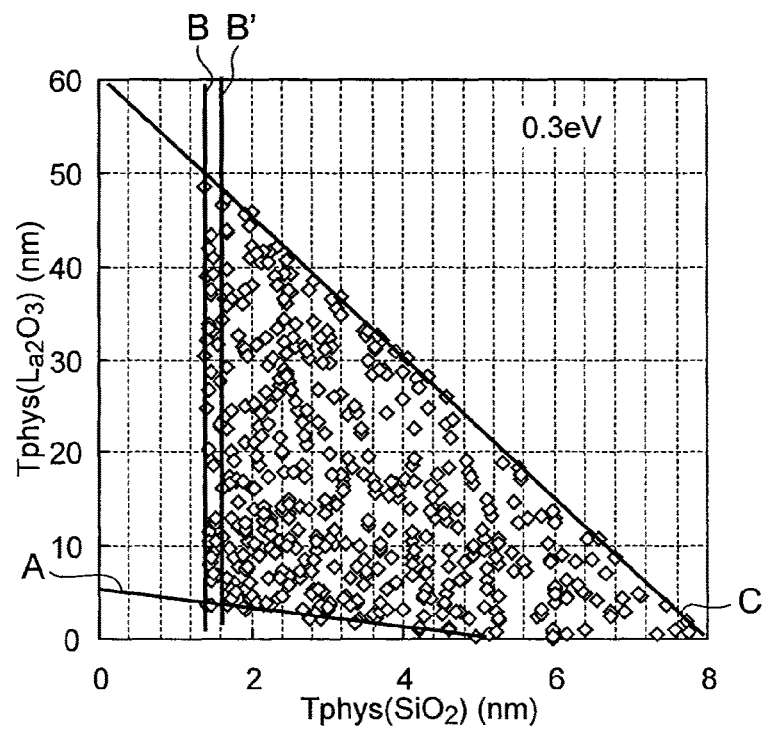
Figure 26K:
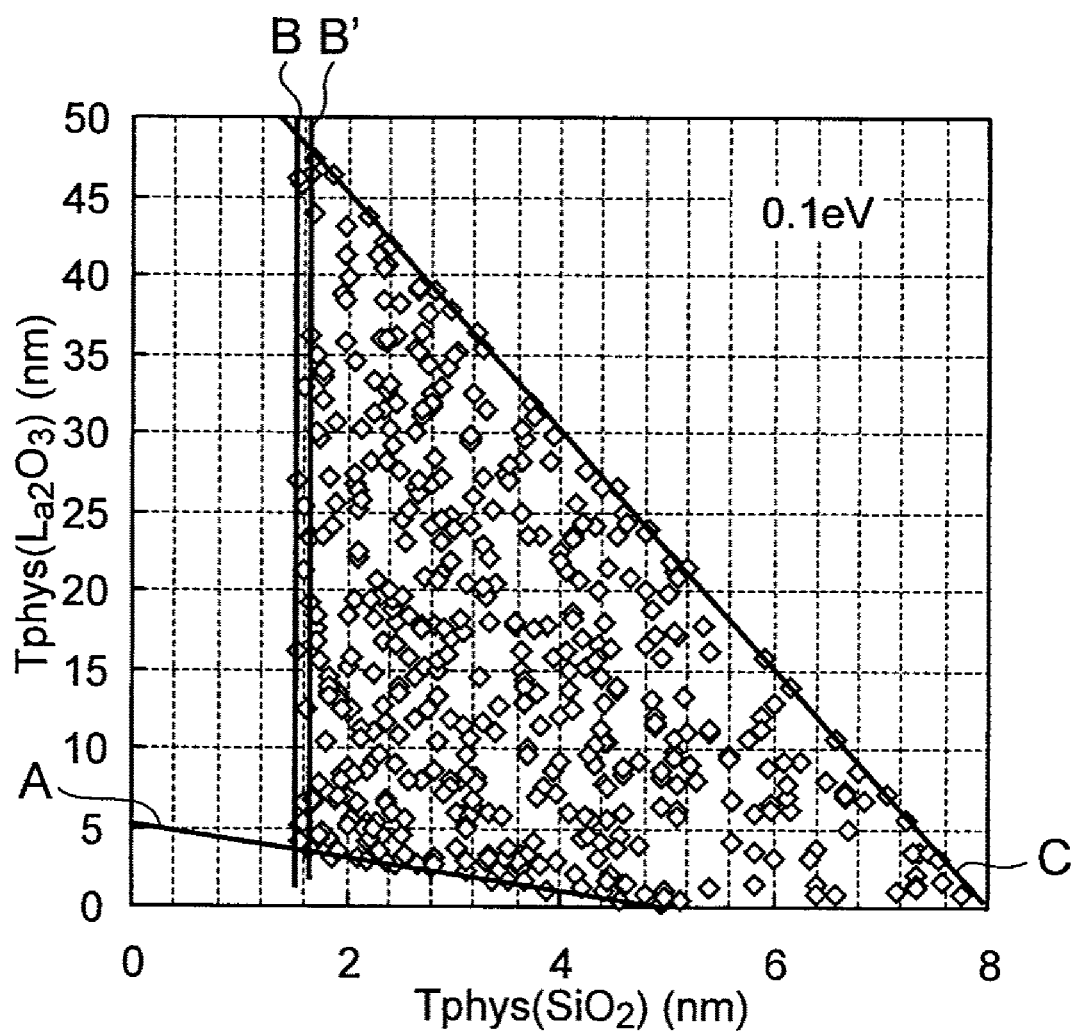

FIGS. 24A to 24M concerns the cases where the assist level of the $Al_2O_3$ layer is 0 eV (the assist level does not exist), 2.5 eV, 2.3 eV, 2.0 eV, 1.9 eV, 1.7 eV, 1.5 eV, 1.3 eV, 1.1 eV, 0.9 eV, 0.7 eV, 0.3 eV, and 0.1 eV, respectively. FIG. 25 shows the relationship between each of those assist levels and the EOT of the tunnel insulating film. As can be seen from FIG. 25, in a case where an $Al_2O_3$ layer is selected as the high-k layer, it is preferable that the assist level is larger than 0 eV but equal to or smaller than 1.9 eV, and more preferable that the assist level is in the range of 0.1 eV to 1.9 eV. When the assist level exists in the $Al_2O_3$ layer, the layer thickness of the low-k layer (the value at the intersection between the straight line B and the abscissa axis) can be made smaller than the layer thickness the low-k layer needs to have when the assist level does not exist (the value at the intersection between the straight line B' and the abscissa axis) (FIGS. 24D to 24L). If the $Al_2O_3$ layer does not have the assist level, the layer thickness of the $SiO_2$ layer needs to be 1.83 nm (FIG. 24A). However, if the assist level in the $Al_2O_3$ layer is in the range of 1.7 eV to 1.9 eV, the tunnel insulating film can be formed only with the $Al_2O_3$ layer, without a $SiO_2$ layer (FIGS. 24E and 24F). Although a $SiO_2$ layer is used as the low-k layer in the above cases, a SiN (silicon nitride) layer can also be used as the low-k layer as opposed to an $Al_2O_3$ layer, as SiN has a lower dielectric constant than $Al_2O_3$. In the above description, the low-k layer is a $SiO_2$ layer, and the high-k layer is an $Al_2O_3$ layer. However, also in a case where the low-k layer is a silicon oxide layer and the high-k layer is an alumina (AlO) layer, the same effects as above can be achieved, as long as the assist level falls into the above described range.

$La_2O_3$ Layer

FIGS. 26A to 26K show the ranges of the physical film thicknesses of tunnel insulating films that satisfy the requirements defined in an embodiment of the present invention with various assist levels. In each of the tunnel insulating films, a $La_2O_3$ layer is selected as the high-k layer while a $SiO_2$ layer is selected as the low-k layer, and the $La_2O_3$ layer and the $SiO_2$ layer are stacked to form the tunnel insulating film.

Figure 27:
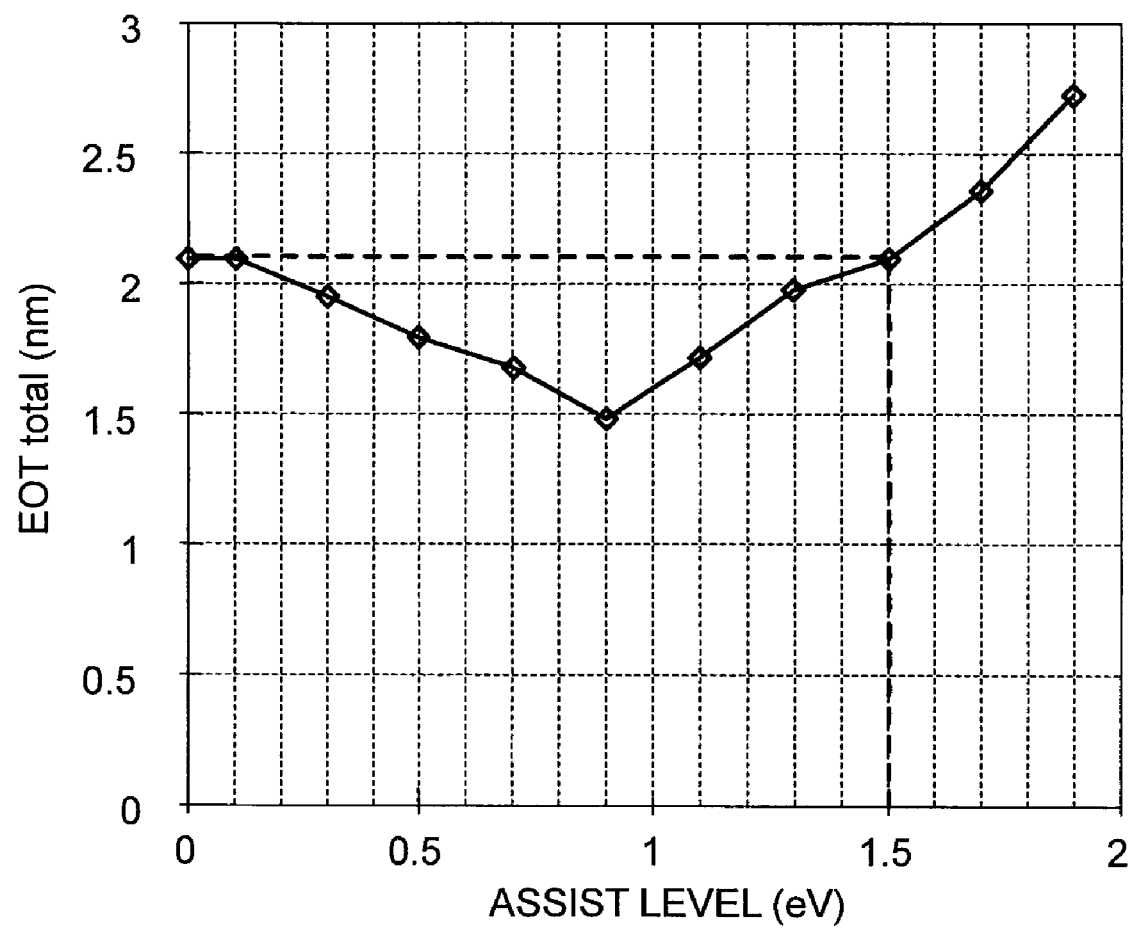
FIG. 27 shows the dependence of the EOT of the tunnel insulating film on the assist level according to the embodiment.

FIGS. 26A to 26K concerns the cases where the assist level of the $La_2O_3$ layer is 0 eV (the assist level does not exist), 1.9 eV, 1.7 eV, 1.5 eV, 1.3 eV, 1.1 eV, 0.9 eV, 0.7 eV, 0.5 eV, 0.3 eV, and 0.1 eV, respectively. FIG. 27 shows the relationship between each of those assist levels and the EOT of the tunnel insulating film. As can be seen from FIG. 27, in a case where a $La_2O_3$ layer is selected as the high-k layer, it is preferable that the assist level is equal to or larger than 0.1 eV but smaller than 1.5 eV, and more preferable that the assist level is in the range of 0.1 eV to 1.3 eV. When the assist level exists in the $La_2O_3$ layer, the layer thickness of the low-k layer (the value at the intersection between the straight line B and the abscissa axis) can be made smaller than the layer thickness the low-k layer needs to have when the assist level does not exist (the value at the intersection between the straight line B' and the abscissa axis) (FIGS. 26H to 26K). Although a $SiO_2$ layer is used as the low-k layer in this example, a SiN (silicon nitride) layer can also be used as the low-k layer as opposed to a $La_2O_3$ layer, as SiN has a lower dielectric constant than $La_2O_3$. In the above description, the low-k layer is a $SiO_2$ layer, and the high-k layer is a $La_2O_3$ layer. However, also in a case where the low-k layer is a silicon oxide layer and the high-k layer is a lanthanum oxide (LaO) layer, the same effects as above can be achieved, as long as the assist level falls into the above described range.

HfSiO Layer

FIGS. 28A to 28J show the ranges of the physical film thicknesses of tunnel insulating films that satisfy the requirements defined in an embodiment of the present invention with various assist levels. In each of the tunnel insulating films, a $HfSiO_4$ layer is selected as the high-k layer while a $SiO_2$ layer is selected as the low-k layer, and the $HfSiO_4$ layer and the $SiO_2$ layer are stacked to form the tunnel insulating film.

Figure 28A:
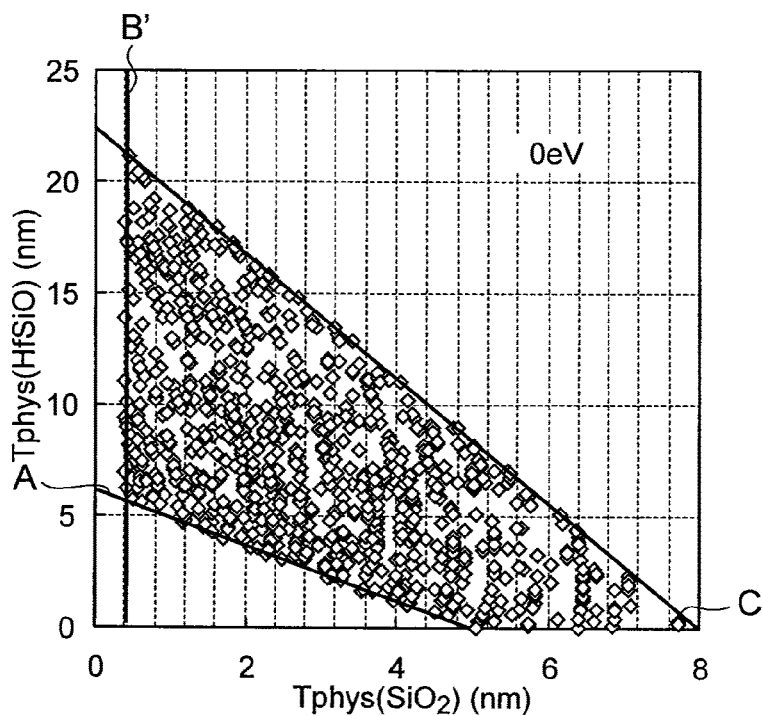
FIGS. 28A to 28J show the ranges of physical film thicknesses of the $SiO_2$ layer and a HfSiO layer of the tunnel insulating film according to an embodiment.
Figure 28B:
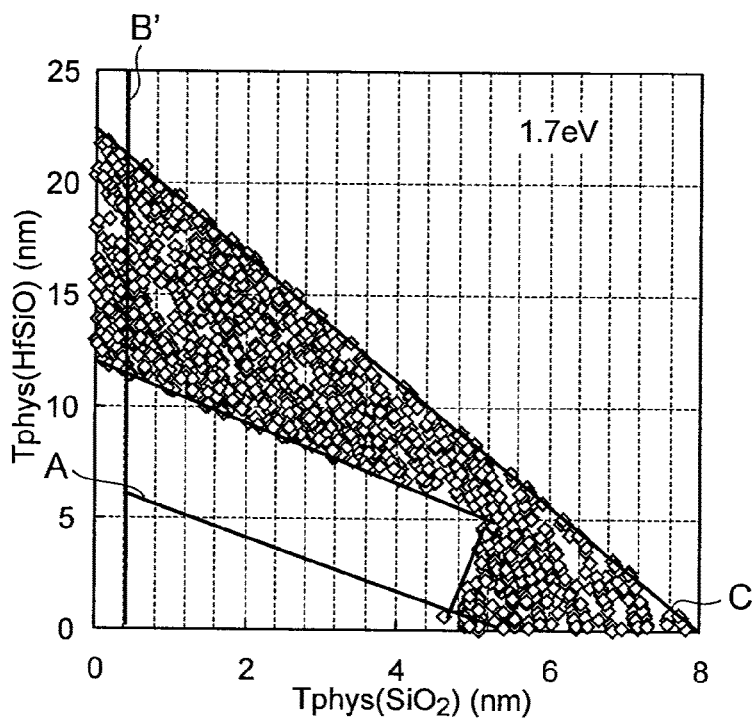
Figure 28C:
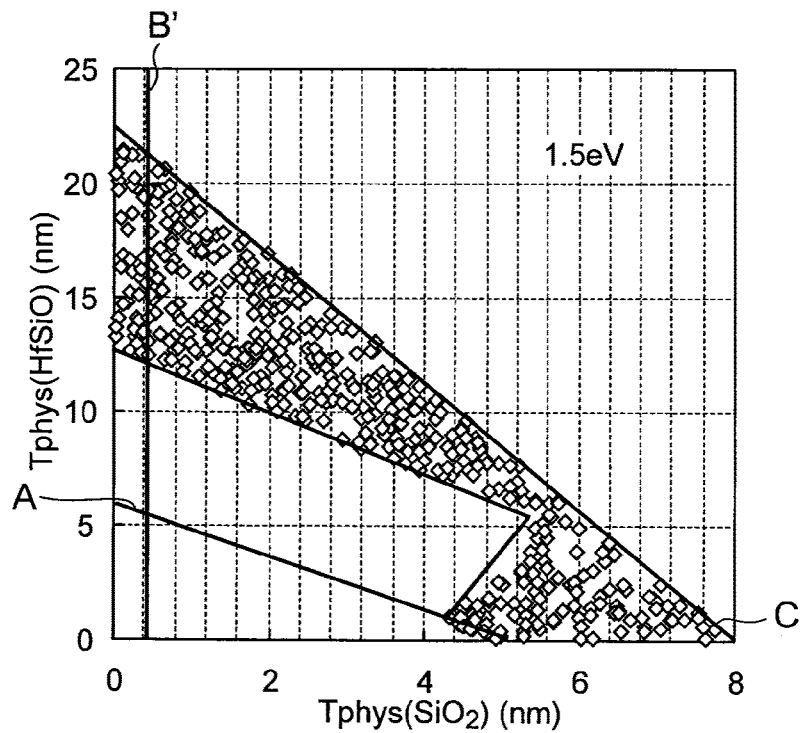
Figure 28D:
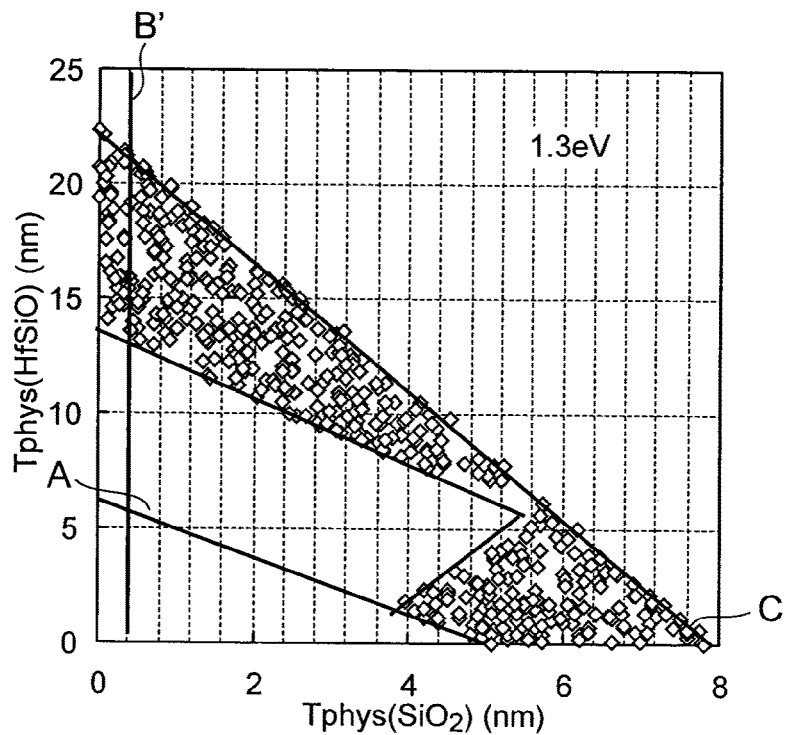
Figure 28E:
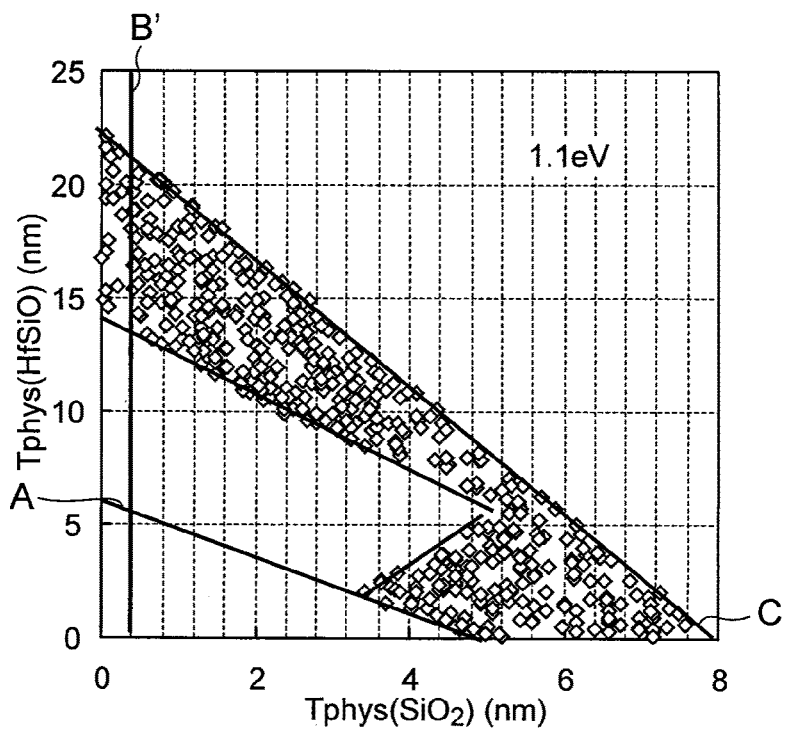
Figure 28F:
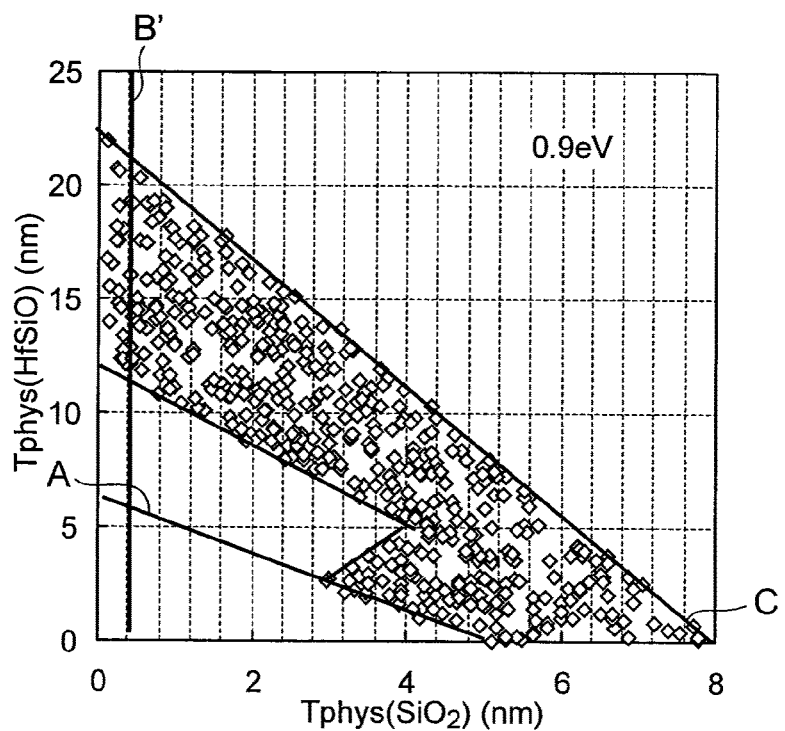
Figure 28G:
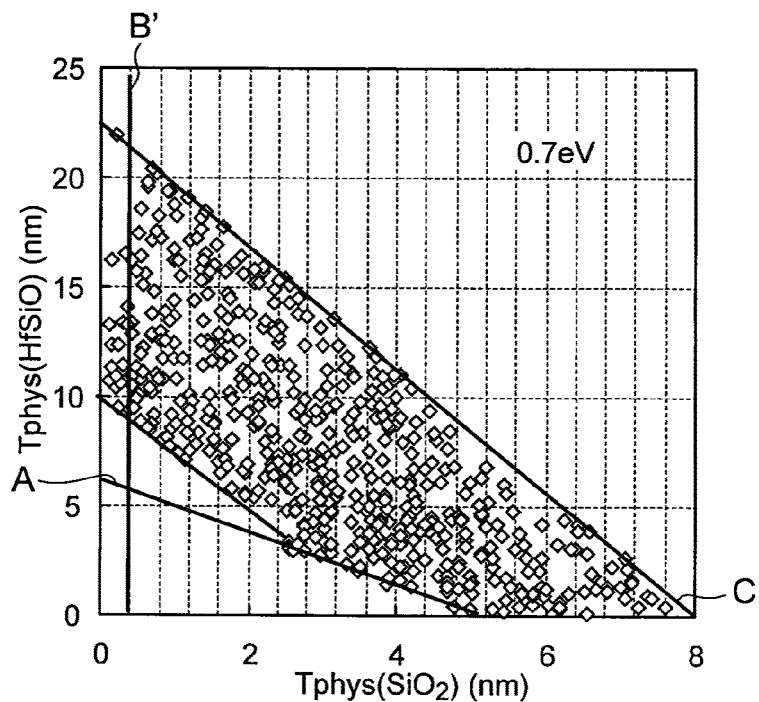
Figure 28H:
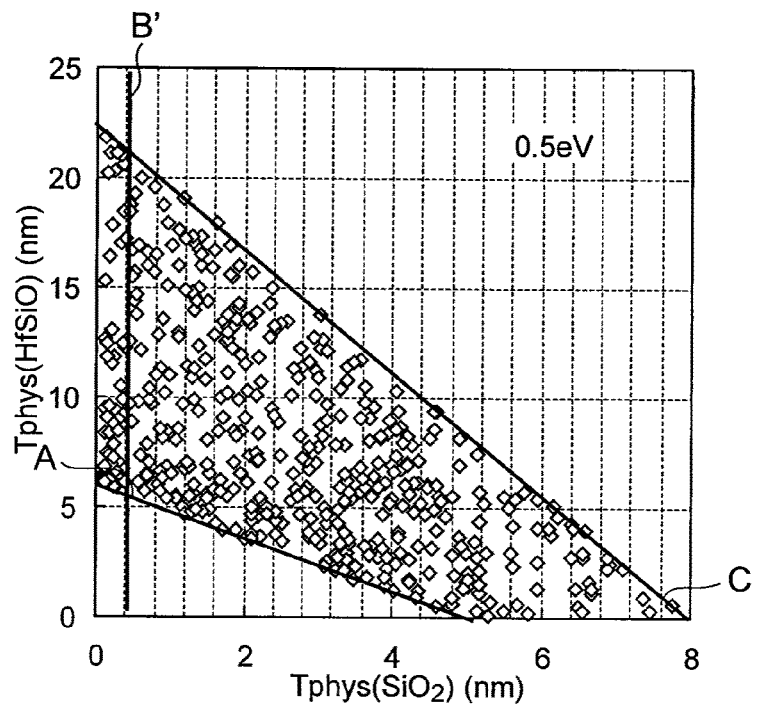
Figure 28I:
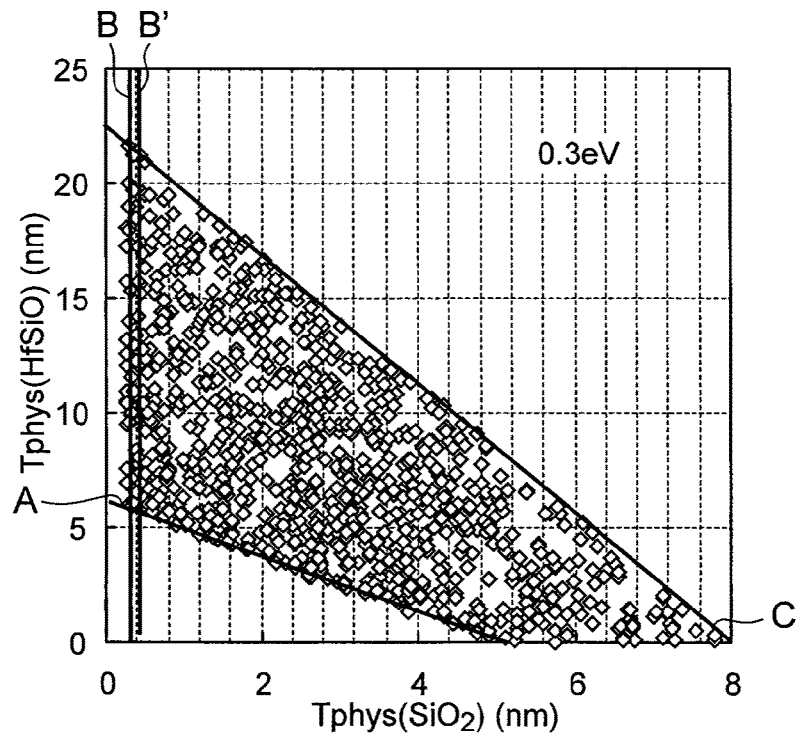
Figure 28J:
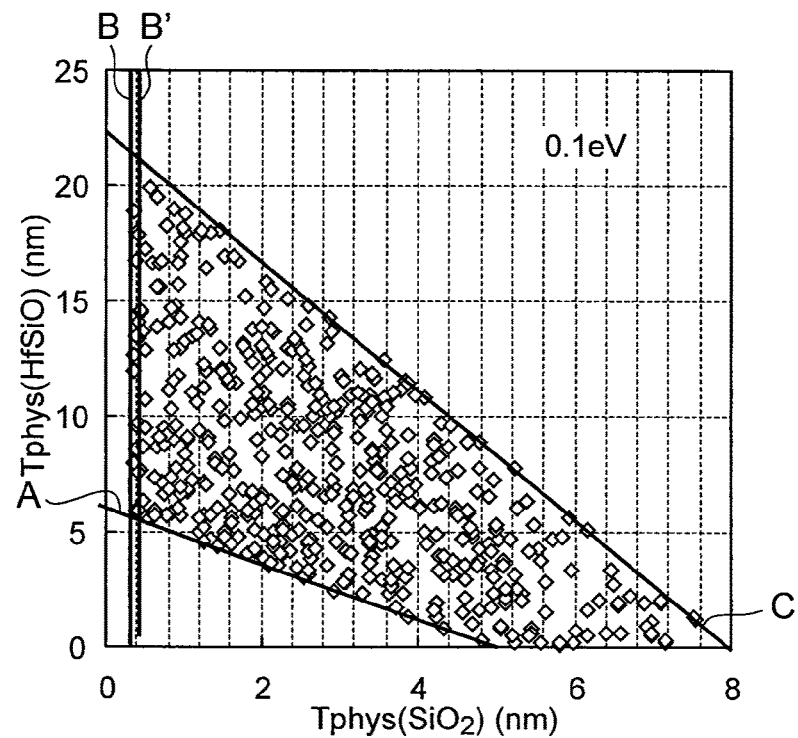
Figure 29:
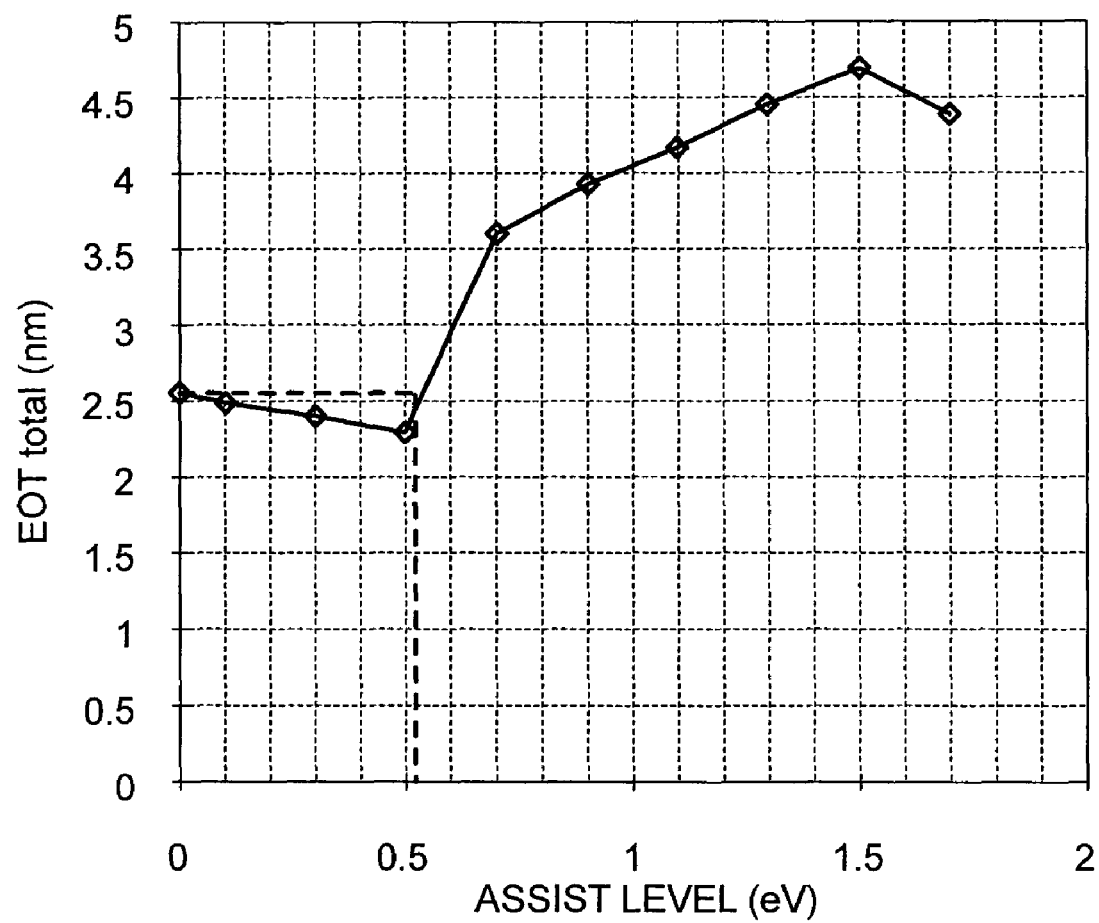
FIG. 29 shows the dependence of the EOT of the tunnel insulating film on the assist level according to the embodiment.

FIGS. 28A to 28J concerns the cases where the assist level of the $HfSiO_4$ layer is 0 eV (the assist level does not exist), 1.7 eV, 1.5 eV, 1.3 eV, 1.1 eV, 0.9 eV, 0.7 eV, 0.5 eV, 0.3 eV, and 0.1 eV, respectively. FIG. 29 shows the relationship between each of those assist levels and the EOT of the tunnel insulating film. As can be seen from FIG. 29, in a case where a $HfSiO_4$ layer is selected as the high-k layer, it is preferable that the assist level is larger than 0 eV but equal to or smaller than 0.5 eV, and more preferable that the assist level is in the range of 0.1 eV to 0.5 eV. When the assist level exists in the $HfSiO_4$ layer, the layer thickness of the low-k layer (the value at the intersection between the straight line B and the abscissa axis) can be made smaller than the layer thickness the low-k layer needs to have when the assist level does not exist (the value at the intersection between the straight line B' and the abscissa axis) (FIGS. 28A to 28J). If the $HfSiO_4$ layer does not have the assist level, the layer thickness of the $SiO_2$ layer needs to be 0.38 nm (FIG. 28A). However, if the assist level in the $HfSiO_4$ layer is 0.5 eV or deeper, the tunnel insulating film can be formed only with the $HfSiO_4$ layer, without a $SiO_2$ layer (FIGS. 28B to 28H). If the assist level deeper than 0.5 eV exists, the effect of making the EOT as thin as possible cannot be achieved. Although a $SiO_2$ layer is used as the low-k layer in this example, a SiN (silicon nitride) layer can also be used as the low-k layer as opposed to a $HfSiO_4$ layer, as SiN has a lower dielectric constant than $HfSiO_4$. In the above description, the low-k layer is a $SiO_2$ layer, and the high-k layer is a $HfSiO_4$ layer. However, also in a case where the low-k layer is a silicon oxide layer and the high-k layer is a hafnium silicate (HfSiO) layer, the same effects as above can be achieved, as long as the assist level falls into the above described range.

LaAlO Layer

FIGS. 30A to 30I show the ranges of the physical film thicknesses of tunnel insulating films that satisfy the requirements defined in an embodiment of the present invention with various assist levels. In each of the tunnel insulating films, a $LaAlO_3$ layer is selected as the high-k layer while a $SiO_2$ layer is selected as the low-k layer, and the $LaAlO_3$ layer and the $SiO_2$ layer are stacked to form the tunnel insulating film.

FIGS. 30A to 30I concerns the cases where the assist level of the $LaAlO_3$ layer is 0 eV (the assist level does not exist), 1.7 eV, 1.5 eV, 1.3 eV, 1.1 eV, 0.9 eV, 0.7 eV, 0.5 eV, and 0.3 eV, respectively. FIG. 31 shows the relationship between each of those assist levels and the EOT of the tunnel insulating film. As can be seen from FIG. 31, in a case where a $LaAlO_3$ layer is selected as the high-k layer, it is preferable that the assist level is larger than 0 eV but smaller than 1.0 eV, and more preferable that the assist level is in the range of 0.3 eV to 0.9 eV.

Figure 30A:
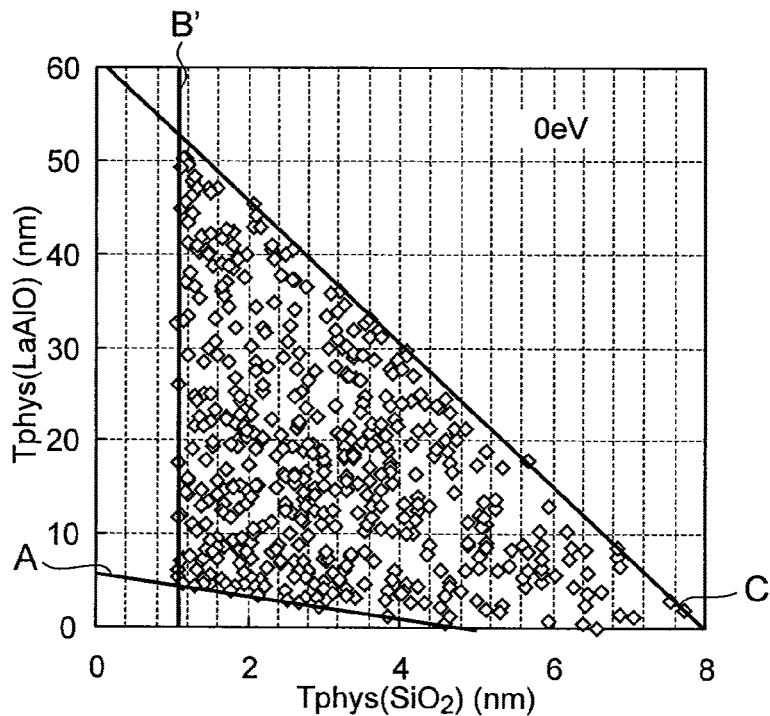
FIGS. 30A to 30I show the ranges of physical film thicknesses of the $SiO_2$ layer and a LaAlO layer of the tunnel insulating film according to an embodiment.
Figure 30B:
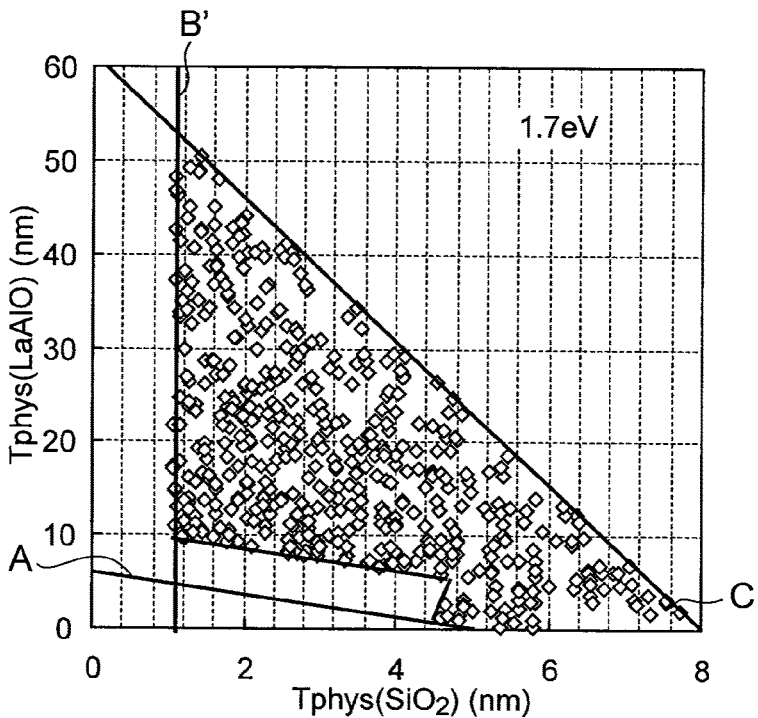
Figure 30C:
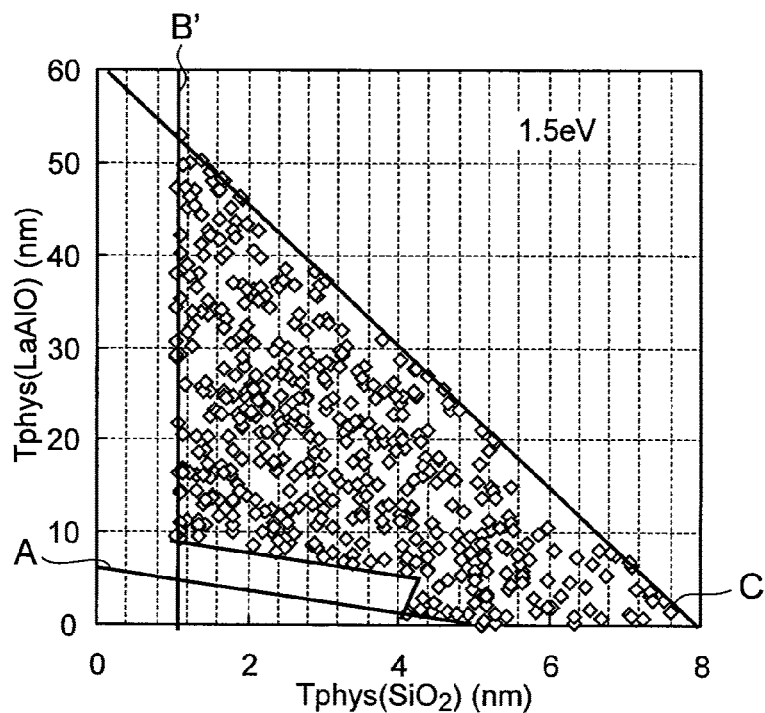
Figure 30D:
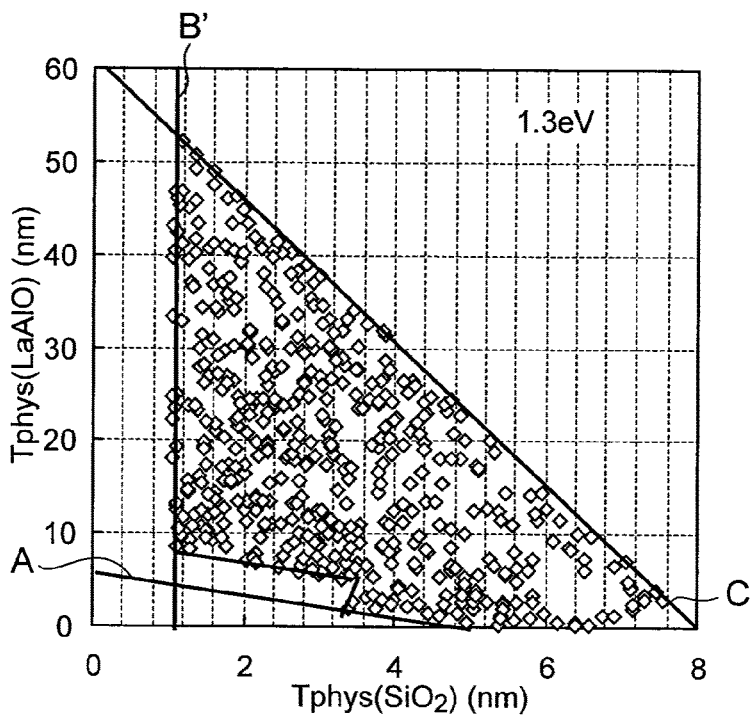
Figure 30E:
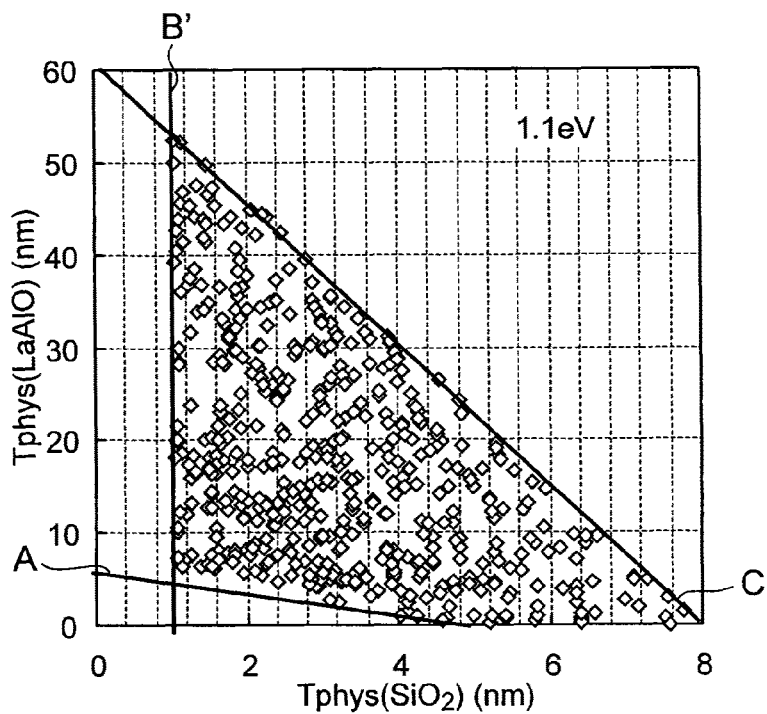
Figure 30F:
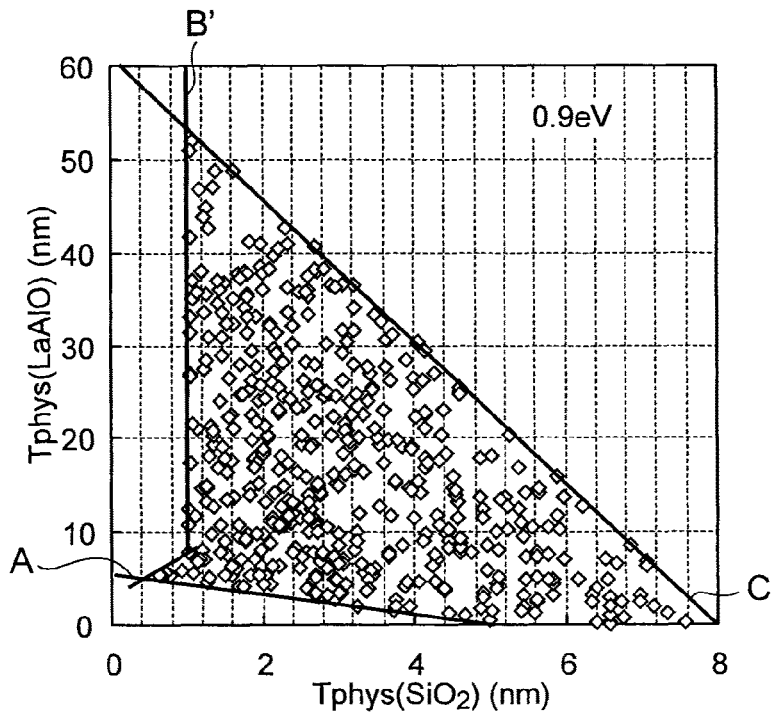
Figure 30G:
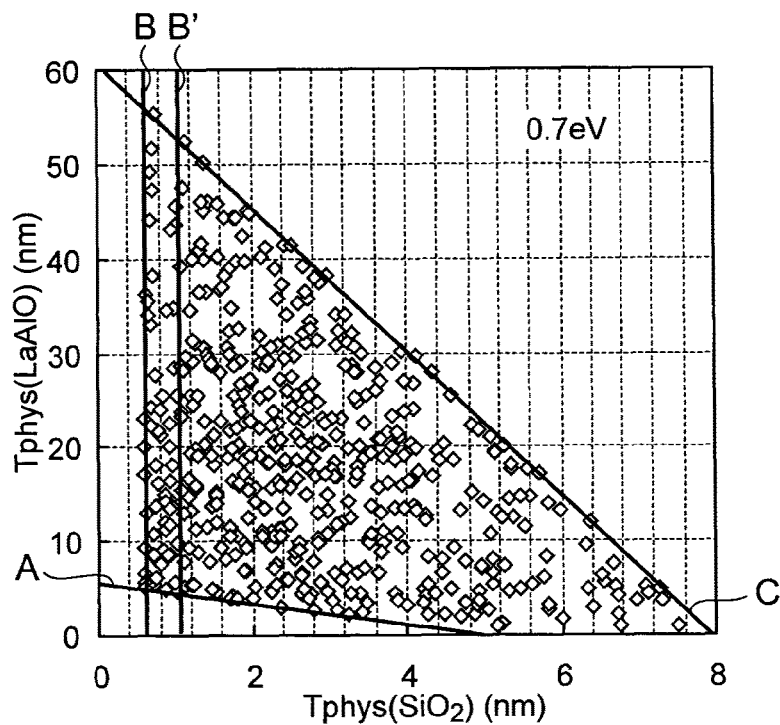
Figure 30H:
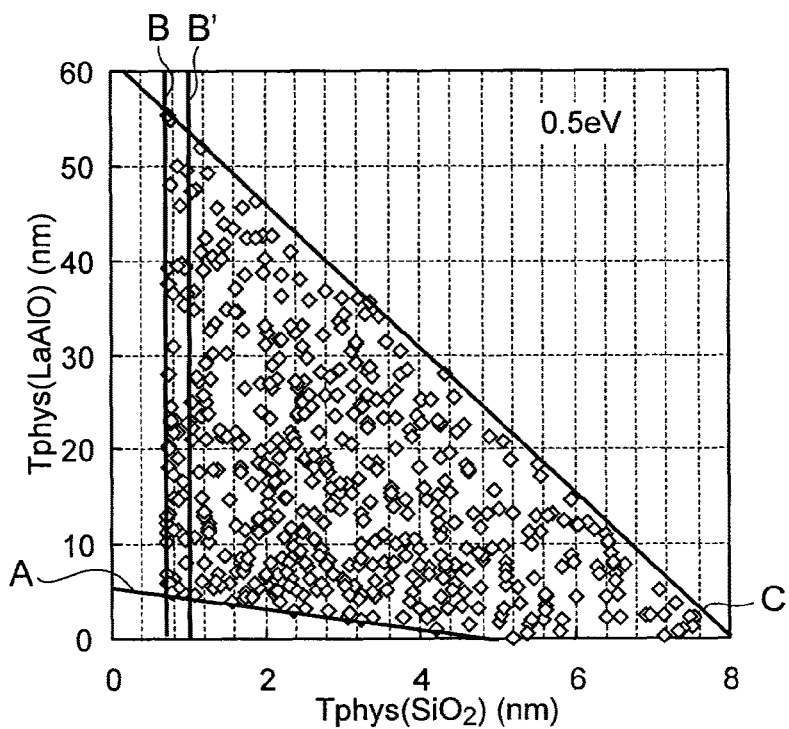
Figure 30I:
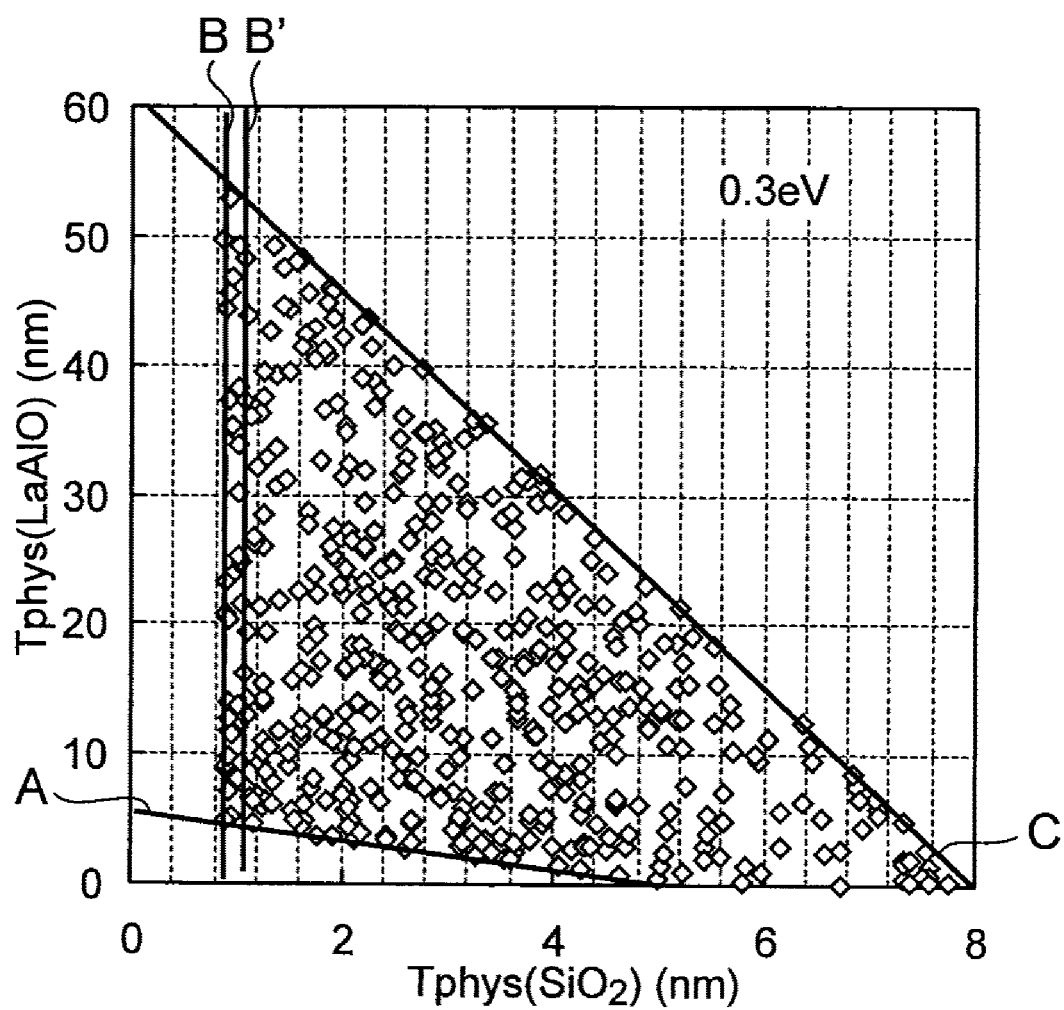
Figure 31:
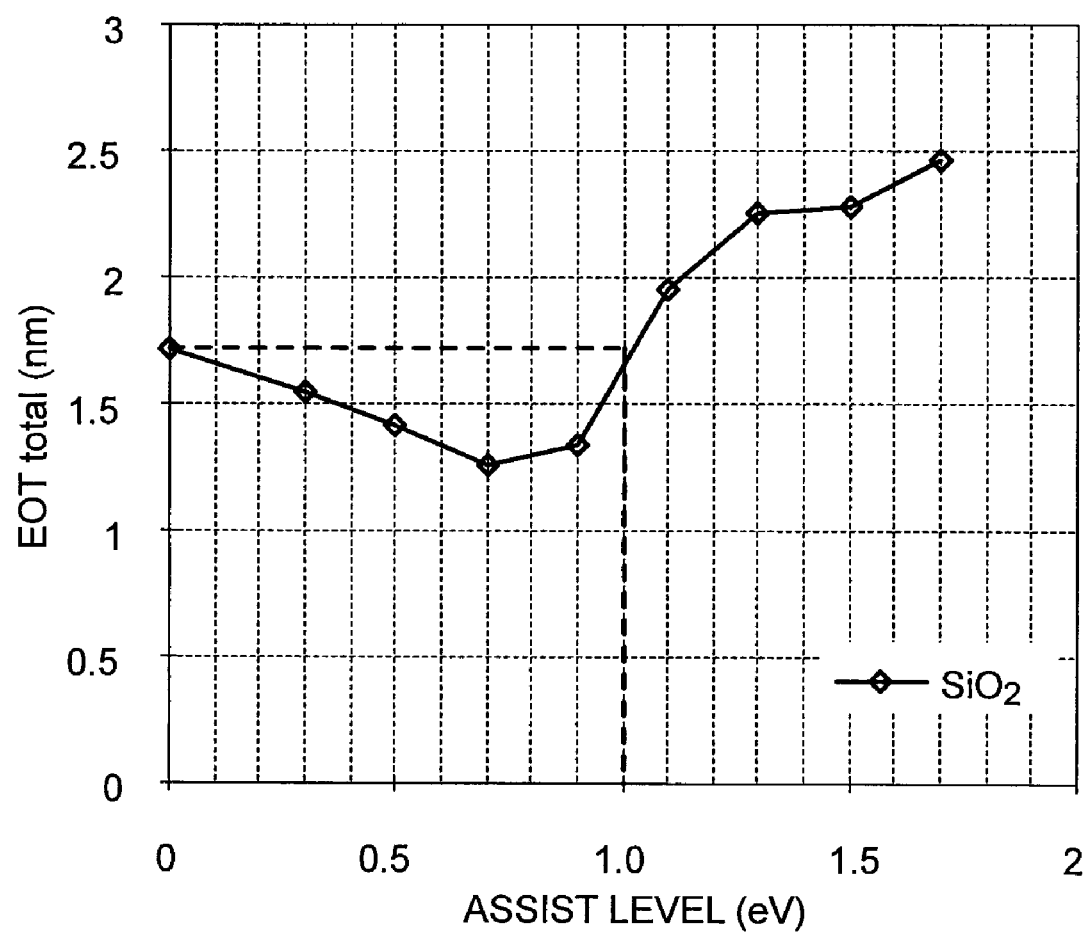
FIG. 31 shows the dependence of the EOT of the tunnel insulating film on the assist level according to the embodiment.

When the assist level exists in the $LaAlO_3$ layer, the layer thickness of the low-k layer (the value at the intersection between the straight line B and the abscissa axis) can be made smaller than the layer thickness the low-k layer needs to have when the assist level does not exist (the value at the intersection between the straight line B' and the abscissa axis) (FIGS. 30G to 30I). Although a $SiO_2$ layer is used as the low-k layer in this example, a SiN (silicon nitride) layer can also be used as the low-k layer as opposed to a $LaAlO_3$ layer, as SiN has a lower dielectric constant than $LaAlO_3$. In the above description, the low-k layer is a $SiO_2$ layer, and the high-k layer is a $LaAlO_3$ layer. However, also in a case where the low-k layer is a silicon oxide layer and the high-k layer is a lanthanum aluminate (LaAlO) layer, the same effects as above can be achieved, as long as the assist level falls into the above described range.

HfAlO Layer

FIGS. 32A to 32K show the ranges of the physical film thicknesses of tunnel insulating films that satisfy the requirements defined in an embodiment of the present invention with various assist levels. In each of the tunnel insulating films, a $Hf_2Al_2O_7((HfO_2)_{2/3}(Al_2O_3)_{1/3})$ layer is selected as the high-k layer while a $SiO_2$ layer is selected as the low-k layer, and the $Hf_2Al_2O_7$ layer and the $SiO_2$ layer are stacked to form the tunnel insulating film.

Figure 32A:
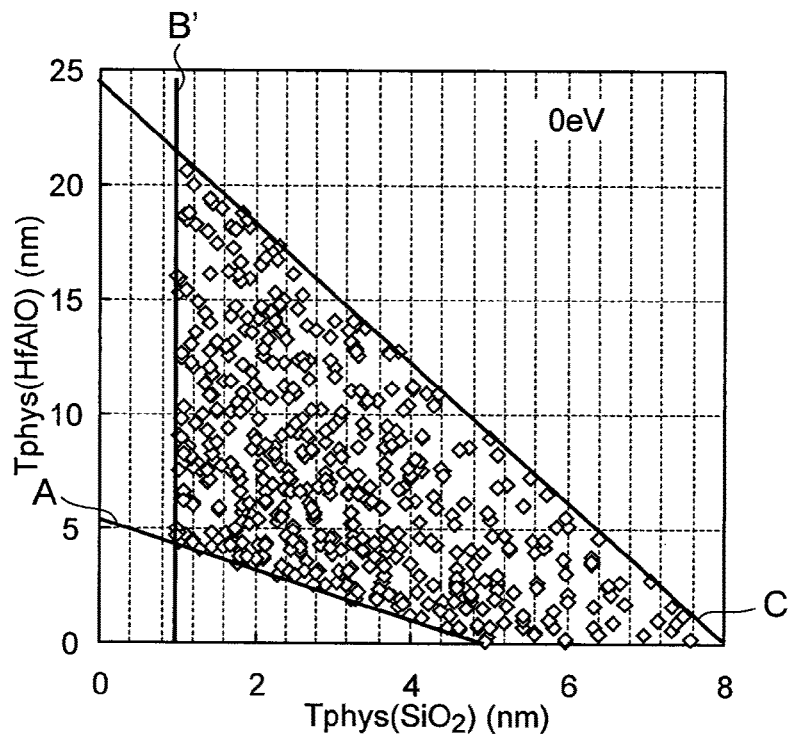
FIGS. 32A to 32K show the ranges of physical film thicknesses of the $SiO_2$ layer and a HfAlO layer of the tunnel insulating film according to an embodiment.
Figure 32B:
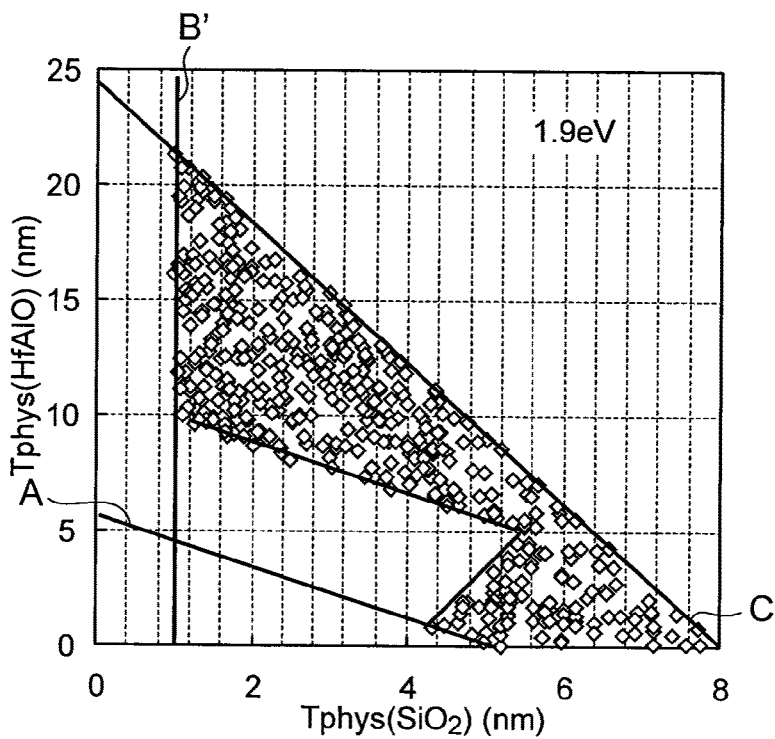
Figure 32C:
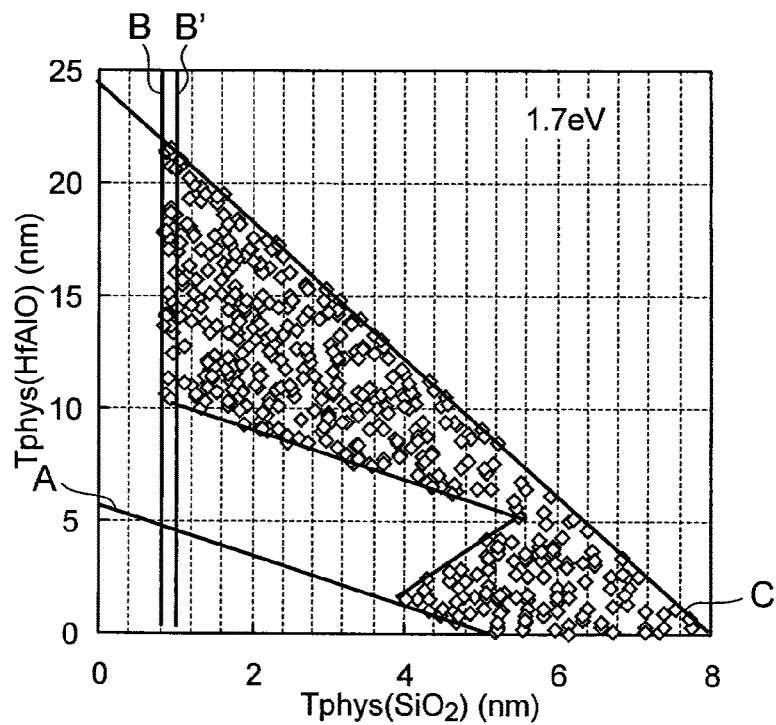
Figure 32D:
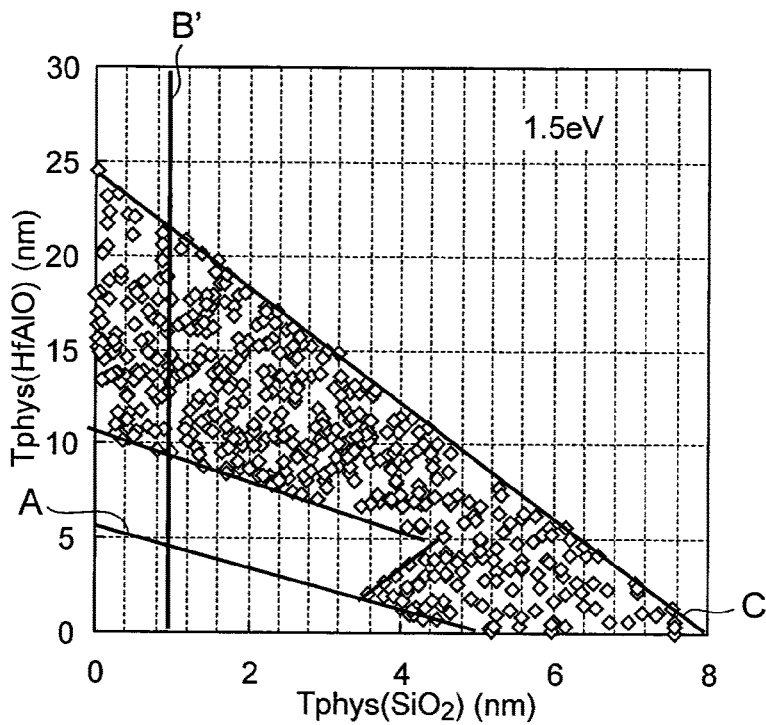
Figure 32E:
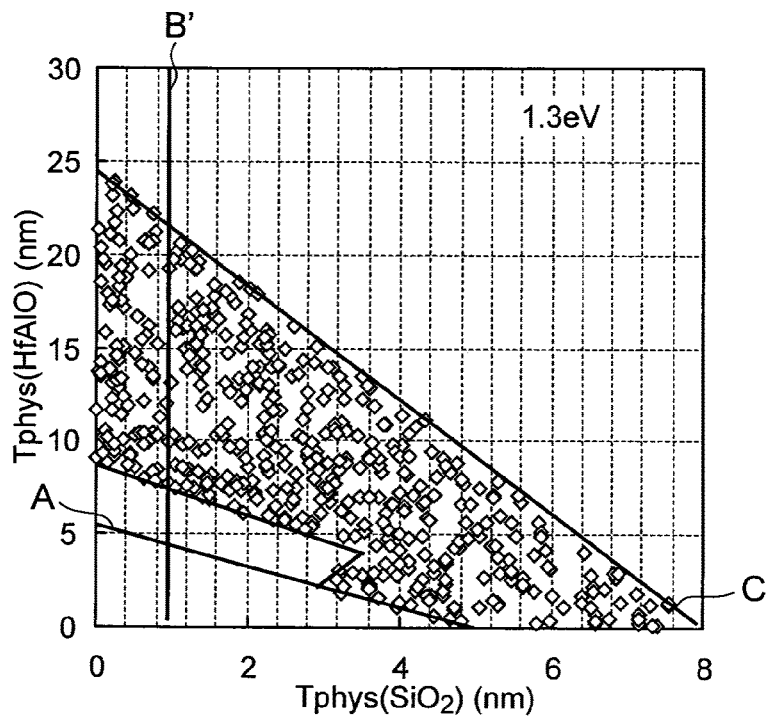
Figure 32F:
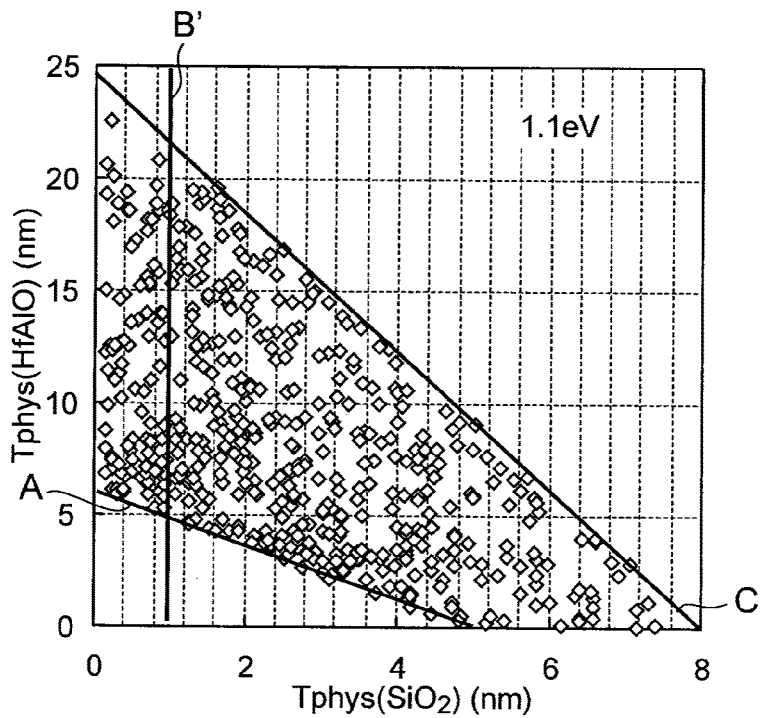
Figure 32G:
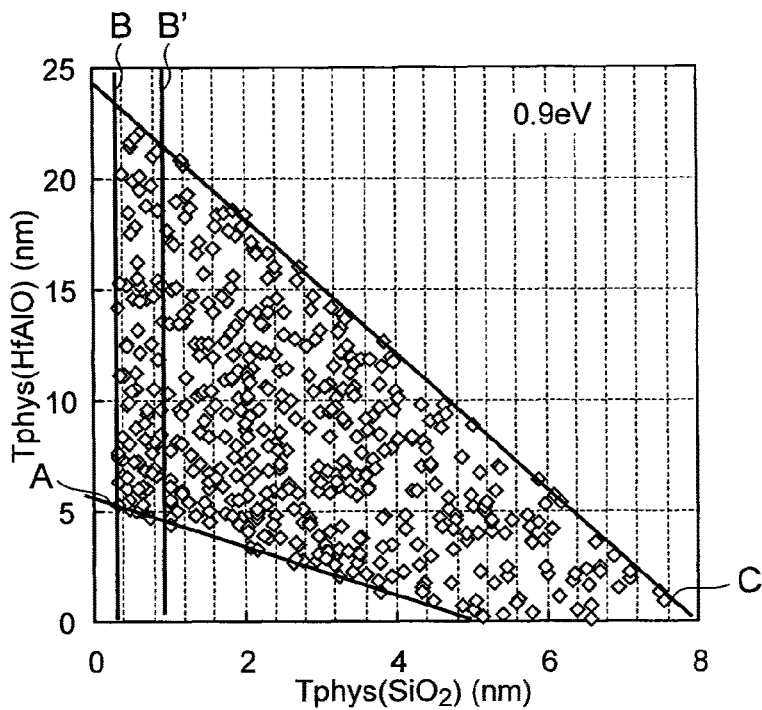
Figure 32H:
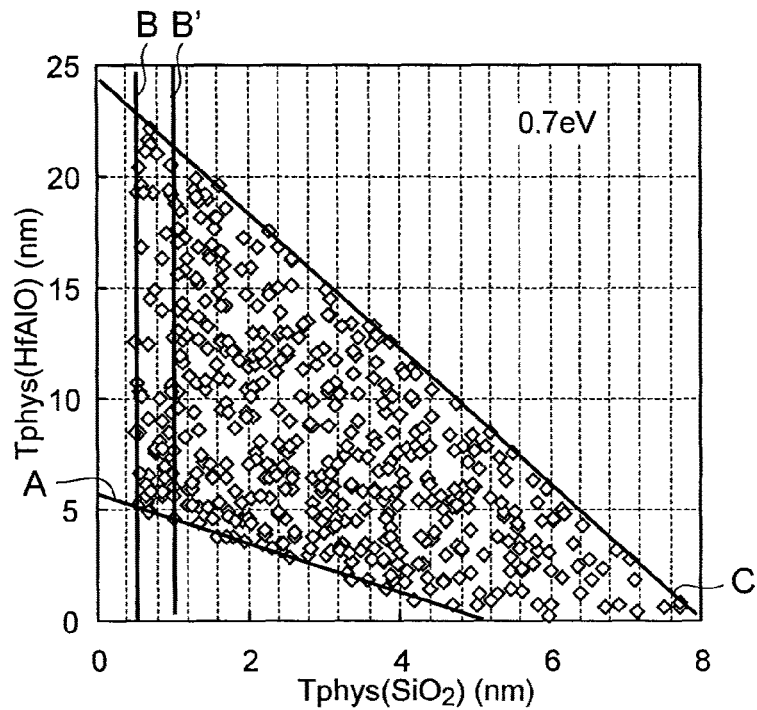
Figure 32I:
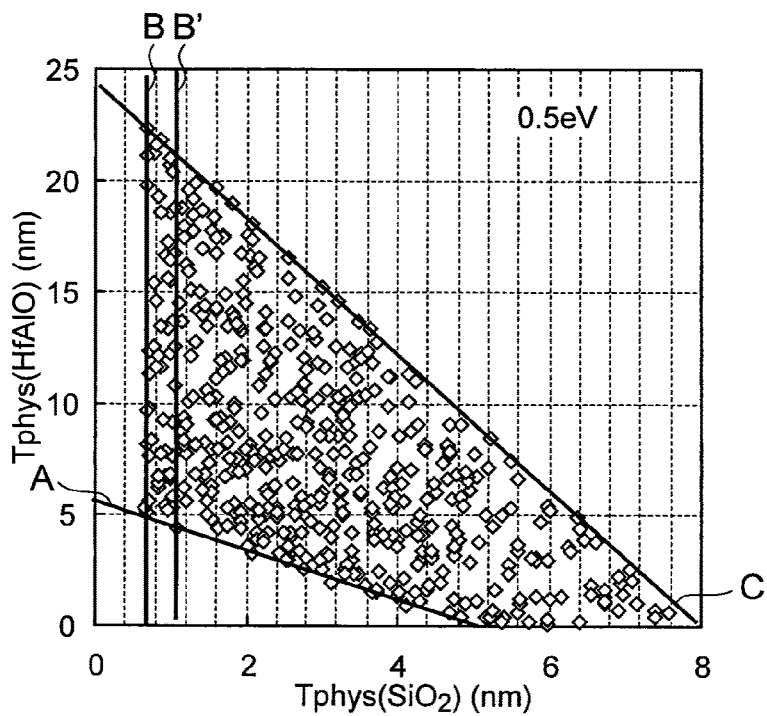
Figure 32J:
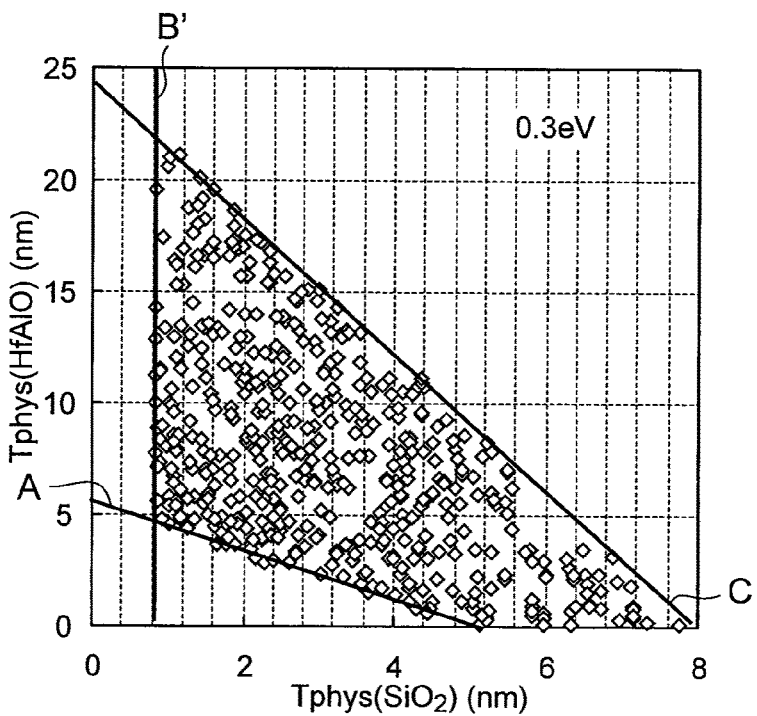
Figure 32K:
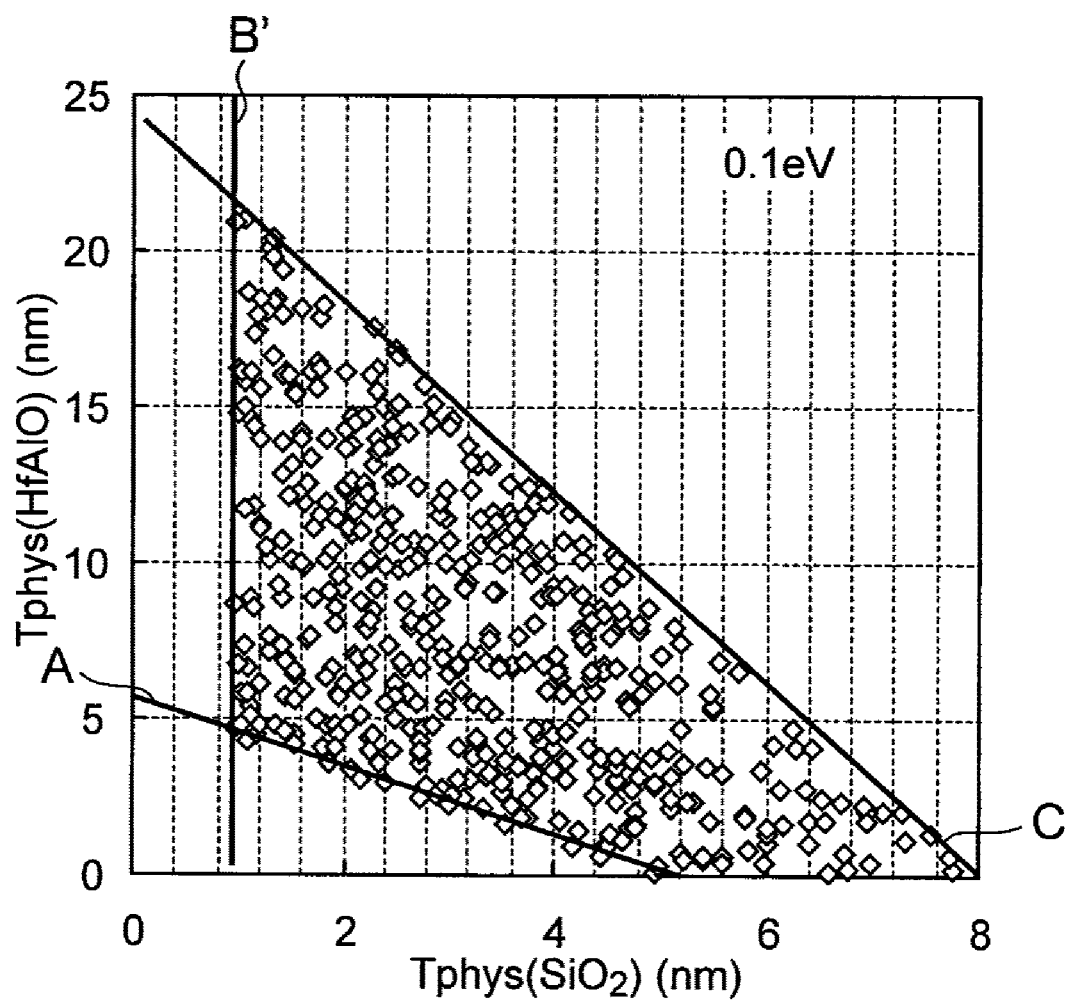
Figure 33:
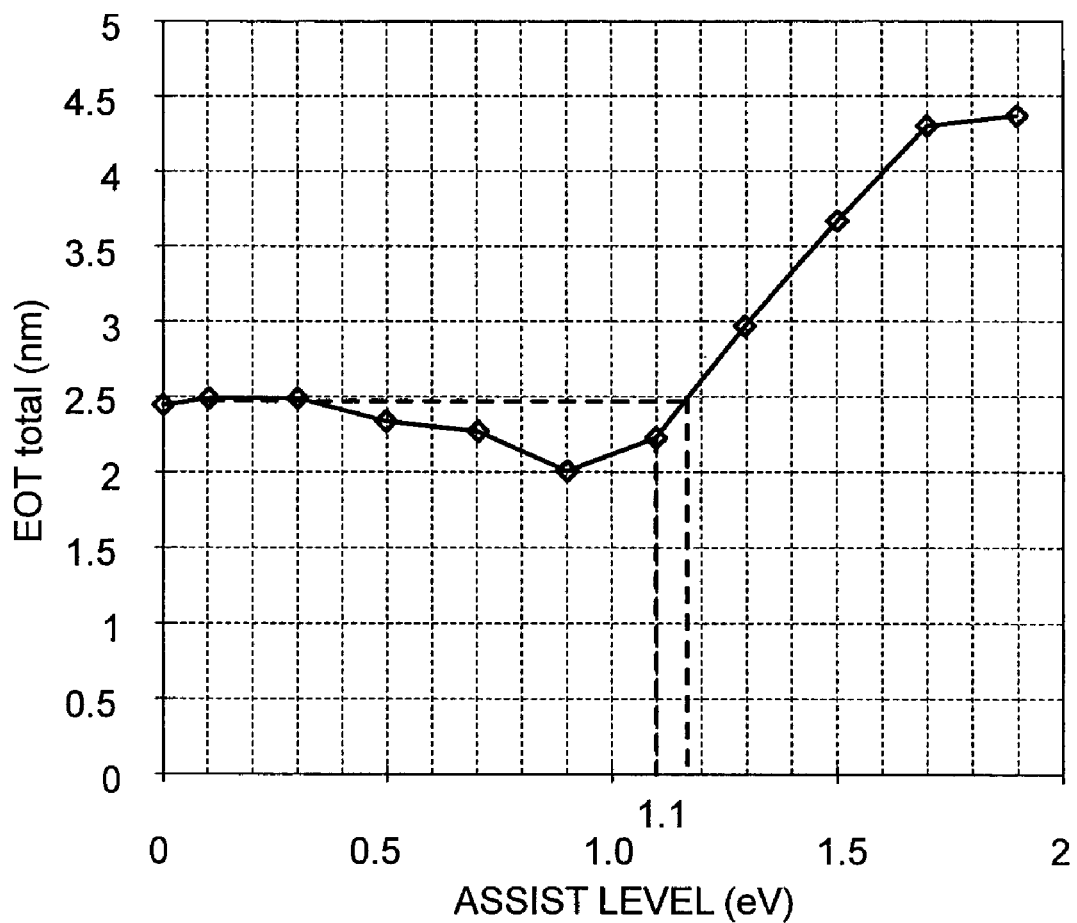
FIG. 33 shows the dependence of the EOT of the tunnel insulating film on the assist level according to the embodiment.
Figure 34A:
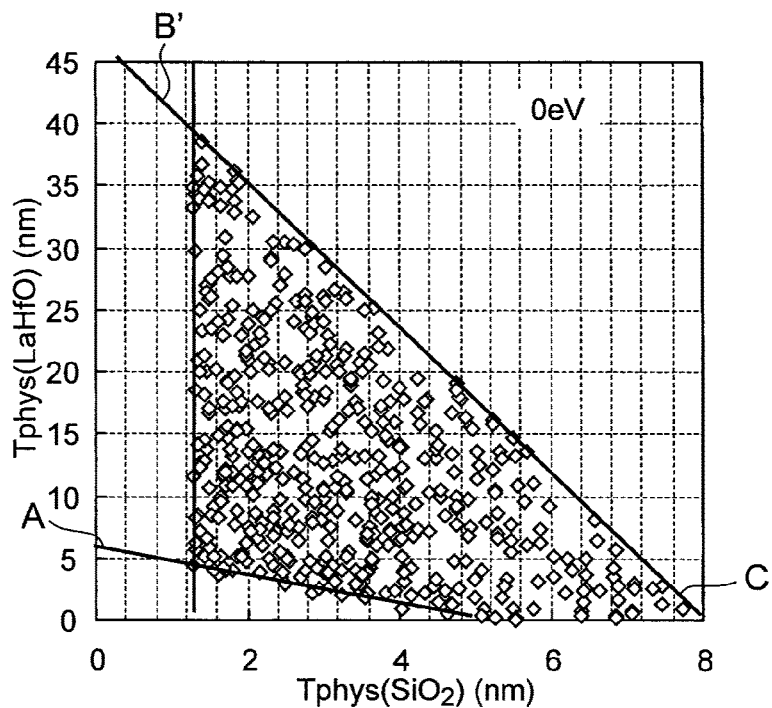
FIGS. 34A to 34K show the ranges of physical film thicknesses of the $SiO_2$ layer and a LaHfO layer of the tunnel insulating film according to an embodiment.
Figure 34B:
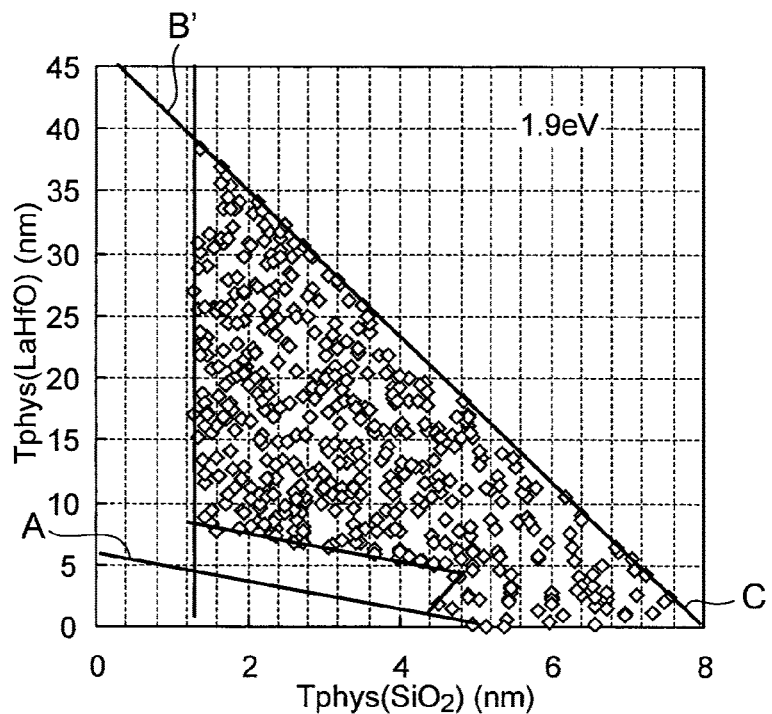
Figure 34C:
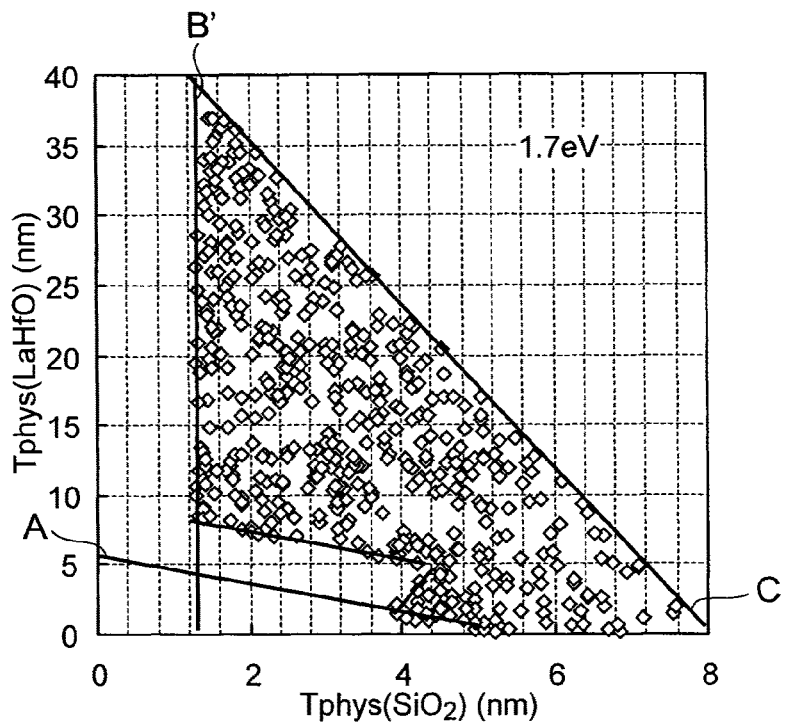
Figure 34D:
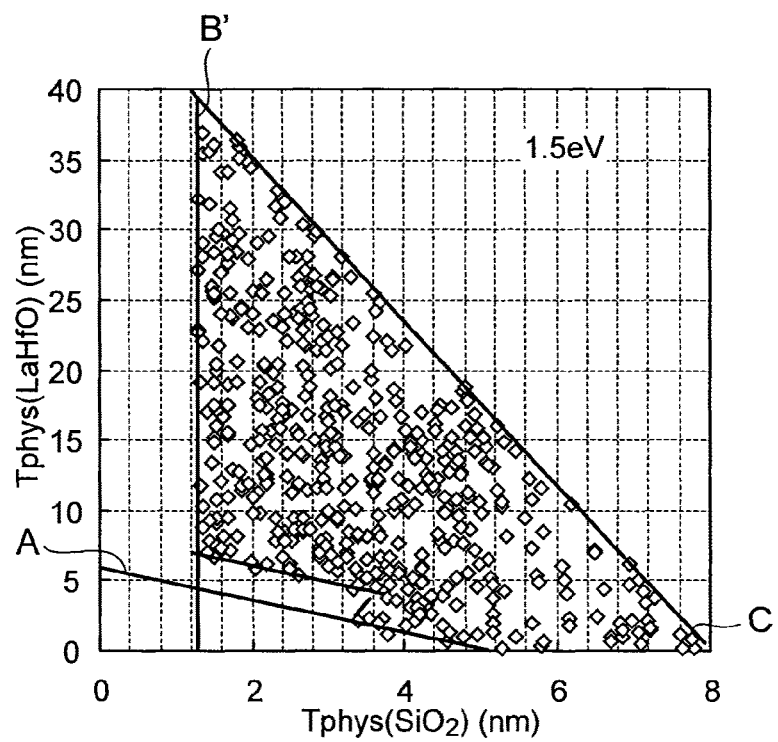
Figure 34E:
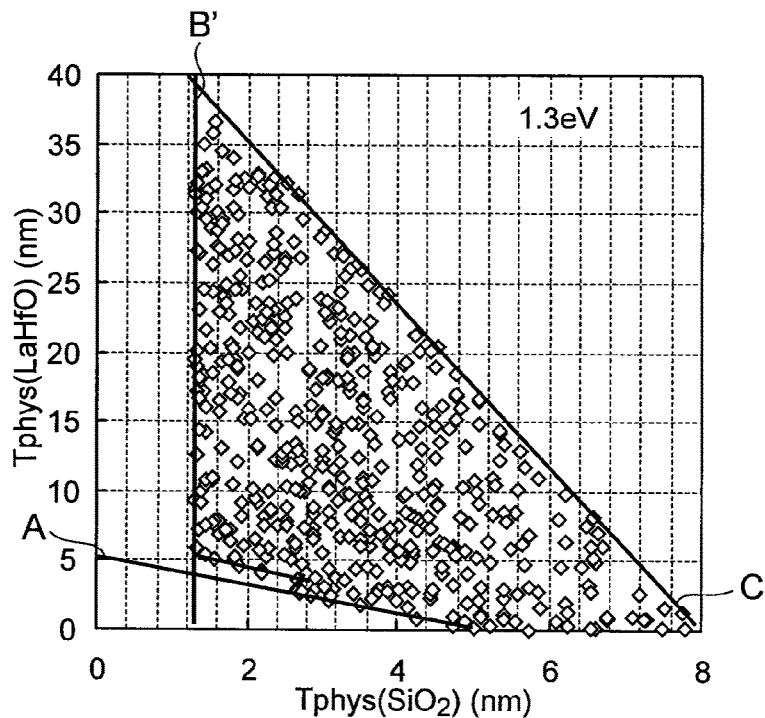
Figure 34F:
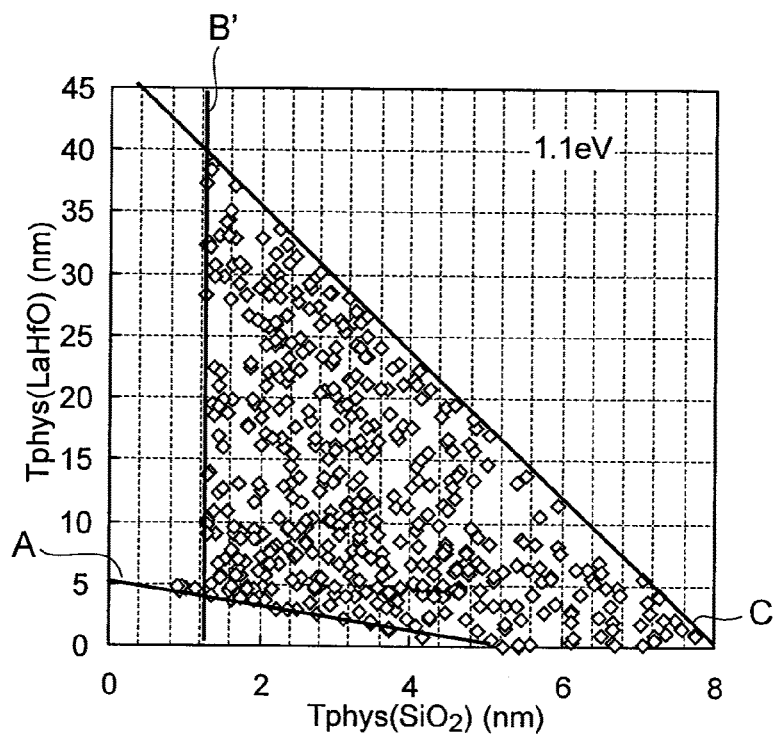
Figure 34G:
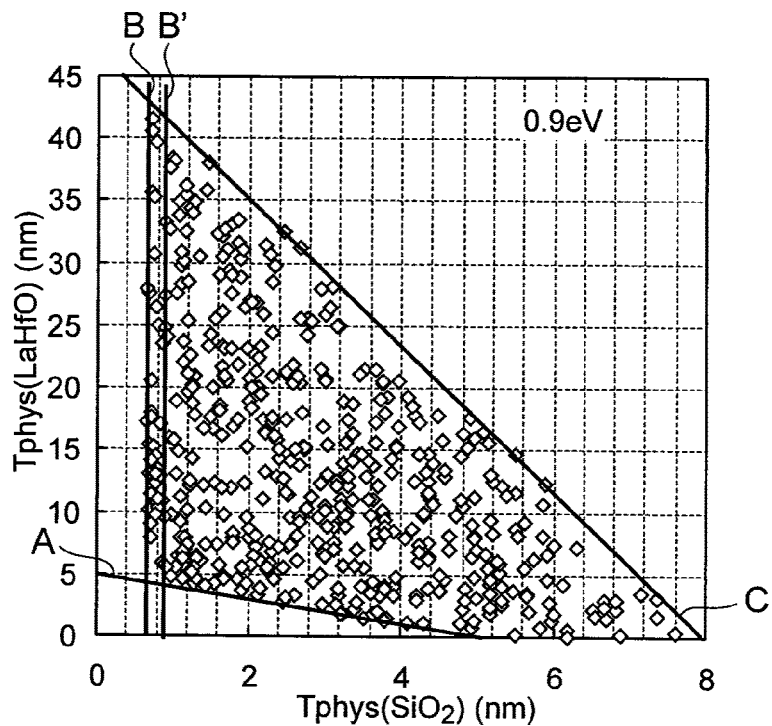
Figure 34H:
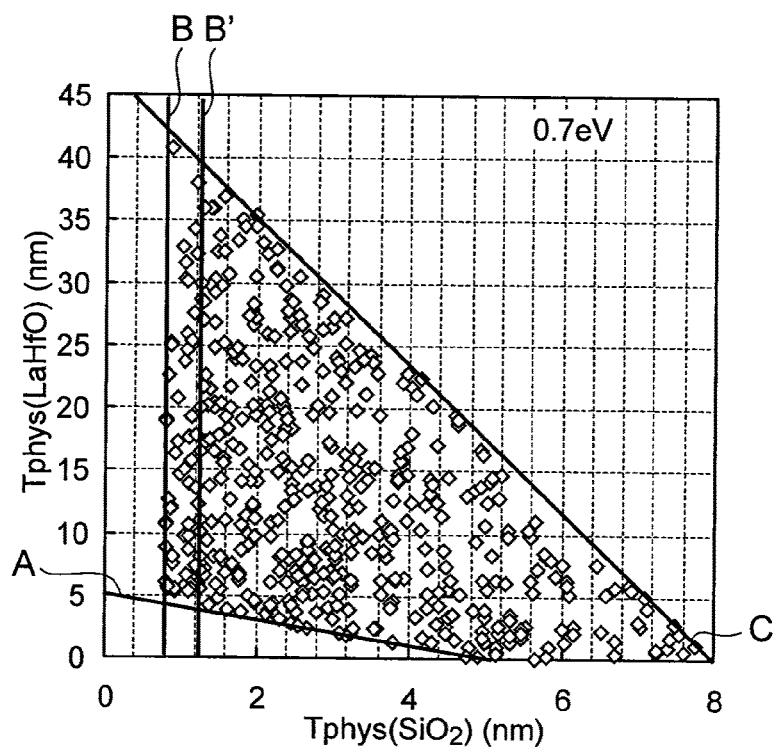
Figure 34I:
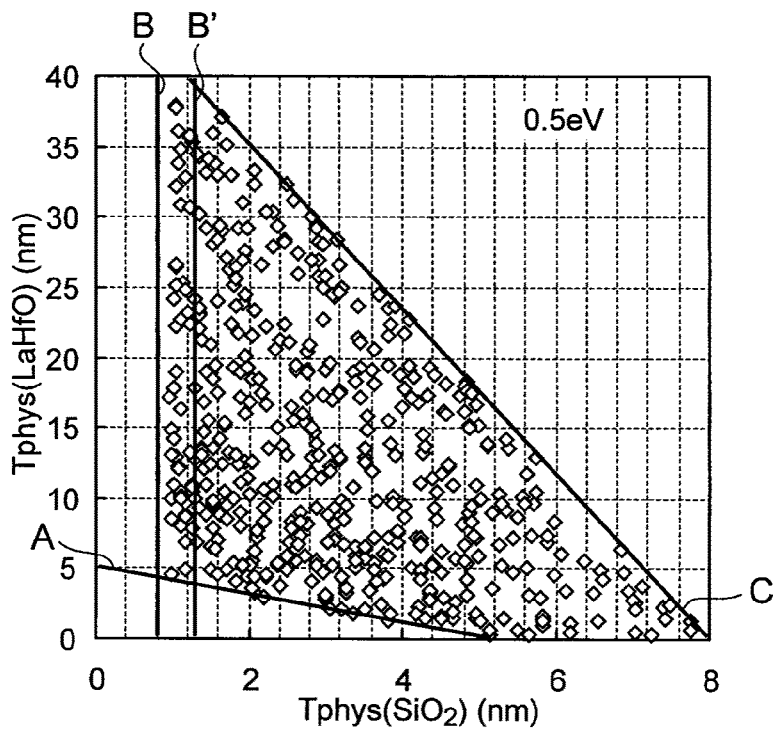
Figure 34J:
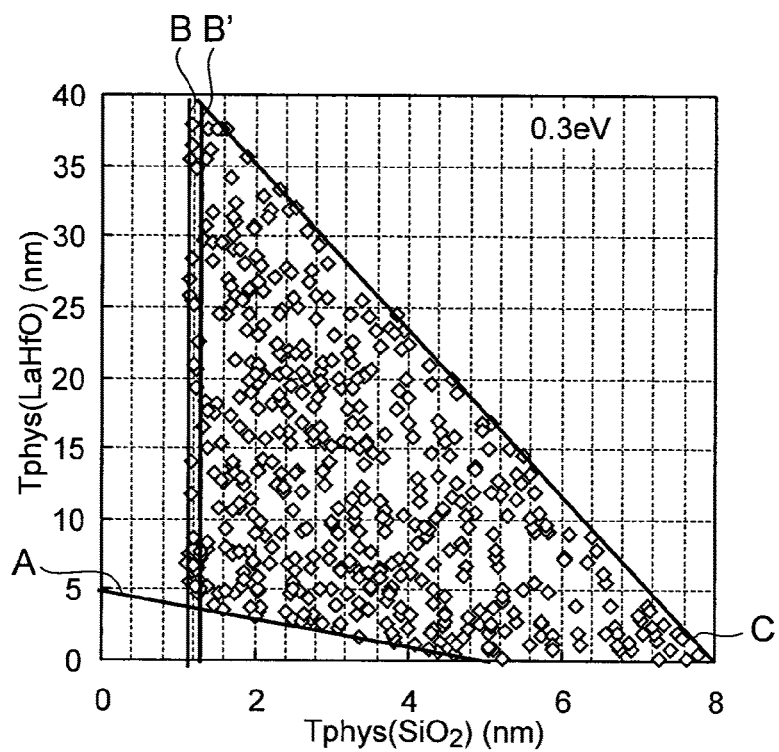
Figure 34K:
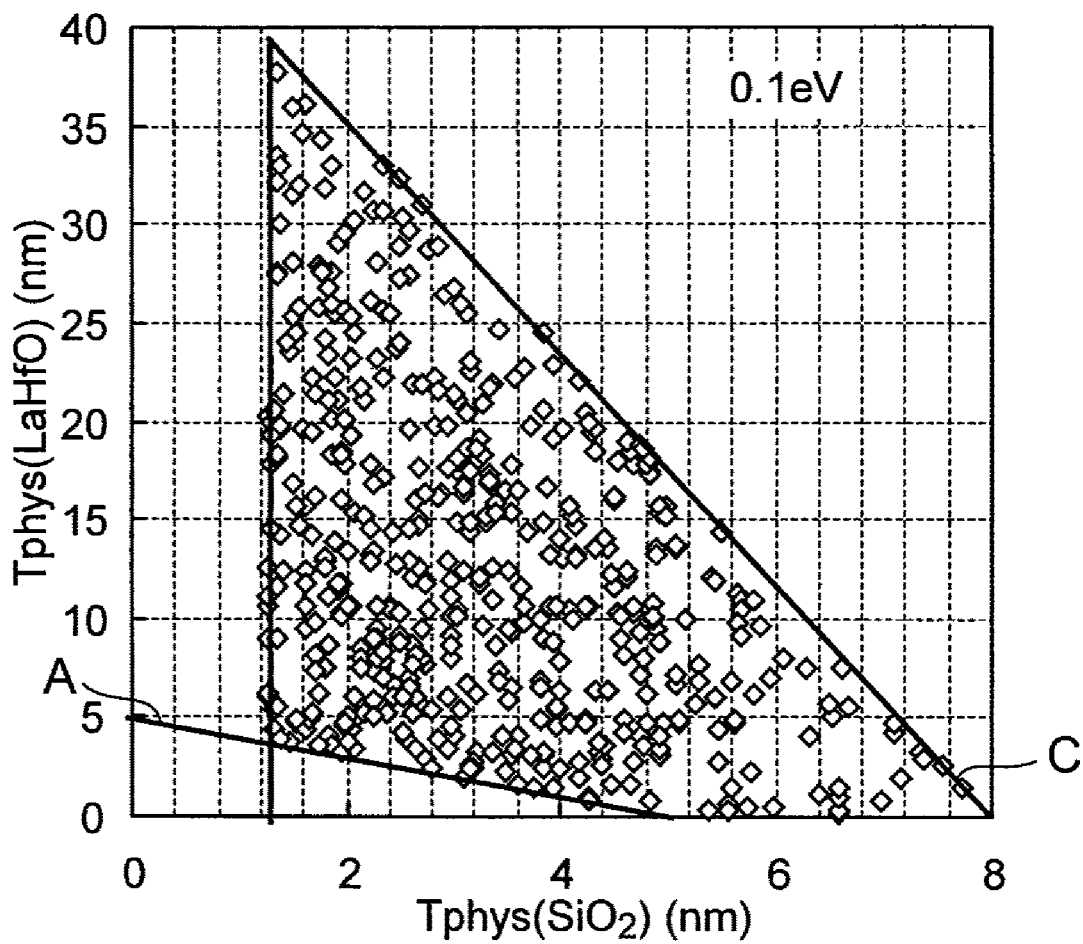

FIGS. 32A to 32K concerns the cases where the assist level of the $Hf_2Al_2O_7$ layer is 0 eV (the assist level does not exist), 1.9 eV, 1.7 eV, 1.5 eV, 1.3 eV, 1.1 eV, 0.9 eV, 0.7 eV, 0.5 eV, 0.3 eV, and 0.1 eV, respectively. FIG. 33 shows the relationship between each of those assist levels and the EOT of the tunnel insulating film. As can be seen from FIG. 33, in a case where a $Hf_2Al_2O_7$ layer is selected as the high-k layer, it is preferable that the assist level is larger than 0.3 eV but equal to or smaller than 1.1 eV, and more preferable that the assist level is in the range of 0.5 eV to 1.1 eV. When the assist level exists in the $Hf_2Al_2O_7$ layer, the layer thickness of the low-k layer (the value at the intersection between the straight line B and the abscissa axis) can be made smaller than the layer thickness the low-k layer needs to have when the assist level does not exist (the value at the intersection between the straight line B' and the abscissa axis) (FIGS. 32C to 32I). If the assist level in the $Hf_2Al_2O_7$ layer is in the range of 1.1 eV to 1.5 eV, the tunnel insulating film can be formed only with the $Hf_2Al_2O_7$ layer, without a $SiO_2$ layer (FIGS. 32D to 32F). However, if the assist level in the range of 1.3 eV to 1.5 eV exists in the $Hf_2Al_2O_7$ layer, the effect of making the EOT as thin as possible cannot be achieved. Although a $SiO_2$ layer is used as the low-k layer in this example, a SiN (silicon nitride) layer can also be used as the low-k layer as opposed to a $Hf_2Al_2O_7$ layer, as SiN has a lower dielectric constant than $Hf_2Al_2O_7$. In the above description, the low-k layer is a $SiO_2$ layer, and the high-k layer is a $Hf_2Al_2O_7$ layer. However, also in a case where the low-k layer is a silicon oxide layer and the high-k layer is a hafnium aluminate (HfAlO) layer, the same effects as above can be achieved, as long as the assist level falls into the above described range.

LaHfO Layer

FIGS. 34A to 34K show the ranges of the physical film thicknesses of tunnel insulating films that satisfy the requirements defined in an embodiment of the present invention with various assist levels. In each of the tunnel insulating films, a $La_2Hf_2O_7$ layer is selected as the high-k layer while a $SiO_2$ layer is selected as the low-k layer, and the $La_2Hf_2O_7$ layer and the $SiO_2$ layer are stacked to form the tunnel insulating film.

Figure 35:
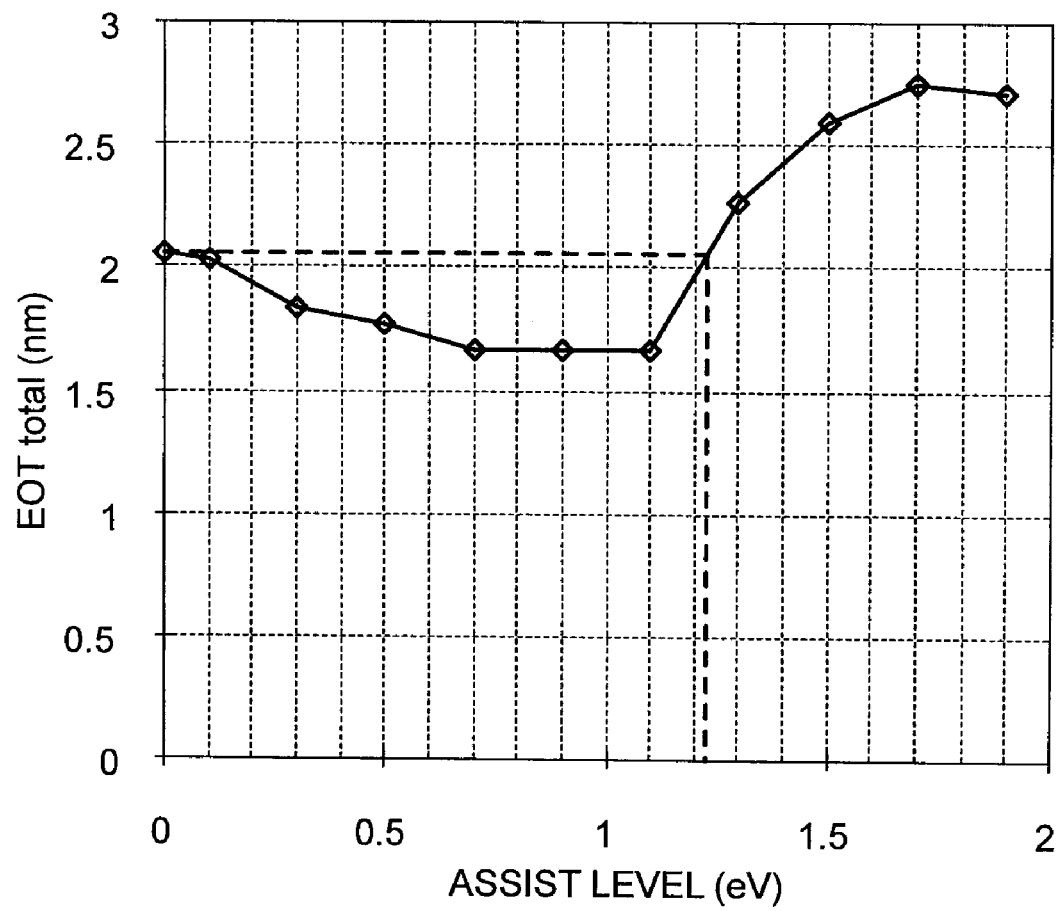
FIG. 35 shows the dependence of the EOT of the tunnel insulating film on the assist level according to the embodiment.
Figure 36A:
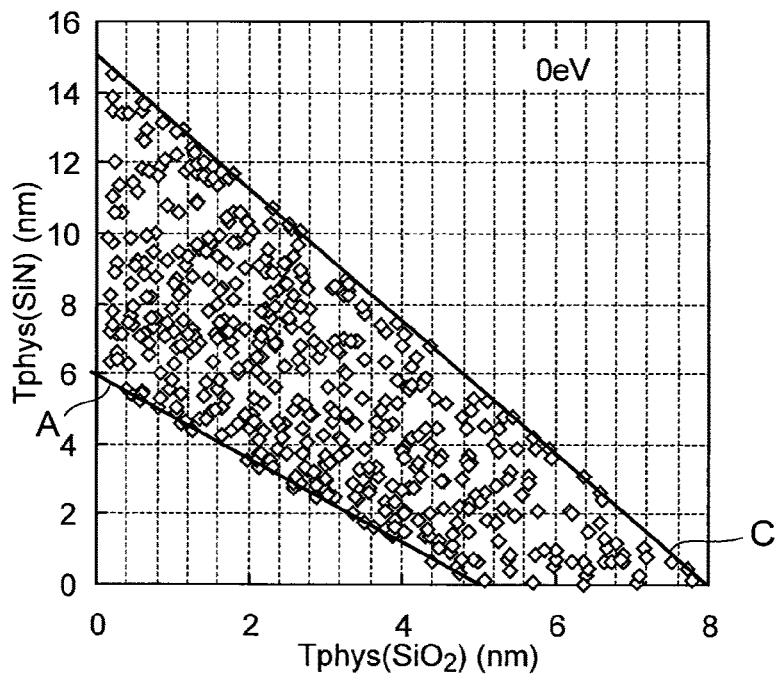
FIGS. 36A to 36J show the ranges of physical film thicknesses of the $SiO_2$ layer and a SiN layer of the tunnel insulating film according to an embodiment.
Figure 36B:
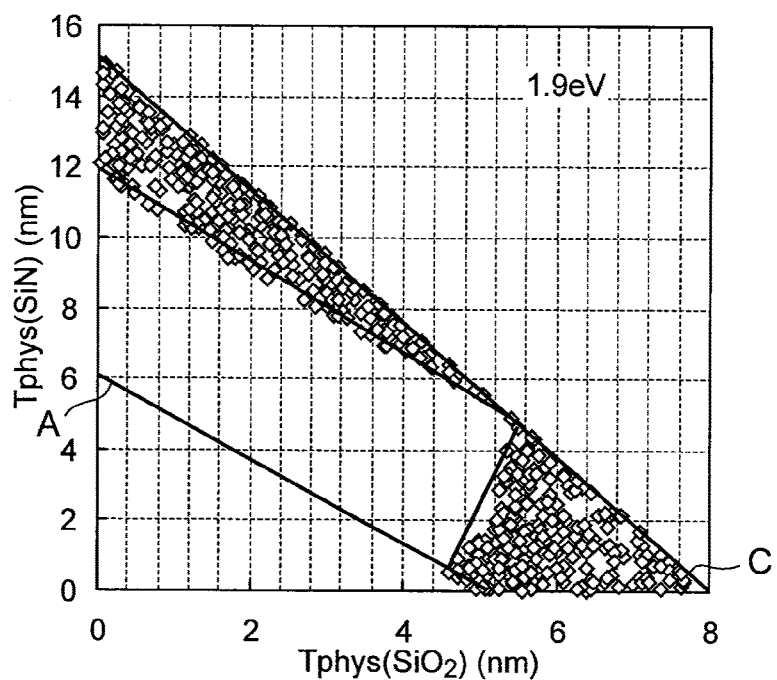
Figure 36C:
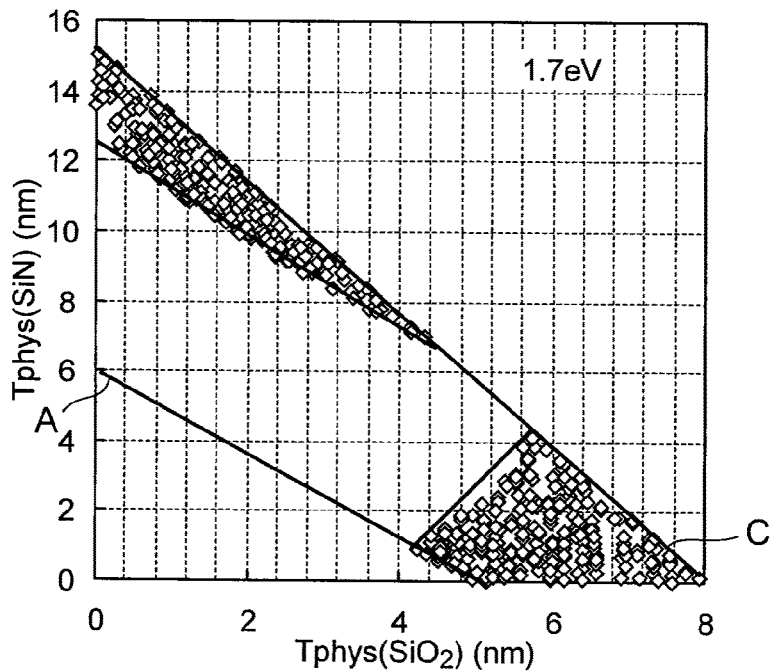
Figure 36D:
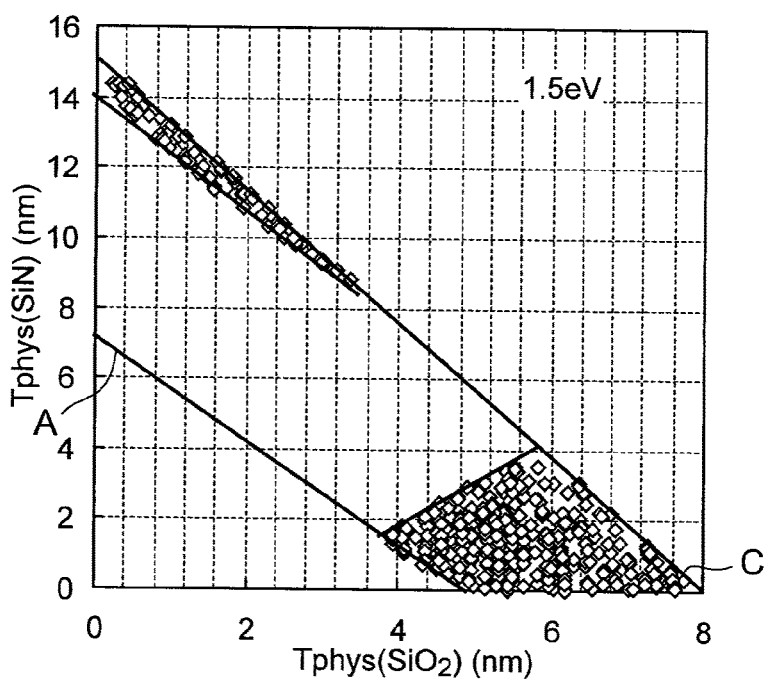
Figure 36E:
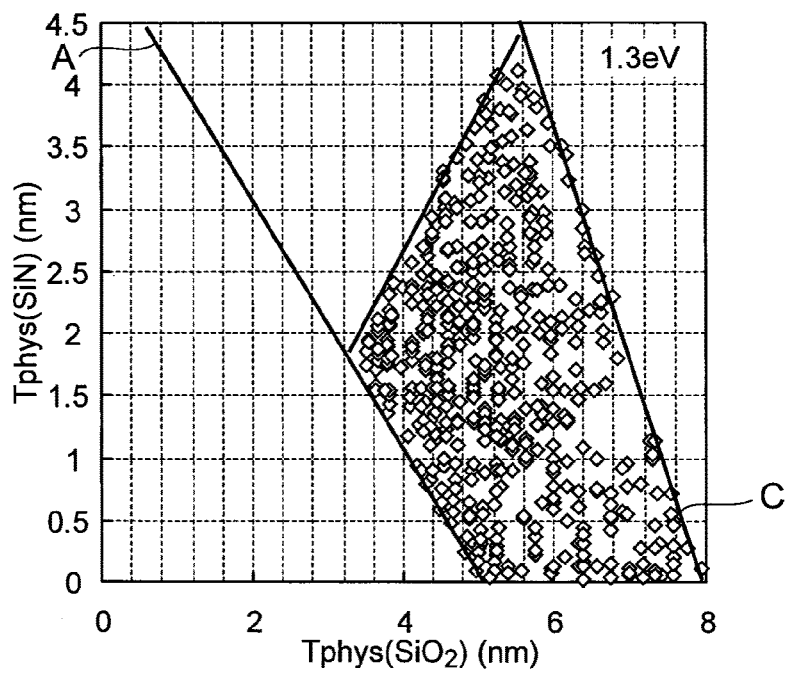
Figure 36F:
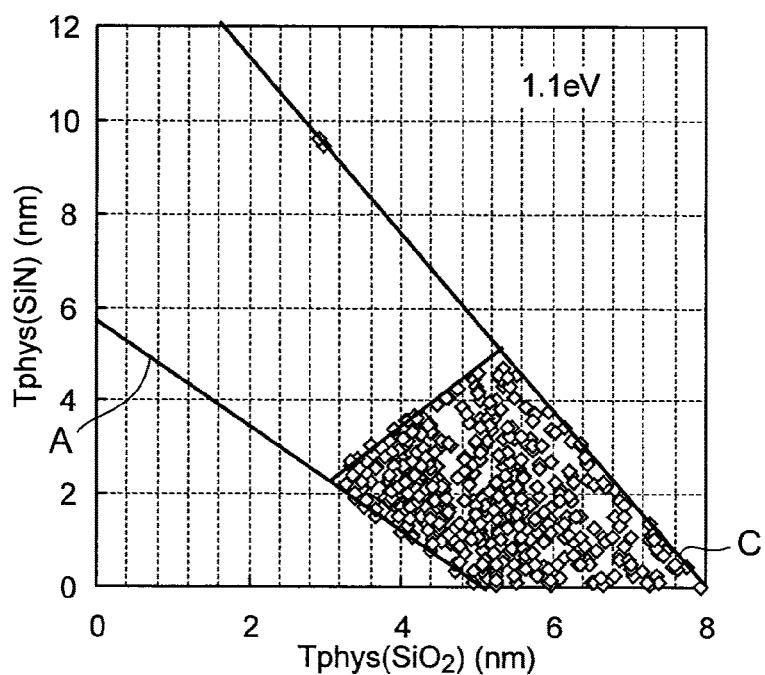
Figure 36G:
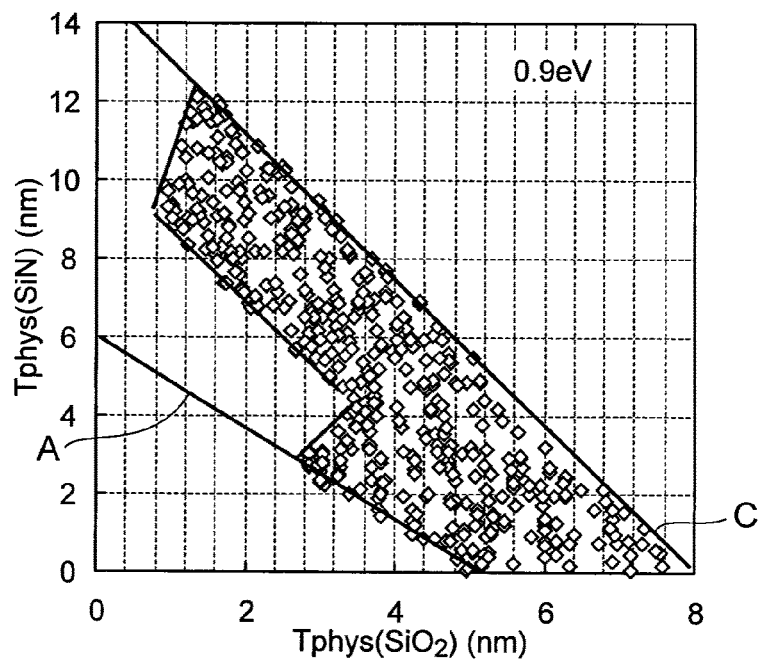
Figure 36H:
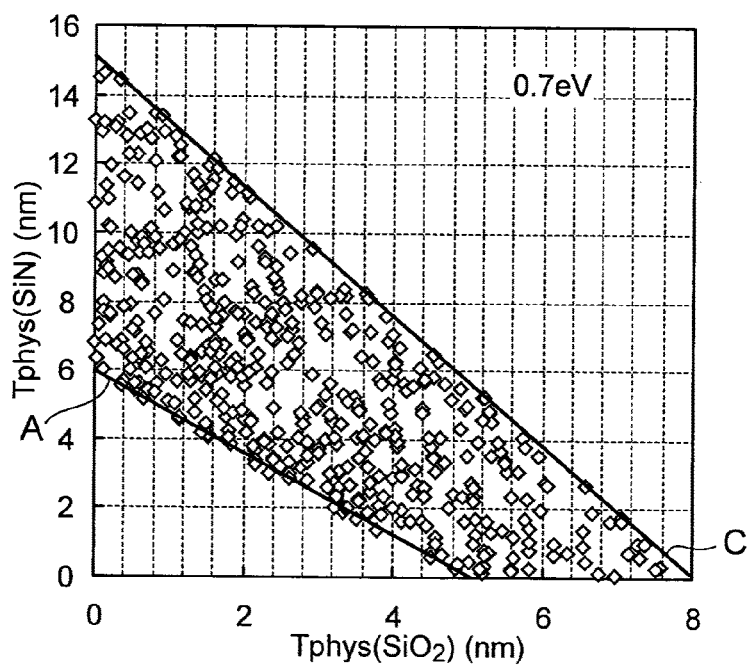
Figure 36I:
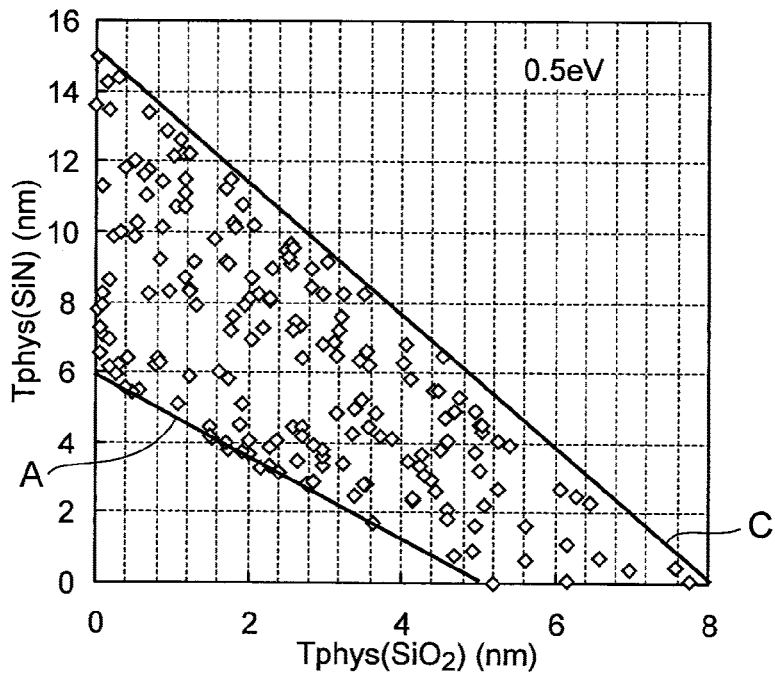
Figure 36J:
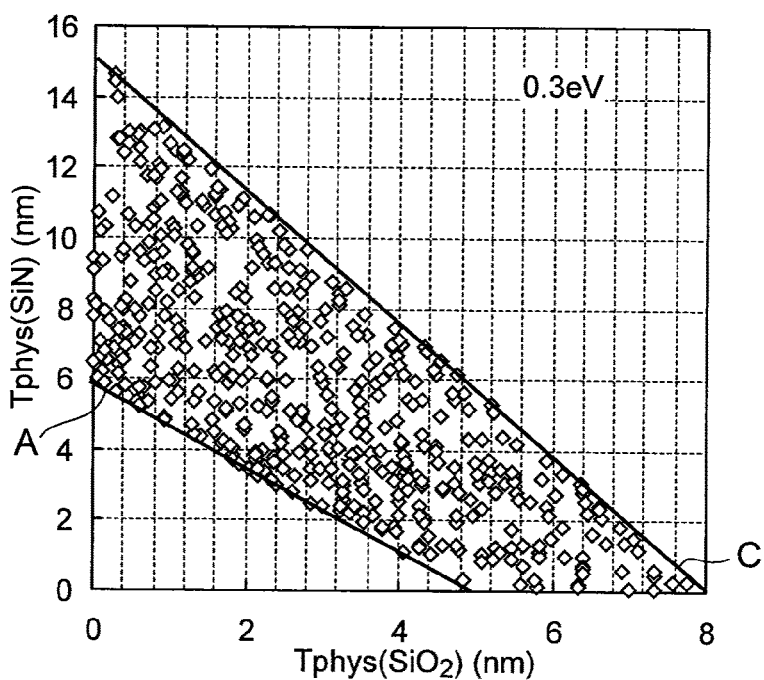

FIGS. 34A to 34K concerns the cases where the assist level of the $La_2Hf_2O_7$ layer is 0 eV (the assist level does not exist), 1.9 eV, 1.7 eV, 1.5 eV, 1.3 eV, 1.1 eV, 0.9 eV, 0.7 eV, 0.5 eV, 0.3 eV, and 0.1 eV, respectively. FIG. 35 shows the relationship between each of those assist levels and the EOT of the tunnel insulating film. As can be seen from FIG. 35, in a case where a $La_2Hf_2O_7$ layer is selected as the high-k layer, it is preferable that the assist level is equal to or larger than 0.1 eV but smaller than 1.3 eV, and more preferable that the assist level is in the range of 0.1 eV to 1.1 eV. When the assist level exists in the $La_2Hf_2O_7$ layer, the layer thickness of the low-k layer (the value at the intersection between the straight line B and the abscissa axis) can be made smaller than the layer thickness the low-k layer needs to have when the assist level does not exist (the value at the intersection between the straight line B' and the abscissa axis) (FIGS. 34G to 34J). Although a $SiO_2$ layer is used as the low-k layer in this example, a SiN (silicon nitride) layer can also be used as the low-k layer as opposed to a $La_2Hf_2O_7$ layer, as SiN has a lower dielectric constant than $La_2Hf_2O_7$. In the above description, the low-k layer is a $SiO_2$ layer, and the high-k layer is a $La_2Hf_2O_7$ layer. However, also in a case where the low-k layer is a silicon oxide layer and the high-k layer is a lanthanum hafnate (LaHfO) layer, the same effects as above can be achieved, as long as the assist level falls into the above described range.

SiN Layer

Since SiN (silicon nitride) has a dielectric constant approximately twice as high as the dielectric constant of $SiO_2$, a SiN layer can function as a high-k insulating layer as opposed to a $SiO_2$ layer. Accordingly, a SiN layer may be selected as the high-k layer while a $SiO_2$ layer is selected as the low-k layer, and the SiN layer and the $SiO_2$ layer are stacked to form a tunnel insulating film. FIGS. 36A to 36J show the ranges of the physical film thicknesses of tunnel insulating films that satisfy the requirements defined in an embodiment of the present invention with various assist levels in such cases.

Figure 37:
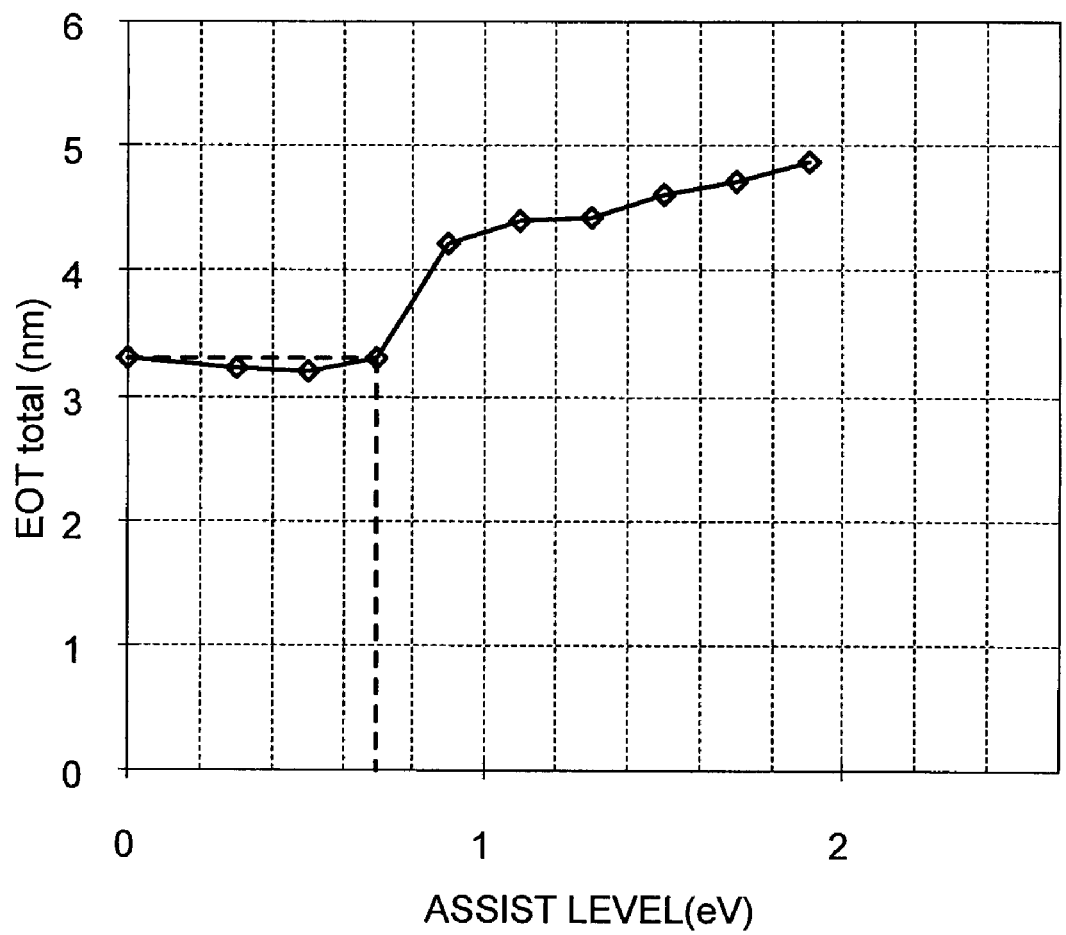
FIG. 37 shows the dependence of the EOT of the tunnel insulating film on the assist level according to the embodiment.

FIGS. 36A to 36J concerns the cases where the assist level of the SiN layer is 0 eV (the assist level does not exist), 1.9 eV, 1.7 eV, 1.5 eV, 1.3 eV, 1.1 eV, 0.9 eV, 0.7 eV, 0.5 eV, and 0.3 eV, respectively. FIG. 37 shows the relationship between each of those assist levels and the EOT of the tunnel insulating film. As can be seen from FIG. 37, in a case where a SiN layer is selected as the high-k layer, it is preferable that the assist level is larger than 0 eV but equal to or smaller than 0.7 eV, and more preferable that the assist level is in the range of 0.3 eV to 0.7 eV. When the assist level of the SiN layer is in the range of 0.3 eV to 0.7 eV, the tunnel insulating film can be formed only with the SiN layer, without a $SiO_2$ layer, as can be seen from FIGS. 36H to 36J.

$Ta_2O_5$ Layer

FIGS. 38A to 38H show the ranges of the physical film thicknesses of tunnel insulating films that satisfy the requirements defined in an embodiment of the present invention with various assist levels. In each of the tunnel insulating films, a $Ta_2O_5$ layer is selected as the high-k layer while a $SiO_2$ layer is selected as the low-k layer, and the $Ta_2O_5$ layer and the $SiO_2$ layer are stacked to form the tunnel insulating film.

Figure 38A:
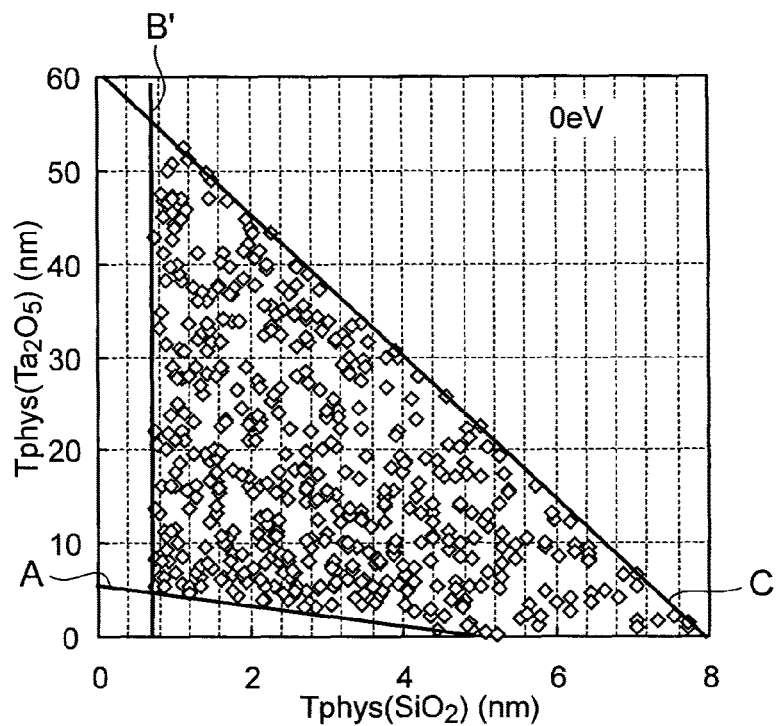
FIGS. 38A to 38H show the ranges of physical film thicknesses of the $SiO_2$ layer and a $Ta_2O_5$ layer of the tunnel insulating film according to an embodiment.
Figure 38B:
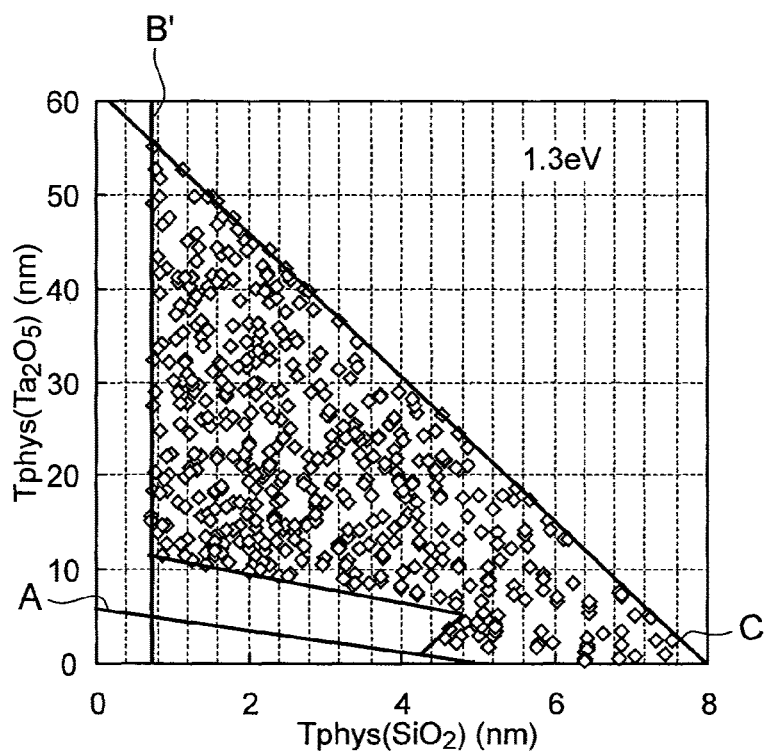
Figure 38C:
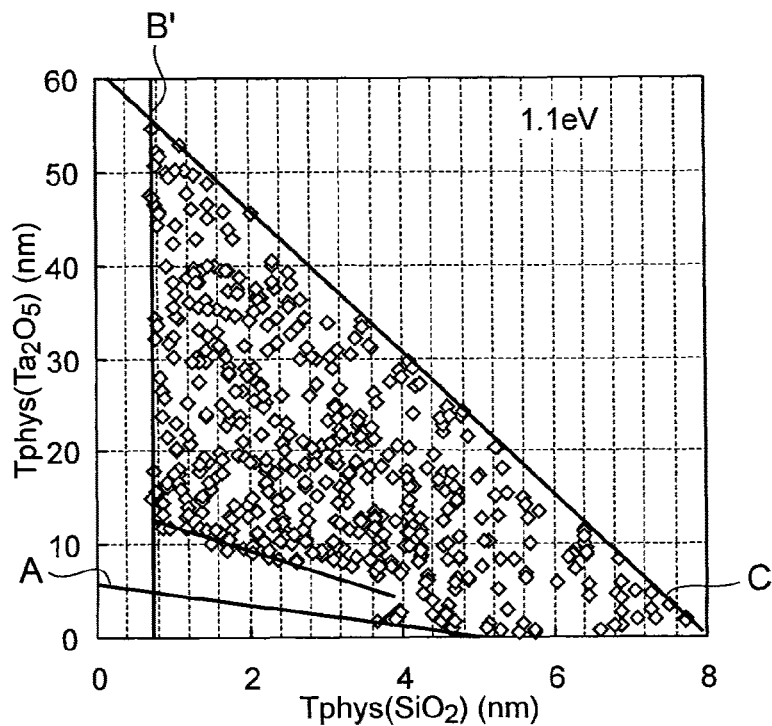
Figure 38D:
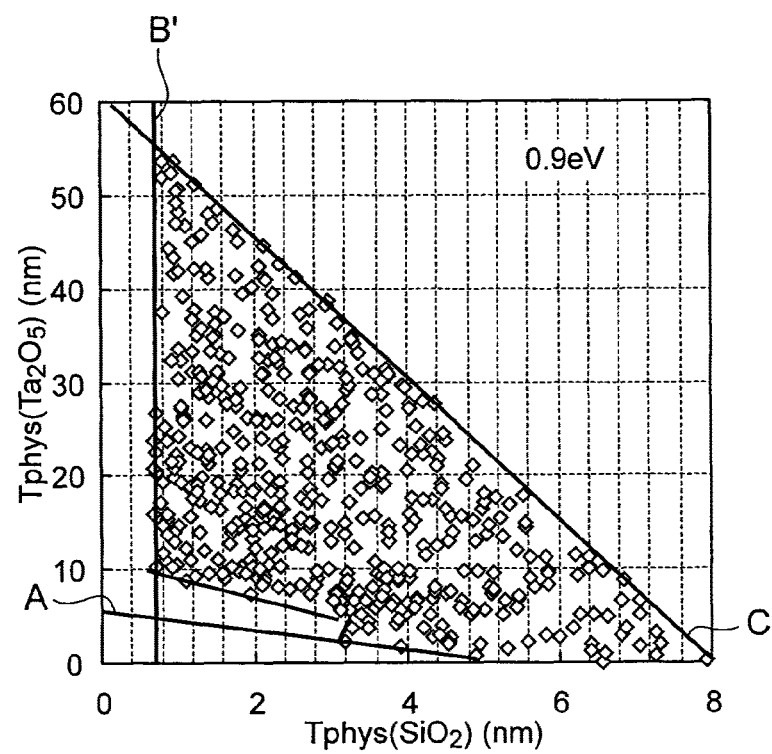
Figure 38E:
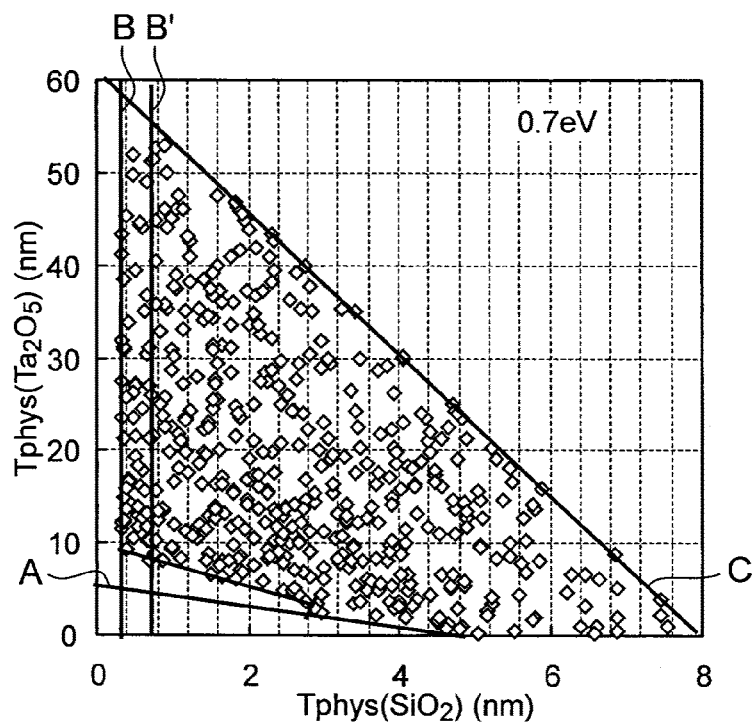
Figure 38F:
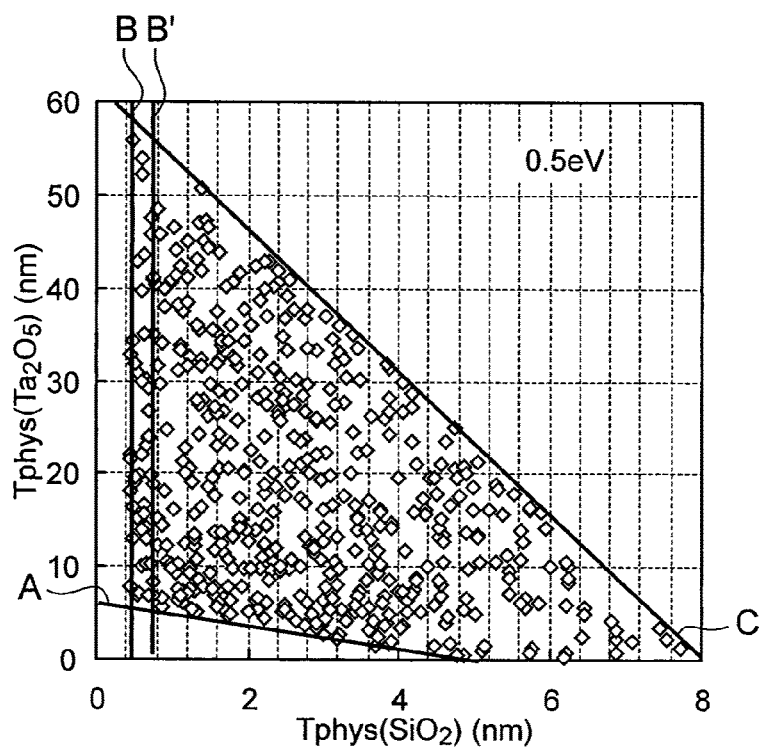
Figure 38G:
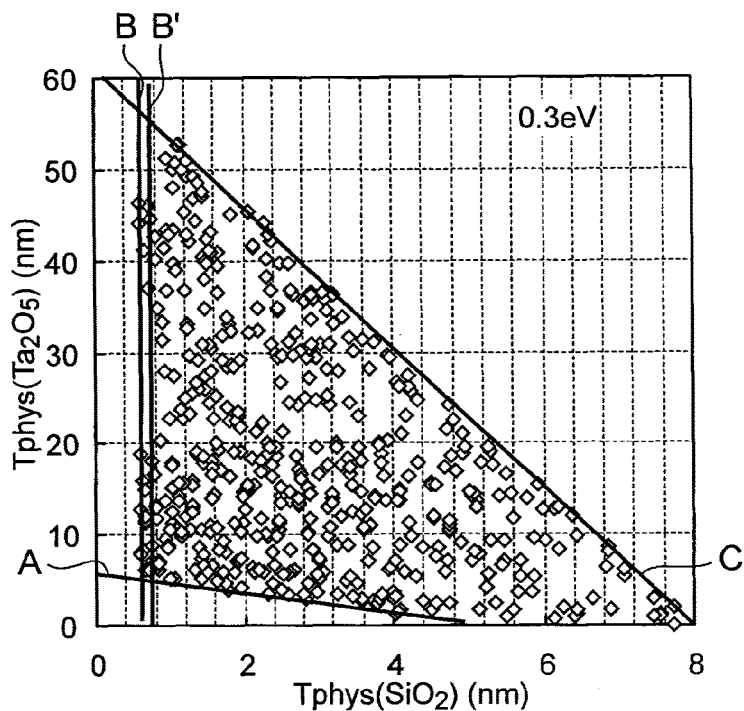
Figure 38H:
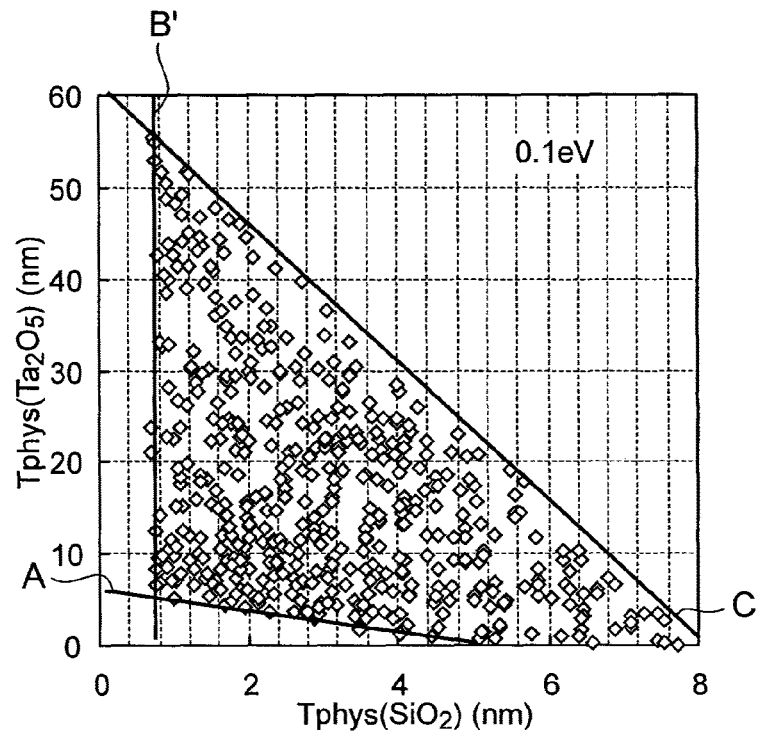
Figure 39:
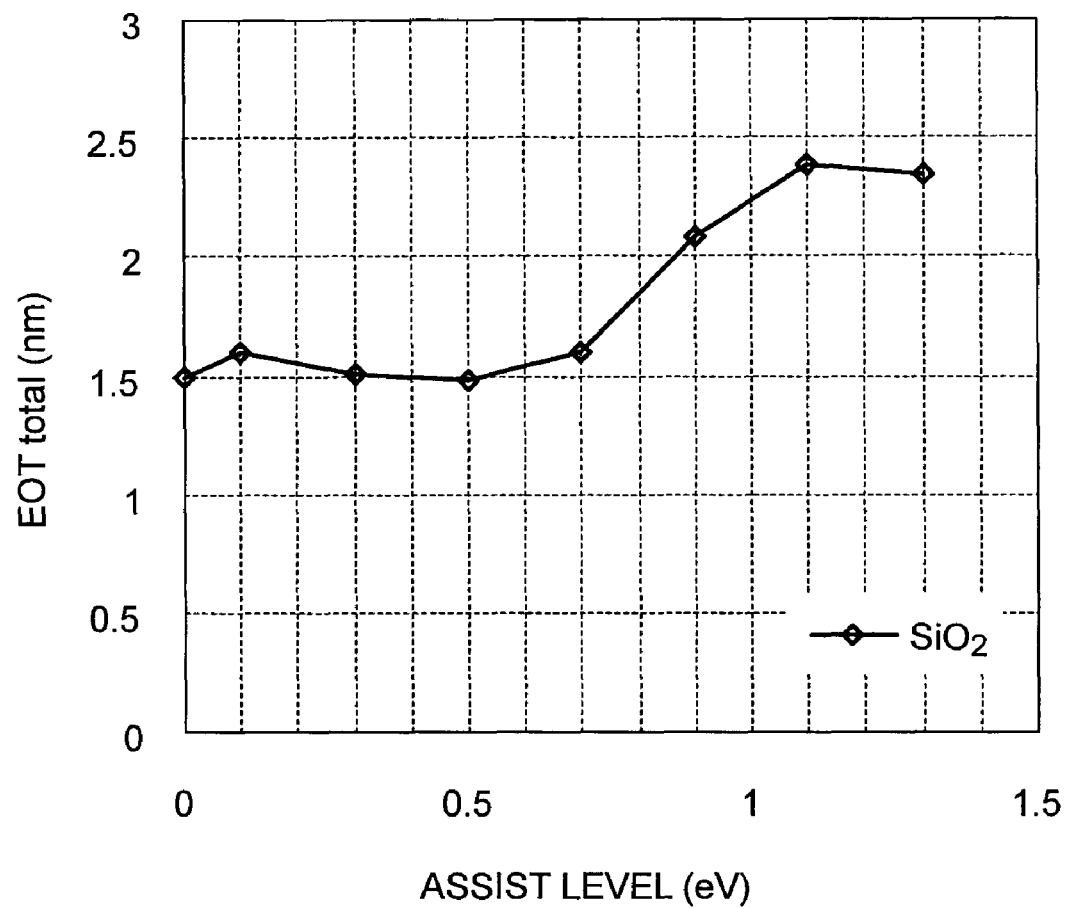
FIG. 39 shows the dependence of the EOT of the tunnel insulating film on the assist level according to the embodiment.

FIGS. 38A to 38H concerns the cases where the assist level of the $Ta_2O_5$ layer is 0 eV (the assist level does not exist), 1.3 eV, 1.1 eV, 0.9 eV, 0.7 eV, 0.5 eV, 0.3 eV, and 0.1 eV, respectively. FIG. 39 shows the relationship between each of those assist levels and the EOT of the tunnel insulating film. As can be seen from FIG. 39, in a case where the assist level of a $Ta_2O_5$ layer is formed, the EOT becomes equal to or larger than the EOT observed in a case where the assist level is not formed (the case of 0 eV), and therefore, a suitable assist level for reducing the EOT does not exist. However, when the assist level exists in the $Ta_2O_5$ layer, the layer thickness of the low-k layer (the value at the intersection between the straight line B and the abscissa axis) can be made smaller than the layer thickness the low-k layer needs to have when the assist level does not exist (the value at the intersection between the straight line B' and the abscissa axis) (FIGS. 38E to 38H). If the $Ta_2O_5$ layer does not have the assist level, the layer thickness of the $SiO_2$ layer needs to be 0.75 nm (FIG. 38A). However, if the assist level is in the range of 0.3 eV to 0.7 eV, the layer thickness of the $SiO_2$ layer can be made as thin as 0.3 nm (FIGS. 38E to 38G).

In FIGS. 20A to 20I, FIGS. 24A to 24L, FIGS. 26A to 26K, FIGS. 28A to 28J, FIGS. 30A to 30I, FIGS. 32A to 32K, FIGS. 34A to 34K, FIGS. 36A to 36J, and FIGS. 38A to 38H, the layer thickness ranges include regions having no dots. In those regions, electrons are trapped while emitting energy, and the desired requirements as the tunnel insulating film are satisfied in those regions, as in the regions filled with dots.

Figures 40A, 40B:
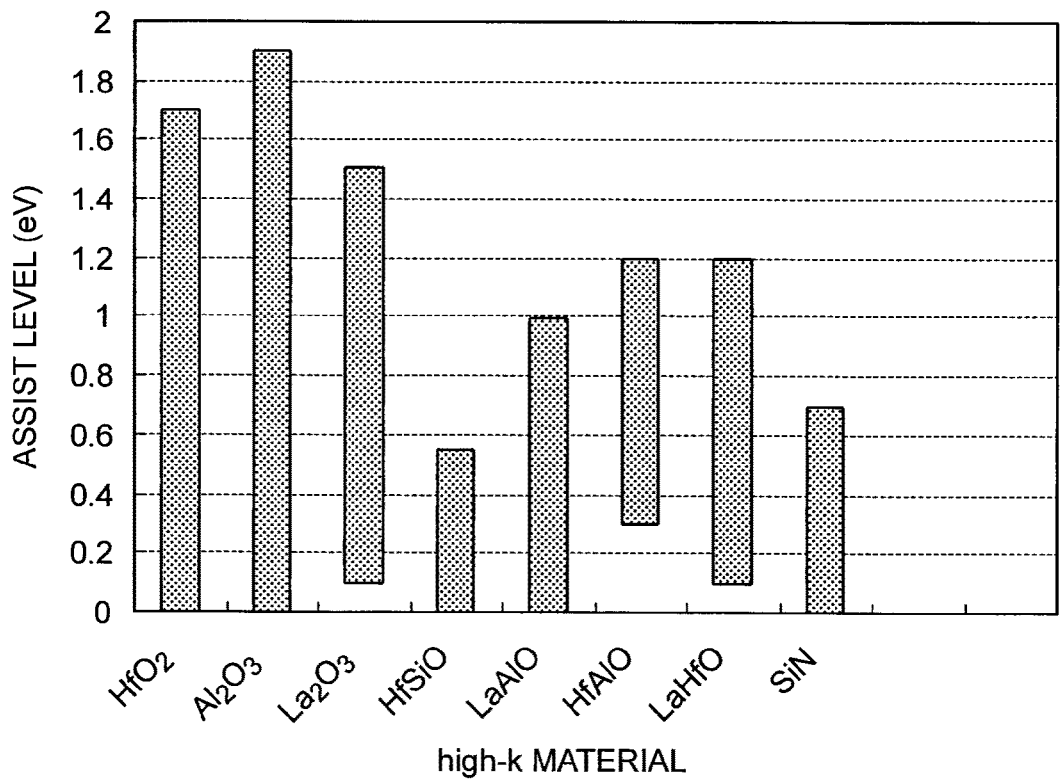
FIGS. 40A and 40B show the ranges of assist levels that satisfy the requirements for the tunnel insulating film used in an embodiment.

FIGS. 21, 25, 27, 29, 31, 33, 35, 37, and 39 also show appropriate assist level ranges for reducing the EOT. FIGS. 40A and 40B show the appropriate ranges for the respective high-k layers. FIG. 40A is a graph illustrating the ranges of the assist levels in which each stacked structure having the assist level is more effective than a single-layer high-k insulating film. FIG. 40B is a table showing the ranges of the assist levels and the minimum EOTs. As can be seen from FIG. 40B, the smallest EOT of a tunnel insulating film is 1.26 nm observed when the high-k layer is a LaAlO layer. The upper limit of the EOT of a tunnel insulating film is 5 nm, as mentioned in accordance with the first embodiment. Accordingly, the EOTs of tunnel insulating films should be in the range of 1.26 nm to 5 nm.

Figures 41A, 41B:
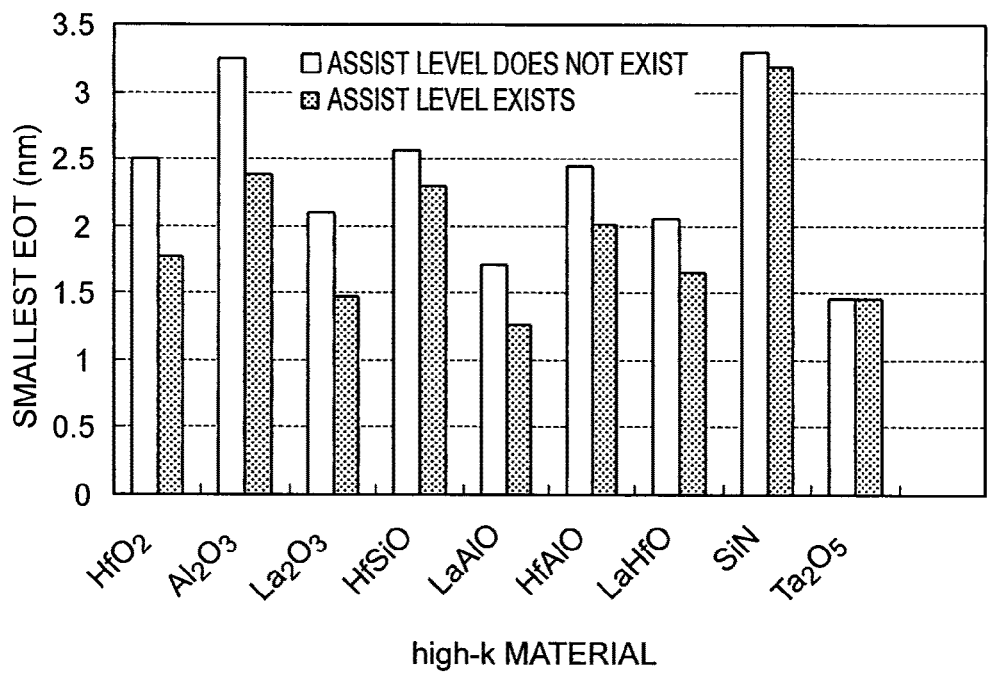
FIGS. 41A and 41B show the results of comparisons between the minimum EOT in a case where the assist level exists in the tunnel insulating film and the minimum EOT in a case where the assist level does not exist.

FIGS. 41A and 41B show the results of comparisons between cases where each tunnel insulating film of a stacked structure of each high-k layer and a $SiO_2$ layer has the assist level and cases where each tunnel insulating film does not have the assist level.

As can be seen from FIGS. 41A and 41B, the EOT in each case with the assist level can be made smaller than the EOT in each corresponding case without the assist level.

Other than the above mentioned high-k materials, any materials having substantially the same dielectric constants and $\Delta Ec$ as those high-k materials, or any materials having dielectric constants and $\Delta Ec$ falling between those of the above high-k materials may be used as high-k materials in embodiments of the present invention. In such a case, there are appropriate ranges of physical layer thicknesses. Each of those ranges can be accurately calculated based on the explanation made so far, or can be estimated by performing an interpolation or extrapolation based on the data of each of the above mentioned high-k layers.

Although the low-k insulating layer is a $SiO_2$ layer in each of the above example cases, the same effects as above can be achieved with a nitride film such as a SiN film or SiON film, an oxynitride film, or an insulating film containing any of those nitride films and oxynitride films, as long as it has a low dielectric constant. A $TiO_2$ film does not have the range of film thicknesses that satisfies the requirements for the tunnel insulating film defined in the embodiments of the present invention, regardless of whether the assist level exists.

In a case where a stacked structure is formed with a high-k layer and a low-k layer, generalization is set as follows. In the case where the high-k layer is $HfO_2$ layer while the low-k layer is a $SiO_2$ layer, the tunnel insulating film needs to have $1.0 \times 10^{-16}$ $A/cm^2$ or less when the electric field $E_{ox}$ is a low electric field of 3 MV/cm, and needs to have 0.1 $A/cm^2$ or more when the electric field $E_{ox}$ is a high electric field of 13 MV/cm. However, the same effects as above can be achieved, as long as the high-k layer and the low-k layer have different dielectric constants. The requirements in a charge retaining state are that the leakage current is $J_{low}$ or lower in the electric field $E_{low}$. Where $T_{1,\ low}$ represents the necessary physical film thicknesses of the low-k layer when the tunnel insulating film is formed of only the low-k layer and the low-k layer needs to restrict the leakage current to $J_{low}$ or lower, $T_{2,\ low}$ represents the necessary physical film thicknesses of the high-k layer when the tunnel insulating film is formed of only the high-k layer and the high-k layer needs to restrict the leakage current to $J_{low}$ or lower, and $T_1$ and $T_2$ represent the physical layer thicknesses of the low-k layer and the high-k layer forming a stacked structure, the following equation is satisfied:

$$T_2 = -(T_{2,low}/T_{1,low}) \times T_1 + T_{2,low} \quad (12)$$

This is the equation corresponding to the straight line A in each of FIG. 11, FIGS. 20A to 20I, FIGS. 24A to 24L, FIGS. 26A to 26K, FIGS. 28A to 28J, FIGS. 30A to 30I, FIGS. 32A to 32K, FIGS. 34A to 34K, FIGS. 36A to 36J, and FIGS. 38A to 38H. The value of $T_{1,\ low}$ is equal to the value at the intersection of the straight line A and the abscissa axis, and the value of $T_{2,\ low}$ is equal to the value at the intersection of the straight line A and the ordinate axis. Accordingly, when the low-k layer is a $SiO_2$ layer, the value of $T_{2,\ low}$ is 5 nm.

The requirements at the time of writing are that the leakage current is $J_{high}$ or more when the electric field is $E_{high}$. Where $T_{1,\ high}$ represents the smallest film thickness the low-k needs to have, the following equation is established:

$$T_1 = T_{1,high} \quad (13)$$

This equation corresponds to the straight line B shown in FIG. 10.

When a stacked structure functions as a tunnel insulating film, there is a limit to the trapping level $\phi_{t1}$ of the low-k layer. More specifically, it is necessary to satisfy the following expression:

$$0 \leq \phi_{t1} \leq \Delta \phi_b + \phi_{t2} \quad (14)$$

Or the low-k layer needs to have no traps. Here, $\Delta \phi_b$ is defined as:

$$\Delta \phi_b = \phi_{b1} - \phi_{b2} \quad (15)$$

If the expression (14) is not satisfied, the leakage current in a low electric field becomes higher, and charges cannot be retained. Here, $\phi_{b1}$ and $\phi_{b2}$ respectively represent the barrier heights of the low-k layer and the high-k layer with respect to the Fermi level $E_F$ of the silicon substrate.

Figure 42:
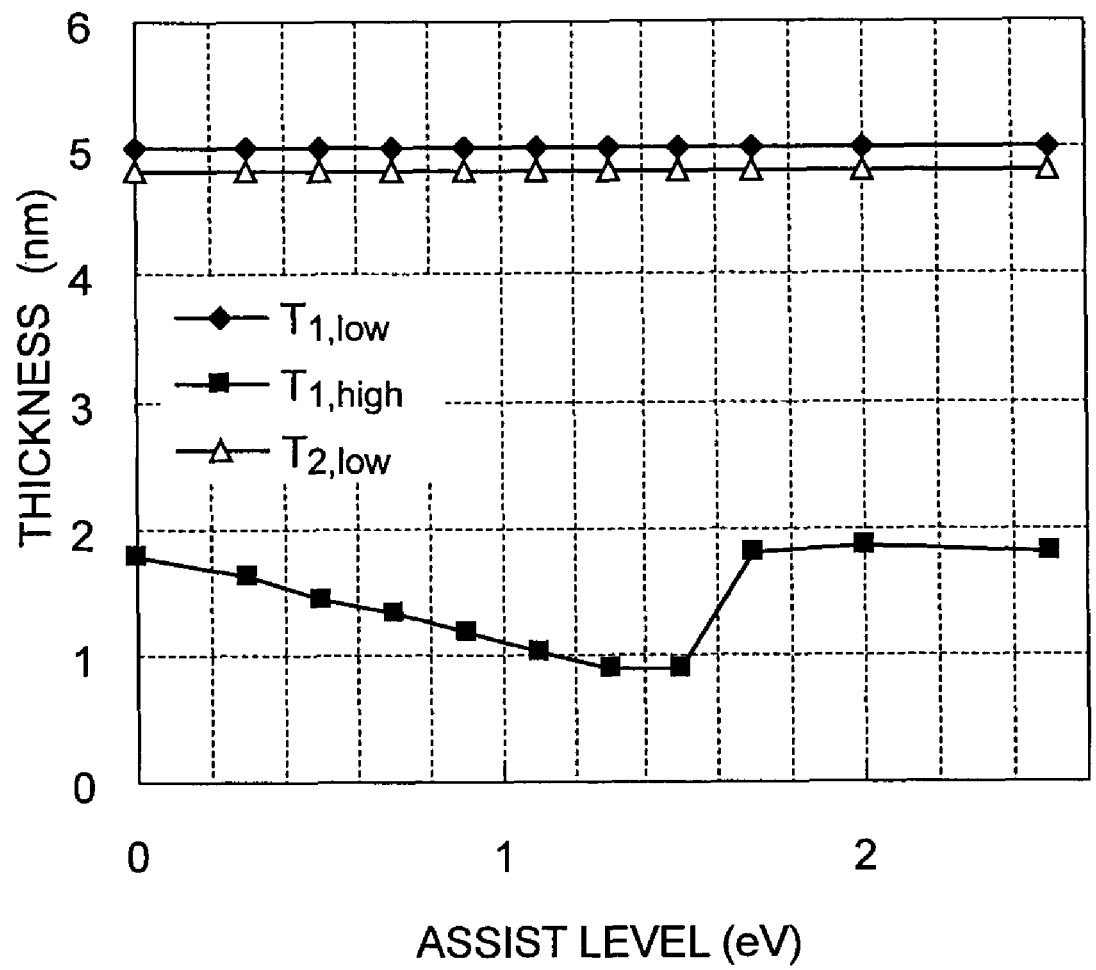
FIG. 42 shows the relationships between the assist level and the physical film thicknesses $T_{1, low}$, $T_{1, high}$, and $T_{2, low}$ in the tunnel insulating film according to an embodiment.
Figure 43:
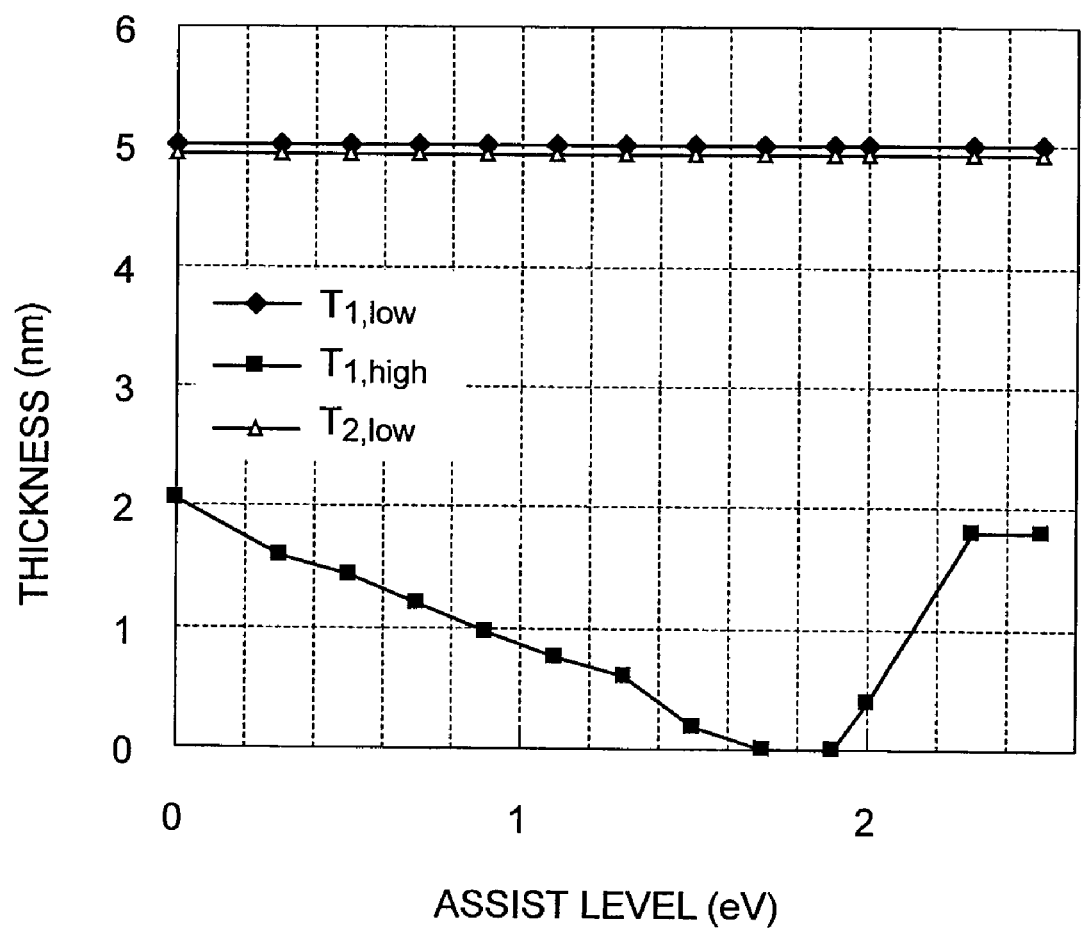
FIG. 43 shows the relationships between the assist level and the physical film thicknesses $T_{1, low}$, $T_{1, high}$, and $T_{2, low}$ in the tunnel insulating film according to another embodiment.
Figure 44:
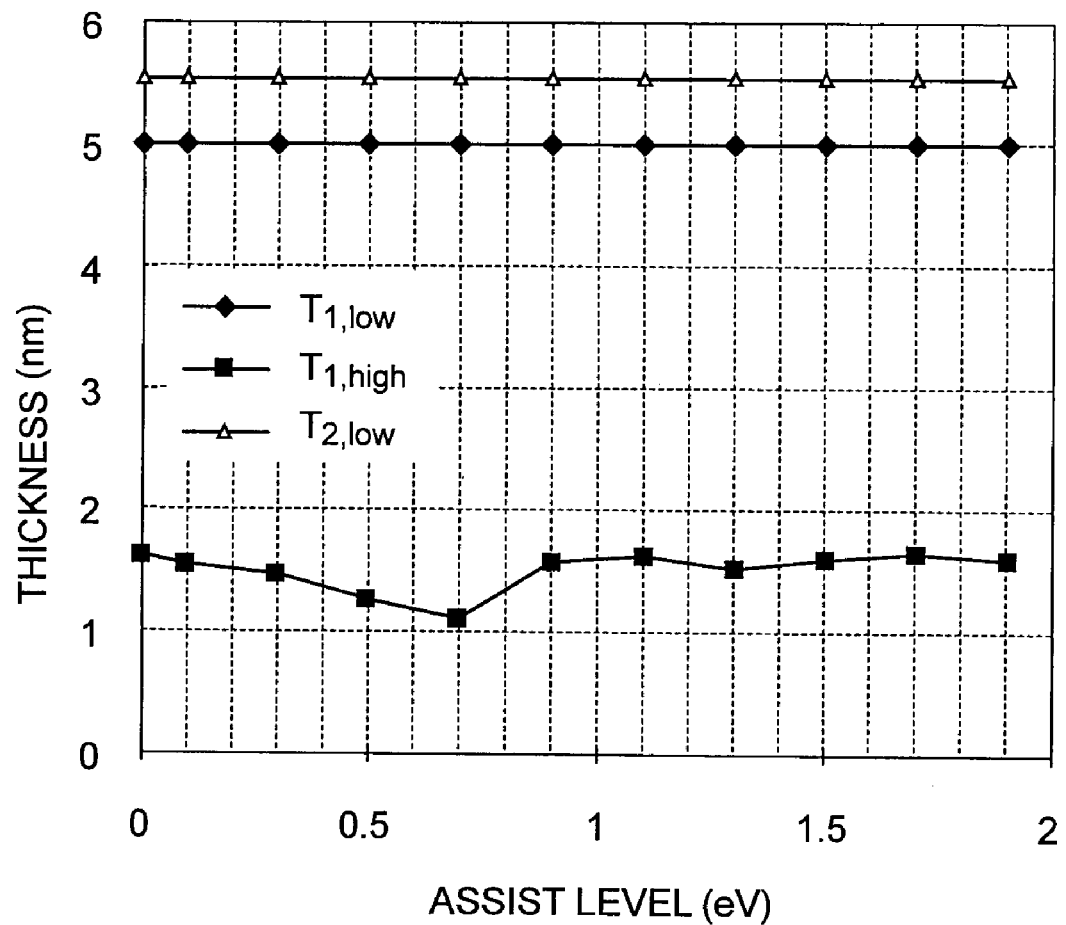
FIG. 44 shows the relationships between the assist level and the physical film thicknesses $T_{1, low}$, $T_{1, high}$, and $T_{2, low}$ in the tunnel insulating film according to yet another embodiment.
Figure 45:
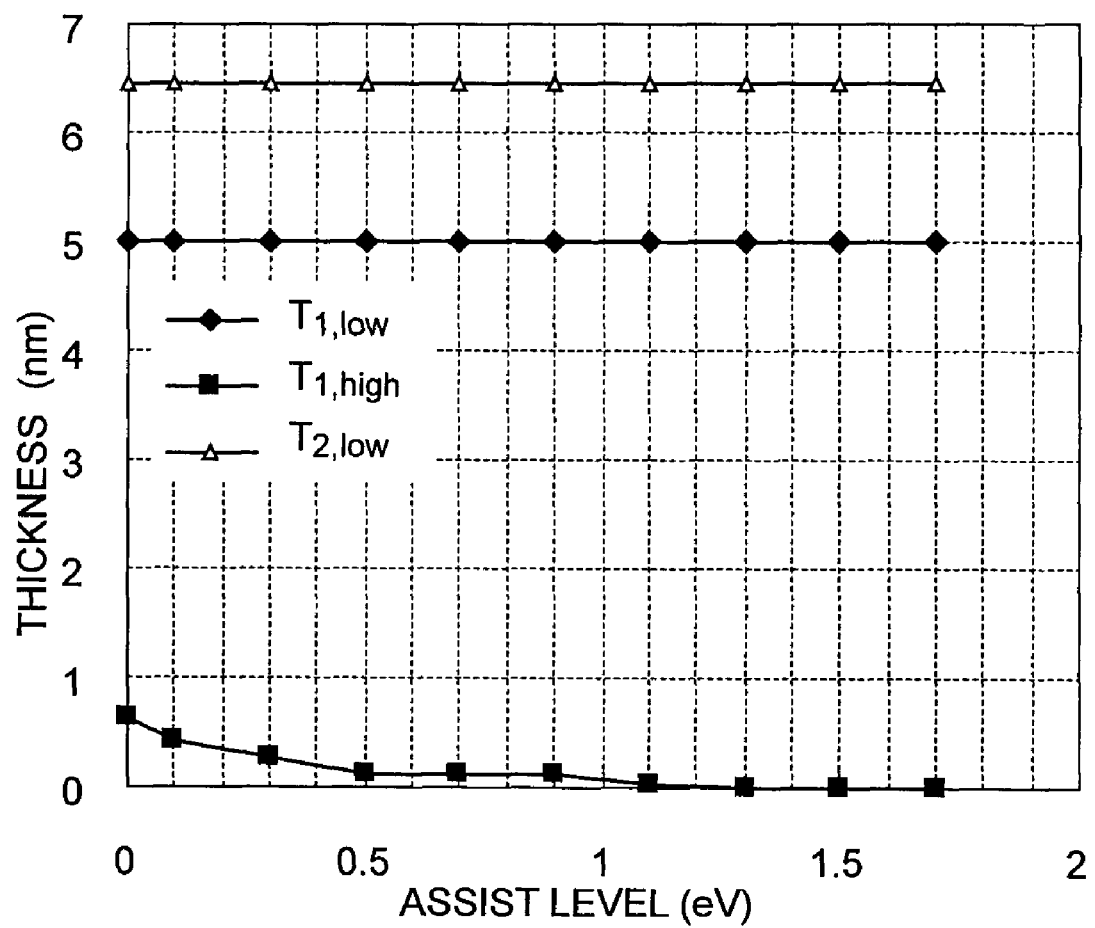
FIG. 45 shows the relationships between the assist level and the physical film thicknesses $T_{1, low}$, $T_{1, high}$, and $T_{2, low}$ in the tunnel insulating film according to still another embodiment.
Figure 46:
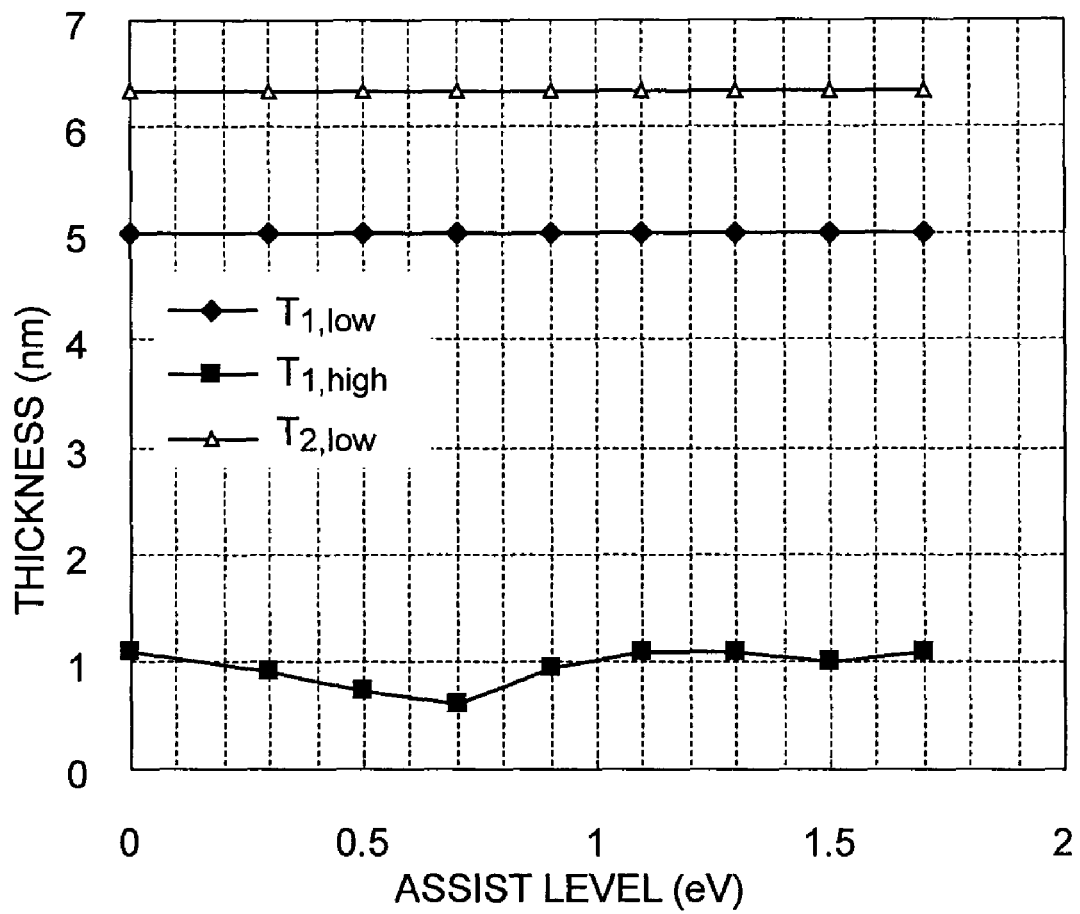
FIG. 46 shows the relationships between the assist level and the physical film thicknesses $T_{1, low}$, $T_{1, high}$, and $T_{2, low}$ in the tunnel insulating film according to yet another embodiment.
Figure 47:
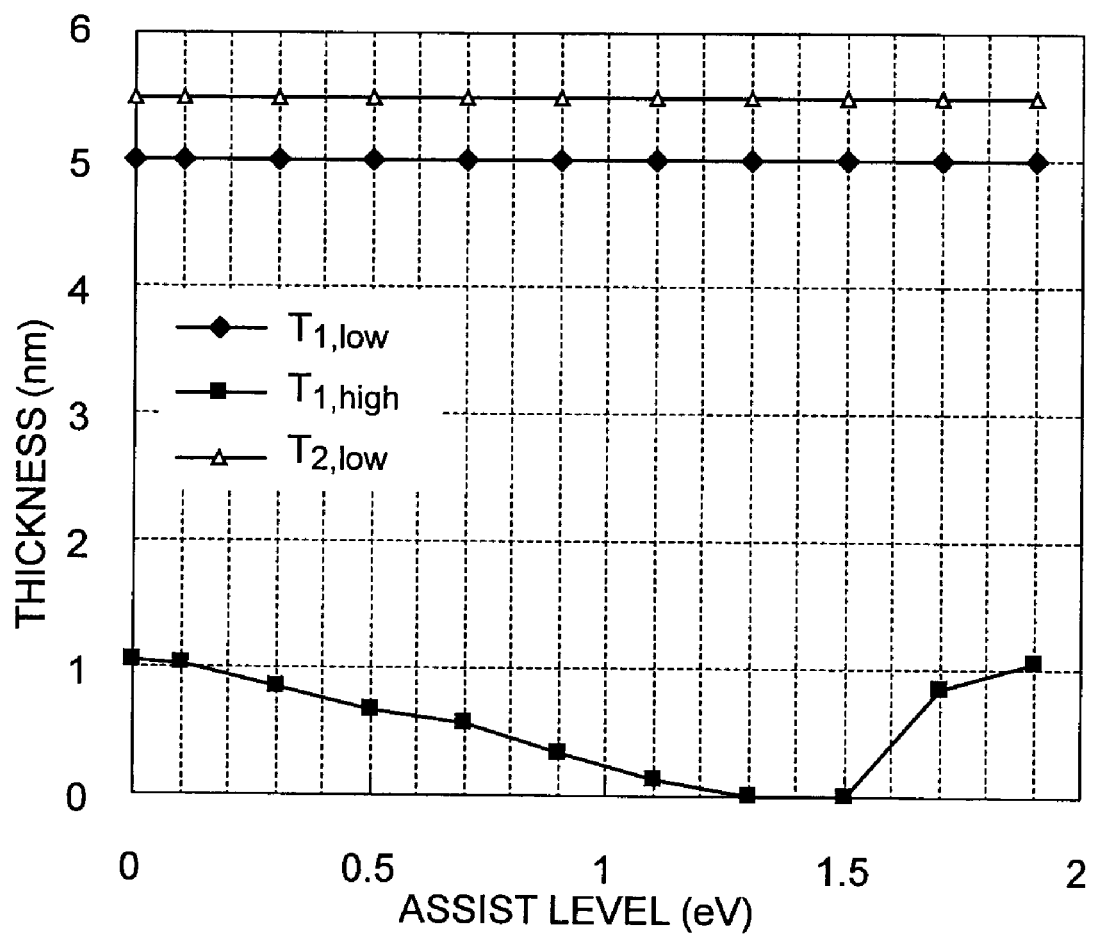
FIG. 47 shows the relationships between the assist level and the physical film thicknesses $T_{1, low}$, $T_{1, high}$, and $T_{2, low}$ in the tunnel insulating film according to still another embodiment.
Figure 48:
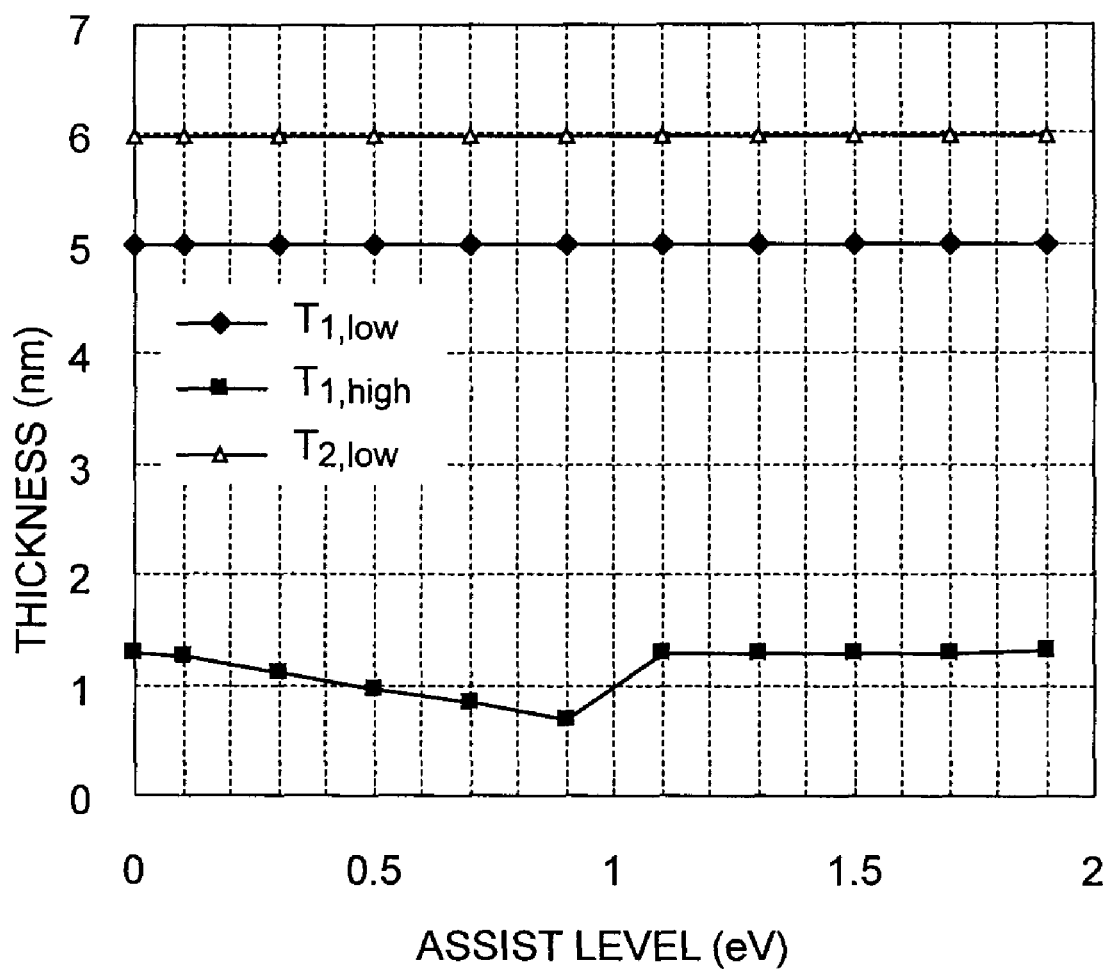
FIG. 48 shows the relationships between the assist level and the physical film thicknesses $T_{1, low}$, $T_{1, high}$, and $T_{2, low}$ in the tunnel insulating film according to yet another embodiment.
Figure 49:
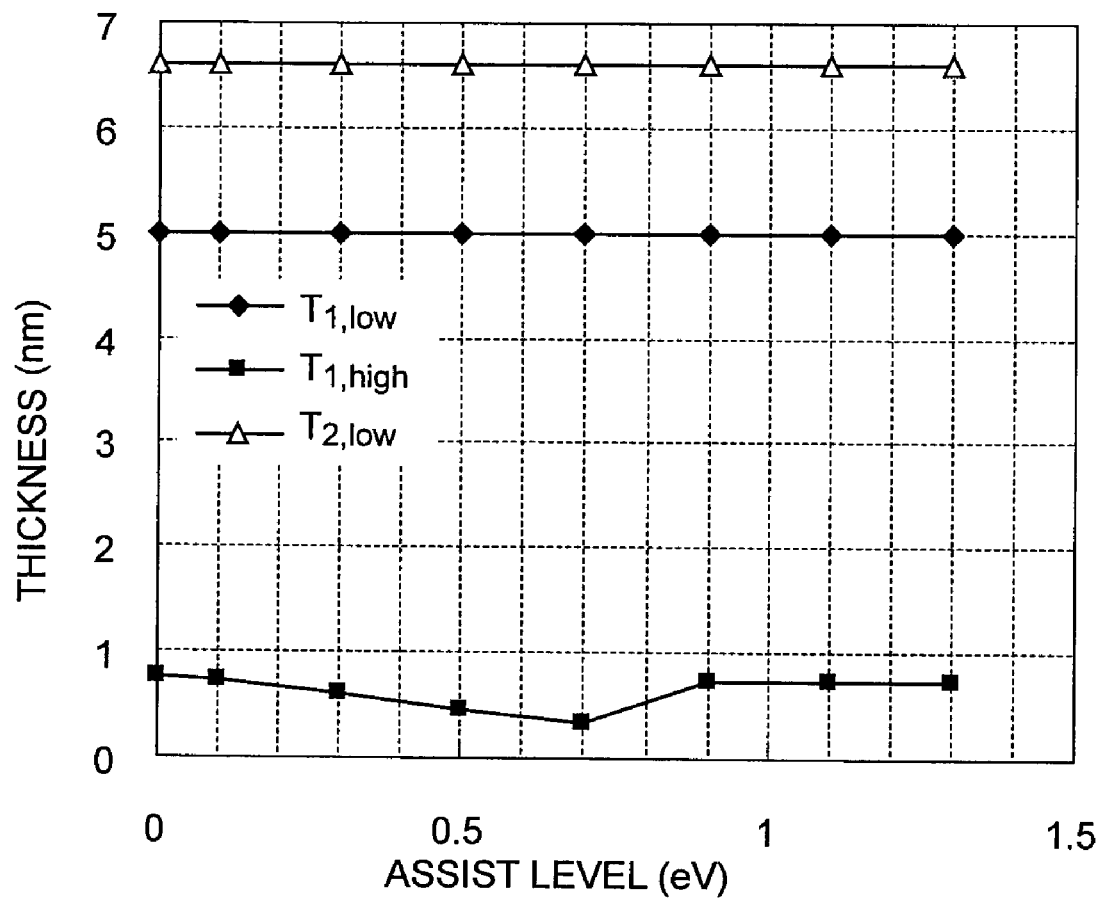
FIG. 49 shows the relationships between the assist level and the physical film thicknesses $T_{1, low}$, $T_{1, high}$, and $T_{2, low}$ in the tunnel insulating film according to still another embodiment.

As described above, the relationship between the assist level and the film thickness range of each insulating layer necessary as a tunnel insulating film is determined by the equations and expression (12) to (15). FIGS. 42 to 49 show the ranges of the layer thicknesses of various high-k layers and low-k layers with various assist levels. FIG. 42 shows the relationships between the assist level and $T_{1,\,low}$, $T_{1,\,high}$, and $T_{2,\,low}$ in a case where a $HfO_2$ layer is selected as the high-k layer while a $SiO_2$ layer is selected as the low-k layer. FIG. 43 shows the relationships between the assist level and $T_{1,\,low}$, $T_{1,\,high}$, and $T_{2,\,low}$ in a case where an $Al_2O_3$ layer is selected as the high-k layer while a $SiO_2$ layer is selected as the low-k layer. FIG. 44 shows the relationship between the assist level and $T_{1,\,low}$, $T_{1,\,high}$, and $T_{2,\,low}$ in a case where a $La_2O_3$ layer is selected as the high-k layer while a $SiO_2$ layer is selected as the low-k layer. FIG. 45 shows the relationships between the assist level and $T_{1,\,low}$, $T_{1,\,high}$, and $T_{2,\,low}$ in a case where a HfSiO layer is selected as the high-k layer while a $SiO_2$ layer is selected as the low-k layer. FIG. 46 shows the relationships between the assist level and $T_{1,\,low}$, $T_{1,\,high}$, and $T_{2,\,low}$ in a case where a LaAlO layer is selected as the high-k layer while a $SiO_2$ layer is selected as the low-k layer. FIG. 47 shows the relationships between the assist level and $T_{1,\,low}$, $T_{1,\,high}$, and $T_{2,\,low}$ in a case where a HfAlO layer is selected as the high-k layer while a $SiO_2$ layer is selected as the low-k layer. FIG. 48 shows the relationships between the assist level and $T_{1,\,low}$, $T_{1,\,high}$, and $T_{2,\,low}$ in a case where a LaHfO layer is selected as the high-k layer while a $SiO_2$ layer is selected as the low-k layer. FIG. 49 shows the relationships between the assist level and $T_{1,\,low}$, $T_{1,\,high}$, and $T_{2,\,low}$ in a case where a $Ta_2O_5$ layer is selected as the high-k layer while a $SiO_2$ layer is selected as the low-k layer. Based on those relationships, restrictions are put on the type (or the barrier height and the dielectric constant) of high-k layer, the layer thickness range of the high-k layer forming a stacked structure with a low-k layer, and the assist level that satisfy the requirements for the tunnel insulating film. As can be seen from FIGS. 42 to 49, $T_{1,\,low}$ and $T_{2,\,low}$ vary with the material, but do not greatly vary with the assist level. It is also apparent from FIGS. 42 to 49 that $T_{1,\,high}$ varies with both the material and the assist level.

The ranges of suitable physical film thicknesses of a high-k layer and a low-k layer can be determined by the equation (12) (the equation corresponding to the straight line A in FIG. 11, for example), the equation (13) (the equation corresponding to the straight line B in FIG. 11, for example), the expression of the defined value of the EOT (EOT=8 nm in the above embodiments) of a stack insulating film formed with a high-k layer and a low-k layer (the expression corresponding to the straight line C in FIG. 11, for example), and the suitable range of the assist level in each material. The defined value of the $EOT_{total}$ (EOT=8 nm in the above embodiments) of a stack insulating film formed with the high-k layer and the low-k layer is expressed as:

$$EOT_{total} = T_1 \times \in_{ox}/\in_1 + T_2 \times \in_{ox}/\in_2 = 8 \text{ (nm)} \quad (16)$$

where $\in_1$ and $\in_2$ represent the dielectric constants of the low-k layer and the high-k layer, $T_1$ and $T_2$ represent the physical film thicknesses of the low-k layer and the high-k layer, and $\in_{ox}$ represents the dielectric constant of $SiO_2$. Accordingly, the region surrounded by the regions expressed by the equation (12), the equation (13), and the equation (16) is the region of the suitable physical film thicknesses of the high-k layer and the low-k layer. This region varies with the suitable range of the assist level in each material. Also, this region is equivalent to the region that satisfies the following three in equations:

$$T_2 \geq -(T_{2,low}/T_{1,low}) \times T_1 + T_{2,low}$$

$$T_1 \geq T_{1,high}$$

$$T_1 \times \in_{ox}/\in_1 + T_2 \times \in_{ox}/\in_2 \leq 8$$

To minimize the film thickness of the tunnel insulating film, $T_1$ is determined according to the equation (13), and $T_2$ is expressed as follows by assigning the equation (13) to the equation (12):

$$T_2 = -(T_{2,low}/T_{1,low}) \times T_{1,high} + T_{2,low} \quad (17)$$

As described above, according to the equations (12), (13), (16), and (17), it is easy to determine the respective film thicknesses of the high-k layer and the low-k layer in a stack insulating film, and the effective assist level, so as to satisfy the requirements for a tunnel insulating film including any type of high-k layer.

(Remarks on Assist Level Distribution)

Figure 50B:
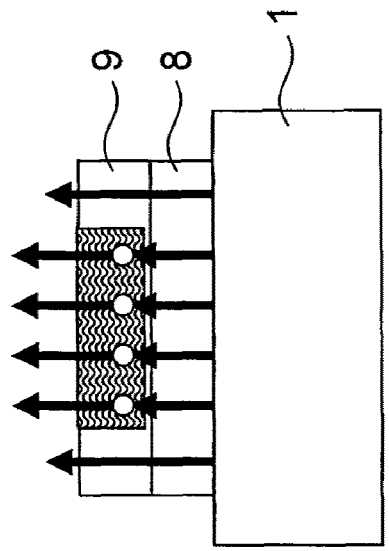
FIGS. 50A and 50B illustrate cases where the tunnel insulating film partially has the assist level.
Figure 50A:
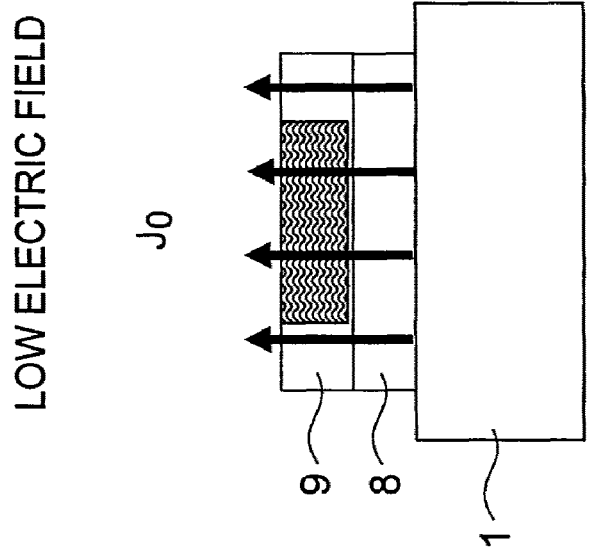

The assist level does not need to exist evenly and parallel to the film. FIGS. 50A and 50B are schematic views of a tunnel insulating film in which the assist level partially exists. The tunnel insulating film is formed by stacking a low-k layer 8 and a high-k layer 9 having the assist level on a substrate 1. With the ratio of the region having the assist level being R, the ratio of the region without the assist level is expressed as 1-R. Where $J_{tat}$ represents the leakage current in the region having the assist level, and $J_0$ represents the leakage current in the region without the assist level, the current J flowing in the entire film is expressed as:

$$J = R \times J_{tat} + (1-R) \times J_0 \quad (18)$$

As shown in FIG. 9A, the leakage current does not depend on the existence of the assist level in a low electric field, and accordingly, the leakage current can be restricted to a low amount in the entire film. In a high electric field, the leakage current becomes higher when the assist level exists, as shown in FIG. 9B. Accordingly, the leakage current can be increased only in the region having the assist level. As shown in FIGS. 50A and 50B, the assist level can be formed inside the end portions of the film, rather than at the end portions. With this arrangement, the leakage current can be increased in the regions other than the end portions at which insulation breakdown is easily caused due to electric field concentration. Thus, the reliability of the film can be made higher.

Defects that inherently exist in the high-k layer (a $HfO_2$ layer, for example), such as defects formed from oxygen vacancy, are in stable and are not controlled. Therefore, such defects do not function as the assist level in the embodiments of the present invention. To achieve the same effects as those of the embodiments of the present invention, it is necessary to add an element to the film, so that an assist level of sufficient density is formed at an optimum position, and the requirements for the tunnel insulating film are satisfied. In other words, it is necessary to form an assist level intentionally in a layer inherently not having defects or in a layer inherently having defects. Therefore, an insulating layer having such effects should be a layer formed with three or more elements including the element to be added. The element to be added may be added at a location that has replaced the lattices forming the layer to which the element is added, or at a location between lattices of the layer to which the element is added.

If the tunnel insulating film has a stacked structure in which a first insulating layer (a low-k layer), a second insulating layer (a high-k layer), and a third insulating layer are stacked in this order, it is preferable that the third insulating layer has the same dielectric constant as the first insulating layer, or has a dielectric constant that falls between the dielectric constant of the first insulating layer and the dielectric constant of the second insulating layer.

Third Embodiment

Referring now to FIGS. 51A to 52D, a method for manufacturing a FG-type nonvolatile memory in accordance with a third embodiment of the present invention is described. FIGS. 51A, 51C, 51E, 52A, and 52C are cross-sectional views that are orthogonal to the cross-sectional views of FIGS. 51B, 51D, 51F, 52B, and 52D, respectively.

Figure 51B:
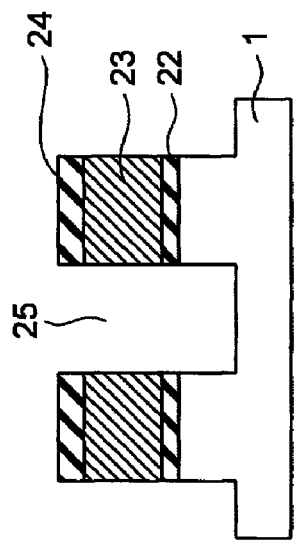
FIGS. 51A to 51F are cross-sectional views illustrating procedures in a method for manufacturing a floating-gate flash memory according to a third embodiment.
Figure 51D:
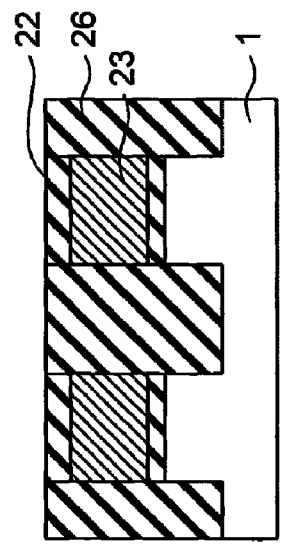
Figure 51F:
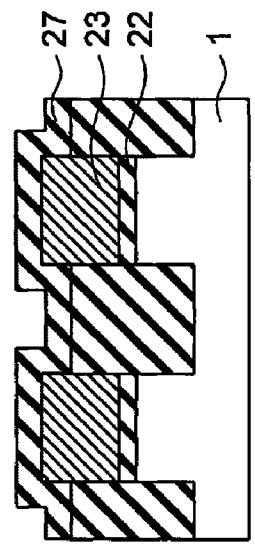
Figure 51A:
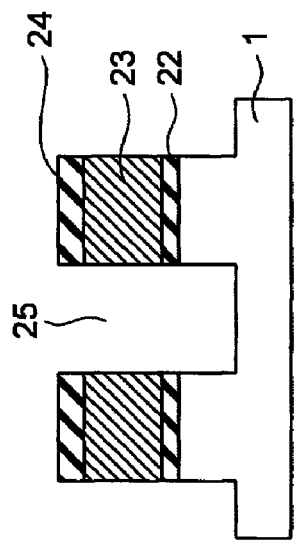

First, as shown in FIGS. 51A and 51B, a tunnel insulating film 22 having the assist level described in the foregoing embodiments is formed on the surface of a p-type silicon substrate 1 that is doped with desired impurities. For example, after a $SiO_2$ layer is formed by oxidizing the surface through combustion oxidation with the use of hydrogen and oxygen at 750° C., a $HfO_2$ layer having Ge added thereto is formed by CVD (chemical vapor deposition), so as to obtain a tunnel insulating film having the assist level. A 60 nm thick phosphorus-doped crystalline silicon layer 23 to be the floating gate electrode is deposited by CVD. A mask member 24 formed with a silicon nitride film, for example, is formed on the crystalline silicon layer 23. After that, etching is performed on the mask member 24, floating gate electrode 23, and the tunnel insulating film 22 in this order by reactive ion etching (RIE) that involves a resist mask (not shown). Through the etching, the surface of the silicon substrate 1 is partially exposed. Etching is further performed on the exposed portions of the silicon substrate, so as to form 100 nm deep device isolation grooves 25.

Figure 51C:
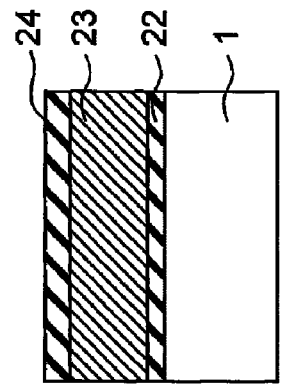

As shown in FIGS. 51C and 51D, a silicon oxide film 26 for device isolation is deposited on the entire surface, so as to completely fill the device isolation grooves 25. The silicon oxide film 26 at the surface portion is removed by CMP (chemical mechanical polishing), so as to flatten the surface. Here, the upper face of the silicon nitride film 24 as the mask member is exposed.

Figure 51E:
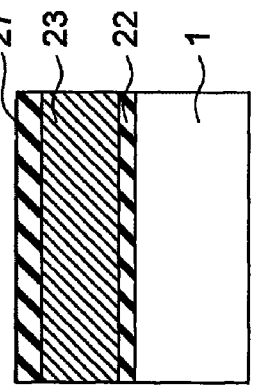

After the exposed mask member 24 is selectively removed by etching, the exposed surface of the silicon oxide film 26 is removed by etching with the use of diluted hydrofluoric acid or the like, so as to partially expose the sidewall faces of the floating gate electrode 23. A high-dielectric film to be an interelectrode insulating film 27 is then formed. For example, an interelectrode insulating film 27 made of HfAlO is formed on the floating gate electrode (the phosphorus-doped crystalline silicon layer) 23 (FIGS. 51E and 51F).

Figure 52A:
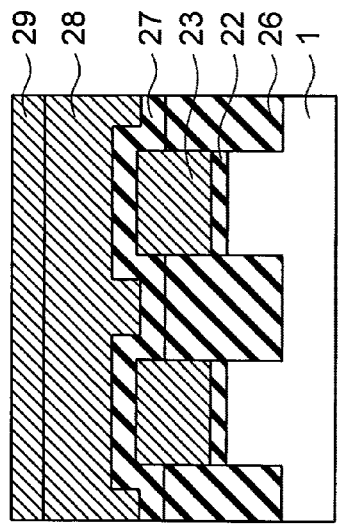
FIGS. 52A to 52D are cross-sectional views illustrating the rest of the procedures in the method for manufacturing the floating-gate flash memory according to the third embodiment.
Figure 52B:
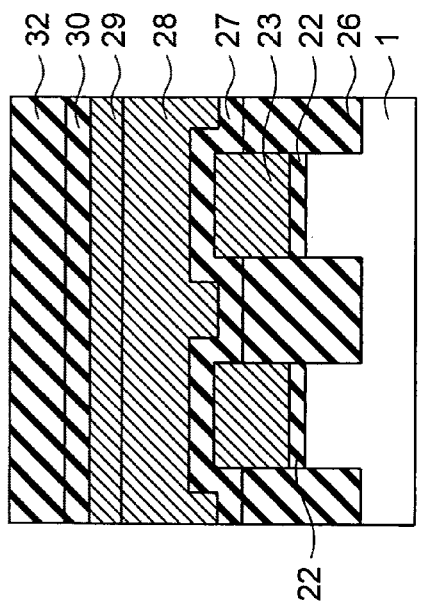

As shown in FIGS. 52A and 52B, a phosphorus-doped $n^+$-type polycrystalline silicon layer 28 is deposited by CVD at 620° C., and is formed as the control gate electrode. A tungsten silicide (WSi) layer 29 is then formed on the polycrystalline silicon layer 28, so as to form a 100 nm thick conductive layer of a two-layer structure formed with the WSi layer and the polycrystalline Si layer. Here, the WSi layer 29 is formed by depositing W by a CVD process that involves $W(CO)_6$ as a raw material gas, and then transforming the polycrystalline silicon layer into WSix in a heating procedure. The method of forming those films is not limited to the above, and some other raw material gas may be used. Also, it is possible to form those films by a technique other ALD and CVD, such as a sputtering technique, a vapor deposition technique, a laser abrasion technique, a MBE technique, or a combination of some of those techniques.

After that, etching is performed on the WSi layer 29, the polycrystalline silicon layer 28, the interelectrode insulating film 27, the floating gate electrode 23 of single-crystal silicon, and the tunnel insulating film 22 in this order by RIE with the use of a resist mask (not shown). Through the etching, slit portions 40 extending in the word-line direction are formed. In this manner, the shapes of the floating gate electrode and the control gate electrode are determined.

Figure 52C:
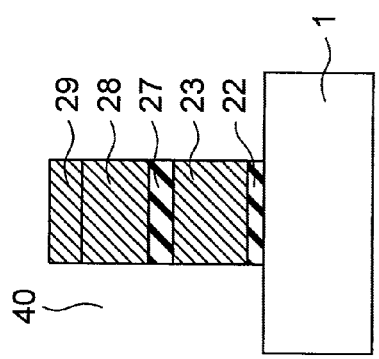
Figure 52D:
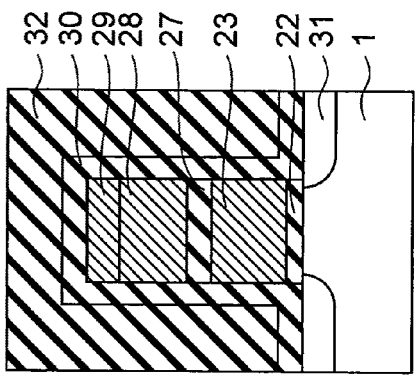

Lastly, as shown in FIGS. 52C and 52D, after a silicon oxide film 30 called an electrode sidewall oxide film is formed on the exposed surface by a thermal oxidation technique, $n^+$-type source and drain diffusion layers 31 are formed by an ion implantation technique. Further, an interlayer insulating film 32 such as a silicon oxide film is formed by CVD method to cover the entire surface. After that, a wiring layer and the likes are formed by known techniques, so as to complete a nonvolatile memory cell.

Fourth Embodiment

Referring now to FIGS. 53A to 54D, a method for manufacturing a MONOS-type nonvolatile memory in accordance with a fourth embodiment of the present invention is described. FIGS. 53A, 53C, 53E, 54A, and 54C are cross-sectional views that are perpendicular to the cross-sectional views of FIGS. 53B, 53D, 53F, 54B, and 54D, respectively.

Figure 53B:
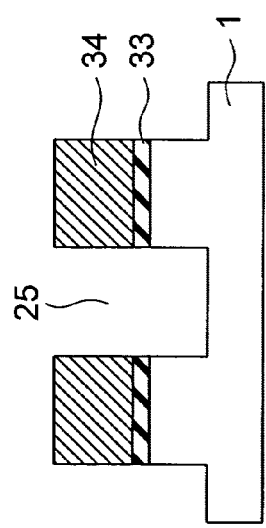
FIGS. 53A to 53F are cross-sectional views illustrating procedures in a method for manufacturing a MONOS-type flash memory according to a fourth embodiment.
Figure 53D:
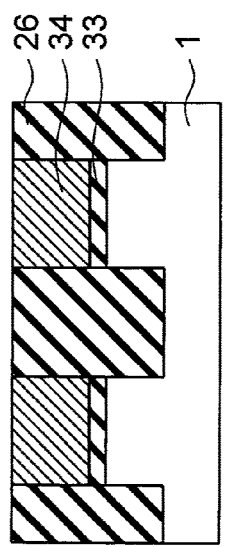
Figure 53F:
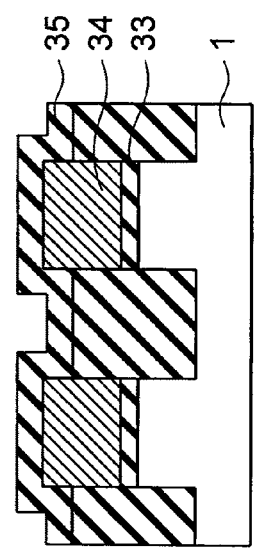
Figure 53A:
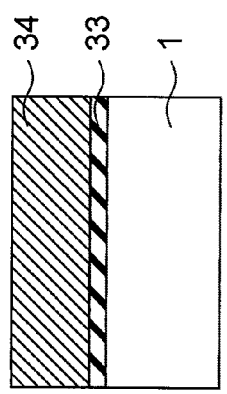

First, as shown in FIGS. 53A and 53B, a tunnel insulating film 33 having the assist level described in the foregoing embodiments is formed on the surface of a p-type silicon substrate 1 that is doped with desired impurities. For example, after a $SiO_2$ layer is formed by oxidizing the surface through combustion oxidation at 750° C. with the use of hydrogen and oxygen, a $HfO_2$ layer having Ge added thereto is formed by CVD. A 60 nm thick silicon nitride layer 34 to be the charge storage layer is then deposited by CVD. The gases used in this process may be dichlorosilane ($SiH_2Cl_2$) and ammonia ($NH_3$), or hexachlorodisilane ($Si_2Cl_6$) and ammonia ($NH_3$), for example. The film formation temperature is approximately 450° C. to 800° C. After that, etching is performed on the silicon nitride film 34 as the charge storage layer and the tunnel insulating film 33 in this order by reactive ion etching (RIE) that involves a resist mask (not shown). Through the etching, the surface of the silicon substrate 1 is partially exposed. Etching is further performed on the exposed portions of the silicon substrate, so as to form 100 nm deep device isolation grooves 25.

Figure 53C:
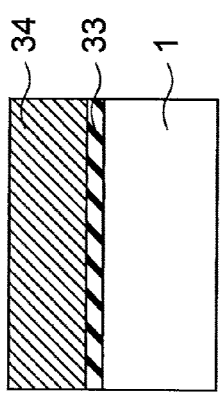

As shown in FIGS. 53C and 53D, a silicon oxide film 26 for device isolation is deposited on the entire surface, so as to completely fill the device isolation grooves 25. The silicon oxide film 26 at the surface portion is removed by CMP, so as to flatten the surface. Here, the upper face of the silicon nitride film 34 is exposed.

Figure 53E:
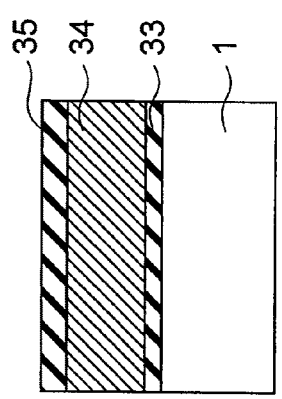

As shown in FIGS. 53E and 53F, the exposed surface of the silicon oxide film 26 is removed by etching with the use of diluted hydrofluoric acid, so as to expose the sidewall faces of the silicon nitride film 33. After that, a 15 nm thick HfAlO film to be a block insulating film 35 is formed on the entire surface. Although the base is a silicon substrate in this embodiment, it may be a SiN film. If the surface of the SiN layer is oxidized during the film formation, the SiN film turns into a SiON film with poorer charge retention properties. However, by the method described in accordance with the first embodiment, a HfAlO film can be formed on the SiON film while the characteristics of the SiN film are maintained. In this embodiment, the surface of the silicon oxide film 26 for device isolation is partially etched, so as to provide step portions to the block insulating film 35. However, the present invention is not limited to that structure, and the block insulating film 35 may be formed as a flat film. Whether to form the step portions can be determined in accordance with the capacity ratio of the tunnel insulating film and the charge storage layer.

Figure 54A:
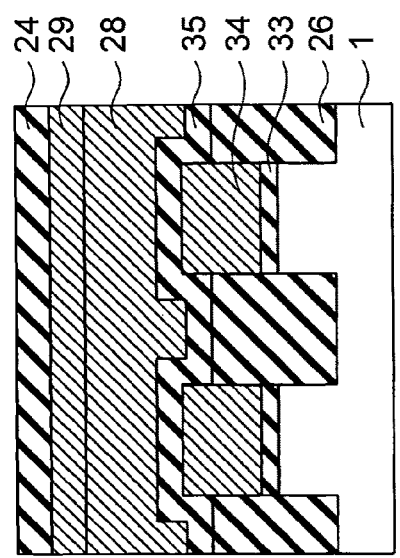
FIGS. 54A to 54D are cross-sectional views illustrating the rest of the procedures in the method for manufacturing the MONOS-type flash memory according to the fourth embodiment.
Figure 54B:
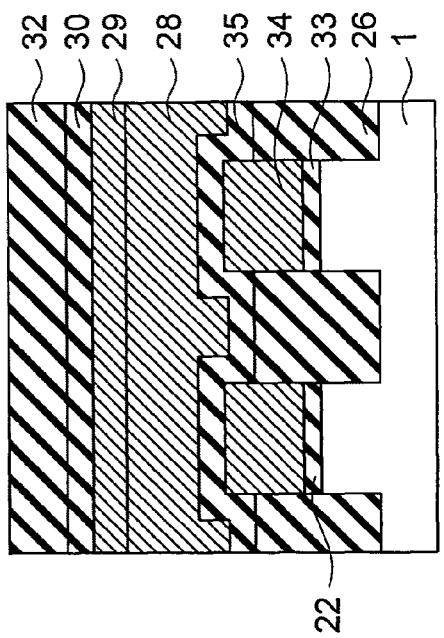

As shown in FIGS. 54A and 54B, a phosphorus-doped n$^+$-type polycrystalline silicon layer 28 is deposited by CVD at 420° C., and is formed as the control gate electrode. A WSi layer 29 is then formed on the polycrystalline silicon layer 28, so as to form a 100 nm thick electrode layer of a two-layer structure formed with the WSi layer 29 and the silicon layer 28. Here, the WSi layer 29 is formed by depositing W by a CVD process that involves W(CO)$_6$ as a raw material gas, and then transforming the polycrystalline silicon layer into WSix in a heating procedure. The method of forming those films is not limited to the above, and some other raw material gas may be used. Also, it is possible to form those films by a technique other ALD and CVD, such as a sputtering technique, a vapor deposition technique, a laser abrasion technique, a MBE technique, or a combination of some of those techniques. A silicon nitride film 24 as a mask material is then deposited on the WSi layer 29 to be the control gate electrode. After that, etching is performed on the silicon nitride film 24, the WSi layer 29, the polycrystalline silicon layer 28, the HfAlOx film as the block insulating film 35, the silicon nitride film as the charge storage layer 34, and SiON film as the tunnel insulating film 33 in this order by RIE with the use of a resist mask (not shown). Through the etching, slit portions 40 extending in the word-line direction are formed, as shown in FIG. 54A.

Figure 54C:
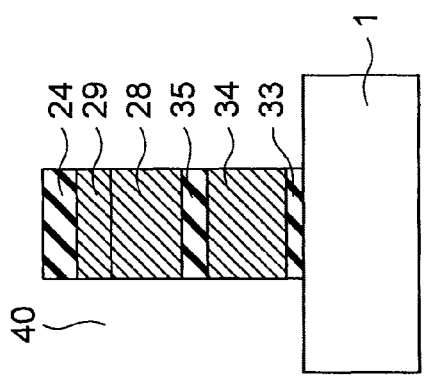
Figure 54D:
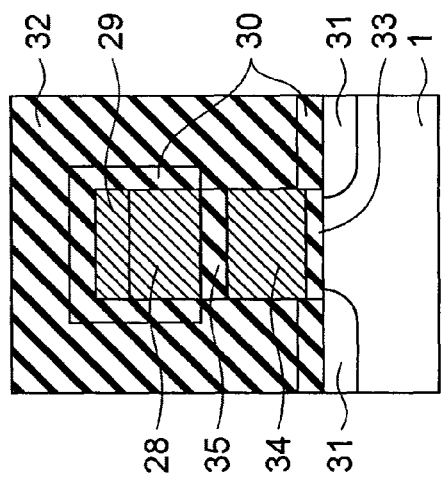

Lastly, as shown in FIGS. 54C and 54D, after a silicon oxide film 30 called an electrode sidewall oxide film is formed on the exposed surface by a thermal oxidation technique, n$^+$-type source and drain diffusion layers 31 are formed by an ion implantation technique. Further, an interlayer insulating film 32 such as a silicon oxide film is formed by CVD method to cover the entire surface. After that, a wiring layer and the likes are formed by known techniques, so as to complete a MONOS-type nonvolatile memory cell.

Although stacked structures that each includes a low-k layer and a high-k layer and each has the assist level have been described so far, a stacked structure may be a three-layer structure of a low-k layer, a high-k layer, and a low-k layer with the assist level, or may include more than three layers. Even if the dielectric constants slowly vary, the same effects as above can be achieved as long as the assist level is formed.

Also, the assist level distribution is even in a layer in the above embodiments. However, the assist level may exist partially in the depth direction of the film, or may have a density distribution. The element forming the assist level may be contained in the semiconductor substrate, the charge storage film, the interelectrode insulating film, or the control gate electrode.

In the above embodiments, the requirements for the tunnel insulating film are that the leakage current is $1.0 \times 10^{-16}$ A/cm$^2$ or lower with an electric field of 3 MV/cm at the time of charge retention, and the leakage current is 0.1 A/cm$^2$ with an electric field of 13 MV/cm at the time of writing. However, in accordance with the present invention, a tunnel insulating film that satisfies desired requirements can be formed.

It is possible to use other semiconductor substrates, e.g., a semiconductor substrate made of Ge or GaAs, instead of a silicon substrate. It is also possible to use a substrate having a semiconductor layer made of Ge or GaAs as the surface layer, for example.

Although the nonvolatile semiconductor memory apparatuses of the first to fourth embodiments are of the NAND type, they may be of the NOR type. In such a case, the tunnel insulating film described in any of the above embodiments may be used as the tunnel insulating film of each memory cell in a NOR-type nonvolatile semiconductor memory apparatus.

As described so far, each of the embodiments of the present invention can provide a nonvolatile semiconductor memory apparatus having a tunnel insulating film that can restrict the leakage current in a low electric field even when the EOT is made smaller, and also can increase the leakage current in a high electric field.

Although the embodiments of the present invention have been described so far, the present invention is not limited to those specific embodiments, and various changes and modifications may be made to them, without departing from the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A nonvolatile semiconductor memory apparatus comprising:
  a memory element including:
    a semiconductor layer;
    a source region and a drain region formed at a distance from each other in the semiconductor layer;
    a first insulating film formed on a portion of the semiconductor layer located between the source region and the drain region, the first insulating film having first sites that perform electron trapping and releasing and are formed by adding an element different from a material of the first insulating film, and energy levels of the first sites being higher than a Fermi level of a material forming the semiconductor layer;
    a charge storage film formed on the first insulating film;
    a second insulating film formed on the charge storage film; and
    a control gate electrode formed on the second insulating film,
  wherein the first insulating film includes a first insulating layer and a second insulating layer formed on the first insulating layer, the second insulating layer having a higher dielectric constant than the first insulating layer, and includes the first sites that perform the electron trapping and releasing, and
  wherein:
    $T_{1,low}$ represents a physical thickness of the first insulating layer when the first insulating film is the first insulating layer and the first insulating layer needs to reduce leakage current to $J_{low}$ or lower, leakage current of the first insulating film in a first electric field applied in the first insulating film being required to be $J_{low}$ or lower as a required condition in a charge retaining state,
    $T_{2,low}$ represents a physical thickness of the second insulating layer when the first insulating film is the second insulating layer and the second insulating layer needs to reduce leakage current to $J_{low}$ or lower, leakage current of the first insulating film in a first electric field applied in the first insulating film being required to be $J_{low}$ or lower as the required condition in the charge retaining state, $T_{1,high}$ represents a physical thickness that the first insulating layer needs to have to increase the leakage current of the first insulating film to $J_{high}$ or higher in a second electric field applied in the first insulating film as a condition required when writing is performed;

∈$_1$ and ∈$_2$ represent dielectric constants of the first insulating layer and the second insulating layer, ∈$_{ox}$ represents a dielectric constant of silicon oxide, and $T_1$ (nm) and $T_2$ (nm) represent the respective physical thicknesses of the first insulating layer and the second insulating layer that are stacked, and the first insulating layer and the second insulating layer have physical thicknesses that fall into ranges that satisfy the following three inequations $$T_2 \geq -(T_{2,low}/T_{1,low}) \times T_1 + T_{2,low}$$

$$T_1 \geq T_{1,high}$$

$$T_1 \times \in_{ox}/\in_1 + T_2 \times \in_{ox}/\in_2 \leq 8.$$

2. The apparatus according to claim 1, wherein:

the first insulating layer is a silicon oxide layer; and when the second insulating layer is a hafnia layer, energy levels of the first sites are larger than 0 eV but smaller than 1.7 eV measured from a conduction band minimum of the hafnia layer, when the second insulating layer is an alumina layer, enemy levels of the first sites are larger than 0 eV but equal to or smaller than 1.9 eV measured from a conduction band minimum of the alumina layer, when the second insulating layer is a lanthanum oxide layer, energy levels of the first sites are equal to or larger than 0.1 eV but smaller than 1.5 eV measured from a conduction band minimum of the lanthanum oxide layer, when the second insulating layer is a hafnium silicate layer, enemy levels of the first sites are larger than 0 eV but equal to or smaller than 0.5 eV measured from a conduction band minimum of the hafnium silicate layer, when the second insulating layer is a lanthanum aluminate layer, enemy levels of the first sites are larger than 0 eV but smaller than 1.0 eV measured from a conduction band minimum of the lanthanum aluminate layer, when the second insulating layer is a hafnium aluminate layer, energy levels of the first sites are larger than 0.3 eV but equal to or smaller than 1.1 eV measured from a conduction band minimum of the hafnium aluminate layer, when the second insulating layer is a lanthanum hafnate layer, energy levels of the first sites are equal to or larger than 0.1 eV but smaller than 1.3 eV measured from a conduction band minimum of the lanthanum hafnate layer, and when the second insulating layer is a silicon nitride layer, energy levels of the first sites are equal to or larger than 0.1 eV but smaller than 1.5 eV measured from a conduction band minimum of the silicon nitride layer.

3. The apparatus according to claim 1, wherein the first insulating layer has second sites that perform the electron trapping and releasing, the second sites being located in a shallower position than the first sites.

4. The apparatus according to claim 1, wherein a band offset $\Delta E_c$ that is a difference between a conduction band minimum of the semiconductor layer and a conduction band minimum of the second insulating layer is in the range of 1.5 eV to 3.1 eV.

5. The apparatus according to claim 1, wherein an EOT of the first insulating film is in the range of 1.26 nm to 5 nm.

6. The apparatus according to claim 1, wherein the charge storage film is a trap insulating film.

7. The apparatus according to claim 1, wherein the charge storage film is a floating gate electrode.

8. The apparatus according to claim 1, wherein the first sites for performing the electron trapping and releasing are partially distributed in the first insulating film in a film-plane direction.

9. The apparatus according to claim 1, wherein the first insulating layer is a silicon oxide layer, and the second insulating layer is one of a hafnia layer, an alumina layer, a lanthanum oxide layer, a hafnium silicate layer, a lanthanum aluminate layer, a hafnium aluminate layer, a lanthanum hafnate layer, and a silicon nitride layer.

10. The apparatus according to claim 1, wherein the Fermi level of the semiconductor layer is higher than a conduction band minimum of the semiconductor layer by approximately 0.1 eV, where an electric field is not applied in the first insulating film.

11. A nonvolatile semiconductor memory apparatus comprising:

a memory element including:

a semiconductor layer;

a source region and a drain region formed at a distance from each other in the semiconductor layer;

a first insulating film formed on a portion of the semiconductor layer located between the source region and the drain region, the first insulating film having first sites that perform electron trapping and releasing, and energy levels of the first sites being higher than a Fermi level of a material forming the semiconductor layer;

a charge storage film formed on the first insulating film;

a second insulating film formed on the charge storage film; and a control gate electrode formed on the second insulating film, wherein the first insulating film includes a first insulating layer and a second insulating layer formed on the first insulating layer, the second insulating layer having a higher dielectric constant than the first insulating layer, and includes the first sites that perform the electron trapping and releasing, and wherein:

$T_{1,low}$ represents a physical thickness of the first insulating layer if the first insulating film is formed of the first insulating layer and the first insulating layer needs to reduce leakage current to $J_{low}$ or lower, leakage current of the first insulating film in a first electric field applied in the first insulating film being required to be $J_{low}$ or lower as a required condition in a charge retaining state, $T_{2,low}$ represents a physical thickness of the second insulating layer if the first insulating film is formed of the second insulating layer and the second insulating layer needs to reduce leakage current to $J_{low}$ or lower, leakage current of the first insulating film in a first electric field applied in the first insulating film being required to be $J_{low}$ or lower as the required condition in the charge retaining state, $T_{1,high}$ represents a physical thickness that the first insulating layer needs to have to increase the leakage current of the first insulating film to $J_{high}$ or higher in a second electric field applied in the first insulating film as a condition required when writing is performed;

$\in_1$ and $\in_2$ represent dielectric constants of the first insulating layer and the second insulating layer, $\in_{ox}$ represents a dielectric constant of silicon oxide, and $T_1$ (nm) and $T_2$ (nm) represent the respective physical thicknesses of the first insulating layer and the second insulating layer that are stacked, and the first insulating layer and the second insulating layer have physical thicknesses that fall into ranges that satisfy the following three inequations $T_2 \geq -(T_{2,low}/T_{1,low}) \times T_1 + T_{2,low}$ $T_1 \geq T_{1,high}$ $T_1 \times \in_{ox}/\in_1 + T_2 \times \in_{ox}/\in_2 \leq 8$.

12. The apparatus according to claim 11, wherein the first insulating layer is a silicon oxide layer, and the second insulating layer is one of a hafnia layer, an alumina layer, a lanthanum oxide layer, a hafnium silicate layer, a lanthanum aluminate layer, a hafnium aluminate layer, a lanthanum hafnate layer, and a silicon nitride layer.

13. The apparatus according to claim 11, wherein the first insulating layer further comprises second sites that perform the electron trapping and releasing, the second sites being located in a shallower position than the first sites.

14. The apparatus according to claim 11, wherein a band offset $\Delta E_c$ that is a difference between a conduction band minimum of the semiconductor layer and a conduction band minimum of the second insulating layer is in the range of 1.5 eV to 3.1 eV.

15. The apparatus according to claim 11, wherein an EOT of the first insulating film is in the range of 1.26 nm to 5 nm.

16. The apparatus according to claim 11, wherein the charge storage film is a trap insulating film.

17. The apparatus according to claim 11, wherein the charge storage film is a floating gate electrode.

18. The apparatus according to claim 11, wherein the first sites for performing the electron trapping and releasing are partially distributed in the first insulating film in a film-plane direction.

19. The apparatus according to claim 11, wherein:

the first sites are formed by adding an element different from a material of the first insulating film into the first insulating film, and the element is at least one element selected from the group consisting of Ge, P, As, B, Sb, F, Cl, Br, I, At, and H.

20. The apparatus according to claim 11, wherein the Fermi level of the semiconductor layer is higher than a conduction band minimum of the semiconductor layer by approximately 0.1 eV, where an electric field is not applied in the first insulating film.

* * * * *